(12) United States Patent
Yano et al.

(10) Patent No.: US 7,536,236 B2
(45) Date of Patent: May 19, 2009

(54) COMPONENT MOUNTING APPARATUS, SERVICE PROVIDING DEVICE AND SERVICING METHOD

(75) Inventors: Toshio Yano, Yamanashi (JP); Hiroshi Okamura, Kyoto (JP); Yoshihiko Misawa, Katano (JP); Yoshinori Isobata, Kofu (JP); Ken Takahashi, Yamanashi (JP); Masuo Masui, Yamanashi (JP); Eigo Sarashina, Kofu (JP); Akira Iizuka, Yamanashi (JP)

(73) Assignee: Panasonic Corporation, Osaka (JP)

( * ) Notice: Subject to any disclaimer, the term of this patent is extended or adjusted under 35 U.S.C. 154(b) by 289 days.

(21) Appl. No.: 11/341,693

(22) Filed: Jan. 30, 2006

(65) Prior Publication Data
US 2006/0136787 A1 Jun. 22, 2006

Related U.S. Application Data

(63) Continuation of application No. 10/451,637, filed as application No. PCT/JP02/00103 on Jan. 10, 2002, now Pat. No. 7,142,939.

(30) Foreign Application Priority Data

Jan. 10, 2001 (JP) .................................. 2001-2066
Mar. 28, 2001 (JP) ............................... 2001-92484

(51) Int. Cl.
 *G06F 19/00* (2006.01)
(52) U.S. Cl. ........................... 700/121; 700/65; 438/26; 29/739
(58) Field of Classification Search .................. 700/65, 700/121; 438/26; 29/739
See application file for complete search history.

(56) References Cited

U.S. PATENT DOCUMENTS 5,822,210 A * 10/1998 Kobayashi et al. .......... 700/121

| 6,385,497 | B1 * | 5/2002 | Ogushi et al. ............... 700/110 |
| 6,510,350 | B1 * | 1/2003 | Steen, III et al. ............... 700/9 |
| 6,592,020 | B1 * | 7/2003 | Currie et al. ................. 228/224 |
| 6,622,054 | B1 * | 9/2003 | Okuda et al. .................. 700/51 |
| 6,634,094 | B1 * | 10/2003 | Morita ........................ 29/740 |
| 6,671,570 | B2 * | 12/2003 | Schulze ..................... 700/121 |
| 6,722,321 | B2 * | 4/2004 | Kim ......................... 123/43 R |
| 6,792,321 | B2 * | 9/2004 | Sepe, Jr. ........................ 700/9 |

FOREIGN PATENT DOCUMENTS

| DE | 29919676 | 2/2000 |
| EP | 0822473 | 2/1998 |
| JP | 5-127720 | 5/1993 |
| JP | 9-024665 | 1/1997 |
| JP | 11-213010 | 8/1999 |
| JP | 11-276963 | 10/1999 |
| JP | 11-277379 | 10/1999 |
| JP | 2000-133988 | 5/2000 |
| JP | 2000-236197 | 8/2000 |
| JP | 2000-259729 | 9/2000 |

OTHER PUBLICATIONS

English language Abstract of JP 2000-236197.

(Continued)

*Primary Examiner*—Michael D Masinick
(74) *Attorney, Agent, or Firm*—Greenblum & Bernstein, P.L.C.

(57) ABSTRACT

A service receiving method for receiving a component library including component size necessary for mount production, by inputting, via a service receiver, to a service provider, mounted component data having the results of fabrication of non-defective products, through the communication system that includes the Internet and deriving, by the service receiver, the component library from a mounted component database provided in the service provider, the mounted component database containing the input mounted component data accumulated for each type of component.

1 Claim, 72 Drawing Sheets

OTHER PUBLICATIONS

English language Abstract of JP 2000-259729.
English Language Abstract of JP 2000-236197.
English Language Abstract of JP 2000-259729.
English Language Abstract of JP 2000-133988.
English Language Abstract of JP 11-277379.
English Language Abstract of JP 11-213010.
English Language Abstract of JP 11-276963.
English Language Abstract of JP 9-024665.
English Language Abstract of JP 5-127720.
U.S. Appl. No. 11/341,691 to Nonaka et al., filed Jan. 30, 2006.

* cited by examiner

Fig. 22

| | 211 FACILITY INFORMATION |
|---|---|
| PRODUCTION MANAGEMENT INFORMATION | EXPECTED NUMBER OF PRODUCTS |
| | EXPECTED NUMBER OF CIRCUITS |
| | NUMBER OF PRODUCED PRODUCTS |
| | NUMBER OF PRODUCED CIRCUITS |
| | POWER ON TIME |
| | OPERATING TIME |
| | OPERATION PREPARING TIME |
| | P-PLATE WAITING TIME |
| | PRODUCT TYPE SWITCHING TIME |
| | MAINTENANCE TIME |
| | TROUBLE SHUTDOWN TIME |
| | NUMBER OF TROUBLE SHUTDOWNS |
| | CONVEYANCE ERROR NUMBER |
| | OPERATION RATE |
| | SUCTION RATE |
| | PLACEMENT RATE |
| | COMPONENT STOCKOUT SHUTDOWN NUMBER |
| | COMPONENT STOCKOUT SHUTDOWN TIME |
| | SUCTION NUMBER |
| | PLACEMENT NUMBER |
| | NUMBER OF SUCTION ERRORS |
| | NUMBER OF STANDING SUCTION ERRORS |
| | NUMBER OF COMPONENT RECOGNITION ERRORS |
| | NUMBER OF COMPONENT RECOGNITION (SHAPE) ERRORS |
| | NUMBER OF BOARD RECOGNITION ERRORS |
| | NUMBER OF BOARD RECOGNITION (SIZE) ERRORS |
| CASSETTE INFORMATION | ZNO. |
| | COMPONENT NAME |
| | NUMBER OF REMAINING COMPONENTS |
| | NUMBER OF COMPONENT STOCKOUTS |
| | SUCTION NUMBER |
| | PLACEMENT NUMBER |
| | NUMBER OF SUCTION ERRORS |
| | NUMBER OF STANDING SUCTION ERRORS |
| | NUMBER OF RECOGNITION ERRORS |
| | NUMBER OF USED COMPONENTS |

Fig. 23

220 (NC DATA)

221 (NC PROGRAM)

| STEP NO. | X | Y | W | Z | COMPONENT NAME | CIRCUIT NO. |
|---|---|---|---|---|---|---|
| 1 | -24.65 | 7.2 | 90 | 1 | 1005C-01 | C01 |
| 2 | -43.4 | 16.2 | 90 | 1 | 1005C-01 | C02 |
| 3 | -50.9 | 18.7 | 0 | 2 | 1608R-01 | R01 |

231 (ARRANGEMENT PROGRAM)

| Z | COMPONENT NAME | SHAPE CODE |
|---|---|---|
| 1 | 1005C-01 | 1005C |
| 2 | 1608R-01 | 1608R |

241 (COMPONENT LIBRARY)

| SHAPE CODE | LENGTH | WIDTH | THICK-NESS | HEAD SPEED | XY SPEED | NOZZLE | TOOL |
|---|---|---|---|---|---|---|---|
| 1005C | 1.0 | 0.5 | 0.4 | HIGH SPEED | HIGH SPEED | SMALL | NO |
| 1608R | 1.6 | 0.8 | 0.4 | HIGH SPEED | HIGH SPEED | SMALL | NO |

Fig. 24

MOUNTING WEB

PLEASE SELECT A SERVICE THAT YOU WISH TO RECEIVE

| CONTRACT | BUSINESS INFORMATION | ELECTRONIC INSTRUCTION MANUAL |
|---|---|---|
| | MENDING PARTS | VIRTUAL TRAINING |
| | MAINTENANCE INFORMATION | SOFTWARE UPGRADE |
| | DATA OF COMPONENT TO BE MOUNTED | TECHNIQUE DATA |

OPTIMIZATION  MONITORING  ANALYSIS

*Fig. 27A*

414 SPEED MASTER

| PLACEMENT MACHINE NAME \ SHAPE CODE | A | B | ...... | Z | LOADING TIME | TOOL CHANGE TIME | CASSETTE REPLACEMENT TIME |
|---|---|---|---|---|---|---|---|
| PLACEMENT MACHINE 1 | 0.20 | | ...... | 0.50 | 5.0 | 0 | 180 |
| PLACEMENT MACHINE 2 | 0.12 | 0.14 | ...... | 0.40 | 3.0 | 0 | 240 |
| ⋮ | ⋮ | ⋮ | ...... | ⋮ | ⋮ | ⋮ | ⋮ |
| PLACEMENT MACHINE 1 | 0.6 | 0.85 | ...... | 1.4 | 5.0 | 5.0 | 210 |

*Fig. 27B*

413 TACT SIMULATION PARAMETER

| NO. | STANDARD TACT (second) | XY RANGE (mm) | XY SPEED (mm second) | Z RANGE (pitch) | Z SPEED (pitch second) |
|---|---|---|---|---|---|
| 1 | 0.20 | 30 | 300 | 1 | 20 |
| 2 | 0.25 | 33 | 290 | 1 | 20 |
| ⋮ | ⋮ | ⋮ | ⋮ | ⋮ | ⋮ |
| 8 | 0.50 | 50 | 240 | 2 | 16 |

Fig. 28

OPERATION QUALITY INFORMATION DB
(FACILITY INFORMATION DB) — 30

| FACILITY \ TIME | FACTORY A | | | FACTORY B | | FACTORY C | |
|---|---|---|---|---|---|---|---|
| | COMPONENT MOUNTING APPARATUS 1 | COMPONENT MOUNTING APPARATUS 2 | ... | COMPONENT MOUNTING APPARATUS 1 | ... | COMPONENT MOUNTING APPARATUS 1 | ... |
| 0:00 | FACILITY INFORMATION | | | | | | |
| 1:00 | | | | | | | |
| 2:00 | | | | | | | |
| : | | | | | | | |

(MOUNTING TACT DB) [FACTORY A]

| PRODUCT TYPE | START TIME | END TIME | COMPONENT MOUNTING APPARATUS 1 | COMPONENT MOUNTING APPARATUS 2 | ... |
|---|---|---|---|---|---|
| A | | | COMPONENT TACT INFORMATION | | |
| B | | | | | |
| C | | | | | |
| : | | | | | |

(INSPECTION RESULT DB)

| PRODUCT TYPE | INSPECTION AFTER PRINT | INSPECTION AFTER PLACEMENT | VISUAL INSPECTION |
|---|---|---|---|
| A | INSPECTION RESULT INFORMATION | | |
| B | | | |
| C | | | |
| : | | | |

Fig. 30

| USER CODE | CODE USER NAME AT DESTINATION OF DELIVERY | CONTRACT LEVEL | ABSENCE/PRESENCE OF AUTOMATIC TRANSMISSION ||||| DELIVERY HISTORY |
|---|---|---|---|---|---|---|---|---|
| | | | BATCH | BUSINESS | INSTRUCTION MANUAL | MAINTENANCE | SOFTWARE OPTIMIZATION | |
| A001 | ○○○ | 0 | ○ | | | | | |
| A002 | △△△ | 2 | | ○ | | | ○ | |
| … | … | … | | | | | | |

320

| SPECIFICATIONS / MACHINE TYPE | TACT | PLACEMENT ACCURACY | PRICE | PLACEABLE COMPONENT | OCCUPIED AREA | ... | CATALOG CODE | SPECIFICATION CODE |
|---|---|---|---|---|---|---|---|---|
| COMPONENT MOUNTING APPARATUS 1 | 0.09 sec | 0.1 mm | ×× YEN | ... | ... | | B001 | C001 |
| COMPONENT MOUNTING APPARATUS 2 | 0.12 sec | 0.05 mm | △△ YEN | ... | ... | | B002 | C002 |
| COMPONENT MOUNTING APPARATUS 3 | 0.20 sec | 0.1 mm | ○○ YEN | ... | ... | | B003 | C003 |
| ⋮ | | | | | | | ⋮ | ⋮ |
| SUMMARY | — | — | — | — | — | ... | B999 | — |

Fig. 33

(STOCK INFORMATION) — 358

| MENDING PART PRODUCT NUMBER | STOCK INFORMATION | | | |
|---|---|---|---|---|
| | POINT 1 | POINT 2 | ... | ... |
| HIN01 | 20 | 15 | ... | ... |
| HIN02 | 5 | 7 | ... | ... |
| : | : | : | | |

(ORDER INFORMATION) — 359

| USER CODE | MENDING PART PRODUCT NUMBER | NUMBER | DELIVERY DATE | CORRE-SPONDING POINT |
|---|---|---|---|---|
| A001 | HIN01 | 4 | 2001.3.1 | POINT 1 |
| A001 | HIN02 | 2 | 2001.3.1 | POINT 1 |
| A002 | HIN01 | 5 | 2001.3.10 | POINT 2 |
| : | : | : | : | : |

| MACHINE TYPE \ EACH SECTION | PLACEMENT HEAD | XY TABLE | COMPONENT SUPPLYING SECTION | ... | MAINTE-NANCE CODE |
|---|---|---|---|---|---|
| COMPONENT MOUNTING APPARATUS 1 | MAINTE-NANCE INFORMA-TION | | | | F001 |
| COMPONENT MOUNTING APPARATUS 2 | | | | | F002 |
| COMPONENT MOUNTING APPARATUS 3 | | | | | F003 |
| : | | | | | : |

F001

MAINTENANCE MANUAL OF COMPONENT MOUNTING APPARATUS 1 EDITION 01 IN 2000

MAINTENANCE MANUAL OF COMPONENT MOUNTING APPARATUS 1 EDITION 01 IN 1999

Fig. 37

| SHAPE CODE | CLASSI- FICATION | COMMON DATA | COMPONENT MOUNTING APPARATUS 1 | COMPONENT MOUNTING APPARATUS 2 | ... |
|---|---|---|---|---|---|
| 1005C | RECTAN- GULAR CHIP | COMMON DATA SUCH AS COMPO- NENT SIZE | MOUNTING CONDITION DATA PECULIAR TO COMPONENT MOUNTING APPARATUS 1 | MOUNTING CONDITION DATA PECULIAR TO COMPONENT MOUNTING APPARATUS 2 | |
| 1608R | RECTAN- GULAR CHIP | | | | |
| : | | | | | |

Fig. 38

| BOARD CONDITION | CREAM SOLDER INFORMATION | ADHESIVE INFORMATION | REFLOW INFORMATION | ... |
|---|---|---|---|---|
| CONDITION 1 | | | | |
| CONDITION 2 | | | | |
| : | | | | |

| | Z | PRODUCT TYPE A | PRODUCT TYPE B | PRODUCT TYPE C |
|---|---|---|---|---|
| PLACEMENT MACHINE 1 | 1 | a | a | a |
| | 2 | b | b | b |
| | 3 | c | c | c |
| | 4 | d | d | — |
| | 5 | e | — | e |
| | 6 | — | f | f |
| | 7 | g | — | — |
| | 8 | — | h | — |
| | PLACEMENT TACT | 78 SECONDS | 85 SECONDS | 62 SECONDS |
| PLACEMENT MACHINE 2 | 1 | i | i | i |
| | 2 | j | j | j |
| | 3 | k | k | — |
| | 4 | — | l | l |
| | 5 | — | m | — |
| | 6 | n | — | n |
| | 7 | — | — | o |
| | 8 | p | — | — |
| | PLACEMENT TACT | 75 SECONDS | 87 SECONDS | 60 SECONDS |
| LINE MOUNTING TACT | | 78 SECONDS | 87 SECONDS | 62 SECONDS |
| NUMBER OF PRODUCTS | | 200 | 120 | 70 |
| TYPE PRODUCTION TIME | | 260 MINUTES | 174 MINUTES | 72 MINUTES 20 SECONDS |

Fig. 60B

| | TYPE A TO B | | TYPE B TO C | |
|---|---|---|---|---|
| | NUMBER OF REPLACED COMPONENTS | TIME | NUMBER OF REPLACED COMPONENTS | TIME |
| PLACEMENT MACHINE 1 | 0 | 0 SECOND | 0 | 0 SECOND |
| PLACEMENT MACHINE 2 | 0 | 0 SECOND | 0 | 0 SECOND |

Fig. 61A

| | Z | PRODUCT TYPE A | PRODUCT TYPE B | PRODUCT TYPE C |
|---|---|---|---|---|
| PLACEMENT MACHINE 1 | 1 | a | a | a |
| | 2 | b | b | b |
| | 3 | c | c | c |
| | 4 | d | d | — |
| | 5 | e →  | h → | e |
| | 6 | g → | f | f |
| | 7 | — | — | — |
| | 8 | — | — | — |
| | PLACEMENT TACT | 70 SECONDS | 79 SECONDS | 58 SECONDS |
| PLACEMENT MACHINE 2 | 1 | i | i | i |
| | 2 | j | j | j |
| | 3 | k | k → | o |
| | 4 | p → | l | l |
| | 5 | n → | m → | n |
| | 6 | — | — | — |
| | 7 | — | — | — |
| | 8 | — | — | — |
| | PLACEMENT TACT | 68 SECONDS | 83 SECONDS | 55 SECONDS |
| LINE MOUNTING TACT | | 70 SECONDS | 83 SECONDS | 58 SECONDS |
| NUMBER OF PRODUCTS | | 200 | 120 | 70 |
| TYPE PRODUCTION TIME | | 233 MINUTES 20 SECONDS | 166 MINUTES | 67 MINUTES 40 SECONDS |

Fig. 61B

| | TYPE A TO B | | TYPE B TO C | |
|---|---|---|---|---|
| | NUMBER OF REPLACED COMPONENTS | TIME | NUMBER OF REPLACED COMPONENTS | TIME |
| PLACEMENT MACHINE 1 | 2 | 6 MINUTES | 1 | 3 MINUTES |
| PLACEMENT MACHINE 2 | 2 | 8 MINUTES | 2 | 8 MINUTES |
| LINE TYPE SWITCHING TIME | 8 MINUTES | | 8 MINUTES | |

Fig. 62A

| | Z | PRODUCT TYPE A | PRODUCT TYPE B | PRODUCT TYPE C |
|---|---|---|---|---|
| PLACEMENT MACHINE 1 | 1 | a | a | a |
| | 2 | b → | d → | c |
| | 3 | c → | h → | b |
| | 4 | d → | b → | e |
| | 5 | e → | f | f |
| | 6 | g → | c | — |
| | 7 | — | — | — |
| | 8 | — | — | — |
| | PLACEMENT TACT | 70 SECONDS | 76 SECONDS | 56 SECONDS |
| PLACEMENT MACHINE 2 | 1 | i → | j → | i |
| | 2 | j → | k → | o |
| | 3 | k → | i → | j |
| | 4 | n → | l | l |
| | 5 | p → | m → | n |
| | 6 | — | — | — |
| | 7 | — | — | — |
| | 8 | — | — | — |
| | PLACEMENT TACT | 68 SECONDS | 78 SECONDS | 54 SECONDS |
| | LINE MOUNTING TACT | 70 SECONDS | 78 SECONDS | 56 SECONDS |
| | NUMBER OF PRODUCTS | 200 | 120 | 70 |
| | TYPE PRODUCTION TIME | 233 MINUTES 20 SECONDS | 156 MINUTES | 65 MINUTES 20 SECONDS |

Fig. 62B

| | TYPE A TO B | | TYPE B TO C | |
|---|---|---|---|---|
| | NUMBER OF REPLACED COMPONENTS | TIME | NUMBER OF REPLACED COMPONENTS | TIME |
| PLACEMENT MACHINE 1 | 5 | 15 MINUTES | 3 | 9 MINUTES |
| PLACEMENT MACHINE 2 | 5 | 20 MINUTES | 4 | 16 MINUTES |
| LINE TYPE SWITCHING TIME | 20 MINUTES | | 16 MINUTES | |

Fig. 70

| SOLDER ITEM | | A | | | B | |
|---|---|---|---|---|---|---|
| SOLDER MANUFACTURER | | | | | | |
| CREAM SOLDER PRODUCT NUMBER | ...1 | ...2 | ...3 | ...4 | | |
| PARTICLE SIZE | | | | | | |
| VISCOSITY | | | | | | |
| REMARKS | | | | | | |
| FLUX TYPE | | | | | | |
| FLUX CONTENT | | | | | | |
| THIXOTROPIC RATIO | | | | | | |
| CHLORINE CONTENT | | | | | | |
| CORRESPONDING PITCH | 0.5 | 0. | | | | |
| ALLOY COMPOSITION | WITH Pb | NO Pb | | | | |

328a

COMPONENT MOUNTING APPARATUS, SERVICE PROVIDING DEVICE AND SERVICING METHOD

This application is a continuation of U.S. patent application Ser. No. 10/451,637 filed Jul. 10, 2003 now U.S. Pat. No. 7,142,939, in the names of Satoshi NONAKA et al., which is the National Stage of PCT/JP02/00103, filed Jan. 10, 2002, the disclosures of which are expressly incorporated by the reference herein in their entirety.

BACKGROUND OF THE INVENTION

1. Technical Field

The present invention relates to: a service receiving device for deriving a service from a production facility manufacturing supplier, the service being for realizing high-efficiency and high-quality production of a production line where a plurality of production facilities including a component mounting apparatus are connected in order of steps; a service providing device for providing a service from a manufacturer side that supplies the production facility; and a method for providing a service from the production facility manufacturing supplier. The present invention also relates to a service receiving program for operating the service receiving device and a service providing program for operating the service providing device.

2. Background Art

A large number of electronic appliances have been reduced in size as well as in weight, while a circuit board constituting the electronic appliance has been more and more highly integrated and mounted at a higher density. On such a circuit board, components are mounted by the above-mentioned component mounting apparatus or component mounting line.

This component mounting line is a type of production line for automatically mounting components on a circuit board. An example of the production line is constituted by: a board supplying device for supplying circuit boards in a one-by-one manner; a cream solder printer for printing a cream solder onto the circuit board; a cream solder print inspection machine for inspecting a state of the printed cream solder; an applicator for applying an adhesive for adhering components onto the board; a high-speed placement machine for placing the components onto the circuit board at high speed; a multifunctional placement machine for placing various kinds of components including an odd-shaped component onto the circuit board; a placed component inspection machine for inspecting a missing component or a positional offset of a component on the circuit board after placement of the components; a reflow device for melting the cream solder so as to solder an electrode of the component and a land on the circuit board to each other to obtain a mounted state of the components; a visual inspection machine for visually inspecting a state of soldering, a placed state of the component or the like; and a board housing device for housing the mounted circuit board therein. A plurality of types of these production facilities are connected in series to each other. Circuit boards sequentially pass through these devices in a one-by-one manner so as to achieve the mount production.

Moreover, depending on the kind of electronic component, equipment in other forms such as a component insertion machine for inserting a radial lead, an axial lead, or a jumper wire, a component mounting apparatus for achieving the mounting with a joint between metals by friction, diffusion due to friction, or fusion can be used for fabricating a circuit board.

In component mounting apparatus manufacturers supplying a component mounting apparatus or a component mounting line as described above, the destination of delivery of a component mounting apparatus or a component mounting line has been expanded not only on a domestic scale but also on a global scale. In this context, a conventional servicing status while the component mounting apparatus is running upon and after delivery to the destination of delivery is as follows.

When a component mounting apparatus or a component mounting line is to be delivered to the destination of delivery, an operation for installing the component mounting line and an adjustment operation for setting up the component mounting line are performed by an operator dispatched from a component mounting apparatus manufacturer. At this time, an instructor dispatched from the component mounting apparatus manufacturer describes the operation of the component mounting apparatus and offers the training for an operator of the apparatus at a factory of the destination of delivery, with reference to an instruction manual delivered along with the component mounting apparatus.

In a case where the component mounting apparatus is shut down due to a trouble, or quality defect of products, or the like occurs during production in the component mounting line after its delivery, the operator, who has received instructions for the operation and the training, analyses its cause at the factory of the destination of delivery so as to eliminate the trouble or the quality defect. In a case where the trouble or the quality defect still remains, the component mounting apparatus manufacturer is requested to dispatch a service person. The service person is asked to analyze the cause so as to eliminate the trouble or the quality defect of products.

Such a service will be specifically described, taking a component mounting apparatus 450 illustrated in FIG. 67 as an example. The component mounting apparatus 450 includes: a data storage section 451 for recording and storing operation information and error information of the component mounting apparatus for trouble recovery or maintenance; an output device 452 (a printer, a floppy disk drive, a display screen, or the like) for outputting the information stored in the data storage section 451; and a communication device 454 for outputting the information to an external personal computer 453 or the like. Moreover, as shown in FIG. 68, a service point 172 for repairing the trouble occurring in the component mounting apparatus 450 and performing maintenance for a customer factory 171 where the apparatus 450 is delivered to be operated is provided on the manufacturer side.

When a trouble occurs on the customer side, the trouble is conventionally recovered as in an example of a procedure shown in a flow chart of FIG. 69. First, in a case where a trouble occurs in the component mounting apparatus 450 present in the customer factory 171 (Step S601), an operator on the customer side outputs the contents of the trouble occurrence, for example, the operation information and the error information of the component mounting apparatus and the like, through the output device 452 of the component mounting apparatus 450 (Step S602). The output information is communicated to the service point 172 by using information transfer means such as a telephone, a facsimile, or the like (Step S603). Thereafter, a service person who has received the communication at the service point 172 receives the contents of the trouble (the operation information, the error information, and the like of the component mounting apparatus) so as to check if all data necessary for analysis have been completed (Step S604). In a case where all data have not been completed, the service person makes contact with the operator at the customer factory 171 again so as to collect the information. In a case where all data have been completed, the analysis is carried out (Step S605) so that the service person visits the customer to recover the trouble (Step S606).

The operation of the component mounting apparatus has been significantly complicated in these days with the diversification of circuit boards or components to be mounted and the corresponding sophistication of component mounting apparatuses. Accordingly, in spite of the service as described above, shutdown due to a trouble or quality defect of products is frequently caused by a faulty operation of the operator who operates a component mounting apparatus.

Moreover, the operators at the destinations of delivery of component mounting apparatuses have varied levels. From a global point of view, in particular, the operators at the destinations of delivery of apparatuses have infinitely varied levels for the respective zones of the world. Thus, the quality of component mount production is varied depending on the level of the operator. As a result, it becomes difficult to ensure the uniform quality over all factories at the destinations of delivery.

Particularly, it is difficult for the operator at the destination of delivery to learn know-how of component mounting, that is, to select a component mounting condition depending on the type of a circuit board or a component to be mounted. Nevertheless, the description of operation or the training for an operator at the time of delivery of the apparatus is normally made on the operation for a particular test circuit board. In many cases, the description or the training does not cover the learning of selection of a component mounting condition depending on the type of a circuit board or a component to be mounted. Thus, it takes considerable time for an operator at the destination of delivery to learn such know-how.

For example, an operator for operating the component mounting apparatus 450 is required to create NC data which is necessary for the component mounting apparatus to perform an operation for mounting components. For creation of such data, it is necessary to search and input a significant amount of information for an individual component to be mounted, as is illustrated in FIG. 23. Nonetheless, the utilization of a system for automatically creating NC data from a component database has an advantage in that it is no more necessary to perform any research and input for a component which is once used and registered in the component database. However, there may sometimes be a trial and error process during production to confirm if the input contents are really suitable or not. Moreover, the number of types of components to be mounted, used in the component mount industry, is estimated to be 100,000 or more in total. In the field of mounting such various kinds of components, the number of components to be newly mounted is hardly reduced in an actual condition. Thus, the contents are likely to be misinput upon creation of NC data. An error in the input contents leads to a trouble of a component mounting apparatus or quality defect of products. What is worse, as the workload of creating the NC data is increased to be enormous, there is an increased possibility that the misinput might occur.

In addition to this, the workload is similarly high in teaching of component recognition data, setting of a squeegee operating condition in screen printing of a cream solder, setting of a heating temperature profile in a reflow device, and the like, which results in an increased possibility that the misinput might occur.

In a case where the shutdown of a component mounting apparatus caused by a trouble or quality defect of products occurs due to a faulty operation by the operator, the support is hardly provided in a timely manner under a servicing condition as conventional. In many cases, it is only after the analysis of the cause by a service person dispatched from a component mounting apparatus manufacturer that the cause of the trouble is proved to be a faulty operation. In some cases, it is even after several days' stay of the service person at the mounting field for grasping the phenomenon that the cause is found. Consequently, it takes several days to recover a component mounting line, resulting in a considerable amount of production loss or quality loss.

A main object of the present invention is to provide a component mounting apparatus, a service providing device, and a servicing method, in which a component mounting apparatus side can receive or be provided with a customer service related to production including the productivity and the quality maintenance from a manufacturer side supplying the component mounting apparatus or a service person side through all communications including the Internet according to the needs so as to facilitate the implementation of production.

DISCLOSURE OF THE INVENTION

In order to achieve the above object, a component mounting apparatus according to the present invention is an apparatus for mounting a component on a circuit board, the apparatus including a communication device which is connectable to the Internet line and is capable of receiving a service necessary for mount production through communication via the Internet line. Furthermore, the communication device: is used for monitoring an operating status of the component mounting apparatus by the service person side; notifies the contents of trouble occurrence to the service person side so as to allow the reception of a service; is used for a remote operation during component mounting from the service person side; is used to collect data for analysis of a trouble, including production mount data or device operation data accumulated in the component mounting apparatus, by the service person side; or allows a software for running the component mounting apparatus to be installed, or allows a component library for operating the component mounting apparatus or other services to be derived from the service person side. Moreover, the communication device derives a service from the service information database provided for the service person side, in which the service information is accumulated.

A servicing method according to the present invention is for a component mounting apparatus for mounting a component onto a circuit board, wherein the component mounting apparatus is connected to a service person side for providing a service of the component mounting apparatus via the Internet line, so that an operating status of the apparatus is monitored by the service person side via the Internet line.

A service providing device according to the present invention is for providing a service necessary for mount production, the device which is provided for a supplier side or a service person side of a component mounting apparatus including: a component supplying device for supplying a component; and component holding means for holding the component from the component supplying device so as to mount the component onto a circuit board, or a component mounting line including the component mounting apparatuses which are connected to each other, wherein the service providing device includes: a transmitting/receiving section for transmitting/receiving information to/from a service receiving device provided for a user side for effectuating the mount production using the component mounting apparatus or the component mounting line, via communication means including the Internet; and a control section used for derivation of a service by the service receiving device via the transmitting/receiving section. Furthermore, the control section is used for derivation of the service data or a service software from the service information database by the service receiving device via the transmitting/receiving section, or for derivation of a service for analyzing a problem arising in the component mounting apparatus or a service for monitoring a production status.

A component mounting apparatus of the present invention includes a cream solder printer for printing a cream solder on a circuit board so as to mount a component thereon. The component mounting apparatus includes: a transmitting/receiving section for transmitting/receiving information to a service providing device provided for a supplier or a service person side of the component mounting apparatus via communication means including the Internet; an input section for inputting instructions for deriving a service; and a control section, in response to the instructions from the input section, for performing control so as to derive a service necessary for printing of the cream solder from the service providing device via the transmitting/receiving section. Furthermore, the control section allows the service person side to receive a service for retrieving information related to characteristics of various cream solders or a printing condition, or notifies the service person side of a printing condition or a printing state or status which is selected to be practically used for printing of the cream solder by the cream solder printer so that the service person receives a service, through the Internet line via the transmitting/receiving section with the service person side who provides a service of the component mounting apparatus including the cream solder printer.

A servicing method according to the present invention is a method for providing a service of a component mounting apparatus including a cream solder printer for printing a cream solder onto a circuit board, wherein the servicing method allows the component mounting apparatus to derive information related to cream solder printing from a service person side who provides a service of the component mounting apparatus via the Internet with the service person side.

A service providing device according to the present invention is for providing a service necessary for cream solder printing, which is provided for a provider or a service person side of a component mounting apparatus including a cream solder printer for printing a cream solder onto a circuit board so as to mount a component thereon, wherein the service providing device includes a service information database, in which characteristic information of a cream solder, performance information obtained by accumulating information related to a printing condition, state or status which is selected to be practically used by a user side receiving the service from the service providing device or a provider or a service person side of a component mounting line, and/or information which is rendered adequate by using at least one of monitoring, evaluation, a countermeasure, and improvement for the accumulated information, is registered as data to be derived by the service receiving device. In this case, for a printing condition database for registering the printing condition of the cream solder among the service information databases, the control section can intend to converge the database while accumulating the evaluated performance of the printing condition as the needs.

The solder characteristic information includes a solder manufacturer, a product number, a particle size, a viscosity and other items. When the control section fails to retrieve the data as a result of retrieval of a product number, the control section performs the retrieval by a particle size and/or a viscosity. It is suitable that, in the retrieved solder characteristic information, characteristic information close to that of a desired solder product number is treated as the result.

The printing condition database suitably includes: a new database containing newly input data; and a basic database to be retrieved from the service receiving device, to which the transition is made when the data registered in the new database is determined to be adequate or stable. It is suitable that even data related to the same solder product number, particle size and viscosity are separately accumulated in the new database, so that the optimal data is selected from the accumulated data to make the transition to the basic database.

Other objects and features of the present invention will be apparent from the following detailed description and the drawings. The features of the invention can be used alone or in combinations varied as much as possible.

BRIEF DESCRIPTION OF DRAWINGS

FIG. 17A is a plan view and FIG. 17B is a front view thereof;

FIG. 22 is a configuration view of facility information in the third embodiment;

FIG. 23 is a configuration view of NC data in the third embodiment;

FIG. 24 shows a WEB screen of a service receiving device in the third embodiment;

FIG. 27A is a data configuration view of a speed master in the third embodiment, and FIG. 27B is a data configuration view of a tact simulation parameter in the third embodiment;

FIG. 28 is a configuration view of an operation quality information DB in the third embodiment;

FIG. 30 is a configuration view of a contract DB in the third embodiment;

FIG. 33 is a configuration view of a mending part DB in the third embodiment;

FIG. 37 is a configuration view of a mounted component DB in the third embodiment;

FIG. 38 is a configuration view of a mounting technique DB in the third embodiment;

FIG. 60A is a view showing an example of simulation of the arrangement of common components and a production tact in the third embodiment, and FIG. 60B is a view showing an example of simulation of type switching time corresponding to FIG. 60A;

FIG. 61A is a view showing an example of simulation of the arrangement of partially common components and a production tact in the third embodiment, and FIG. 61B is a view showing an example of simulation of type switching time corresponding to FIG. 61A;

FIG. 62A is a view showing an example of simulation of the optimal arrangement of individual components and a production tact in the third embodiment, and FIG. 62B is a view showing an example of simulation of type switching time corresponding to FIG. 62A;

FIG. 70 is a configuration view showing an example of a solder characteristic DB relating to solder characteristics in cream solder information in the mounting technique DB in the third embodiment;

BEST MODE FOR CARRYING OUT THE INVENTION

Hereinafter, some embodiments of the present invention will be described in detail with reference to the drawings for understanding of the invention. The embodiments described below merely show representative specific examples in the case of a component mounting apparatus for mounting components such as an electronic component onto a circuit board such as a printed board so as to fabricate an electronic circuit board, and therefore do not limit the recitation of the present invention within the scope of claims.

Hereinafter, a first embodiment of the present invention will be described.

Figure 1:
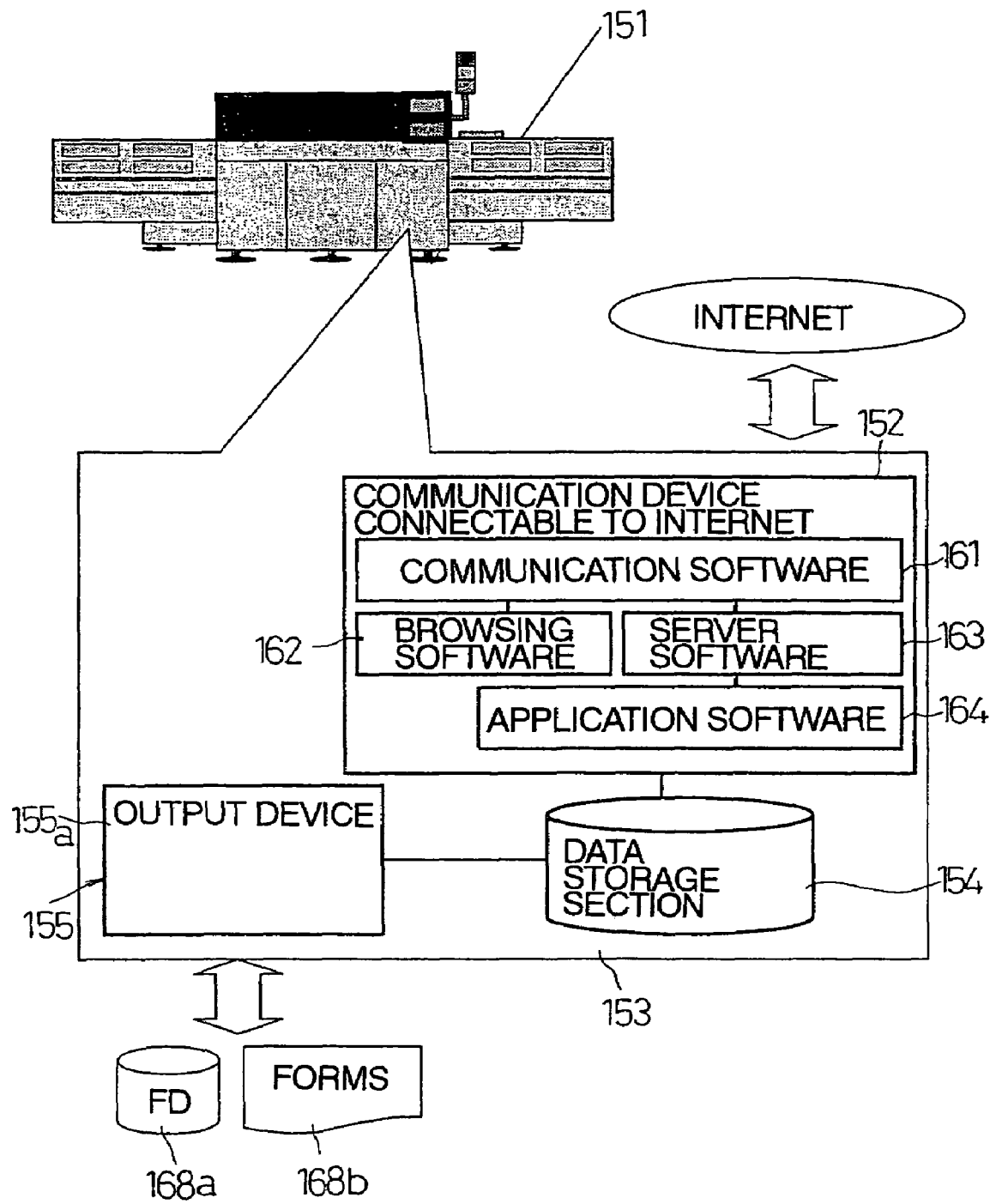
FIG. 1 is a block diagram showing a component mounting apparatus according to a first embodiment of the present invention.

A component mounting apparatus 151 shown in FIG. 1 according to the first embodiment includes a communication device 152 that is connectable to the Internet line, and a group of softwares. The communication device 152 is, for example, a computer; it may be an internal function of a control device 153 of a computer or the like for controlling an operation of the component mounting apparatus 151 as in this embodiment, or may be dedicated equipment. The communication device 152 may be a host computer for managing a plurality of component mounting apparatuses 151, or may be a computer which can communicate with all the component mounting apparatuses 151 in the entire factory. The group of softwares includes: a communication software 161, which runs on the communication device 152 to be connected to the Internet line (for example, a provider) for communication via the Internet; a browsing software 162, which runs on the communication device 152 to allow the consultation of a website on the Internet; a server software 163, which runs on the communication device 152 so as to respond to a request through communication via the Internet line; and an application software 164, which runs on the communication device 152 to perform the transmission and the reception of information with the server software 163 so as to transmit data accumulated in a data storage section 154 to the Internet line or to update a software or the setting within the device. The group of these softwares run in the communication device 152. The communication device 152 is incorporated into the component mounting apparatus 151.

The control device 153 including the data storage section 154 controls the operation of an output device 155 including a display 155a so as to input and store operation data including a trouble or an error of the component mounting apparatus 151, production result data, and the like into the data storage section 154. The control device can output data, which is input to or stored in the data storage section 154, to the exterior by the output device 155 so that the data can be used. The output is performed by recording on a recording medium 168a such as a floppy disk, printing on a recording chart 168b, screen display on the display 155a, or the like. The output device 155 also outputs communication data from the server software 163 in response to a request via the communication by the communication device 152.

Figure 2:
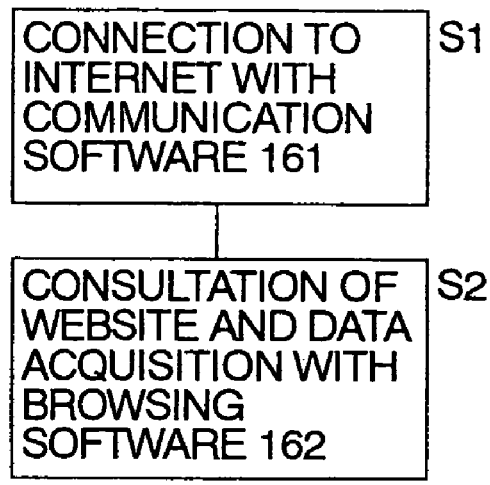
FIG. 2 is a flow chart for connection from the component mounting apparatus to the Internet in the first embodiment.

A procedure of connection from the above-described component mounting apparatus 151 to the Internet line will be described with reference to a flow chart shown in FIG. 2. First, the communication software 161 for connection to the Internet line is activated so as to establish a connection to the Internet by means of a communication medium such as a telephone line 156 or a LAN 157 (Step S1). Next, the browsing software 162 is activated so as to consult a website of a server connected on the Internet or to acquire data (Step S2). Naturally, for this data acquisition, the security is intended to be ensured by ID management or the like.

Figure 3:
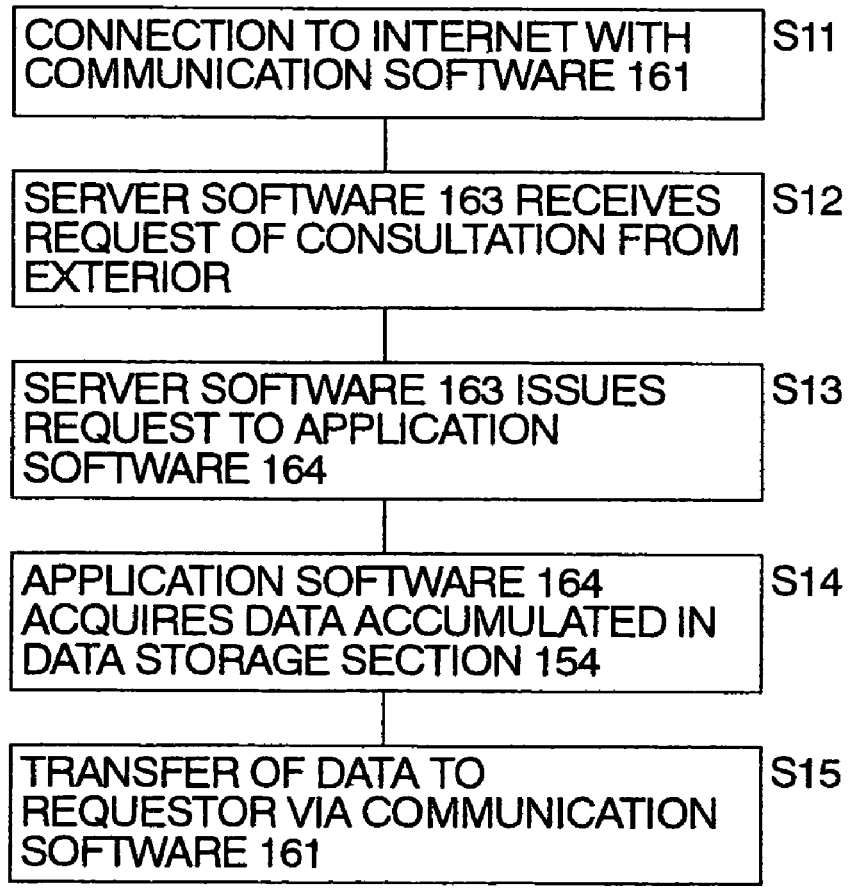
FIG. 3 is a flow chart for connection from the exterior via the Internet line to the component mounting apparatus in the first embodiment.

Next, a connection procedure from the exterior via the Internet line to the component mounting apparatus 151 will be described with reference to a flow chart shown in FIG. 3. First, the communication software 161 is activated so as to establish a connection to the Internet by means of a communication medium such as the telephone line 156 or the LAN 157 (Step S11). When there is a request for consultation from the Internet, the server software 163 receives the request (Step S12). Based on the contents of the request, the server software 163 issues a request to the application software 164 (Step S13). The application software 164 acquires data accumulated in the data storage section 154 (operation information, trouble or error information or the like of the component mounting apparatus 151) (Step S14), and then transfers the acquired data via the communication software 161 to a requestor (Step S15).

In this manner, the component mounting apparatus 151 is always capable of performing the communication via the Internet line so that a customer service such as daily monitoring, regular check, recovery or maintenance at the occurrence of a trouble, and updating of a software is received from the destination of communication. It does not take long time to receive a service, and the cost is reduced because the cost resulting from a transfer of a service person and the cost resulting from a dedicated line facility for each customer are not required. Thus, this procedure is particularly advantageous when a customer is remotely located from a service person.

Hereinafter, a second embodiment of the present invention will be described.

Figure 4:
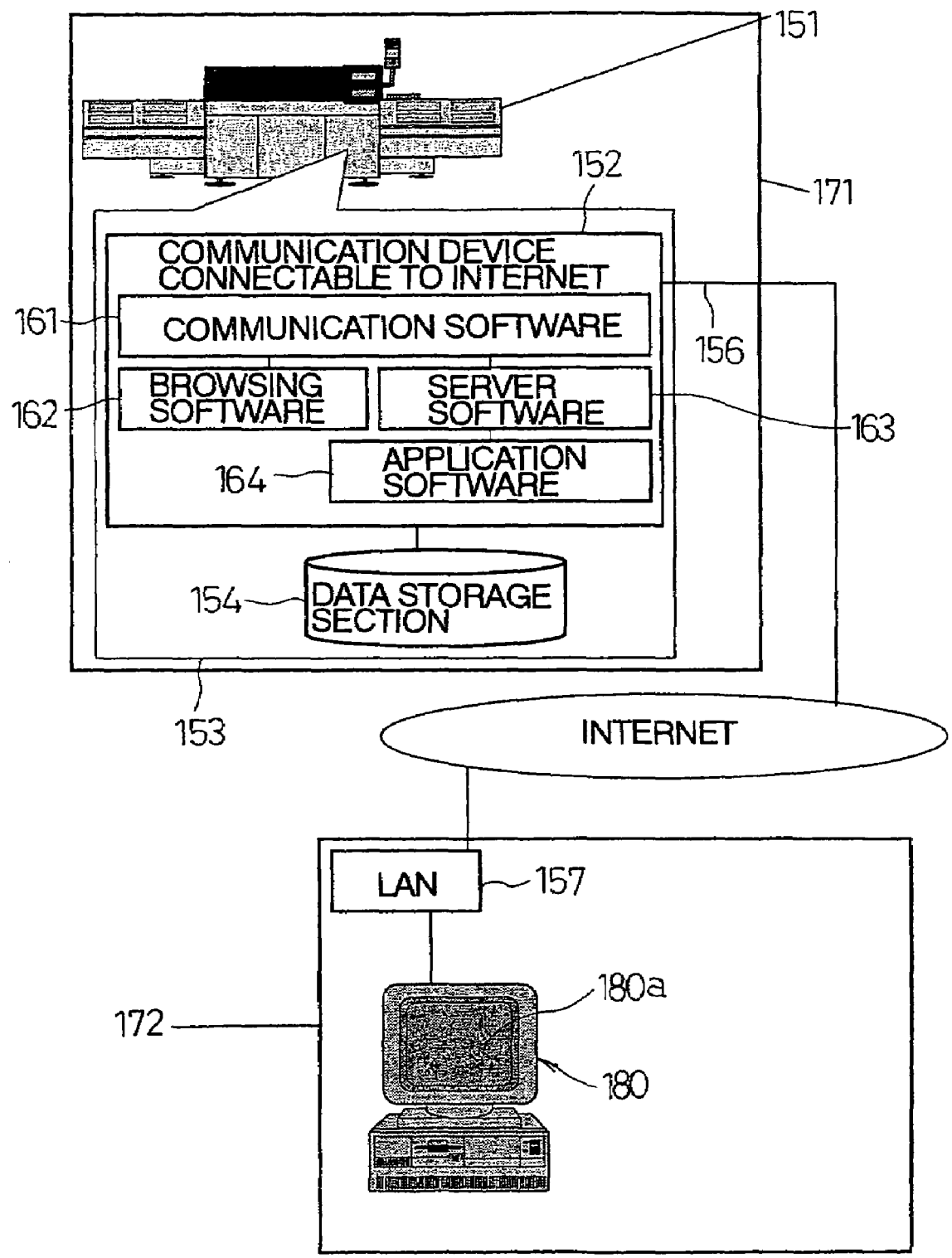
FIG. 4 is a general configuration view showing a customer servicing method and a device thereof according to a second embodiment of the present invention.

A customer servicing method and a device thereof according to the second embodiment use, as shown in FIG. 4, the component mounting apparatus 151 which is not particularly different from that shown in the first embodiment, and, in addition to this, include a service point 172 of a service person for offering a service to a customer. Regarding the component mounting apparatus 151, the common parts are denoted by the same reference numerals and the overlapping description thereof is omitted. The component mounting apparatus 151 is delivered to and installed in a customer factory 171. The communication device 152 is connected to the Internet line via the telephone line 156, the LAN 157, or the like. The communication device 152 can be constituted as an internal function of the control device 153 of the component mounting apparatus 151. The communication device may be the above-described computer for managing a plurality of component mounting apparatuses, or may be a computer which communicates with each of the component mounting apparatuses 151 in the customer factory so as to receive a service. The service point 172 is located at the position different from the customer factory 171, for example, at a remote location. Within the service point 172, a communication device 180 such as a computer, connected to the Internet via the telephone line 156, the LAN 157, or the like, is placed. The communication device 180 may be an internal function of a computer for performing customer management, or may be dedicated equipment.

Figure 5:
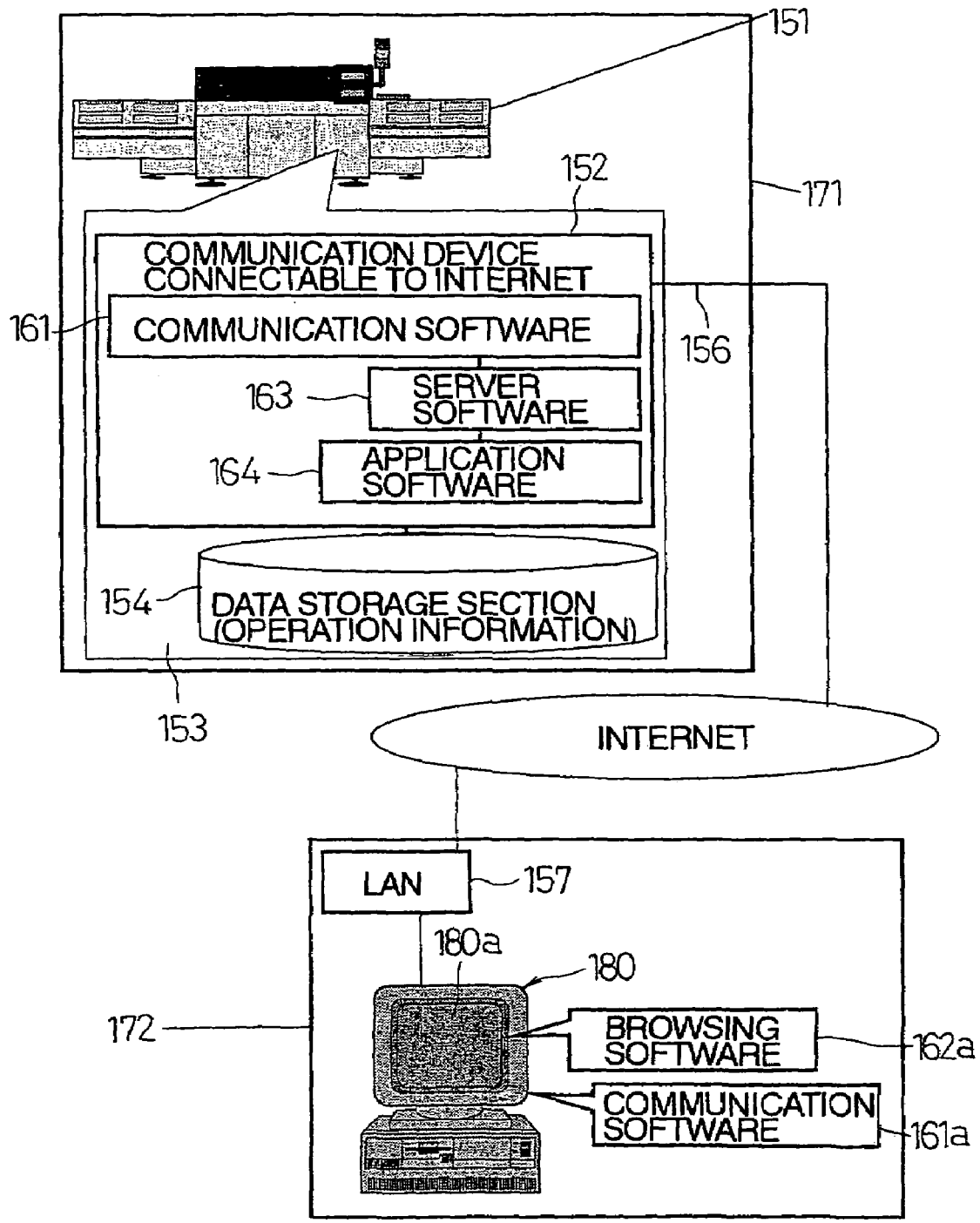
FIG. 5 is a view showing a specific example of a monitoring state for the component mounting apparatus through the Internet line from a remote location in the second embodiment.
Figure 6:
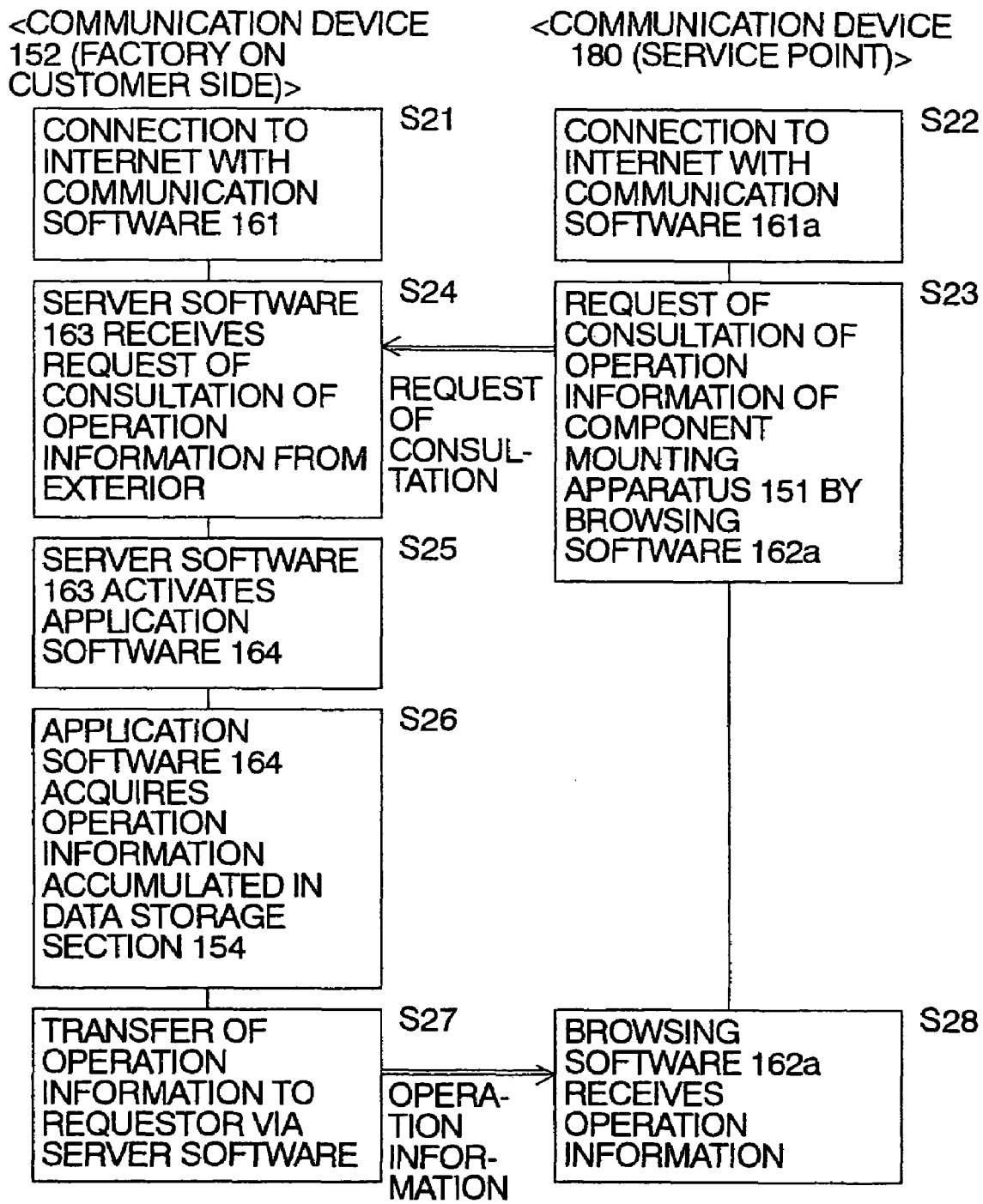
FIG. 6 is a flow chart showing a processing in FIG. 5.

FIG. 5 shows a specific example of monitoring a state of the component mounting apparatus 151 via the Internet line from a remote location at the service point 172 shown in FIG. 4. FIG. 6 shows a processing flow thereof. In order to monitor the component mounting apparatus 151, in the state where the communication devices 152 and 180 are both connected to the Internet (Steps S21 and S22), a browsing software 162a running on the communication device 180 within the service point 172 and the server software 163 running on the communication device 152 within the component mounting apparatus 151 communicate with each other (Steps S23 and S24). The server software 163 activates the application software 164 (Step S25). The application software 164 passes the operation information held in the data storage section 154 of the component mounting apparatus 151 to the server software 163 (Steps S26 and S27). Furthermore, the browsing software 162a within the service point 172 receives that information (Step S28), so that a service person can consult the operation information of the component mounting apparatus 151 in the customer factory 171 without leaving the service point 172. By automatically or manually repeating this processing, a state of the component mounting apparatus 151 is monitored.

In this case, the operation information is information indicating an operating status of the component mounting apparatus 151, and includes, for example, the total of an operation rate, operating time or shutdown time, real time information indicating if the component mounting apparatus is currently in operation, under suspension, or in trouble, and the like.

Figure 7:
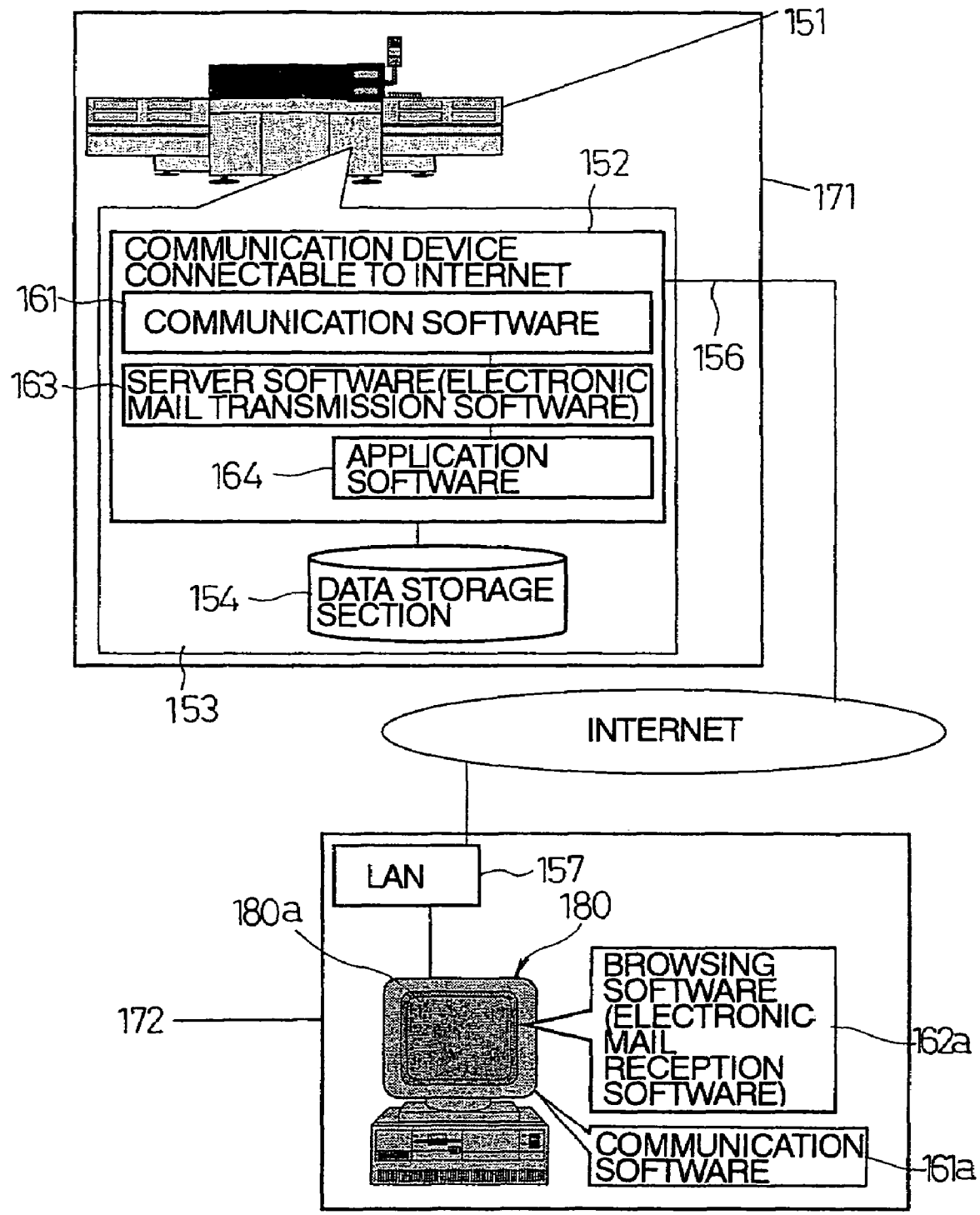
FIG. 7 shows a specific example of a state where trouble or error information of the component mounting apparatus is notified to a remote location through the Internet line in the second embodiment.

FIG. 7 shows a specific example for notifying trouble or error information of the component mounting apparatus 151 to the service point 172 at a remote location via the Internet line. When an error such as a trouble occurs in the state where the communication devices 152 and 180 are both being connected to the Internet, the component mounting apparatus 151 notifies the service point 172 of error information via the Internet line by using communication means such as an electronic mail with an electronic mail software of the browsing software 162a.

Figure 8:
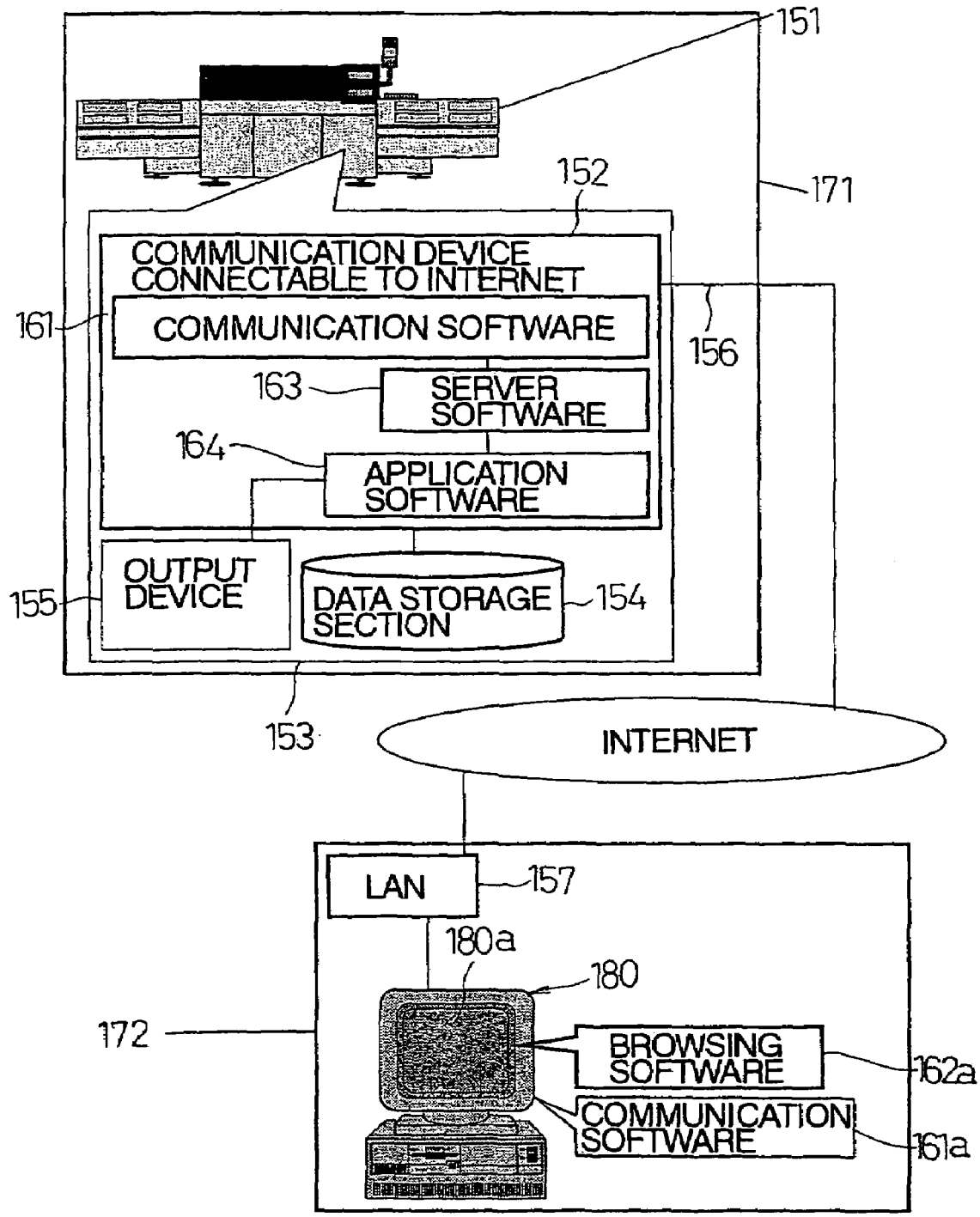
FIG. 8 shows a specific example of a state where the component mounting apparatus is operated from a remote location through the Internet line in the second embodiment.
Figure 9:
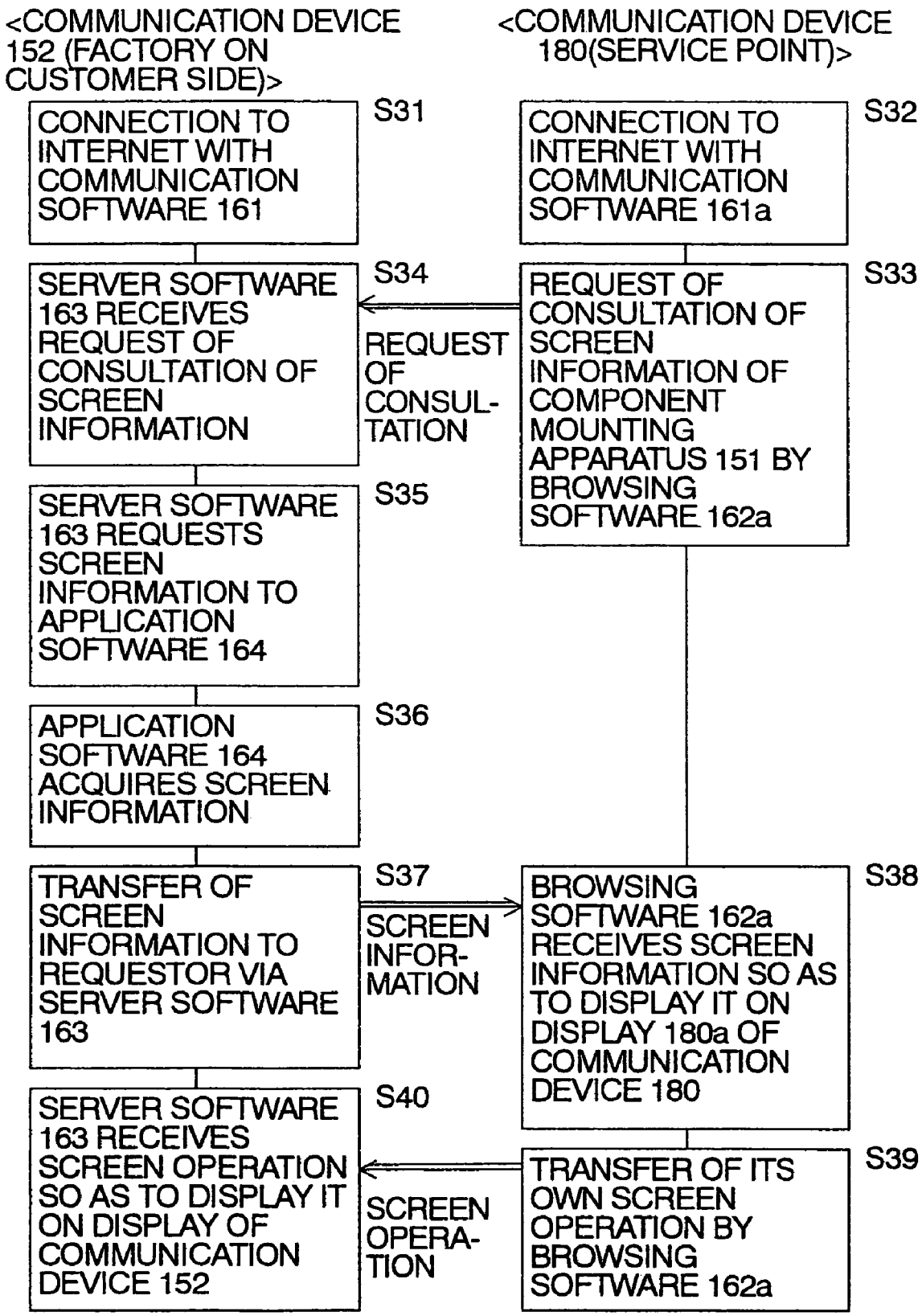
FIG. 9 is a flow chart showing a processing in FIG. 8.

FIG. 8 shows a specific example of operating the component mounting apparatus 151 via the Internet line from a remote location at the service point 172. FIG. 9 shows a processing flow thereof. In the state where the communication devices 152 and 180 are both connected to the Internet (Steps S31 and S32), in response to a request received by the server software 163 (Steps S34 and S35), the application software 164 in the component mounting apparatus 151 transmits information currently displayed on a screen by the display 155a of the component mounting apparatus 151, to the browsing software 162a of the computer within the service point 172 via the server software 163 (Steps S36 and S37). The application software 164 also receives a screen operation (an operation of a mouse, an input through a keyboard, or the like) of the browsing software 162a on the communication device 180 side so as to display it on the display 155a of the component mounting apparatus 151 (Steps S39 and S40). As a result, a screen operation is performed on a display 180a of the computer serving as the communication device 180 in the service point 172 so as to realize an operation, which is equivalent to a screen operation on the display 155a of the component mounting apparatus 151 in the customer factory 171. In this manner, a recovery operation is performed. Instead of or in addition to this operation, instructions for operation can be issued so as to deal with an operation which is hard or impossible to automatically perform.

Figure 10:
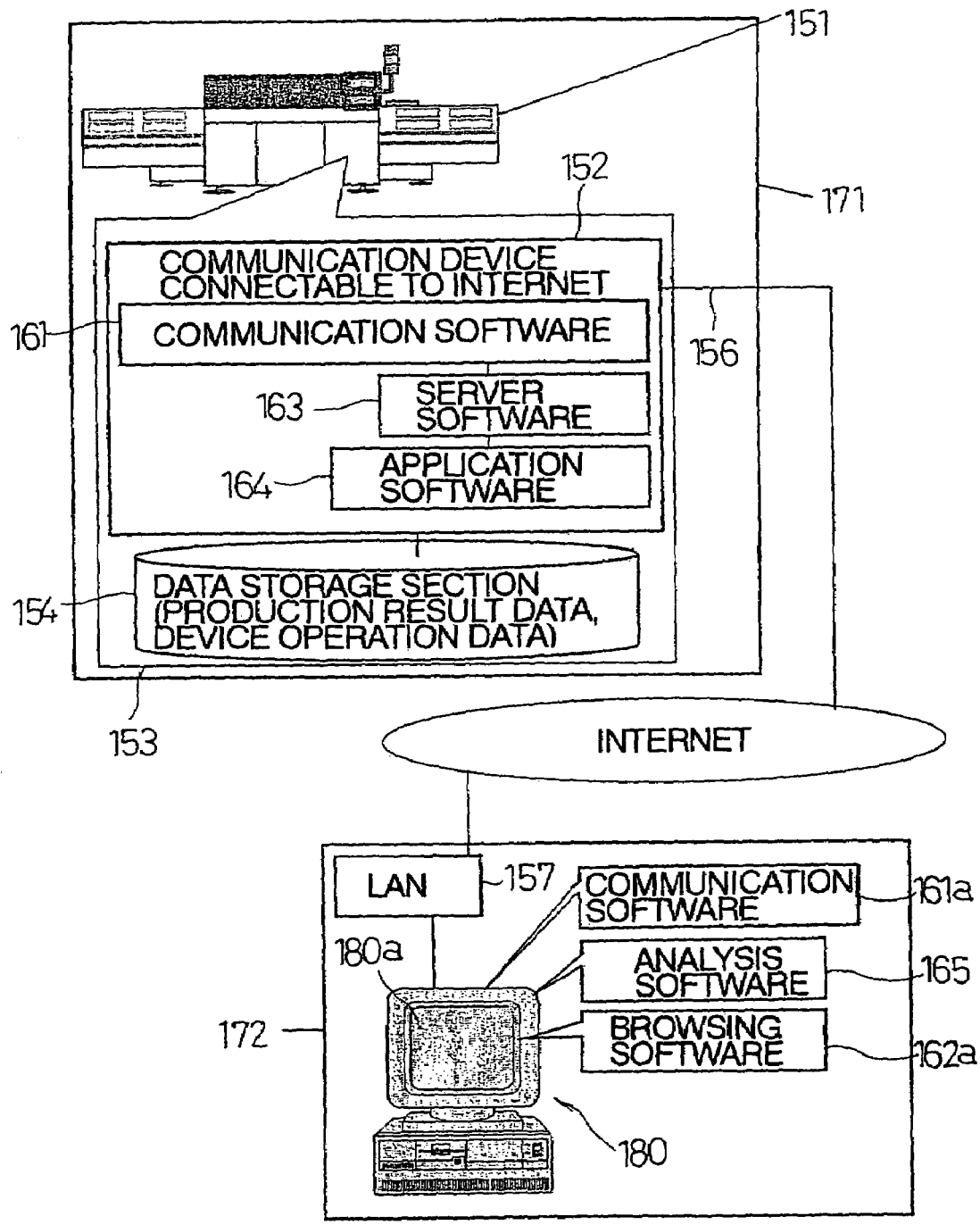
FIG. 10 shows a specific example of a state where production result data and device operation data stored in the component mounting apparatus are collected from a remote location through the Internet line in the second embodiment.
Figure 11:
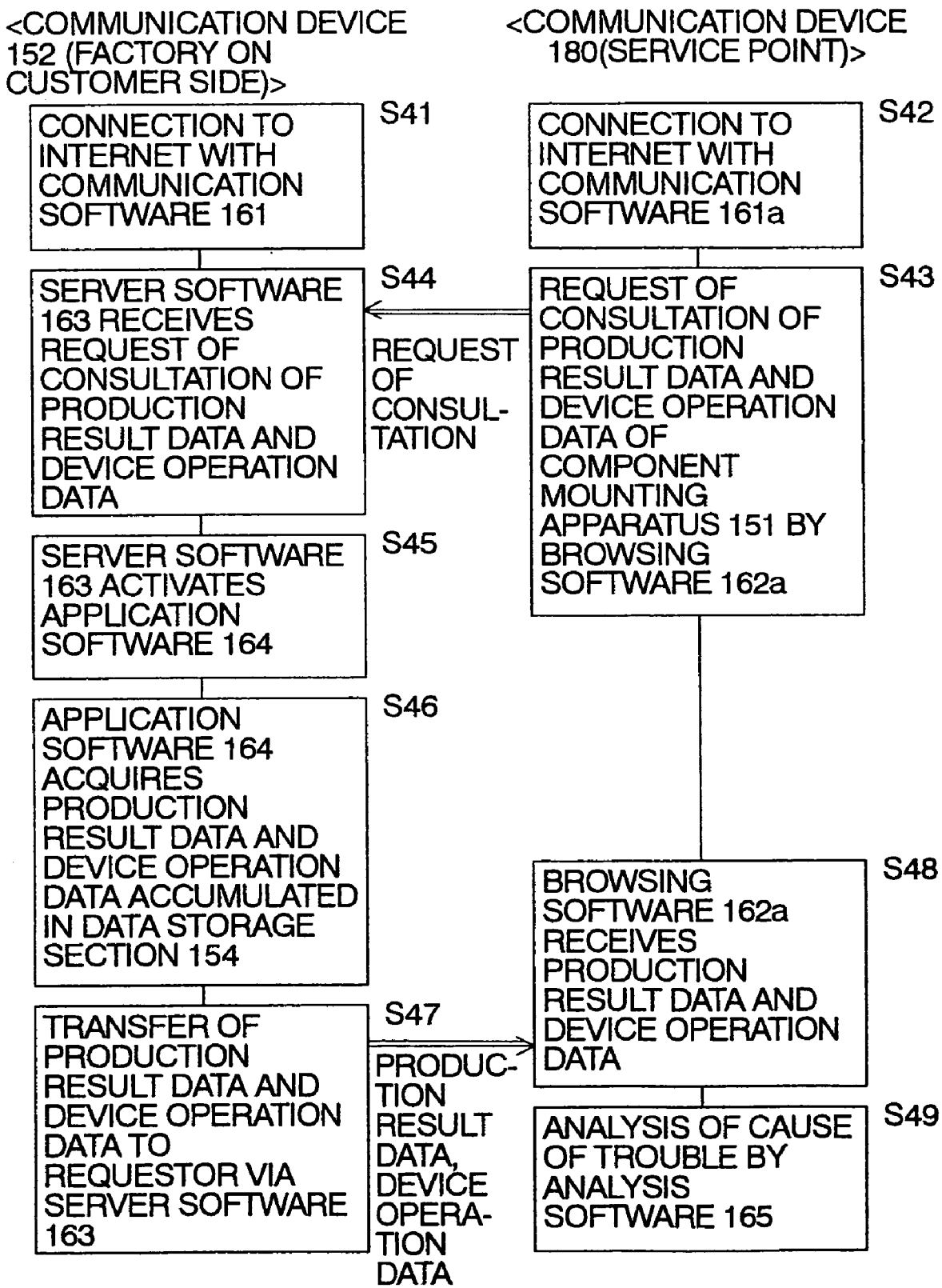
FIG. 11 is a flow chart showing a processing in FIG. 10.

FIG. 10 shows a specific example for collecting production result data and device operation data of the component mounting apparatus 151 accumulated in the data storage section 154 from a remote location at the service point 172 via the Internet line. FIG. 11 shows a processing flow thereof. When a trouble occurs in the component mounting apparatus 151 in the state where the communication devices 152 and 180 are both connected to the Internet (Steps S41 and S42), a service person at the service point 172 activates the browsing software 162a running on the communication device 180 in the service point 172. As a result, the browsing software 162a running on the communication device 180 in the service point 172 and the server software 163 in the component mounting apparatus 151 communicate with each other (Steps S43 and S44), so that the server software 163 activates the application software 164 (Step S45). The application software 164 passes the production result data and the device operation data in the component mounting apparatus 151 to the server software 163 (Steps S46 and S47). Furthermore, the browsing software 162a in the service point 172 receives that information (Steps S48). Thereby, a service person consults information necessary for trouble analysis of the component mounting apparatus 151 at the customer factory 171 without leaving the service point 172 so as to perform an analysis operation with the analysis software 165 (Step S49). The result of analysis is reflected into the component mounting apparatus 151 by a remote operation as indicated in the flow chart of FIG. 9 so as to be used for a recovery operation of a trouble or the like.

Herein, the production mount data is the totaled data such as the number of produced circuit boards, the number of errors, and the like. The device operation data is log information such as the contents and time of error occurrence and the like during operation of the component mounting apparatus 151. With these data, the cause of a trouble can be analyzed.

Figure 12:
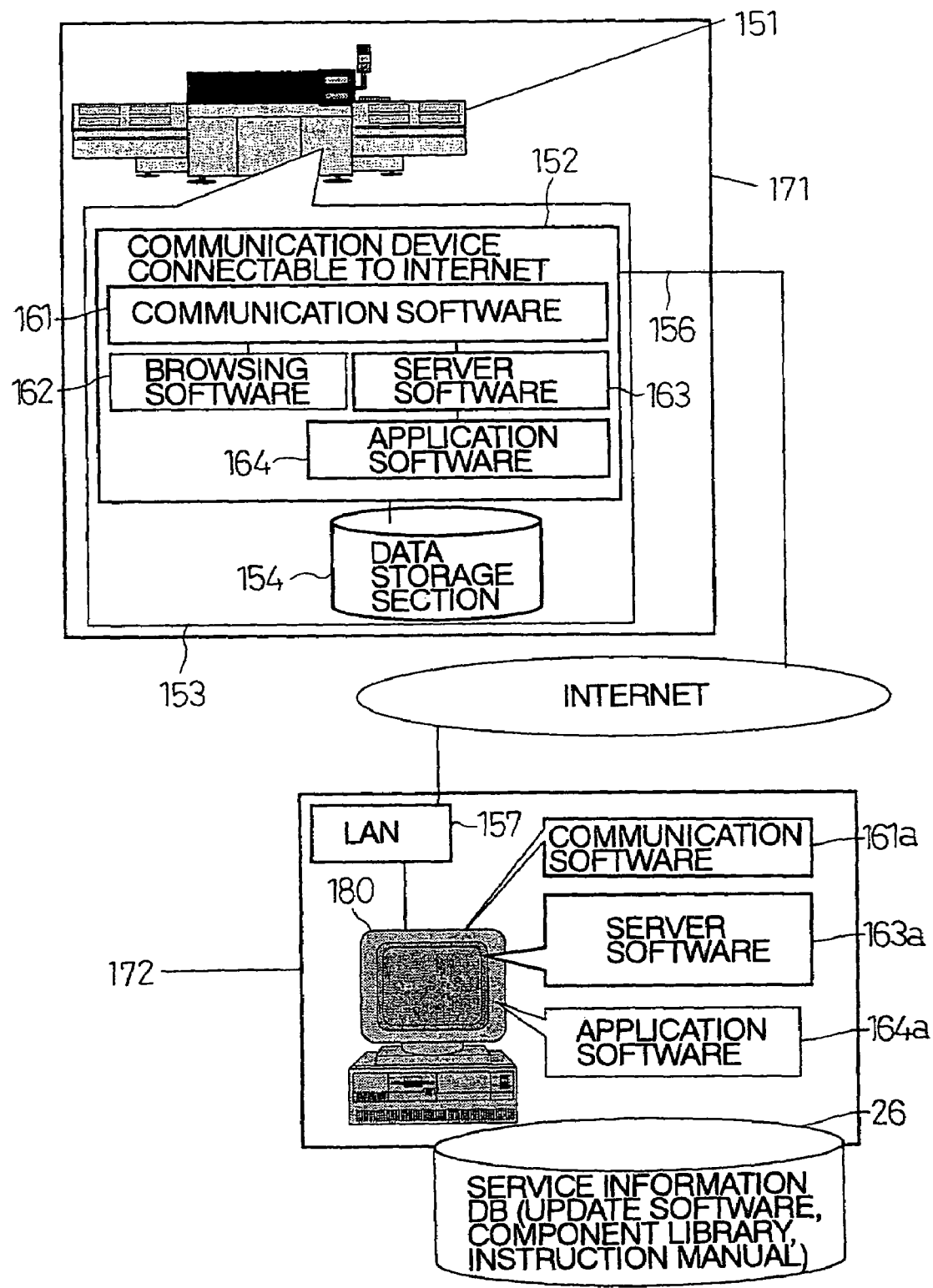
FIG. 12 shows a specific example of a state where a software in the component mounting apparatus is updated through the Internet line in the second embodiment.
Figure 13:
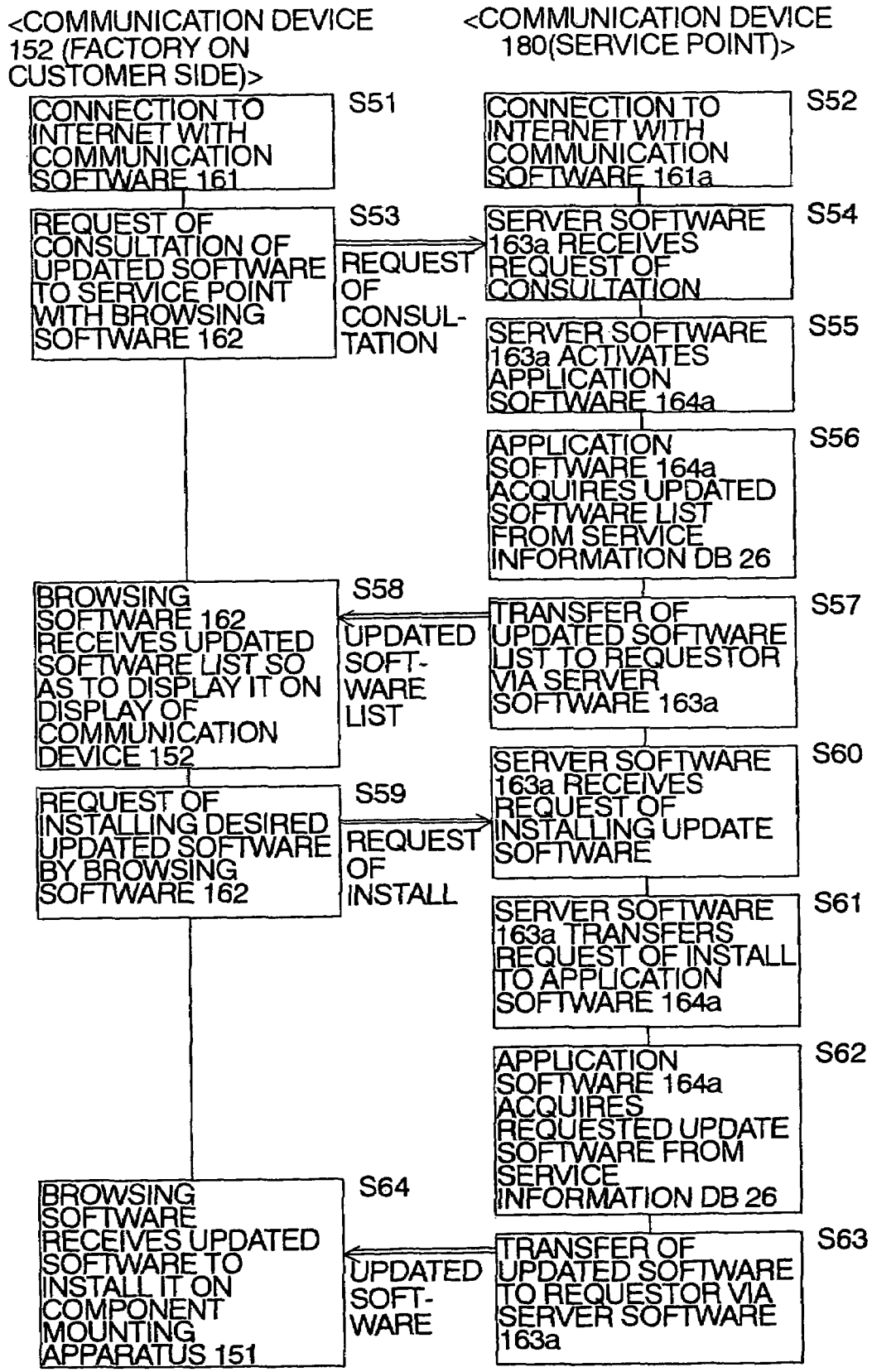
FIG. 13 is a flow chart showing a processing in FIG. 12.

FIG. 12 shows a specific example of updating a software in the communication device 152 included in the component mounting apparatus 151 via the Internet line from a remote location at the service point 172. In the communication device 180, a software of the component mounting apparatus 151, a component library corresponding to data for each component for operating the component mounting apparatus 151, an instruction manual for operating the component mounting apparatus 151, and the like are accumulated in a service information database 26. FIG. 13 shows a processing flow thereof. In the state where the communication devices 152 and 180 are both connected to the Internet (Steps S51 and S52), an operator in the customer factory 171 uses the browsing software 162 in the communication device 152 included in the component mounting apparatus 151 to output a request for consultation to the communication device 180 in the service point 172 (Step S53). The application software 164a, which is activated by the server software 163a on the side of the communication device 180 receiving that request, acquires a list of corresponding softwares from the service information DB 26 (Steps S54 to S56). The acquired list is transferred to the browsing software 162 of the communication device 152 via the server software of the communication device 180, so that the operator at the customer factory can consult it (Steps S57 and S58). In the case where there is a software of the updated version among the softwares relating to the component mounting apparatus 151, the browsing software 162 in the component mounting apparatus 151 and the server software 163a in the service point 172 are allowed to communicate with each other so as to download and update the updated software, which is acquired from the service information database 26 present on the communication device 180 side in the service point 172, into the component mounting apparatus 151 (Steps S59 to S64).

Besides the softwares of the component mounting apparatus 151, for example, even the component library and the instruction manual can be acquired and consulted from the service information DB 26 of the service point 172 in the same procedure as described above.

Although the implementation of at least one of the specific examples shown in FIGS. 7, 8, 10, and 12 in the second embodiment described above is even effective, it is suitable to carry out all the specific examples with the device shown in FIG. 4.

Hereinafter, a third embodiment of the present invention will be described.

Figure 14:
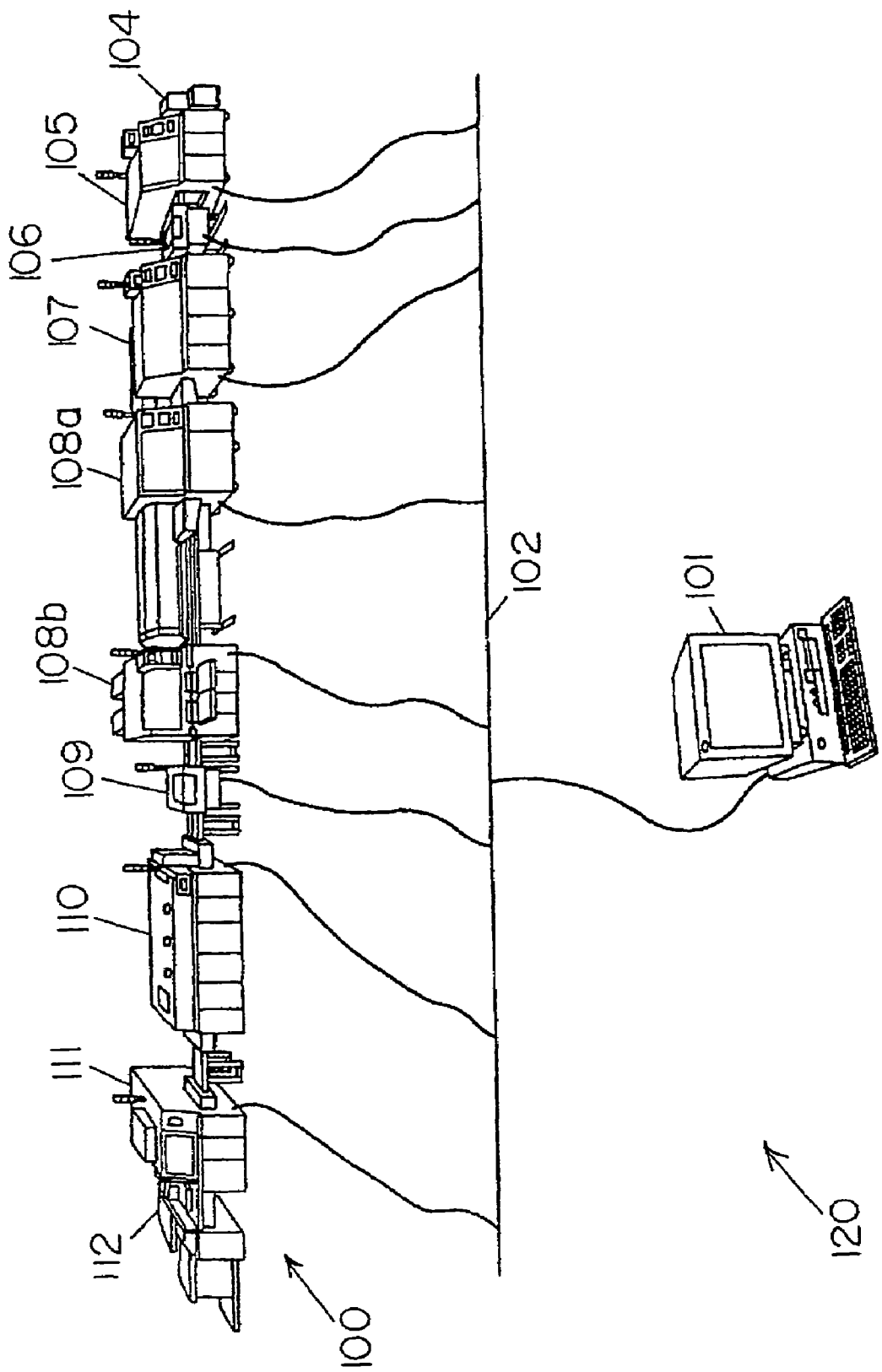
FIG. 14 is a configuration view of a component mounting system in a third embodiment of the present invention.
Figure 15:
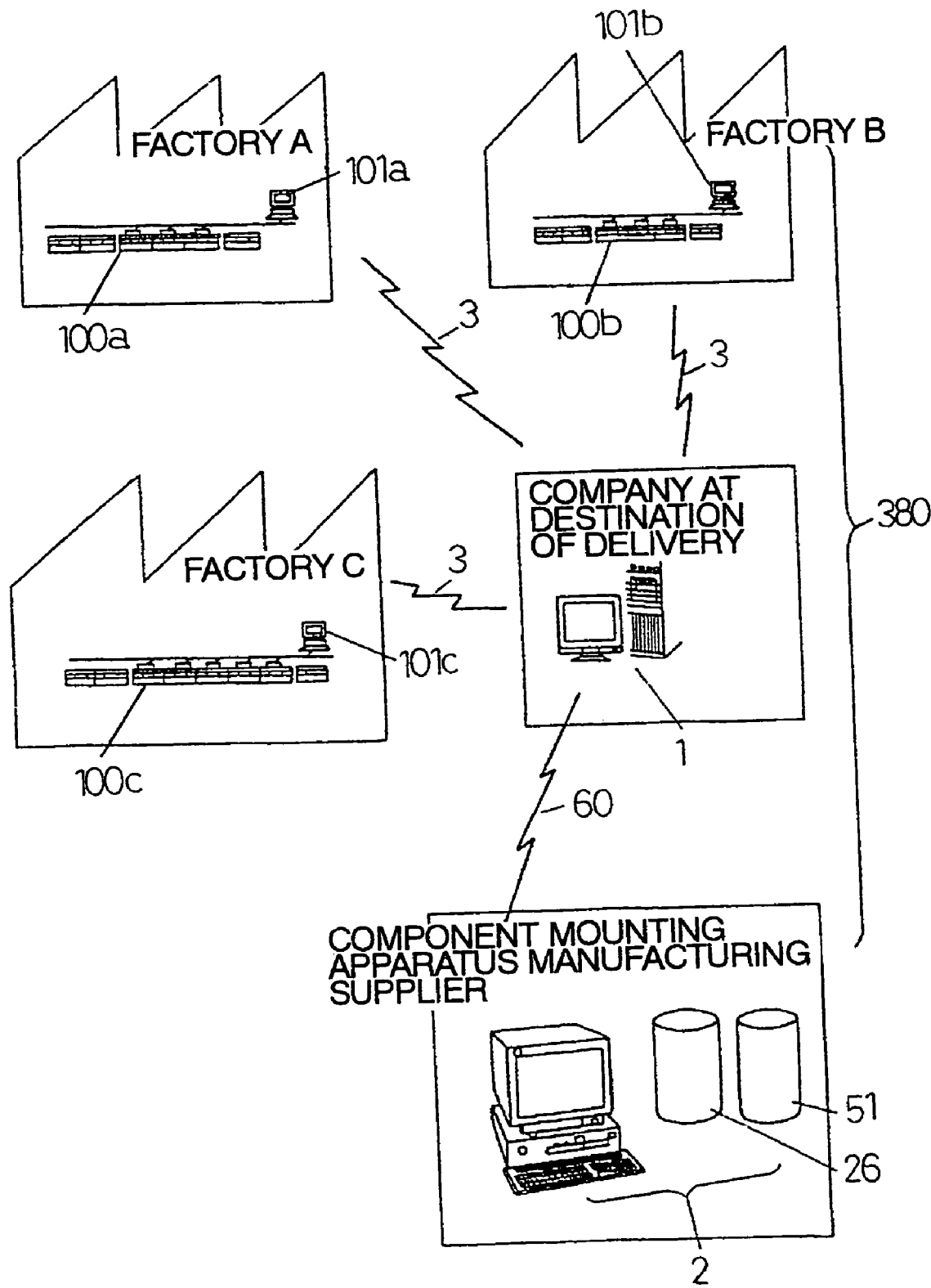
FIG. 15 is a general configuration view of a service system in the third embodiment.

This embodiment relates to a service system for a component mounting system 120 as shown in FIG. 14, including a component mounting line 100 and a management device 101 for receiving/transmitting information from/to the component mounting line 100 so as to manage the component mounting line 100. FIG. 15 shows the entire system configuration of a service system 380 of this embodiment. This service system 380 shows an example of the case where each factory of the destination of delivery of a component mounting apparatus, which possesses the component mounting system 120, and the service receiving device 1 at the destination company of delivery are connected to each other through a network 3, whereas the service receiving device 1 and the service providing device 2 at a component mounting apparatus manufacturing supplier are connected to each other through a network 60.

In FIG. 15, the service providing device 2 includes a service information database 26 (hereinafter, referred to as a service information DB). The service receiving device 1 at the destination company of delivery fetches the service information from the service providing device 2 via the network 60. With the fetched service information, the service providing device provides a service to component mounting lines 100a, 100b, and 100c of the respective factories A, B, C, and the like which are under the umbrella of the destination company of delivery via the management device 101.

Herein, the network 60 may be any communication means including, for example, the Internet as long as it is capable of performing the communication. However, the network is the Internet in this embodiment because the Internet is suitable for transmitting/receiving information at high speed. Although similar communication means may be used as the network 3, the intranet for connecting global points in the company is used in this embodiment. Although it is assumed that each of the factories A, B, and C of the destination company of delivery is present at each global point, it is not limited thereto; all factories may be present at domestic points.

The service providing device 2 may be placed at a location other than at the component mounting apparatus manufacturing supplier or may be placed in a service provider for providing a service for the component mounting apparatus.

In this manner, for a user in any zone of the world, the same service is provided to the service receiving device 1 provided for the user side via the network 60. As a result, regardless of the operational level learned by the operator of the component mounting apparatus in each zone, it is possible to provide a service which results from the accumulation of know-how concerning the selection of a condition for mounting a component depending on the type of a circuit board or a component to be mounted. Thereby, uniform high-efficiency and high-quality mount production is realized all over the world. Moreover, since a service is derived independently from the user side, the service is derived at any timing necessary for the user side. Thus, each user does not suffer from any damage caused by a delay in taking action to maintain the efficiency of the mount production and the quality of the products.

The contents of disclosure of a service that the service receiving device 1 derives from the service providing device 2 vary depending on the level of a contract that the destination company of delivery made with the component mounting apparatus manufacturing supplier. If the level of a contract is low, only the latest instruction manual information and the inventory information of mending parts can be disclosed so as to derive these information. However, as the level of a contract is elevated, the range of disclosure is expanded so as to sequentially cover the virtual training for offering the training via a network, information on component to be mounted, a mounting order optimization software, and the like. An adequate service which meets the level of a user is thereby provided. Moreover, a service to be provided for each user is easily managed, and a service is prevented from being needlessly derived from a user who is not under contract.

It is desirable to determine the level of a contract depending on the level of an operator of the component mounting apparatus or the difficulty level of a mounting technique used for production at a factory, and further on the demand of the destination of delivery. In this manner, an appropriate level of a contract is easily determined from various points of view. Alternatively, the service providing device 1 and an operator interact with each other in a dialogical manner, or the service receiving device 1 or the service providing device 2 automatically judges to allow an appropriate level of a contract to be determined. Based on this level of a contract, a user at the destination of delivery is charged. The accounting is regularly made, for example, by the month. The accounting is regularly made, for example, by the month in a collective manner depending on the level of a contract of a service, instead of charging for each provided service. An accounting processing is facilitated both for a user and for a manufacturer. Moreover, for a user, there is not any more inconvenience that the user might select an unnecessary service to be wrongly charged.

When the level of a contract is elevated, it is possible to provide a service in which the service providing device 2 of the component mounting apparatus manufacturing supplier monitors the quality and an operating status of the component mounting line 100 via the network 60 and further, when something wrong happens during monitoring, a service for giving feedback as a countermeasure against it.

In order to provide the above-mentioned monitoring service, as shown in FIG. 14, in the component mounting line 100 where the individual component mounting apparatuses 105 to 111 are connected, facility information such as an operation rate, shutdown time, type switching time, and the like, tact information such as a mounting tact corresponding to time required for the mounting of one circuit board, a tact loss, and the like, and further quality information such as the presence/absence of a quality defect, the contents of a defect, and the like of each of the component mounting apparatuses 105 to 111 are collected to the management device 101 via a network 102. In FIG. 15, the management devices 101a to 101c of the respective factories A to C which include the component mounting lines 100a to 100c shown in FIG. 14, and the service receiving device 1 at the company, to which a component mounting apparatus is to be delivered, are connected to each other via the network 3. The facility information, the tact information, and the quality information collected in the management devices 101a to 101c are collected in the service receiving device 1, which are in turn transmitted to the service providing device 2 at the component mounting apparatus manufacturing supplier via the network 60. These facility information, tact information, and quality information are converted so as to have a data structure that is easy to analyze for operation, and is then accumulated in an operation quality information database 51 (hereinafter, referred to as an operation quality information DB) provided for the service providing device 2.

The service providing device 2 monitors if the operation rate, the mounting tact, and the ratio of defective products reach their targets; if not, its factor is analyzed. If the factor of failing to reach the targets is found as a result of factor analysis, a service for eliminating the factor is provided for the service receiving device 1. The service receiving device 1 feedbacks the provided service to the component mounting lines 100a to 100c via the management devices 101a to 101c at the respective factories.

In this manner, when a trouble such as shutdown of the component mounting apparatus, quality defect of products, or the like occurs at the mounting factory of a user, a user side can derive the service for analyzing the trouble to provide a solution at any time. Thus, it is possible to minimize the reduction in production efficiency and in quality due to shutdown caused by a trouble. For example, the following inefficiency as is conventionally found is remarkably improved; it is only after several days' stay for analysis that a service person, who is dispatched from a manufacturer for analysis of a trouble caused by a faulty operation, can prove the cause to be a faulty operation.

Moreover, the user side can derive at any time a service for monitoring a production so as to analyze a problem if it arises. As a result, if there is a symptom that a trouble may arises, it is possible to sense the symptom so as to avoid any trouble that may arise. Thereby, stable high-efficiency and high-quality production is carried on.

Although the network 102 is a LAN (Local Area Network) for wirelessly transmitting/receiving information (hereinafter, referred to as a wireless LAN) in this embodiment, the network is not limited thereto. However, with the wireless LAN, it is possible to flexibly respond to a change in layout of each of the component mounting apparatuses 151 of the component mounting line, without altering a cable wiring of the network 102. As a result, it is possible to freely and actively promote the construction of a new mounting line with the addition of the new component mounting apparatus 151, which is capable of realizing the production with a higher tact and higher quality, without considering an alteration in cable wiring due to layout change. Moreover, it is possible to transmit the derived service information not only to the component mounting apparatus 151 but also to a portable terminal such as a portable telephone, a PHS, or the like carried by an operator of the component mounting apparatus 151. Accordingly, it is possible to encourage the operator of the component mounting apparatus 151 to reflect the received service into the production.

With the above structure, the service providing device 2 provides a necessary service to a factory at destination of delivery in accordance with the level of a contract desired by the destination of delivery. With some contract levels, it is possible to simultaneously monitor and analyze an operation or quality status at each mount factory in real time by the service providing device 2. Then, the factor of lowering operation and quality statuses is found, so that a service for eliminating the factor is provided in real time. Thus, it is possible to manage the operating and quality statuses of all mounting factories which are developed on the global scale in the same manner so as to maintain high and uniform quality and production statuses.

Although the case where each factory at the destination of delivery of component mounting apparatuses and a component mounting apparatus manufacturing supplier are connected via the network 3 is described above, it is not limited thereto. The service providing device 2 may be present in a specific factory among the respective factories for mount production so as to provide a service for the other factories via a network including the Internet. Moreover, although one management device 101 is provided for one component mounting line 100, it is not limited thereto. A single management device 101 may be provided for a plurality of component mounting lines 100. Alternatively, a single management device 101 is provided only for one component mounting apparatus.

Figure 16:
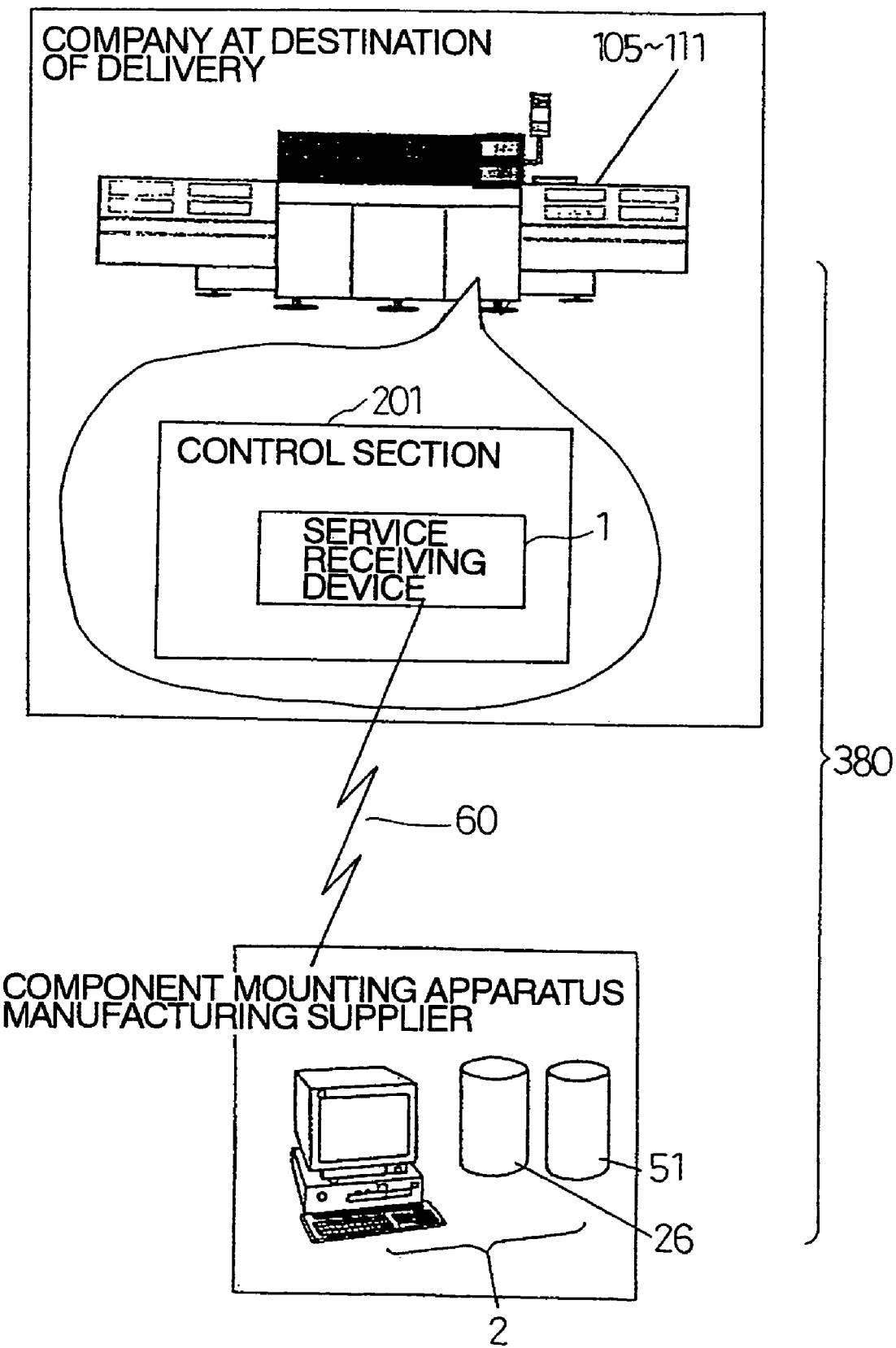
FIG. 16 is a general configuration view of another service system in the third embodiment.

Furthermore, as shown in FIG. 16, each component mounting apparatus may be equipped with the service receiving device 1 described above as an internal function in its control section 201 so as to receive a service from the service providing device 2 via the network 60 from the component mounting apparatus itself, depending on the level of a contract.

Moreover, although the component mounting line 100 constituted by the component mounting apparatus 151 is described above, it is not limited thereto. The component mounting line may be a production facility alone for processing or assembling a product, or may be a production line in which the production facilities are connected to each other.

The outline of the third embodiment of the present invention has been described above. Hereinafter, system configuration and operation will be individually described in detail.

I. Configuration of the Component Mounting System 120

The component mounting system 120 is a production system for mounting a component onto a circuit board so as to carry out the mount production of circuit boards. As shown in FIG. 14, the component mounting system 120 is constituted by the management device 101, the wireless LAN 102 serving as a network, and the component mounting line 100. The component mounting line 100 includes: a supplying device 104; a cream solder printer 105; a cream solder print inspection machine 106; an adhesive applicator 107; a high-speed placement machine 108a; a multifunctional placement machine 108b; a placed component inspection machine 109; a reflow device 110; a visual inspection machine 111 and a housing device 112.

The cream solder printer 105, the cream solder print inspection machine 106, the adhesive applicator 107, the high-speed placement machine 108a, the multifunctional placement machine 108b, the placed component inspection machine 109, the reflow device 110, and the visual inspection machine 111 are connected to the management device 101 via the wireless LAN 102.

Each of the high-speed placement machine 108a and the multifunctional placement machine 108b is a type of component mounting apparatus for surface-mounting a chip component on a circuit board, and is also referred to as a mounter or a placement machine. Although not described in this embodiment, the component mounting apparatus includes a component insertion machine for inserting a lead of a component such as an axial component or a radial component into a lead insertion hole on the circuit board. The component insertion machine is also referred to as an inserter, and sometimes inserts a jumper wire. The cream solder printer 105, the cream solder print inspection machine 106, the adhesive applicator 107, the placed component inspection machine 109, the reflow device 110, the visual inspection machine 111, and the like, which constitute the component mounting line 100, are included in the category of component mounting apparatus in a broad sense. In this embodiment, these cream solder printer 105, cream solder print inspection machine 106, adhesive applicator 107, placed component inspection machine 109, reflow device 110, visual inspection machine 111, and the like are included in the category of component mounting apparatus, unless otherwise noted.

In a similar manner, the term "placement" is defined to denote the surface mounting including the case where a metallic joint between an electrode and a land is intended by using diffusion due to friction or fusion utilizing an ultrasonic wave so as to mount a chip component onto a circuit board. The term "placement" is defined to be included in "mounting" for mounting a component onto a circuit board so as to form a circuit. Not only the term "placement" but also the phrase containing "placement" used in this embodiment below mean the surface mounting of a chip component described above unless otherwise noted. On the other hand, the signification of the term "mounting" and the phrase containing "mounting" is not limited to the meaning of "placement;" it is used to indicate the formation of a circuit in a broader concept which even includes "insertion," "solder print," "adhesive application," and "various inspections," unless otherwise noted.

The amount of time for mounting of a single circuit board by a component mounting apparatus is defined as "mounting tact." In the mounting tact, in particular, a standard value of the mounting tact in the case where a component mounting apparatus operates in accordance with its specifications without generating any tact loss is referred to as a "standard mounting tact", and an actual value of a mounting tact detected or collected from the component mounting apparatus is referred to as a "mounting tact actual value".

(1) Supplying Device 104

The supplying device 104 stocks a plurality of circuit boards in advance. No component is mounted on these circuit boards yet. The supplying device 104 supplies the circuit boards to the cream solder printer 105 in a one-by-one manner.

(2) Cream Solder Printer 105

The cream solder printer 105 receives the circuit boards from the supplying device 104 in a one-by-one manner, and prints a cream solder onto the received circuit board so as to provide the circuit board, on which the cream solder is printed, to the cream solder print inspection machine 106. Moreover, the cream solder printer 105 outputs facility information relating to the print of the cream solder and the like to the management device 101 via the wireless LAN 102. Furthermore, the cream solder printer 105 is capable of installing the NC data and the like for indicating various conditions for printing by the cream solder printer 105, from the management device 101 via the wireless LAN 102.

Figure 17A:
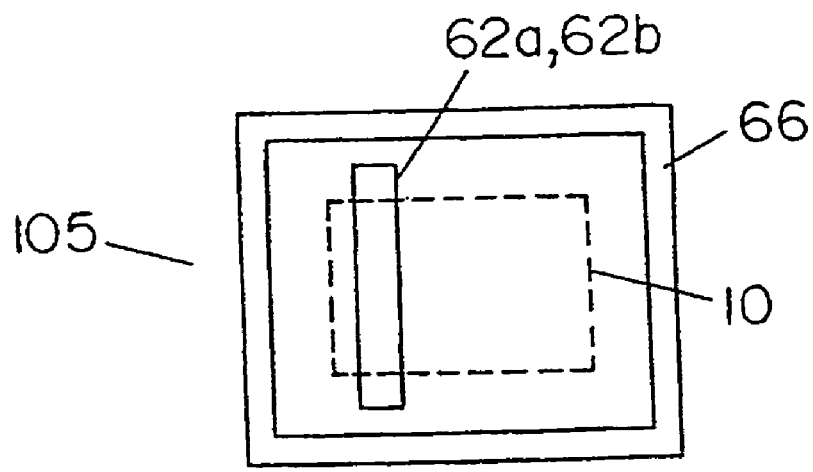
FIGS. 17A and 17B show a configuration of a main part of a cream solder printer in the third embodiment, where
Figure 17B:
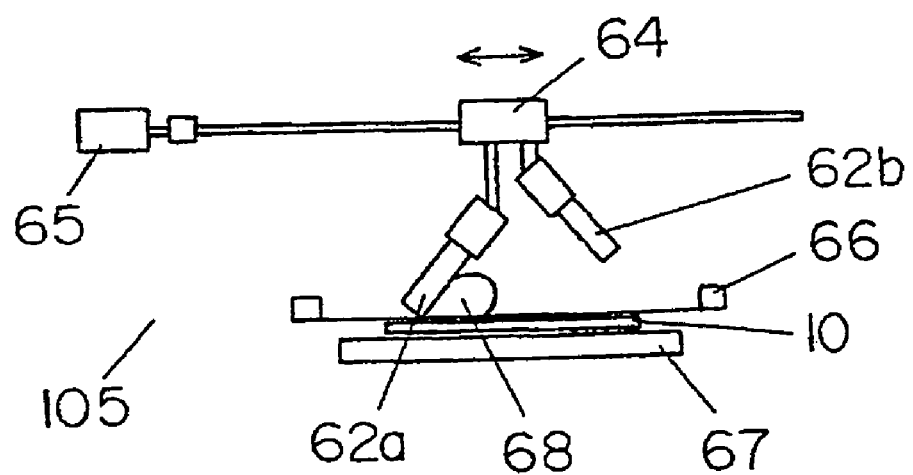

The cream solder printer 105 includes, as shown in FIGS. 17A and 17B illustrating its main configuration: a stage 67 on which a circuit board 10 is placed; a screen plate 66, which covers the circuit board 10 and has an opening (not shown) in the form and at the position corresponding to those of a land on the circuit board 10; a squeegee 62a held by a squeegee head 64 on the screen plate 66. The squeegee 62a is driven by a squeegee driving part 65 via the squeegee head 64 to be moved in a direction indicated with an arrow in the drawing along the screen plate 66. At this moment, the squeegee 62a moves while pressing the cream solder 68 supplied onto the screen plate 66 against the screen plate 66 so that the cream solder is supplied through the opening provided through the screen plate 66 onto a land of the circuit board 10 for achieving the printing. The squeegee head 64 also holds another squeegee 62b which enables the printing when the squeegee head is moved in a direction opposite to that of the printing with the squeegee 62a.

In this case, in order to maintain the quality in the cream solder printer 105, it is necessary to set the NC data in consideration of various conditions for cream solder printing. For example, it is necessary to select a type, a temperature, and a viscosity of the cream solder, in consideration of a material of the circuit board, a mounting density, and the like. Moreover, it is also necessary to set a traveling speed of the squeegees 62a and 62b, depending on the type of the circuit board 10 or the type of the cream solder 68. By appropriately selecting the above-described conditions, the cream solder is expanded in an excellent manner over the land of the circuit board 10 through the opening of the screen plate 66 so as to prevent the imperfect printing such as faintness or blur of the cream solder. Furthermore, it is also important to well separate the opening of the screen plate 66 and the printed cream solder 68 from each other so as to avoid any crack of the cream solder 68 by controlling the speed of upwardly detaching the screen plate 66 from the circuit board 10 after printing. If the cream solder 68 is not separated from this opening, so that the accumulated cream solder results in solder clogging on the opening, it is necessary to additionally perform the cleaning so as to eliminate the solder clogging.

A mounting tact in the cream solder printer 105 is determined by time for carrying in and out the circuit board 10 (loading time), attachment/removal time of the screen plate 66 on/from the circuit board 10, a traveling speed of the squeegees 62a and 62b, and the like.

(3) Cream Solder Print Inspection Machine 106

The cream solder print inspection machine 106 receives the circuit boards 10 in a one-by-one manner from the cream solder printer 105 so as to inspect a state of the cream solder 68 printed on the received circuit board 10. The cream solder print inspection machine 106 supplies the circuit board 10, which has undergone the inspection, to the applicator 107 of an adhesive. The cream solder print inspection machine also outputs facility information, information of the result of inspection relating to the cream solder print inspection, and the like to the management device 101 via the wireless LAN 102. Moreover, the cream solder print inspection machine 106 is capable of installing the NC data for indicating inspection data for inspection or the like from the management device 101 via the wireless LAN 102. The inspection data contains the position of a land on which the cream solder 68 is to be printed, a threshold value of inspection OK/NG, and the like.

At this point, the cream solder print inspection machine 106 picks up an image of the circuit board, on which the cream solder 68 is printed, and processes the obtained image so as to judge if the cream solder 68 is normally printed. If the print is judged to be unsuccessful, the type of a defect and the location on the board where the defect occurs are output. Examples of the contents of a defect include a print positional offset of the cream solder 68, faintness, blur, or overflow of the cream solder 68, and the like. For the identification of a location on the board, for example, the location is identified by a circuit number assigned to each component to be mounted and an electrode number assigned to each electrode of each mounted component.

A mounting tact in the cream solder print inspection machine 106 is determined by time for carrying in and out the circuit board 10 (loading time), time for picking up an image of the circuit board 10, time for processing and inspecting the data of the picked-up image of the circuit board 10, and the like.

(4) Applicator 107 of Adhesive

The applicator 107 of an adhesive receives the circuit boards in a one-by-one manner from the cream solder print inspection machine 106 so as to apply an adhesive for placing a component onto the received circuit board 10. Then, the applicator supplies the circuit board 10, on which the adhesive is applied, to the high-speed placement machine 108*a*. The applicator 107 also outputs facility information relating to the application of an adhesive and the like via the wireless LAN 102 to the management device 101. Moreover, the applicator 107 of an adhesive is capable of installing the NC data for indicating the position of application of an adhesive and various conditions for application of an adhesive, or the like from the management device 101 via the wireless LAN 102.

The applicator 107 of an adhesive includes: a syringe which stores an adhesive therein; an application nozzle connected to the syringe, for applying the adhesive pushed out from the syringe at an air pressure; and an XY table for positioning the position of application on the circuit board below the application nozzle.

In order to maintain the quality in such an applicator 107 of an adhesive, it is necessary to set the NC data in consideration of various conditions for applying an adhesive. For example, it is important to appropriately control the type, a temperature, a viscosity, and further a pressure for application and application time of an adhesive so as to apply an adequate amount of an adhesive for adhering a component without causing any stringiness. Moreover, the nozzle clogging must be prevented from occurring by controlling the above-described various conditions.

A mounting tact in the applicator 107 of an adhesive corresponds to time needed to apply an adhesive onto a single substrate, and is determined by time for carrying in and out the circuit board 10 (loading time), time for applying an adhesive onto all the application points corresponding to the positions where the respective components are to be mounted, and the like. In this case, a mounting tact is limited to the application of an adhesive so as to be also referred to as an "application tact," whereas a standard mounting tact is limited to the application of an adhesive so as to be also referred to as a "standard application tact." A mounting tact actual value is limited to the application of an adhesive so as to be also referred to as an "application tact actual value."

When the application tact (or the application tact actual value) exceeds the standard application tact, the exceeded amount of the tact is referred to as a "tact loss." The tact loss includes, for example, a movement loss of the XY table 9. The standard application tact per application point is referred to as a "standard application tact per point," the application tact per application point is referred to as an "application tact per point," and the tact loss per application point is referred to as a "tact loss per point."

(5) High-Speed Placement Machine 108*a*

The high-speed placement machine 108*a* receives the circuit boards 10 in a one-by-one manner from the applicator 107 of an adhesive so as to place a component on the received circuit board 10 at high speed, and then supplies the circuit board 10, on which the component is placed, to the multifunctional placement machine 108*b*. Moreover, the high-speed placement machine 108*a* outputs facility information relating to the placement of a component and the like to the management device 101 via the wireless LAN 102. Furthermore, the high-speed placement machine 108*a* is capable of installing the NC data indicating the position where a component is to be placed and various conditions for placing a component and the like from the management device 101 via the wireless LAN 102.

In the component mounting line 100, each of the high-speed placement machine 108*a* and the multifunctional placement machine 108*b* is a type of placement machine for placing a component onto the circuit board 10; the common parts thereof are denoted by the same reference numerals, and the overlapping description thereof is herein omitted. The high-speed placement machine 108*a* is mainly designed to place a small chip component onto the circuit board 10 at high speed, whereas the multifunctional placement machine 108*b* is designed to place a great variety of types of chip component including an odd-shaped component onto the circuit board 10. These placement machines are common in that they place the components onto the circuit board 10.

Figure 18A:
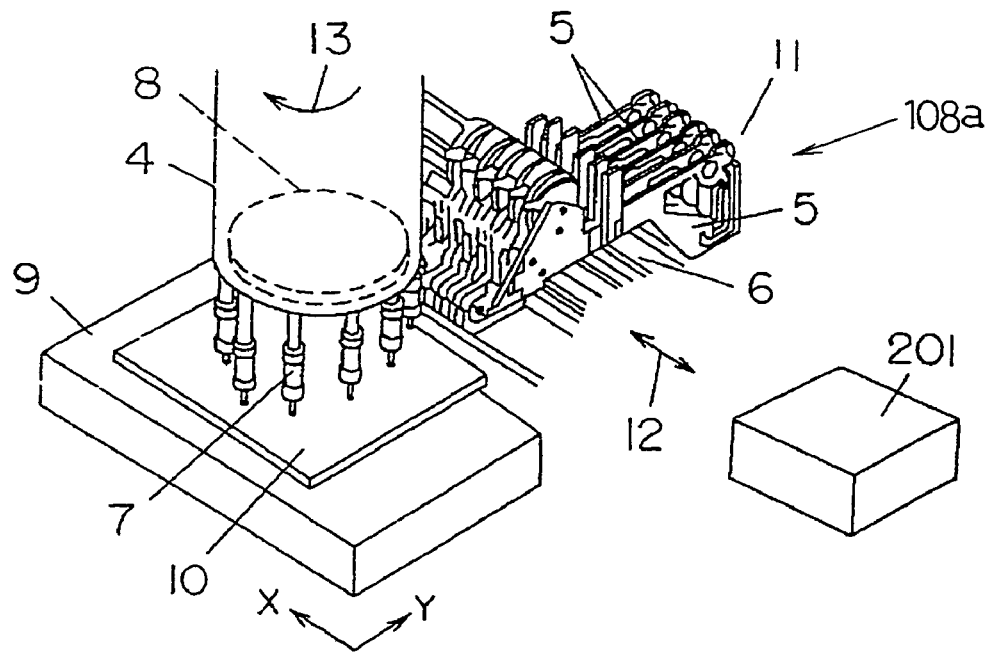
FIG. 18A is a configuration view showing a main part of one type of placement machine in the third embodiment.

The high-speed placement machine 108*a* includes, as shown in FIG. 18A, a component supplying section 11 having a plurality of component supplying devices 5 mounted onto a moving table 6, an XY table 9 for mounting the circuit board 10 thereon so as to move and position the circuit board in XY directions for mounting a component, a rotational table 8 which intermittently rotates, component suction nozzles 7 positioned at constant pitches at the outer periphery of the rotational table 8, and a placement head 4 for placing a component supplied from the component supplying section 11 at a predetermined position on the positioned circuit board 10. Although not shown in detail in the drawing, a reeled component housing tape for holding a plurality of components of the same type at constant pitches is mounted on the component supplying device 5 so as to supply the component. The component housing tape is intermittently fed by the component housing pitch so as to supply the components in a one-by-one manner. The component supplying section 11 loads a necessary number of the component supplying devices 5 onto the moving table 6 in accordance with the type of component to be placed. The moving table 6 moves in a direction indicated with an arrow 12 to be positioned so that the component supplying device 5 capable of supplying a component to be placed matches the component supplying position. Each time the component suction nozzles 7 of the placement head 4, which are at the position so as to fetch a component out of the component supplying device 5 positioned at the component supplying position, suck a component supplied from the component supplying device 5, the rotational table 8 intermittently rotates by the arrangement pitch of the component suction nozzles 7 in a direction indicated with an arrow 13. When the component suction nozzles 7 sucking the component are positioned so as to be opposed to the location where the component is sucked on the outer periphery of the rotational table 8 as a result of the successive intermittent rotation of the rotational table 8, the component suction nozzles 7 place the component at the placement position on the circuit board 10. The XY table 9 positions the circuit board 10 so as to be aligned with the placement position of the component placed by the component suction nozzles 7. The component supplying section 11, the XY table 9, the placement head 4, and the like described above are controlled by the control section 201.

Although not illustrated, in intermittent rotation of the rotational table 8, a recognition section is provided for recognizing the sucked component from a downward direction with a camera so as to detect the positional offset of suction (the amount of a shift in X and Y directions and the amount of rotational shift around an axis of the component suction nozzle 7), at the rotation stop position in the course of movement of the component suction nozzles 7 from the position where the component is fetched out from the component supplying device 5 to the position where the component is placed onto the circuit board 10. The control section 201 controls the component suction nozzles 7 to correct the rotation around their axes so as to eliminate the amount of a rotational shift detected by the recognition section, and to correct the positioning of the XY table 9 so as to eliminate the positional offset amount in the X and Y directions, which is detected by the recognition device.

The component supplying device 5 is not limited to the tape feeder type described above, and includes, for example, a tray-type one or a stick-type one. The above-described tape feeder type one is also called a parts cassette or a parts feeder.

Moreover, in the high-speed placement machine 108*a* in the above-described case, the placement head 4 is equipped with the component suction nozzles 7 which serve to suck and hold a component. However, a chuck for grasping and holding a component may be used instead. In the component mounting apparatus other than the high-speed placement machine 108*a*, for example, in the multifunctional placement machine 108*b* described below, a chuck for grasping and holding a component is frequently used. Moreover, in the component inserting machine, a chuck is used in the most of cases. These component suction nozzles 7, chuck, and the like for holding a component from the component supplying device 5 and mounting it onto the circuit board 10 are collectively referred to as component holding means.

In the high-speed placement machine 108*a* as shown in FIG. 18A, in order to maintain the quality, it is necessary to set NC data in consideration of various conditions for placing a component. For example, it is necessary to perform the setting in consideration of a placement speed (specifically, a rotational speed of the rotational table 8, and a moving speed and an acceleration of the XY table 9) depending on the kind, the size, the weight, and the like of a component. If a heavy component is intended to be placed at high speed, a suction positional shift occurs due to inertia force of the component, resulting in inconveniences such as a positional offset in placement of the component, a fall of the component from the component suction nozzles 7, and the like. Moreover, in order that the recognition section recognizes the amount of a suction offset of the component, it is necessary to teach in advance the recognition data corresponding to image data of the component at a normal position without any suction offset and to preselect a recognition algorism with which an image processing is to be performed. Furthermore, in the case where the component supplying device 5, the component suction nozzle 7, or the like becomes defective, an component suction error is generated to lower an operation rate of the placement machine. Therefore, the defective component supplying device 5 or component suction nozzle 7 must be quickly replaced by the one for repairs.

A mounting tact in the high-speed placement machine 108*a* corresponds to the amount of time needed for placing components onto a single circuit board, and is determined based on time for carrying in and out the circuit board 10 (loading time), time for placing all components at the placement positions, and the like. In this case, a mounting tact is limited to the placement of components so as to be also referred to as an "placement tact," whereas a standard mounting tact is limited to the placement of components so as to be referred to as a "standard placement tact." A mounting tact actual value is limited to the placement of components so as to be referred to as an "placement tact actual value."

When the placement tact (or the placement tact actual value) exceeds the standard placement tact, the exceeded amount of the tact is referred to as a "tact loss." The tact loss includes, for example, a movement loss of the XY table 9 and a movement loss of the component supplying section 11. The standard placement tact for each placement point is referred to as a "standard placement tact per point," the placement tact for each placement point is referred to as an "placement tact per point," and the tact loss for each placement point is referred to as a "tact loss per point."

Moreover, in the high-speed placement machine 108*a* as shown in FIG. 18A, in order to achieve its initial object of placing a component at high speed, that is, placing a component with a standard placement tact corresponding to a tact enabling the placement in a standard manner, it is necessary to optimize the placement order of components and the position where the component supplying device 5 is placed on the moving table 6. For example, the amount of time needed for the rotational table 8 of the placement head 4 to rotate by one pitch corresponds to the standard placement tact per point. If the component supplying device 5 is not positioned at the component supplying position during the standard placement tact per point, a component cannot be placed with the standard placement tact per point. Moreover, if the XY table 9 does not position the circuit board 10 at the component placement position during the standard placement tact per point, a component cannot be placed with the standard placement tact per point. For the positioning of each of the component supplying device 5 and the XY table 9, an allowable movement range where the movement is permitted during the standard placement tact per point is determined. The component placement order and the position of the component supplying device 5 are optimized so that the movement of the component supplying device 5 and the movement of the XY table 9 both fall within this allowable movement range. However, it is normally impossible to all components to be placed with the standard placement tact per point. In this case, the optimization is effected so as to minimize the tact loss corresponding to the amount of excess from the standard placement tact, even if it is impossible to perform the placement with the standard placement tact. This tact loss is ideally obtained by calculating a larger one of: time calculated based on the amount of excess in the amount of movement of the component supplying device 5 from the allowable movement range; and time calculated based on the amount of excess in the amount of movement of the XY table 9.

Although two placement machines (that is, the high-speed placement machine 108*a* and the multifunctional placement machine 108*b* ) are connected in series in the component mounting line 100, a larger number of placement machines may be connected in series.

Therefore, assuming that a plurality of placement machines are connected in series in the component mounting line 100, the n-th placement machine among a plurality of placement machines is indicated as a placement machine n108. Hereinafter, the placement machine n108 will be described instead of describing the high-speed placement machine 108a.

(5-1) Placement Machine n108

Figure 19:
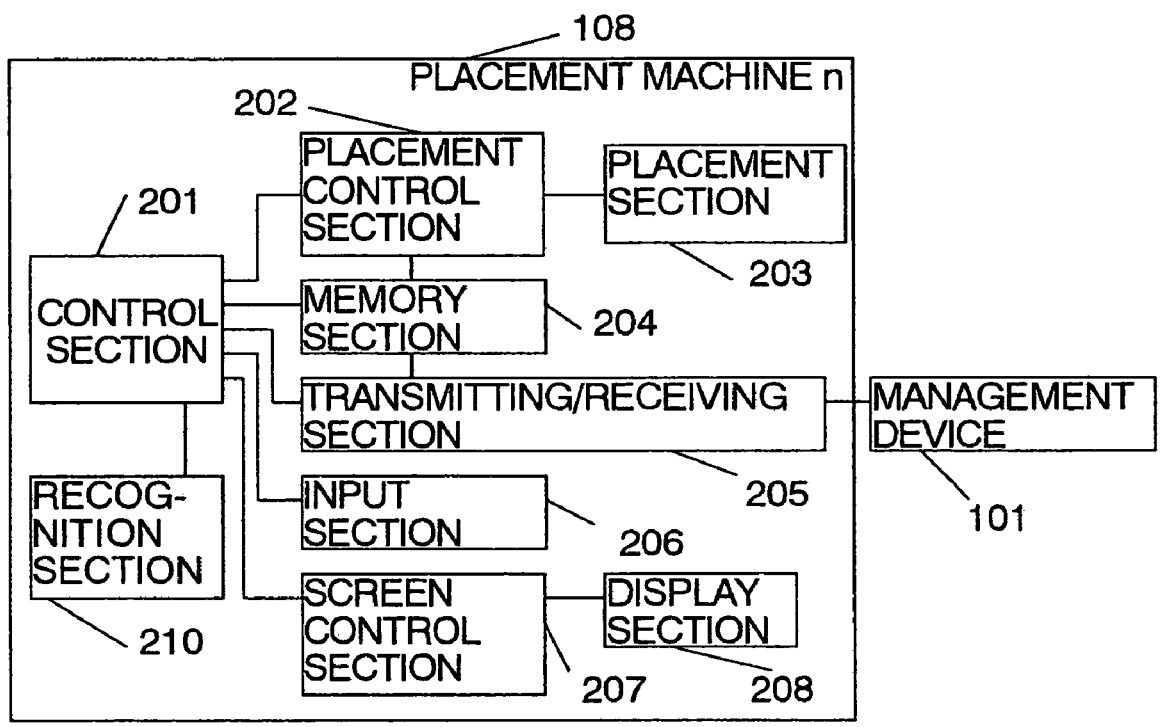
FIG. 19 is a control configuration view of a placement machine in the third embodiment.

A control system of the placement machine n108 is constituted by, as shown in FIG. 19, the control section 201, a placement control section 202, a placement section 203, a memory section 204, a recognition section 210, a transmitting/receiving section 205, an input section 206, a screen control section 207, and a display section 208.

The placement section 203 corresponds to the component supplying section 11, the XY table 9 and the placement head 4 shown in FIG. 19 in the high-speed placement machine 108a. The transmitting/receiving section 205 is for performing the transmission and reception with the management device 101, and includes an antenna capable of performing the transmission and reception in the wireless LAN 102 in this example. However, it is not limited thereto, and may be a network adapter connected through a cable.

(a) Memory Section 204

The memory section 204 stores the facility information 211 shown in FIG. 22 and the NC data 220 shown in FIG. 23, and a control software necessary for the control section to control the placement machine n108.

The facility information 211 is constituted by production management information and cassette information (information relating to the component supplying device 5, that is, the parts cassette), as shown in FIG. 22 as an example thereof. The production management information includes the expected number of products, the expected number of circuits, the number of products, . . . , the operation rate, the suction rate and the like, whereas the cassette information includes ZNO corresponding to a number indicating the position where the component supplying device 5 is located, the name of a component, the remaining number of components of the component supplying device 5, and the like.

In this case, the number of products corresponds to the number of circuit boards produced by the placement machine n108, the operation rate corresponds to a ratio of the amount of actual mounting time of components onto a circuit board to the total operation time of the placement machine n108, and the suction rate corresponds to a ratio of the actual number of components sucked by the component suction nozzles 7 to the total number of suction in the placement machine n108.

The NC data contains, as shown in FIG. 23, an NC program 221, an arrangement program 231, and a component library 241.

The NC program 221 is a program for specifying the kind and the position of a component to be placed and the number of placement onto a single circuit board by the placement machine n108. More specifically, as shown in FIG. 23, a step No. indicates the order of placing a component; the placement position (X, Y, W (placement angle), the circuit number), Z(an arrangement number of the component supplying device 5 for fetching out a component), and the name of a component are specified for each step No.

The arrangement program 231 corresponds to the NC program 221, and specifies the name of a component and a shape code which are set in the component supplying device 5 having the Z number specified with each step No. of the NC program 221. The shape code corresponds to a code uniquely assigned to components having the same shape.

The component library 241 is constituted by detailed data relating to each component, and stores information such as a shape (a length, a width, a thickness, and the like), an placement condition (a head speed, an XY speed, a nozzle, a tool, and the like), recognition data (although not shown in FIG. 23, contained in the component library) of a component for each shape code in the component arrangement program 231, and the like.

Herein, the head speed corresponds to a speed at which the placement head 4 intermittently rotates, in an example of the high-speed placement machine 108a of FIG. 18A, and is specified in accordance with the size of the component (for each shape code). For example, the placement head 4 can be rotated at high speed with a microchip component such as a 1005 chip component (a chip component having a length of 1 mm and a width of 0.5 mm). However, if the placement head 4 does not rotate at low speed for a large component such as an SOP component, a sucked component causes the suction positional offset due to inertia force. Similarly, the XY speed corresponds the traveling speed of the XY table 9, and the nozzle corresponds to a kind of the component suction nozzle 7 to be used and is specified for each shape code. Although only one kind of component suction nozzle 7 is placed at each position provided at a constant pitch interval on the outer periphery of the rotational table 8 in FIG. 18A for simplification, a plurality of component suction nozzles (for example, a small one, a medium-sized one, and a large one) selected depending on the kind of a component are actually provided at the respective positions. Moreover, the recognition data teaches the position that the component suction nozzle 7 sucking a component should be take in advance, which allows the recognition section 210 to recognize.

The control software is necessary to control the placement machine n108. The control section 201 controls the placement machine n108 in accordance with the control software read from the memory section 204. For example, the control section 201 passes the control software to the placement control section 202 so as to control the placement section 203.

The NC data 220 or the control software can be installed from the management device 101 via the transmitting/receiving section 205.

(b) Placement Control Section 202

The placement control section 202 reads out the NC data 220 from the memory section 204 based on an instruction of the control section 201 so that the control section 203 is controlled to sequentially place the components in accordance with an instruction of the NC data 220. Moreover, the placement control section 202 receives information of the result of placement from the placement section 203 so as to update each information contained in the facility information 211 stored in the memory section 204.

The fundamental operation of the placement section 203, that is, the intermittent rotation and the component placement operation of the placement head 4, the traveling operation of the component supplying section 11 and the positioning operation of the XY table 9 are controlled in accordance with the control software described above.

(c) Transmitting/Receiving Section 205

Upon reception of a request for uploading the facility information 211 or the NC data 220 from the management device 101, the transmitting/receiving section 205 outputs the received request to the control section 201. In accordance with the instruction of the control section 201, the transmitting/receiving section 205 reads out the facility information 211 or the NC data 220 stored in the memory section 204 so as to transmit it to the management device 101.

The transmitting/receiving section 205 receives the NC data 220, which is newly created from the management device 101 or is once uploaded to be reoptimized at the higher order, so as to store the received NC data 220 in the memory section 204 in accordance with an instruction of the control section 201.

The transmitting/receiving section 205 receives the control software from the management device 101 so as to store it to the memory section 204.

(d) Recognition Section 210

Although not shown in FIG. 18A, the recognition section 210 downwardly recognizes a sucked component with a camera so as to detect a suction positional offset (the amount of an offset in X and Y directions, the amount of a rotational offset about an axis of the component suction nozzle 7). The control section 201 rotates the component suction nozzle 7 about its axis for correction so as to eliminate the rotational offset detected by the recognition section 210. Moreover, the control section 201 performs the control to correct the amount of positioning of the XY table 9 so as to eliminate the amount of an offset in the X and Y directions detected by the recognition section 210.

Moreover, for recognition, recognition data (contained in the NC data 220), which is taught in advance, is stored in the memory section 204. When an actually placed component is to be recognized, the above-described recognition data or a prespecified recognition algorism (contained in the control software) is read out from the memory section 204 so as to perform a recognition processing.

(e) Control Section 201

The control section 201 controls the respective sections of the placement machine, and instructs the placement control section 202, the transmitting/receiving section 205, and the like as described above to control so as to upload the facility information 211 and the NC data 220 and to download the NC data 220.

The control section 201 receives an instruction order by an operator from the input section 206 so as to perform a processing in accordance with the received instruction order. The control section 201 also outputs an instruction order and the contents of display relating to screen display to the screen control section 207.

(5-2) Component Mounting Apparatus k

A k-th component mounting apparatus among a plurality of the respective component mounting apparatuses including the placement machine connected with each other is denoted as a component mounting apparatus k. The component mounting apparatus k is more broadly interpreted, and it is apparent that the placement machine n108 is included in the component mounting apparatus k.

Although not shown in the drawing, a configuration of a control system of the component mounting apparatus k is similar to that of the control system of the placement machine n108. For example, the control system of the component mounting apparatus k includes the control section 201, the memory section 204, the recognition section 210, the transmitting/receiving section 205, the input section 206, the screen control section 207, and the display section 208. In addition, an operation control section for controlling the original operation of the component mounting apparatus k, which corresponds to the placement control section 202 of the placement machine n108, is included. The operation control section controls, for example, an operation for inserting a component into a circuit board if it concerns the component insertion machine, and an operation for printing a cream solder onto a circuit board if it concerns the cream solder printer 105.

The memory section 204 stores the facility information 211 similar to that shown in FIG. 22, the NC data similar to that shown in FIG. 23, and a control software necessary for the control section 201 to control the component mounting apparatus k.

The facility information 211 has the common items from the uppermost item to the operation rate in production management information in FIG. 22 over the types of the component mounting apparatus k. Although the other production management information and cassette information can be directly used in the component insertion machine, there is particular information in the cream solder printer 105, the adhesive applicator 107, the reflow device 110, or various inspection machines, respectively.

The NC data 220 is almost common to various component mounting apparatuses k for the component library 241. The NC program 221 and the arrangement program 231 can be directly used in the component insertion machine. The NC programs 221 can be directly used in the adhesive applicator 107 and various inspection machines. For each of the cream solder printer 105 and the reflow device 110, the NC program 221 having a particular format for indicating each particular operation is present.

The transmitting/receiving section 205 serves to perform the transmission and the reception with the management device 101, and includes an antenna enabling the transmission and the reception via the wireless LAN 102 in this embodiment. However, the transmitting/receiving section is not limited thereto; it may be a network connected through a cable thereto.

(6) Multifunctional Placement Machine 108b

The multifunctional placement machine 108b receives the circuit board 10 in a one-by-one manner from the high-speed placement machine 108a to place components onto the received circuit board 10 so as to supply the circuit board 10 having the components placed thereon to the placed component inspection machine 109. Moreover, the multifunctional placement machine 108b outputs the facility information relating to the placement of components and the like to the management device 101 via the wireless LAN 102. Furthermore, the multifunctional placement machine 108b can install the NC data 220 indicating the position where a component is to be mounted and various conditions for placing a component, and the like from the management device 101 via the wireless LAN 102.

The multifunctional placement machine 108b places a great variety of kinds of chip components including an odd-shaped component onto the circuit board 10 as described above.

Figure 18B:
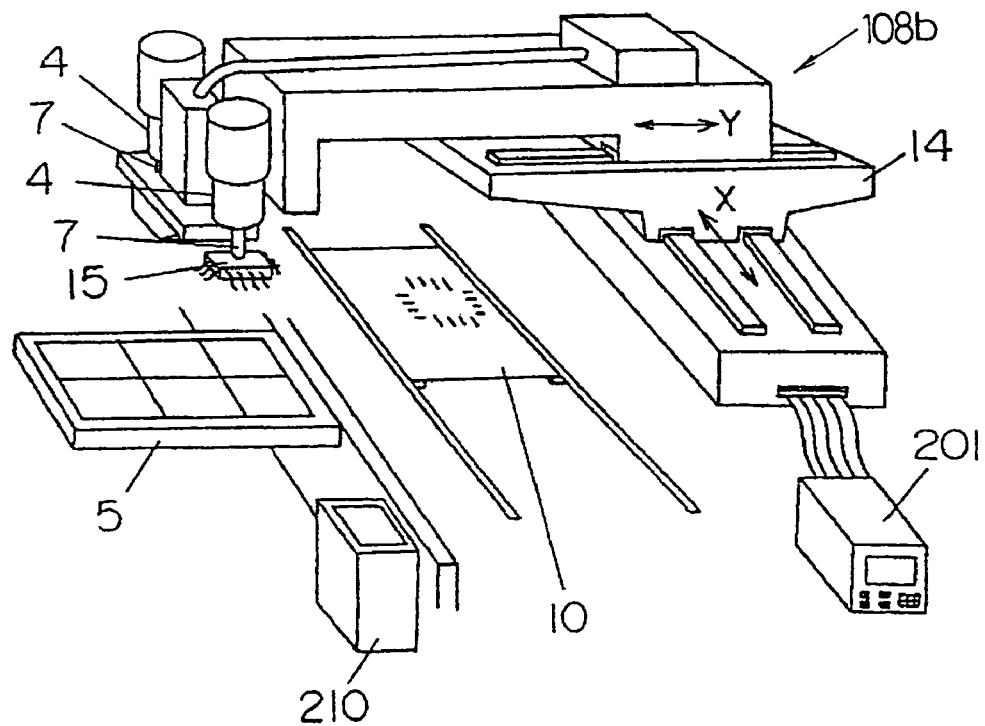
FIG. 18B is a configuration view showing a main part of another type of placement machine in the third embodiment.

The configuration of the multifunctional placement machine 108b is shown in FIG. 18B. In FIG. 18B, the reference numeral 5 denotes tray-type component supplying devices. Although only one tray is shown in the drawing for simplification, in actual, a plurality of trays are housed within the tray housing device in accordance with the kind of a component so that a necessary tray is drawn out to supply a component. Moreover, it is possible to mount a parts cassette as that used in FIG. 18A onto the multifunctional placement machine as the component supplying device 5. The reference numeral 10 denotes the circuit board which is fixed at a predetermined position. The reference numeral 4 denotes the placement head; in the example shown in FIG. 18B, the multifunctional placement machine 108b has two placement heads. The reference numeral 7 denotes the component suction nozzles, which are provided for the respective placement heads. The reference numeral 14 denotes an XY robot for positioning the positions of the component suction nozzles 7 to the component suction position of the component supplying device 5 and the placement position of the circuit board 10 and for moving the component suction nozzles 7 between two positions. The reference numeral 15 denotes a component sucked onto the component suction nozzles 7 so as to be mounted onto the circuit board 10. The reference numeral 201 denotes the control section for controlling the XY robot 14 and the like. The multifunctional placement machine 108b includes the recognition section 210 for recognizing the component 15 sucked onto the component suction nozzle 7 with a camera from a downward direction so as to detect a suction positional offset. The XY robot 14 is driven to move the placement head 4 above the recognition section 210 after the placement head 4 sucks the component 15 from the component supplying device 5. At this position, the recognition section 210 recognizes the component 15 so as to detect a suction offset. Thereafter, the XY robot 14 is driven to move the placement head 4 to the placement position for placing the component 15 after the placement head 4 performs the correction so as to eliminate the suction offset detected by the recognition section 210.

Herein, in order to maintain the quality in the multifunctional placement machine as that shown in FIG. 18B, it is necessary to consider various conditions for placing a component such as a placement speed of a component, as in the high-speed placement machine 108a.

A mounting tact in the multifunctional placement machine 108b corresponds to the amount of time necessary to place components onto a single circuit board, and is determined based on time for carrying in and out the circuit board 10 (loading time), time for placing all components at the placement positions and the like. In this case, the mounting tact is limited to component placement so as to be also referred to as a "placement tact," whereas the standard mounting tact is limited to component placement so as to be also referred to as a "standard placement tact." Moreover, the mounting tact actual value is limited to component placement so as to be also referred to as "placement tact actual value."

When the placement tact (or the placement tact actual value) exceeds the standard placement tact, the exceeded amount of the tact is referred to as a "tact loss." The tact loss includes, for example, a movement loss of the placement heads 4 and the amount of time for replacing the component suction nozzles 7. The standard placement tact for each placement point is referred to as a "standard placement tact per point," the placement tact for each placement point is referred to as a "placement tact per point," and the tact loss for each placement point is referred to as a "tact loss per point."

In the multifunctional placement machine 108b having the configuration as described above, the placement tact per point is determined based on a traveling distance of one cycle, in which, after the placement heads 4 move to the component supplying device 5 to suck the component, the placement heads move to the placement position. In the case where the traveling distance falls within a predetermined range, the placement can be achieved with the standard placement tact per point. However, in the case where the traveling distance exceeds the predetermined range, the placement with the standard placement tact per point is failed to be achieved with the placement tact per point including the tact loss. Therefore, in the case of the multifunctional placement machine, the key point for optimization is to minimize a distance between the placement position and the position of the component supplying device 5. Moreover, in the case where a plurality of the placement heads 4 are mounted onto the XY robot 14 as shown in FIG. 18B, the simultaneous or successive suction of components with the plurality of the suction heads 4 from the component supplying device 5 is the key point for reduction of a tact. Moreover, although not illustrated, it is necessary to replace the component suction nozzles 7 in accordance with the kind of a component. If the replacement is performed, a tact loss is generated. Therefore, the minimization of the number of replacement of the component suction nozzles 7 is also the key point for optimization.

Since the configuration of a control system of the multifunctional placement machine 108b is similar to that of the placement machine n108 described above, the description thereof is herein omitted.

(7) Placed Component Inspection Machine 109

The placed component inspection machine 109 receives the circuit board 10 from the multifunctional placement machine 108b in a one-by-one manner to inspect a missing component or a positional offset of the component on the received circuit board 10 so as to supply the circuit board 10 which has undergone the inspection to the reflow device 110. The placed component inspection machine 109 also outputs the facility information relating to placed component inspection, information of the result of inspection, and the like to the management device 101 via the wireless LAN 102. Moreover, the placed component inspection machine 109 can install the NC data 220 indicating inspection data used by the placed component inspection machine 109 for inspection and the like from the management device 101 via the wireless LAN 102. The inspection data contains the position where a component is placed, a threshold value of inspection OK/NG, and the like.

The contents of an output of the placed component inspection machine 109 correspond to the result of judgment if each component is normally placed, and the specification of the position of a component judged as defectively placed and the contents of the defect. The position of a component is specified by, for example, a circuit number assigned to each component to be placed.

The mounting tact in the placed component inspection machine 109 is determined based on time for carrying in and out the circuit board 10 (loading time), time for picking up an image of the circuit board 10, time for processing and inspecting image data obtained by the picked-up image of the circuit board 10, and the like.

(8) Reflow Device 110

The reflow device 110 receives the circuit board 10 from the placed component inspection machine 109 in a one-by-one manner and then melts a cream solder for the received circuit board 10 so as to solder an electrode of a component and a land on the circuit board 10 with each other. The reflow device 110 supplies the soldered circuit board 10 to the visual inspection machine 111. The reflow device 110 also outputs the facility information relating to the reflow to the management device 101 via the wireless LAN 102. Moreover, the reflow device 110 can install the NC data 220 (also including a temperature profile) for indicating various conditions under which the reflow device 110 conducts the soldering, from the management device 101 via the wireless LAN 102.

The reflow device 110 conveys the circuit board 10 to be soldered through a reflow furnace to melt a cream solder so as to solder an electrode of a component and a land on the circuit board 10 with each other. In order to maintain the quality in such a reflow device 110, it is necessary to consider various conditions for conducting the reflow soldering. For example, a temperature profile in the reflow furnace must be appropriately set depending on the kind of the circuit board 10, the kind of a mounted component, the kind of a cream solder, and the like. The control of an atmosphere or air blasting within the reflow furnace is a condition which is required to be taken into consideration.

A mounting tact in the reflow device 110 is determined based on time for conveying the circuit board 10 through the reflow device 110 and the like.

(9) Visual Inspection Machine 111

The visual inspection machine 111 receives the circuit board 10 from the reflow device 110 in a one-by-one manner so as to visually inspect a state of soldering, a state of a mounted component, and the like for the received circuit board 10. The visual inspection machine 111 supplies the non-defective circuit board 10, which has undergone the inspection, to the housing device 112. The visual inspection machine 111 outputs the facility information 211 relating to the visual inspection, information of the result of inspection, and the like to the management device 101 via the wireless LAN 102. Moreover, the visual inspection machine 111 can install the NC data 220 indicating inspection data for inspection by the visual inspection machine 111 from the management device 101 via the wireless LAN 102. The inspection data includes a component mounting position, a threshold value of inspection OK/NG, and the like.

The contents of an output of the visual inspection machine 111 correspond to the result of judgment if each component is normally placed and the specification of the positions of a component judged as defectively placed and its electrode, and the contents of the defect. The position of a component is specified by, for example, a circuit number assigned to each component to be placed. The position of an electrode is specified by an electrode number assigned to each electrode of a component. As examples of a soldering defect, a positional offset of a component, a missing component, unsuccessful connection of a solder, a solder bridge, and the like can be cited.

A mounting tact in the visual inspection machine 111 is determined based on time for carrying in and out the circuit board 10 (loading time), time for picking up an image of the circuit board 10, time for processing and inspecting image data obtained by the picked-up image of the circuit board 10, and the like.

(10) Housing Device 112

The housing device 112 receives the circuit board from the visual inspection machine 111 in a one-by-one manner so as to house the received circuit board 10 therein.

(11) Management Device 101

Figure 20:
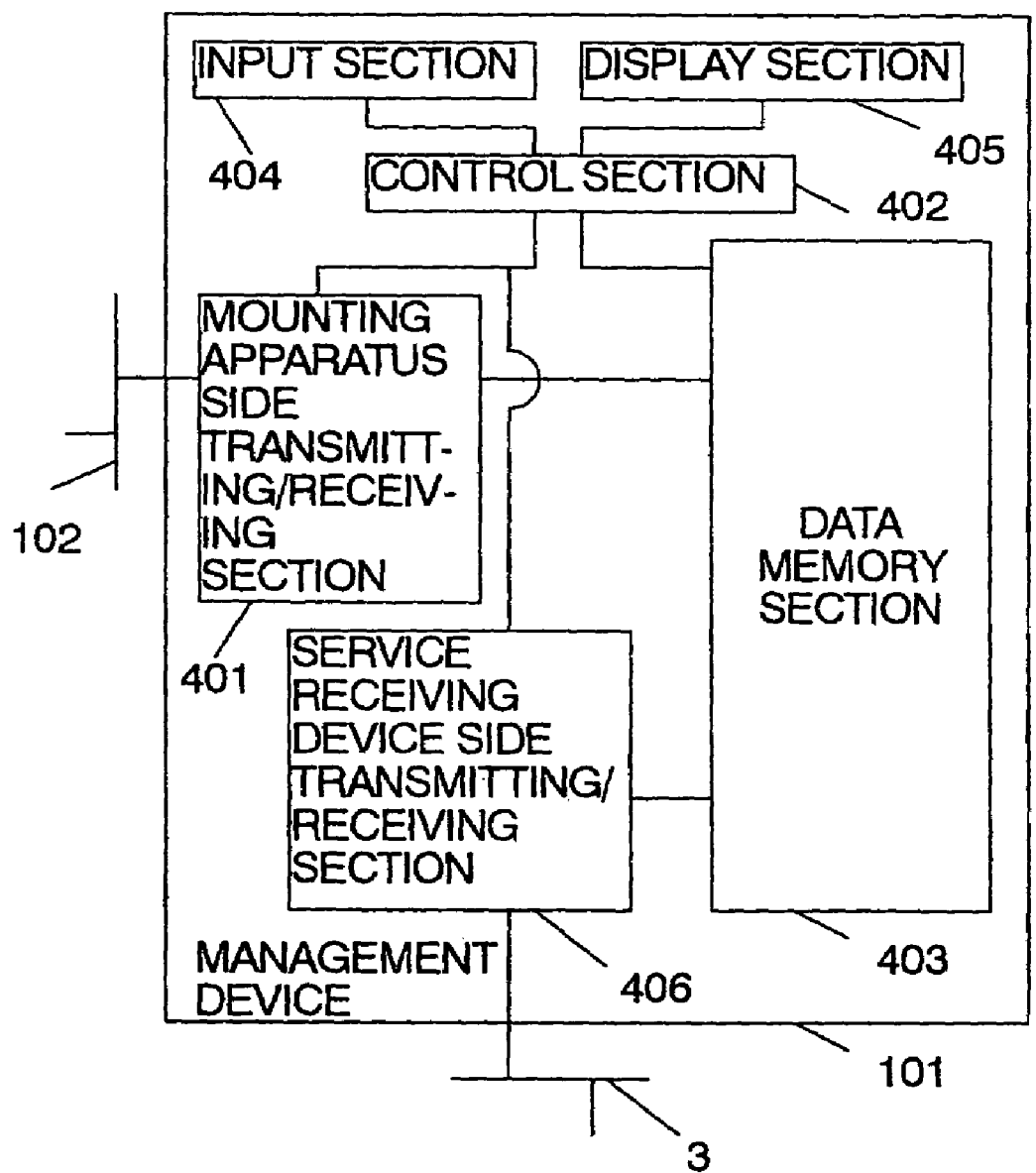
FIG. 20 is a control configuration view of a management device in the third embodiment.
Figure 21:
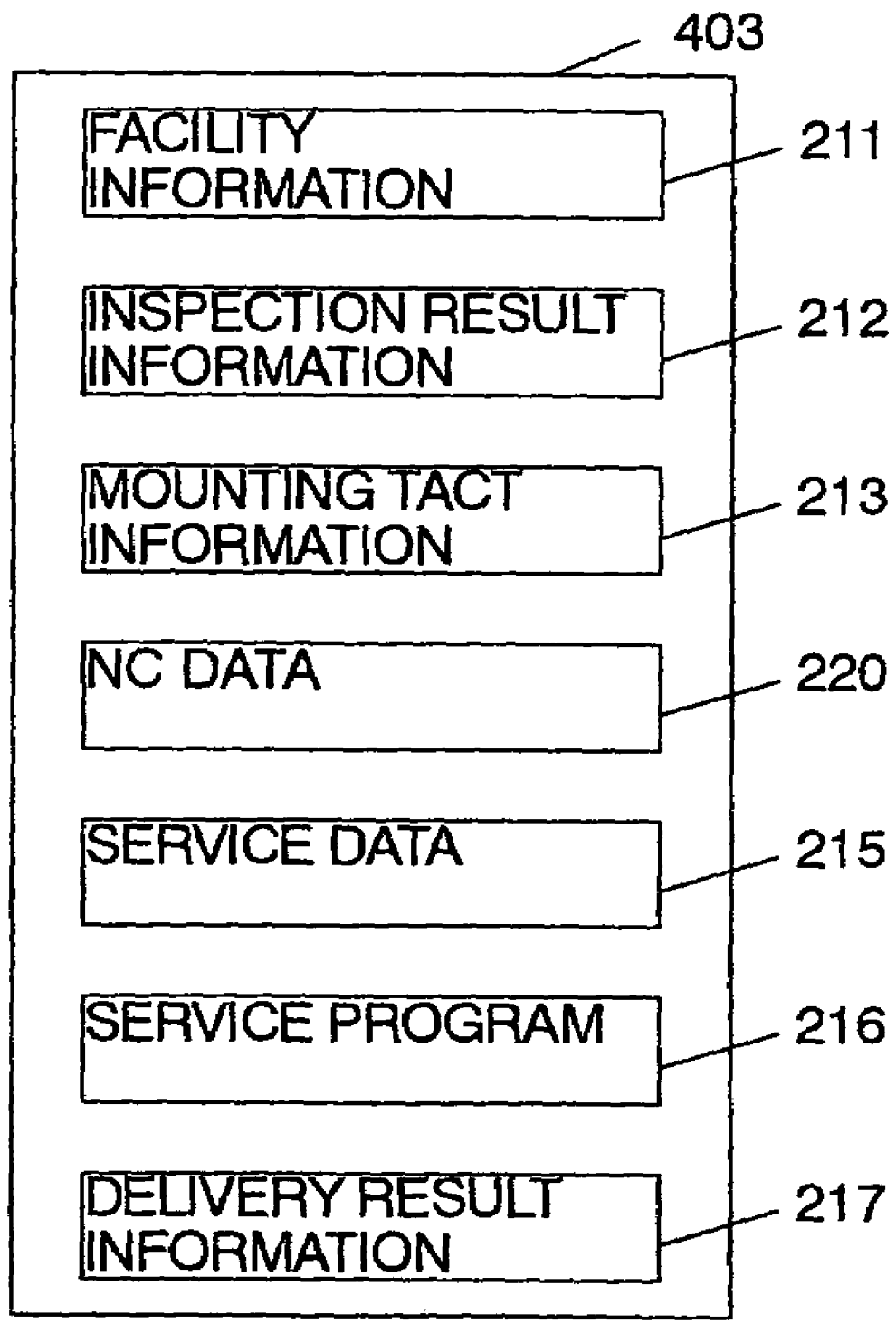
FIG. 21 is a memory configuration view of a data memory section of the management device in the third embodiment.

The management device 101 is constituted by, as shown in FIG. 20, a component mounting apparatus side transmitting/receiving section 401, a service receiving device side transmitting/receiving section 406, a control section 402, a data storage section 403, an input section 404, and a display section 405.

The component mounting apparatus side transmitting/receiving section 401 includes an antenna so as to be capable of performing the transmission and the reception with each component mounting apparatus k via the wireless LAN 102. The service receiving device side transmitting/receiving section 406 is capable of performing the transmission and the reception with the service receiving device 1 via the network 3.

(a) Data Storage Section 403

The data storage section 403 stores the facility information 211 of each component mounting apparatus k, inspection result information 212 of each inspection machine, mounting tact information 213 of each component mounting apparatus k, the NC data 220 of each component mounting apparatus k, service data 215, a service program 216, and delivery result information 217. Each of the facility information 211, the inspection result information 212, and the mounting tact information 213 is result information uploaded from each component mounting apparatus k and is stored for each component mounting apparatus k. The NC data 220 is to be downloaded to each component mounting apparatus k or is uploaded from each component mounting apparatus, and is stored for each component mounting apparatus k.

The service data 215 and the service program 216 serve as the specific contents of service information derived from the service providing device 2 by the service receiving device 1. The information transmitted from the service receiving device 1 is stored. Herein, as the service data 215, there are business information, instruction manual information, maintenance information, and the like. The service data 215 is for providing a service to a user of various component mounting apparatuses. As the service program 216, there are a virtual training software, an optimization software, and the like. The service program 216 is executed to provide a service.

The delivery result information 217 represents the result of delivery of a component mounting apparatus, and includes, for example, the type of a delivered machine, the number thereof, and the like. The delivery result information 217 is collected to the service providing device 2 via the service receiving device, and is used so as to provide the service data 215 and the service program 216.

(b) Component Mounting Apparatus Side Transmitting/Receiving Device 401

In the case of the reception of an upload instruction of the facility information 211 and the NC data 220 from the control section 402, the component mounting apparatus side transmitting/receiving device 401 uploads the facility information 211 and the NC data 220 for all component mounting apparatuses k via the wireless LAN 102 so as to write the received facility information 211 and the NC data 220 into the data storage section 403.

The component mounting apparatus side transmitting/receiving section 401 receives the NC data 220 to be downloaded into the component mounting apparatus k from the control section 402 so as to transmit it to the component mounting apparatus k via the wireless LAN 102.

(c) Service Receiving Device Side Transmitting/Receiving Section 406

The service receiving device side transmitting/receiving section 406 transmits the facility information 211, the inspection result information 212, the mounting tact information 213, the delivery result information 217, and the NC data 220 to the service receiving device 1 in accordance with the upload from the service receiving device 1.

The service receiving device side transmitting/receiving section 406 also receives the NC data 220, the service data 215, and the service program 216 which are downloaded from the service receiving device 1.

(d) Control Section 402

The control section 402 automatically judges the timing for uploading the facility information 211, the inspection result information 212, and the NC data 220 or instructs the component mounting apparatus side transmitting/receiving device 401 to upload the facility information 211, the inspection result information 212, and the NC data 220 by judgment of an operator. Then, the control section 402 receives the facility information 211, the inspection result information 212, and the NC data 220 for each of the component mounting apparatuses k from the component mounting apparatus side transmitting/receiving device 401 so that the data storage section 403 stores them for each of the component mounting apparatuses k. The timing for automatically uploading the facility information 211 is set in a regular manner, for example, once for 10 minutes. Moreover, the upload of the NC data 220 can be issued while specifying a specific component mounting apparatus k.

The control section 402 reads out the NC data 220 for each of the component mounting apparatuses k stored in the data storage section 403 by automatically judging the timing or by judgment of an operator. The control section 402 outputs to the component mounting apparatus side transmitting/receiving section 401 so as to download the readout NC data 220 of the component mounting apparatus k. The timing for automatically downloading the NC data 220 is, for example, prior to production of a circuit board of the corresponding type.

The control section 402 calculates a mounting tact actual value by automatically judging the timing or by judgment of an operator. The mounting tact actual value is contained in the mounting tact information 213, and corresponds to actual time taken by each of the component mounting apparatuses k to fabricate one circuit board. In the case of the high-speed placement machine 108a and the multifunctional placement machine 108b, in particular, the mounting tact actual value corresponds to actual time for placing components onto one circuit board.

In order to calculate the mounting tact actual value, the facility information 211, which is uploaded in a fixed cycle described above, is used. The result of subtraction of the sum of the P plate (printed substrate, i.e., circuit board) waiting time, the maintenance time, the trouble shutdown time, and the component stockout shutdown time from the amount of elapsed time from the previous upload time point is divided by the number of fabricated boards during that period so as to obtain an actual value of a mounting tact. A mean value of a plurality of actual values of the mounting tact is output as a mounting tact actual value.

The control section 402 writes and updates the mounting tact actual value calculated in the above-described manner in a region of the mounting tact information 213 of the data storage section 403. The timing for automatically calculating the mounting tact actual value is, for example, at the beginning of fabrication of a circuit board of the corresponding type.

Although an example where the mounting tact actual value is calculated in the management device 101 based on the facility information 211 collected from the component mounting apparatus k has been presented, it is not limited thereto. In the component mounting apparatus k, time for mounting one circuit board may be detected so as to be stored as the mounting tact actual value which may be a value to be uploaded by the management device 101 along with the facility information 211 and the like.

In response to an input from the input section 404 by an operator, the control section 402 creates the delivery result information 217 so as to store it to the data storage section 403. However, a method of creating the delivery result information 217 is not limited thereto. Alternatively, then the component mounting apparatus k is delivered to a factory so as to be connected to the management device 101 via the wireless LAN 102, the control section 402 receives a signal from the connected component mounting apparatus k so as to detect the delivery of the new component mounting apparatus k, thereby creating the delivery result information 217.

In response to an instruction of upload from the service receiving device 1 via the service receiving device side transmitting/receiving section 406, the control section 402 reads out the facility information 211, the inspection result information 212, the mounting tact information 213, the delivery result information 217, and the NC data 220 from the data storage section 403 so as to transmit them to the service receiving device 1 via the service receiving device side transmitting/receiving section 406.

The control section 402 also receives the download of the NC data 220, the service data 215, and the service program 216 from the service receiving device 1 via the service receiving device side transmitting/receiving section 406.

Moreover, the control section 402 receives an instruction order from the input section 404 by an operator so as to create screen data based on the received instruction order. The control section 402 outputs the created screen data to the display section 405.

II. Configurations of the Service Receiving Device 1 and the Service Providing Device 2

The service receiving device 1 is placed at the destination of delivery of a component mounting apparatus, and is a device for deriving a service relating to the mounting from the service providing device 2 at a manufacturer supplying a component mounting apparatus via the network 60 including the Internet.

(1) Functions of the Service Receiving Device 1

The service receiving device 1 sets up a WEB screen on the display section 25 as an example of a selection screen as shown in FIG. 24. By pushing on a menu displayed on the WEB screen, a service desired to be provided can be selected. The service receiving device 1 retrieves and derives corresponding service data and service program from the service information DB 26 of the service providing device 2 for a service corresponding to the menu selected by an operator. The derived service data 215 and service program 216 can be confirmed on a screen of the service receiving device 1, and further can be transferred to the management device 101 of each factory.

Hereinafter, each service to be provided will be described.

(1-1) Provision of a Service in Accordance with a Contract Level

The contents of disclosure of a service derived by the service receiving device 1 from the service providing device 2 vary depending on a level of a contract that a destination company of delivery has made with a manufacturer supplying a component mounting apparatus. As the level of a contract is elevated, the range of disclosure is expanded to a service of a higher level. It is desirable to determine the level of a contract depending on the level of an operator of the component mounting apparatus k or the difficulty level of a mounting technique used in fabrication at a facility, and further on demand of the destination of delivery.

When a "contract" menu is selected on the WEB screen on the display section 25 shown in FIG. 24, the level of a contract can be selected. The drawing shows a state of an initial level of a contract, and therefore only the menus for "business information," "electronic instruction manual," and "mending parts" can be selected. The other menus indicated with broken lines in the drawing cannot be selected unless the level of a contract is elevated.

(1-2) Business Information

New product information can be obtained. The latest union catalog, a catalog for each type of the respective component mounting apparatuses k, or an electronic file of a specification can be provided.

(1-3) Electronic Instruction Manual

The latest information of an instruction manual, which is necessary for an operator to operate each of the component mounting apparatuses k, can be provided. It is possible to know how the contents of a revised instruction manual are reflected into the latest version. Moreover, an electronic file of a selected instruction manual can be provided.

(1-4) Mending Parts

A service is provided so that a parts cassette corresponding to the component supplying device 5, a mending part of the component suction nozzle 7, or the like is arranged to be shipped to a factory of the destination of delivery of a component mounting apparatus.

(1-5) Virtual Training

The virtual training is offered to an operator operating the component mounting apparatus k at a factory at the destination of delivery of a component mounting apparatus by displaying an operation guide on the management device 101 or the display section 208 of the component mounting apparatus k. Upon reception of this service, a virtual training software is transferred from the service providing device 2. This virtual training software is transferred to the management device 101 at the corresponding factory so that the virtual training software is activated on the management device 101 of the corresponding factory or the component mounting apparatus k so as to carry out the training. Moreover, the virtual training software is activated on the service receiving device 1 so as to carry out the training by a remote operation via the network 3.

(1-6) Maintenance Information

The maintenance information described for a recovery method at the trouble occurrence in the component mounting apparatus k or an electronic file of a maintenance manual can be provided. Moreover, in each of the component mounting apparatuses k, the disclosure of information of inconveniences, which have occurred so far, can be received. For the disclosed inconveniences, in order to eliminate the inconveniences, a coping strategy, for example, if a mending part is needed to be replaced, if a software is needed to be upgraded, can be known.

(1-7) Software Upgrade

In the component mounting apparatus k, a service can be provided for upgrading a software to its latest version in which the inconveniences of the software occurring in the past have been eliminated. It is possible to know, for example, information relating to how much the operationality has been improved in the latest version, even if it is not the inconvenience. It is also possible to know the upgrade is charge-free or charged.

In the case where the upgrade is to be offered, the latest version software is transferred from the service providing device 2. This latest version software is transferred to the management device 101 at the corresponding factory so as to be installed on the corresponding component mounting apparatus k.

(1-8) Mounted Component Data

The component library 241 among the NC data 220 can be provided. The normal component library 241 including all components having the results of fabrication of non-defective products is held in the service information DB 26 of the service providing device 2. It is possible to acquire the entire component library 241 or the range where necessary component mounting apparatus k or kind of component is specified. As a result, the mount production, which is suitable for obtaining the good quality in accordance with the kind of a component or a circuit board to be used, is enabled even by a novice operator.

(1-9) Technique Data

The technique data relating to a way of selecting a cream solder or an adhesive for the kind of each component or circuit board, a way of determining a temperature profile in reflow can be acquired.

(1-10) Optimization

An optimization software for the NC data 220 can be provided for optimization in the placement order of components and the arrangement of component supplying device 5 of the component supplying section 11 for the purpose of reducing the placement time in the single placement machine n108, distribution of components to each of the component mounting apparatuses n108 for balancing a mounting tact of a plurality of placement machines n108 constituting the component mounting line 100, and creation of the arrangement of common components for the purpose of arrangement sharing of the component supplying device 5 so as to reduce the type switching time for replacing the component supplying device 5 upon type switching of a produced circuit board. With this optimization software, the NC data 220, which is uploaded from the component mounting apparatus k at each factory, can be optimized so as to feedback the optimized NC data 220 to the component mounting apparatus k at each factory. The mounting tact simulation is performed on the NC data 220, which is optimized by the optimization software, so as to provide a mounting tact simulation software for performing a theoretical calculation of a mounting tact.

For the component mounting apparatuses k other than the mounting apparatus n108, the optimization is performed for reducing the mounting time corresponding time for fabricating or inspecting one circuit board in the single component mounting apparatus k so as to distribute the mounted components or the applied components to each of the component mounting apparatuses k in consideration of the balance of the mounting tact of each of the component mounting apparatuses k including the placement machine n108. Moreover, for the component mounting apparatuses k other than the placement machine n108, the optimization is performed so as to reduce the type switching time. Such optimization is performed on the NC data 220 of the component mounting apparatuses k other than the placement machine n108. The optimized NC data 220 is feedbacked to each of the component mounting apparatuses k.

(1-11) Monitoring and Analysis

A service for monitoring the quality and an operation status of the component mounting line 100 by the service providing device 2 of a manufacturer supplying a component mounting apparatus via the network 60 and further a service for analyzing the cause of abnormality when the abnormality occurs during monitoring so as to provide the feedback to the component mounting line 100, are provided. This monitoring and analysis service is realized by executing a monitoring and analysis software provided by the service providing device 2.

(2) Control Configuration of the Service Providing Device 2

Figure 25:
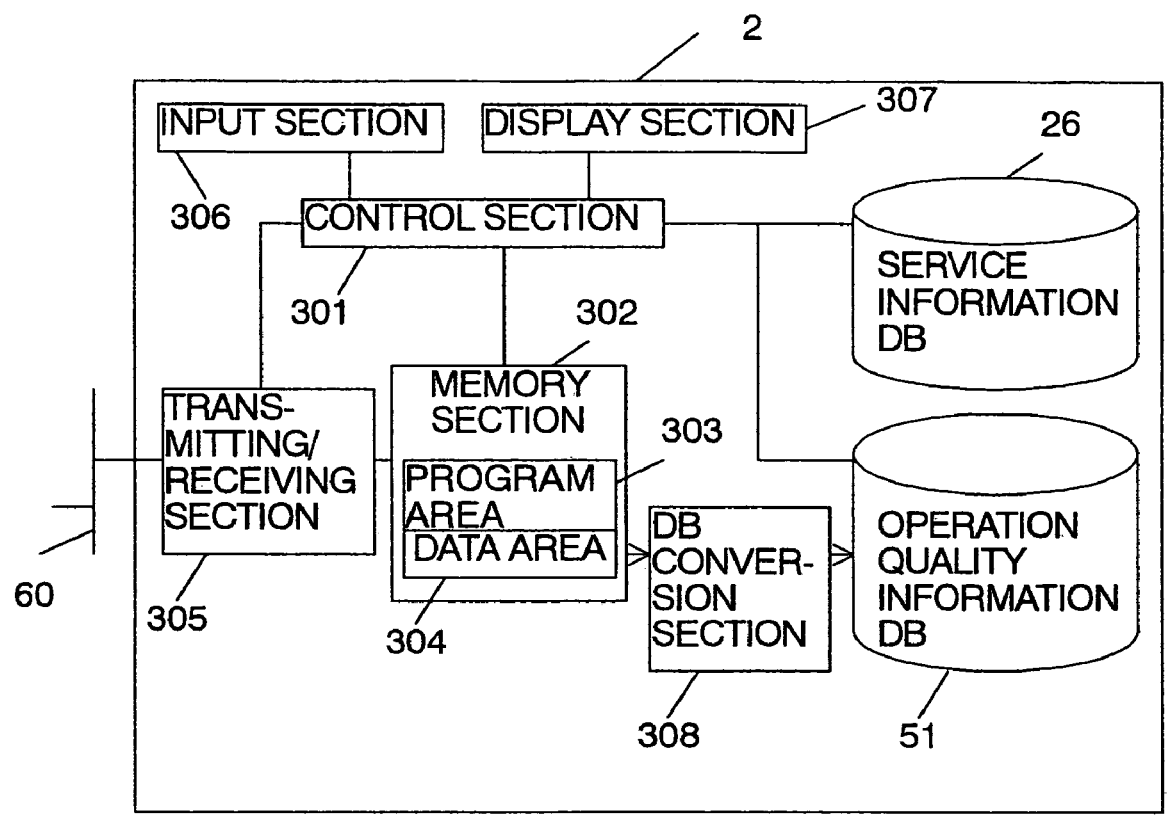
FIG. 25 is a control configuration view of a service providing device in the third embodiment.

A control configuration of the service providing device 2 will be described with reference to FIG. 25.

The service providing device 2 is constituted by a transmitting/receiving section 305, a memory section 302, a DB conversion section 308, a service information DB 26, an operation quality information DB 51, a control section 301, an input section 306 and a display section 307. The transmitting/receiving section 305 is connected to a network 60, and is capable of transmitting and receiving information to and from the service providing device side transmitting/receiving section 23 of the service receiving device 1.

(2-1) Memory Section 302

The memory section 302 is constituted by a program area 303 and a data area 304.

In the program area 303, a service providing program for performing an operation in a procedure described below so that the service providing device 2 realizes various functions for providing a service requested from the service receiving device 1, is installed and stored in advance. The service providing program can be installed or sold via a storage medium such as a floppy disk or a CD-ROM, or a transmission medium such as the Internet. In some cases, the service program 216, which is derived from the service information DB 26 by the service providing program, is stored in the program area 303 of the memory section 302 so as to execute the service program 216 in the service providing device 2. As such a service program 216, an optimization software, a mounting tact simulation software, a monitoring and analysis software, or the like are cited. The service program 216 can also be installed and sold via a storage medium such as a floppy disk or a CD-ROM, or a transmission medium such as the Internet.

In the data area 304, the facility information 211, the mounting tact information 213, the delivery result information 217, and the NC data 220 of each component mounting apparatus k in each factory at the destination of delivery of component mounting apparatuses are stored. Moreover, the inspection result information 212 of each inspection machine is stored therein. Moreover, a speed master 414 and a tact simulation parameter 413 (see FIGS. 27A and 27B) used for performing the mounting tact simulation are also stored.

The facility information 211 and the inspection result information 212 are the result information uploaded from each component mounting apparatus k via the service receiving device 1, and are stored for each component mounting apparatus k. The mounting tact information 213 is composed of result information including a mounting tact result value uploaded from the management device 101 via the service receiving device 1 and theoretical values of the mounting tact and the tact loss calculated in the mounting tact simulation, and is stored for each component mounting apparatus k. The delivery result information 217 is uploaded from the management device 101 via the service receiving device 1. The delivery result information 217 corresponds to data of the type, the number, the delivery date, and the like of the delivered component mounting apparatuses k, and is stored for each user to whom each component mounting apparatus is delivered. The NC data 220 is to be downloaded to each component mounting apparatus k via the service receiving device 1 or is uploaded from each of the component mounting apparatuses k via the service receiving device 1. The NC data 220 is stored for each component mounting apparatus k.

In the speed master 414, the standard placement tact per point for a shape code, which is uniquely determined for each shape of the component, is stored for each placement machine name which serves as a name for identifying the placement machine n108, as shown in FIG. 27A given as an example of the placement machine n108. Moreover, the speed master 414 stores loading time, tool change time, and cassette replacement time for each placement machine name. Herein, the loading time corresponds to the amount of time from the completion of placement on the previous circuit board to the setting of a next circuit board to be placed at the position for placement. The tool change time corresponds to the amount of time for changing the component suction nozzle 7 for sucking a component or a tool for chucking a component, which should be taken into consideration in the multifunctional placement machine 108b. With them, the standard placement tact for placement of one circuit board can be calculated.

The cassette replacement time correspond to the amount of time required to replace one parts cassette, that is, the component supplying device 5. The type switching time is theoretically calculated based on the prestored cassette replacement time and the NC data 220 prior to and after the type switching. Specifically, the number of replacements of the component supplying device 5 can be known from the NC data 220 prior to and after the type switching. The number of replacement is multiplied by the cassette replacement time to obtain the type switching time.

The tact simulation parameter 413 is present for each component mounting apparatus k. An example of the placement machine n108 is shown in FIG. 27B. A standard tact (corresponding to the standard placement tact per point), an XY range (allowable moving range of the XY table 9 within the standard tact), an XY speed (XY table moving speed), a Z range (allowable moving range of the component supplying device 5 within the standard tact), and a Z speed (component supplying device moving speed) are stored in advance. The placement speed corresponds to a placement head speed or the XY table moving speed. With these parameters, an XY table movement loss and a component supplying device movement loss are calculated.

(2-3) Transmitting/Receiving Section 305

The transmitting/receiving section 305 responds to a request for deriving the service data 215 and the service program 216 from the service receiving device 1. The transmitting/receiving section 305 receives the permission to the derivation request from the control section 301 which in turn transmits the service data 215 and the service program 216 retrieved from the service information DB 26 to the service receiving device 1 via the network 60.

The transmitting/receiving section 305 requests the service receiving device 1 to upload the facility information 211, the mounting tact information 213, the inspection result information 212, the delivery result information 217, and the NC data 220 so as to upload the facility information 211, the mounting tact information 213, the inspection result information 212, the delivery result information 217, and the NC data 220 from the service receiving device 1 via the network 60. The transmitting/receiving section downloads the NC data 220 to the service receiving device 1 via the network 60.

(2-4) Operation Quality Information DB 51

The operation quality information DB 51 fetches the facility information 211, the mounting tact information 213, the inspection result information 212 and the like stored in the data area 304 of the storage section 302 so as to process an operating status or a quality status to have a data structure which is easy to analyze and to accumulate it in a database.

The operation quality information DB 51 contains, as an example as shown in FIG. 28, a facility information DB 30, a mounting tact DB 32, and an inspection result DB 34.

In the facility information DB 30, the facility information 31 is written for each facility index identified by a factory name of the destination of delivery of component mounting apparatuses and a name of the component mounting apparatus and for each time index identified by time. The facility information 31 is based on the facility information 211 which is fetched from the management device 101 at a factory of the destination of delivery of each component mounting apparatus to be written into the data area 304 of the memory section 302, and composed of an operation rate, a suction rate, P-plate waiting time, trouble shutdown time, maintenance time, and the like.

The mounting tact DB 32 is present for each factory name of the destination of delivery of component mounting apparatuses. Production start time and production end time are stored for each type of the produced circuit board. The mounting tact information 33 is written for each facility index identified by the name of a component mounting apparatus and for each type index identified by the produced type. The mounting tact information 33 is based on the mounting tact information 213 (including a tact loss calculated by using the tact simulation parameter 413 stored in the data area 304 of the memory section 302 in advance), which is fetched from the management device 101 at each factory of the destination of delivery of a component mounting apparatus to be written into the data area 304 of the memory section 302.

The inspection result DB 34 is present for each factory name of the destination of a delivery of component mounting apparatus. The inspection result information 35 is written for each inspection machine index identified by each of the inspection after printing, the inspection after placement, and the visual inspection and for each type index identified by the type of production. The inspection result information 35 is based on the inspection result information 212 which is fetched from the management device 101 at each factory of the destination of delivery of a component mounting apparatus to be written into the data area 304 of the memory section 302. Furthermore, by specifying an identification code, a circuit number, and an electrode number of each circuit board 10 in the inspection result information 35, it is possible to retrieve information indicating if each circuit board 10 is OK or NG and information indicating the contents of a defect with its circuit board number and electrode number.

In this manner, since the facility information 211 and the mounting tact information 213 collected from each component mounting apparatus k are accumulated for each index of each produced type or each time index and for each index of each component mounting apparatus k or the inspection result information 212 collected from each inspection machine for each index of each produced type or each index of each inspection machine, it is possible to easily perform the retrieval, the matching, and the analysis by the produced type, the time, the component mounting apparatus k, and the inspection machine serving as important keywords for analysis.

In the operation quality information DB 51, target values of the line operation rate, the line mounting tact, and the suction rate and allowable ranges of the line tact balance and the tact loss are written in advance. For the line operation rate, the line mounting tact, and their target values and allowable ranges will be described below in detail in "(2-2) Operation for monitoring and analysis" of "IV. Operations of the service receiving device 1 and the service providing device 2."

(2-5) DB Conversion Section 308

The DB conversion section 308 converts the facility information 211, the mounting tact information 213 (including the mounting tact actual value corresponding to an actual value and the tact loss corresponding to a theoretical value), and the inspection result information 212 written into the data area 304 of the memory section 302 to have a data structure for the operation quality information DB 51 so as to write them into the operation quality information DB 51. For example, in the case where the facility information 21 is to be written into the operation quality information DB 51, the retrieval is performed on the indices of the facility information DB 30 considering from which factory of the destination of delivery of component mounting apparatuses, from which component mounting apparatus k and at which time the facility information 211 is. Then, the converted facility information 31 is written at the locations of the corresponding indices.

Moreover, the DB conversion section 308 writes the delivery result information 217, which has been written into the data area 304 of the memory section 302, into the contract DB 320 (described below) of the service information DB 26 for each user.

(2-6) Service Information DB 26

Figure 29:
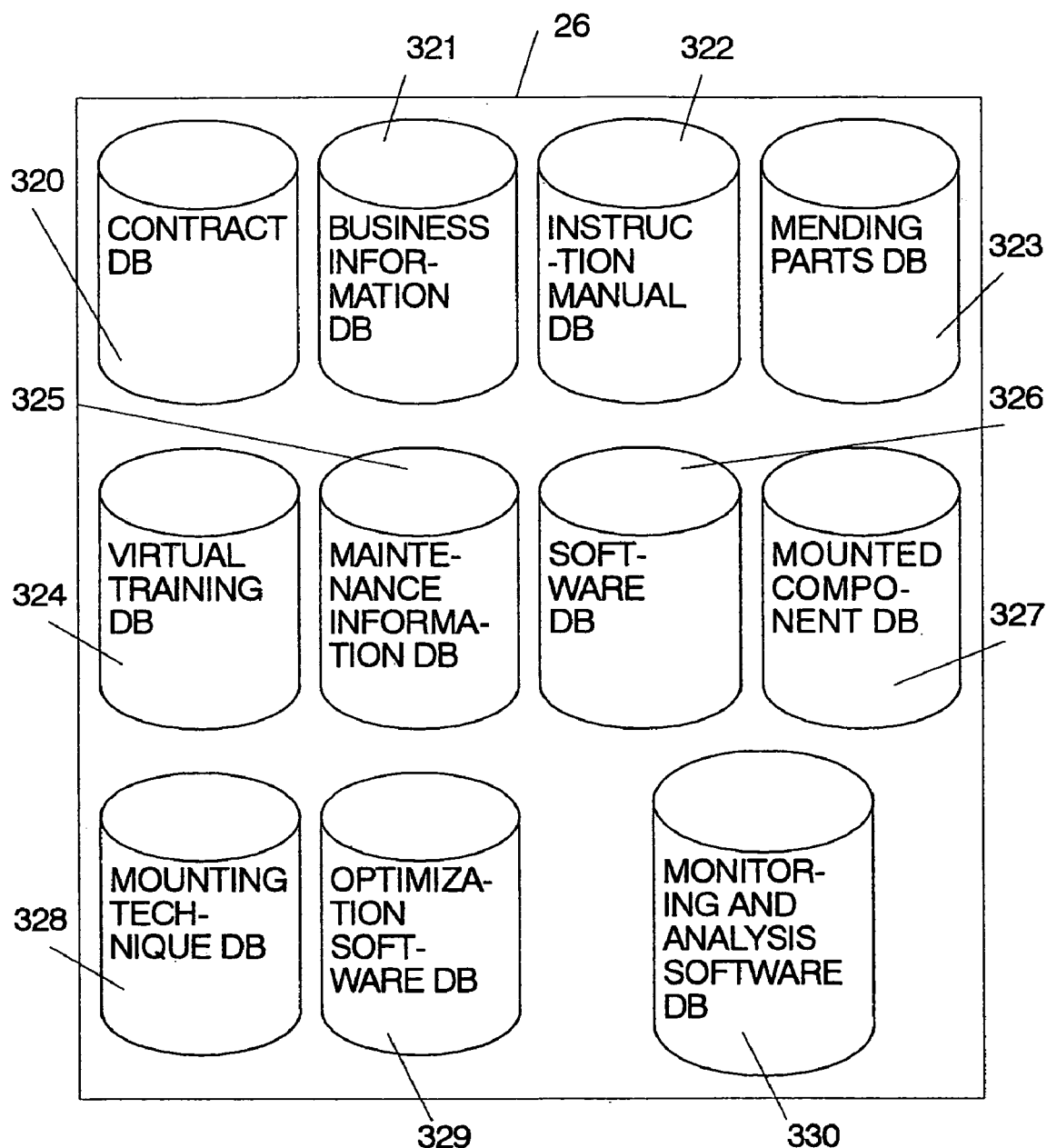
FIG. 29 is a configuration view of a service information DB in the third embodiment.

The service data 215 and the service program 216 which are required to provide service functions are accumulated in the service information DB 26 and can be fetched out as necessary to provide a service. The service information DB is constituted by the respective databases shown in FIG. 29.

The service data 215 and the service program 216 are the specific contents of service information. The service data 215 is data necessary to provide a service to a user, and includes, for example, contract information, business information, instruction manual information, mending parts information, maintenance information, a software of a component mounting apparatus, mounted component information, mounting technique information, and the like. The service program 216 is capable of providing a service to a user by executing itself, and includes, for example, a virtual training software, an optimization software, a monitoring and analysis software, and the like.

All the service data 215 or all the service program 216 is stored in a centrally managed manner in the service information DB 26 as new mounting know-how so that the service data 215 or the service program 216 serving as the latest know-how can be easily retrieved from the service receiving device 1 from any zone of the world. Therefore, it is ensured that the latest service data 215 or service program 216 necessary for a user can be immediately acquired. As a result, even with a complicated mounting technique which is conventionally likely to cause a trouble due to wrong operation, the mount production can be realized based on the already established latest know-how without establishing the know-how through a production loss generated upon set-up through a trial and error process.

Hereinafter, the specific contents thereof will be described
(a) Contract DB 320

The contract database 320 (hereinafter, referred to as a contract DB; similarly, the other databases are also referred to using DB below) is the accumulation of contract information for each user at the destination of delivery of component mounting apparatuses of each contractant as shown in FIG. 30 illustrating the contents thereof. For example, the level of a contract can be retrieved by a user code or a delivery destination user name so as to allow the access. As a result, all the levels of a contract for each user can be centrally managed so as to easily determine the range of disclosure of a service for each user depending on the contents of the level of a contract registered in the contract database.

In FIG. 30, a contract level "0" indicates that it is a contract of the lowermost level corresponding to the initial level. For a user of this level, only the minimum services such as business information, an electronic instruction manual, or the like are disclosed. A contract level "2" indicates that it is a contract of the level two ranks higher than the initial level. As compared with the contract level "0," this contract level has a broader range of disclosure of a service.

Based on this contract level, a user at the destination of delivery is charged. The accounting is regularly made, for example, by the month. As a result, instead of charging for each service provision, the accounting is regularly made in a collective manner, for example, by the month depending on the level of a contract for services. Therefore, an accounting process can be facilitated both for a user and for a manufacturer. Moreover, for a user, there will be no inconvenience that the user selects an unnecessary service to be wrongly charged.

Moreover, the presence/absence of automatic transmission of the service data 215 or the service program 216 and the delivery result of the component mounting apparatus k are registered in the contract DB 320 for each user.

For the presence/absence of automatic transmission of the service data 215 or the service program 216, for example, either the batch transmission or the individual transmission of the service data 215 and the service program 216 can be registered as shown in FIG. 30. When the "batch" is selected to be registered, a revised or updated version of the service data 215 and the service program 216 is automatically transmitted at the timing of revising or upgrading either of the service data 215 or the service program 216 in all of them. On the other hand, when, for example, business information, an instruction manual, maintenance information, a component mounting apparatus software, or an optimization software is individually selected for either of the service data 215 or the service program 216, a revised or updated version of the selected and registered service data 215 or service program 216 is automatically transmitted only for the selected and registered service data 215 or service program 216. As a result, a user receives the latest service by immediately replacing a service by a new one upon revision or upgrade even though the user does not check the revision or the update of the contents of a service by himself/herself.

For the delivery result of the component mounting apparatus k, the type of the delivered component mounting apparatus k, the delivered number thereof, and the delivery date are registered. As a result, the service data 215 or the service program 216 relating to the type of the delivered component mounting apparatus k can be automatically transmitted at the timing of its revision or upgrading. Therefore, since a user can receive only a service relating to the type of the necessary component mounting apparatus k, a service can be efficiently provided without generating any loss.

For the delivery result of the component mounting apparatus k, the delivery result information 217 collected from the service receiving device 1 so as to be written in the data area 304 of the memory area 302 is converted by the DB conversion section 308 to be registered.

(b) Business Information DB 321

Figure 31:
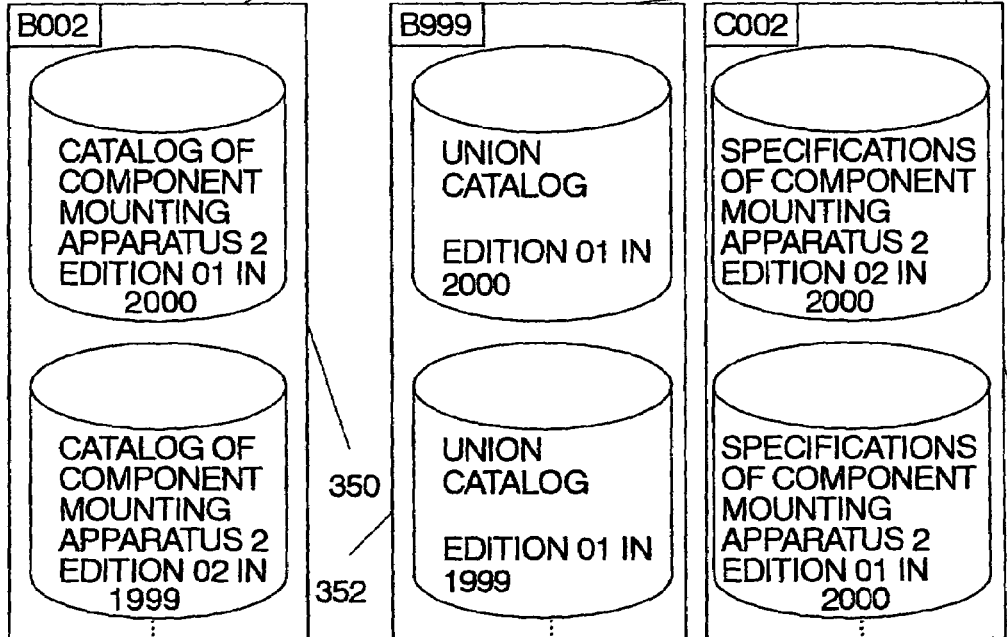
FIG. 31 is a configuration view of a business information DB in the third embodiment.

A catalog code corresponding to an address where a catalog is present and a specification code corresponding to an address where a specification is present are stored for each type of each component mounting apparatus k in the business information DB 321, as shown in FIG. 31 illustrating the contents thereof. The catalog code allows the retrieval of an electronic file 350 of a catalog of the corresponding type of machine, whereas the specification code allows the retrieval of an electronic file 351 of a specification of the corresponding type of machine.

Moreover, as shown in FIG. 31, the business information DB 321 has such a database structure that each desired specification condition of a user is specified to allow the retrieval of the corresponding type of machine so as to identify the type of the component mounting apparatus k based on specification conditions specified by the user. The specification conditions specified by the user, for example, as shown in the drawing, are a tact (mounting tact per point), a placement accuracy, a price, a mountable component, the occupied area, and the like. When a placement machine having a mounting tact per point faster than 0.15 sec. and a placement accuracy of 0.05 mm or higher, and capable of placing a 1005 chip component is desired, a placement machine meeting these conditions is retrieved. When the retrieved one is a "component mounting apparatus 2," an electronic file of a catalog or a specification of the corresponding "component mounting apparatus 2" can be retrieved by the corresponding catalog code or specification code.

As a result, the business information such as a catalog, a specification, or the like of a component mounting apparatus meeting the specification conditions specified by the user can be derived, the component mounting apparatus k satisfying the conditions desired by the user can be easily retrieved so as to efficiently acquire a catalog, a specification or the like of the component mounting apparatus k.

Moreover, as found in the drawing, since a catalog or a specification is stored for each issuance number consisting of the year of issuance and a serial number, not only the latest version but also an older catalog can be consulted. Furthermore, when the summarized information is specified (the type of machine is specified to "Summary" ), the electronic file 352 of a union catalog can be retrieved. Since the electronic file 352 of a union catalog is also stored for each issuance number, not only the latest version but an older catalog can be consulted. Although the price is indicated in Japanese yen in the drawing, the prices in the currencies of various countries such as American dollar, Canadian dollar, and European Euro are also prepared in the business information DB 321.

(c) Instruction Manual DB 322

Figure 32:
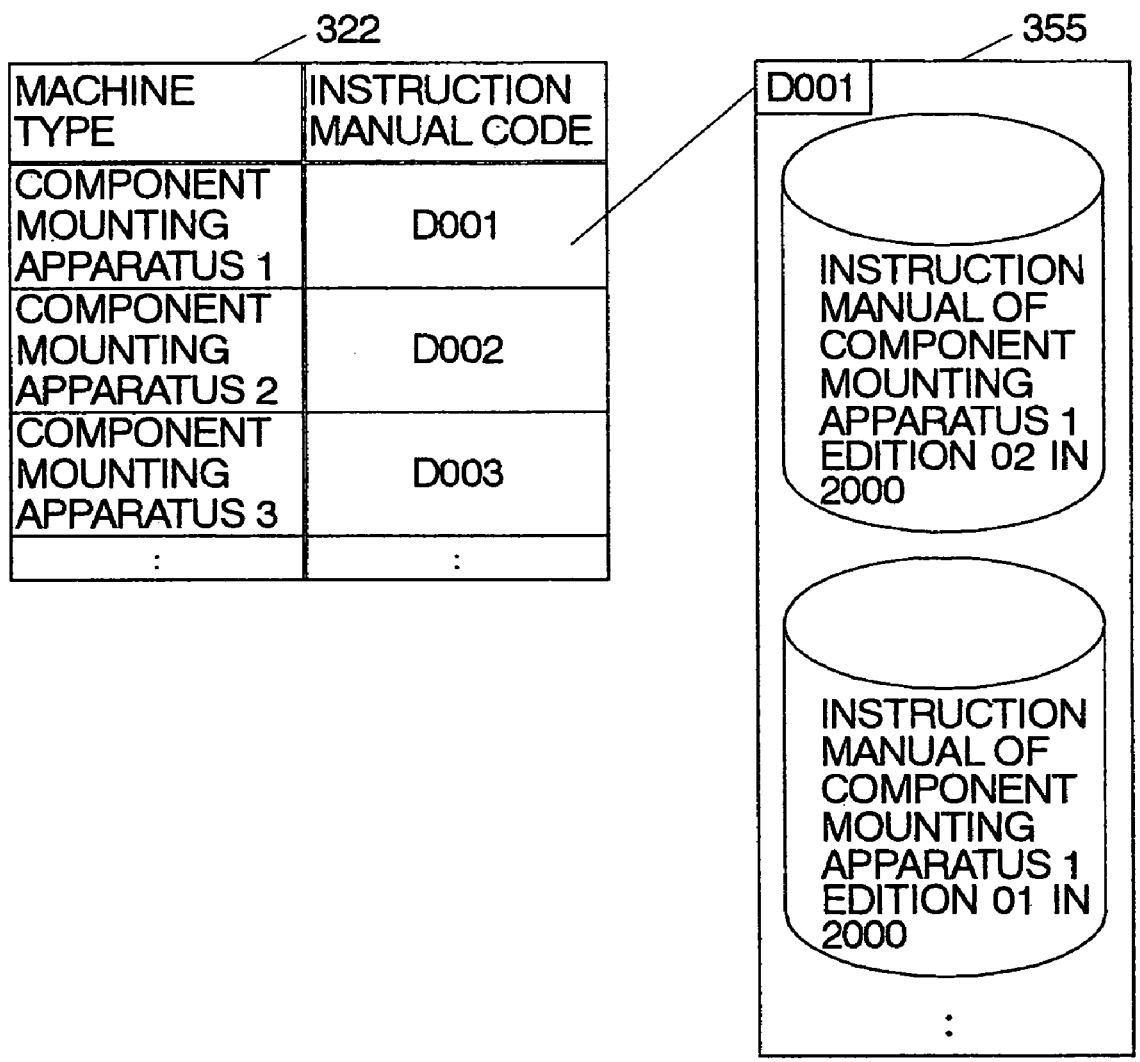
FIG. 32 is a configuration view of an instruction manual DB in the third embodiment.

In the instruction manual DB 322, as shown in FIG. 32 illustrating the contents thereof, an instruction manual code corresponding to an address where an instruction manual for each type of each component mounting apparatus k is present is stored. The instruction manual code allows the retrieval of the electronic file 355 of the instruction manual of the corresponding type of a machine. Moreover, since the instruction manual is stored for each issuance number consisting of the year of issuance and a serial number, not only the latest version but also an older instruction manual can be consulted. Moreover, the latest version of the instruction manual can be provided at any time at the timing necessary for a user.

(d) Mending Parts DB 323

The mending parts DB 323 consists of stock information 358 and arrangement information 359 as shown in FIG. 33 illustrating the contents thereof. As the stock information 358, the number of stocks at each service point is stored for each mending parts number. Herein, the mending parts are, for example, the component supplying device 5 including a parts cassette, the component suction nozzle 7, and the like.

As the arrangement information 359, a mending parts number to be arranged, the number of mending parts, the delivery date, and a dealing point and the like are stored. A point 1, a point 2, . . . may be the respective points in Japan, or may be the respective points in the respective countries. The arrangement information 359 can be fetched out from the mending parts DB 323 so as to be arranged in the order of users having earlier delivery date for consultation.

(e) Virtual Training DB 324

Figure 34:
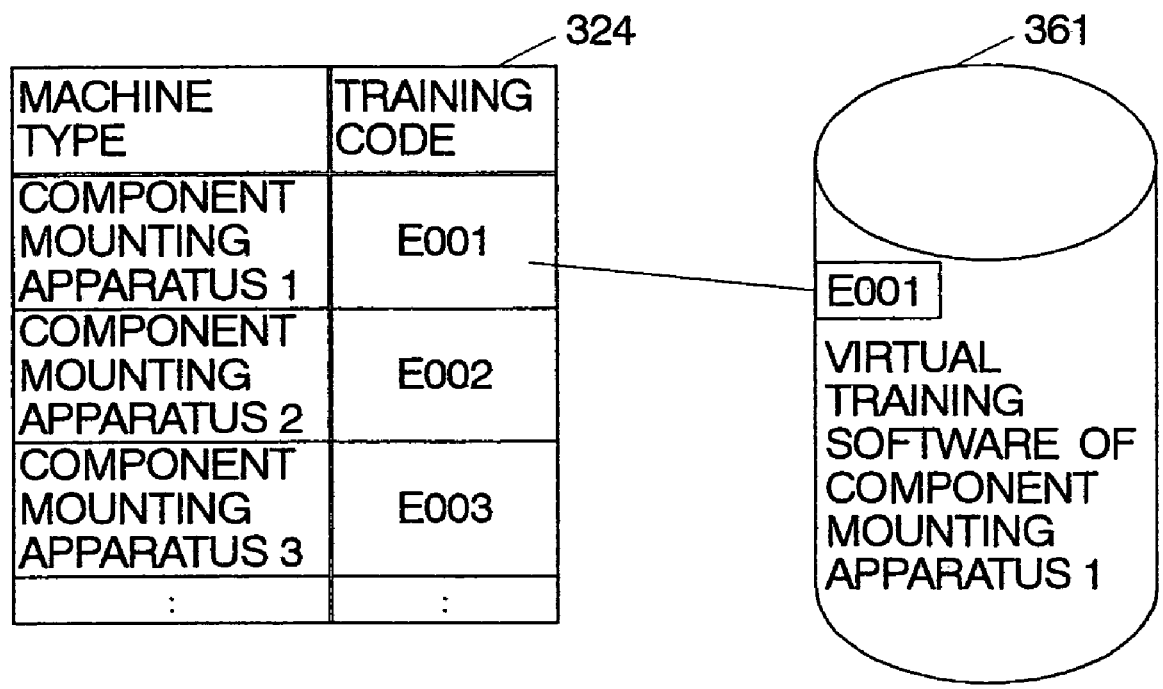
FIG. 34 is a configuration view of a virtual training DB in the third embodiment.

In the virtual training DB 324, a training code corresponding an address where a virtual training software is present is stored for each type of each component mounting apparatus k as sown in FIG. 34 illustrating the contents thereof.

With the training code, it is possible to retrieve the virtual training software 361 of the corresponding type of a machine.

By supplying the virtual training software 361 from this virtual training DB 324 to a user, the training on an operator of the component mounting apparatus k can be carried out at necessary timing so that the wrong operation of the operator of the component operator k does not occur.

(f) Maintenance Information DB 325

Figure 35:
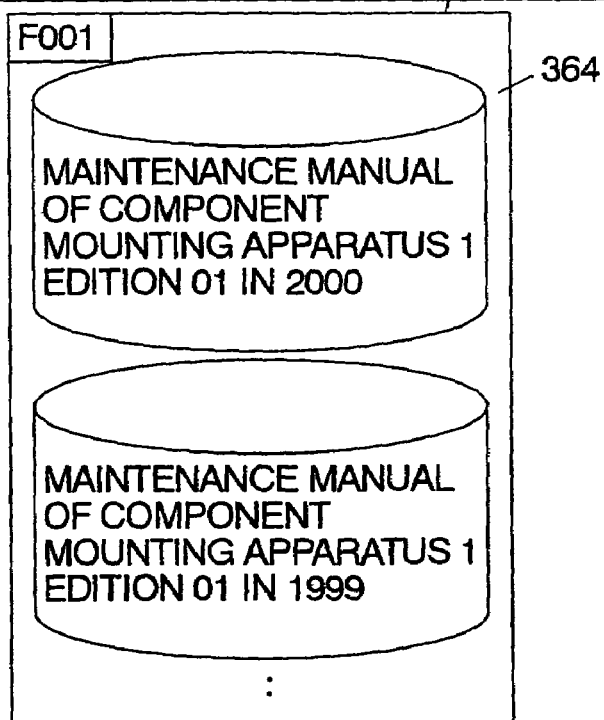
FIG. 35 is a configuration view of a maintenance information DB in the third embodiment.

In the maintenance information DB 325, the maintenance information 363 corresponding to each section can be retrieved for each type of the component mounting apparatuses k as shown in FIG. 35 illustrating the contents thereof. As the respective sections, there are the placement head 4, the XY table 9, the component supplying section 11, the recognition section, and the like. By specifying these sections, the maintenance information 363 can be derived. The maintenance information 363 consists of the contents of errors, the contents of inconveniences occurred in the past, and methods of coping with them. By specifying the type of the component mounting apparatus k and a section name for the maintenance information DB 325, a list of the contents of inconveniences occurred in the past can be extracted so as to know methods of coping with the respective extracted contents of inconveniences. The contents of a coping method is, for example, the necessity of replacement of mending parts, or the necessity of upgrade of a software.

As another extracting method, the type of the component mounting apparatus k, a section name, and the contents of an inconvenience may be specified in the maintenance information DB 325 so as to extract a method of coping with the inconvenience. As a result, since a recovery method or preventive measures for an error actually occurring in the component mounting apparatus k, which is desired to be urgently eliminated, can be quickly extracted from the enormous maintenance information, the error shutdown time of the component mounting apparatus k can be minimized so as to prevent the recurrence of that error.

The maintenance information DB 325 stores a maintenance code corresponding to an address where a maintenance manual is present for each type of each component mounting apparatus k as shown in FIG. 35. The maintenance code allows the retrieval of the electronic file 364 of a maintenance manual of the corresponding type of a component mounting apparatus. Herein, the maintenance manual consists of information necessary for maintenance such as regular check, a control wiring diagram, a sequence control diagram, and the like in addition to the above-described maintenance information 363. Since the maintenance manual is stored for each issuance number consisting of the year of issuance and a serial number, not only the latest version but also an older maintenance manual can be consulted. The latest version of the maintenance manual can be provided at any time.

(g) Software DB 326

Figure 36:
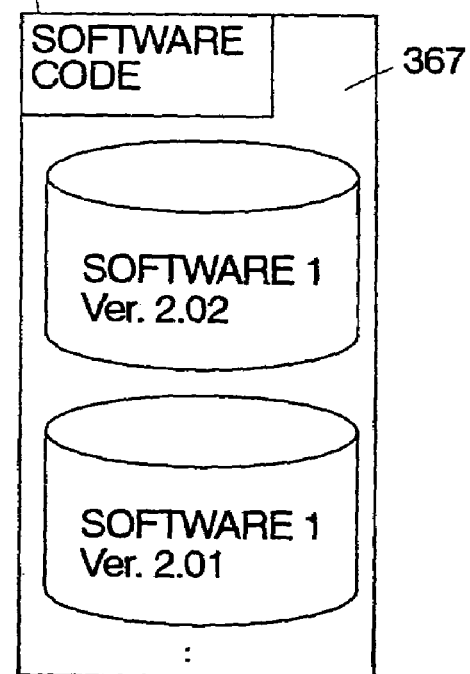
FIG. 36 is a configuration view of a software DB in the third embodiment.

In the software DB 326, as shown in FIG. 36 illustrating the contents thereof, the upgrade information 366 and a software code corresponding to the type of a software can be retrieved for each type of each component mounting apparatus k. Although the type of a software is indicated as a software 1, a software 2, . . . in the drawing, for example, an operation control software, a positioning software for a component supplying section, and the like are cited. The upgrade information 366 consists of the contents of upgrade of a software over each version of the software, for example, the contents of eliminated inconveniences, the contents of improved operability and functions, and the like.

A software code indicates an address where the corresponding software is present. The software code allows the retrieval of a software 367 of the corresponding type of component mounting apparatus. In addition of the latest version of the software 367, its older version can also be retrieved.

(h) Mounted Component DB 327

The mounted component DB 327 is present for each shape code of components as shown in FIG. 37 illustrating the contents thereof. The mounted component DB 327 consists of the classification of classified components, common data 369 such as component size which is common to the types of the component mounting apparatuses k, and mounting condition data 370 peculiar to each type of each component mounting apparatus k. The specific contents are similar to those of the component library 241 of FIG. 23. For example, the common data 369 is a length, a width, a thickness of a component, the style of packing provided by a tape, or the like. The mounting condition data 370 contains a moving speed of the placement head 4, a moving speed of the XY table 9, the type of the component suction nozzle 7 to be used, and the like, and also contains recognition data. By these data, a shape code and the type of the component mounting apparatus k are specified in the mounted component DB 327 so as to retrieve and extract the contents of the component library 241. Naturally, it is possible to specify the type of the component mounting apparatus k so as to fetch out a component library of all shape codes registered for the specified type of component mounting apparatus.

With this mounted component DB 327, it is possible to store the component library 241 in a centrally managed manner as new mounting know-how so that the component library 241 serving as the latest know-how can be easily retrieved from the service receiving device 1 from anywhere of the world. Therefore, the latest component library 241 which is necessary for a user can be immediately and certainly acquired. As a result, even with a complicated mounting technique which is conventionally likely to cause a trouble due to wrong operation, the mount production can be realized based on the already established latest know-how without establishing the know-how with a production loss upon start-up in a trial and error process.

Moreover, by specifying the type of a component, it is possible to acquire a component library of shape codes within the specified range, for example, so as to extract all shape codes of a rectangular chip. As a result, a component library of the type within the range used by a user for production can be fetched out so as to be managed and stored without fetching out a component library of all components so as to prevent the occupation of an enormous storage capacity due to management of the component library including unnecessary components. Therefore, the effective operation is possible.

(i) Mounting Technique DB 328

From the mounting technique DB 328, as shown in FIG. 38 illustrating the contents thereof, mounting technique information such as cream solder information, adhesive information, and reflow information can be retrieved to be extracted for each board condition. The board conditions are a material or a thickness of a circuit board, the type of a component to be mounted, a closely adjacent status of a lead pitch of SOP or QFP, and the like. All existing conditions such as a condition 1, a condition 2, . . . are assumed. The matching condition is retrieved so as to extract the corresponding mounting technique information. The cream solder information is information relating to a material, a viscosity, a temperature, and the like of a cream solder. The adhesive information is information relating to a material, a viscosity, a temperature, and the like of an adhesive to be applied. The reflow information is a temperature profile, a conveying speed of a board in a furnace, and the like.

(j) Optimization Software DB 329

Figure 39:
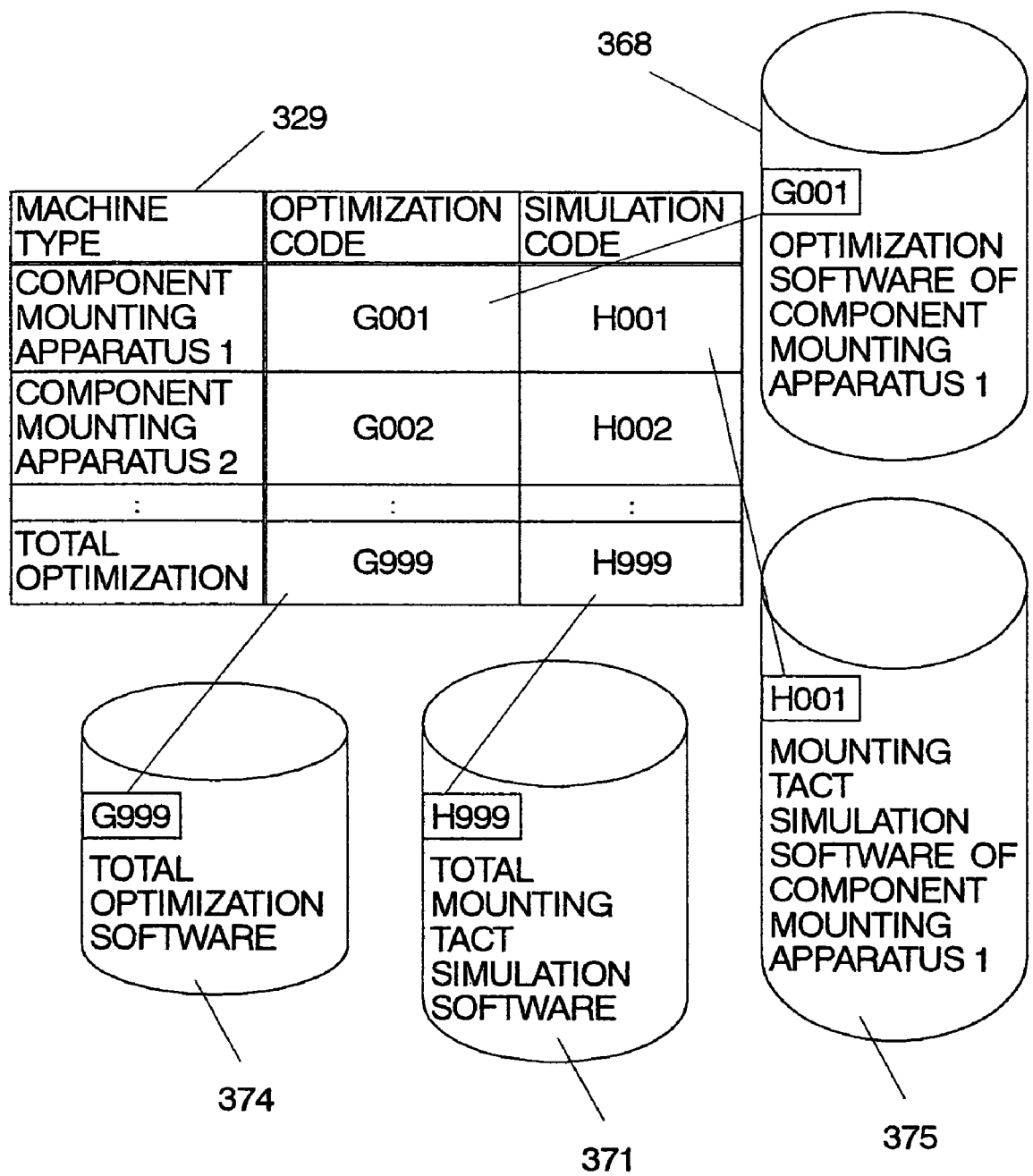
FIG. 39 is a configuration view of an optimization software DB in the third embodiment.

The optimization software DB 329 stores, as shown in FIG. 39 illustrating the contents thereof, an optimization code corresponding to an address where an optimization software is present and a simulation code corresponding to an address where a mounting tact simulation software is present for each type of each component mounting apparatus k. The optimization code allows the retrieval of an optimization software 368 of the corresponding type of component mounting apparatus, whereas the simulation code allows the retrieval of a mounting tact simulation software 375 of the corresponding type of component mounting apparatus.

The optimization software 368 performs the optimization so as to reduce the mounting time for one component mounting apparatus k, including the optimization of the component mounting order of a single component mounting apparatus and the arrangement of the component supplying device 5. When "total optimization" is selected in the type of a component mounting apparatus, a total optimization software 374 for total optimization of the component mounting line 100 can be retrieved. The total optimization software 374 performs the distribution of mounted components and applied components to the component mounting apparatuses k including the respective placement machines n108 of the component mounting line 100 in consideration of the mounting tact balance and the creation of common component arrangement which is the arrangement of the component supplying devices 5 common to a plurality of types of products.

The mounting tact simulation software 375, for example, reads the NC data 220 of a single placement machine so as to theoretically calculate the amount of placement time in consideration of a tact loss of a single placement machine. When "total optimization" is selected for the type of machine, a total mounting tact simulation software 371 for performing the total mounting tact simulation of the component mounting line 100 can be retrieved. The total mounting tact simulation software 371 theoretically calculates the mounting tact balance of the component mounting line 100 or the amount of production time of the types of product produced in total for one day.

Since the optimization software DB 329 allows various optimization softwares 368 or mounting tact simulation software 375 necessary for each type of the component mounting apparatus k or each usage to be accumulated in the database so that the software matching the type of machine or the usage can be retrieved to be fetched out, the optimization of the mounting order and the tact simulation applicable to the type of the component mounting apparatus k, in which a tact loss is desired to be eliminated, can be quickly provided. As a result, the already established optimization know-how is reflected into the mounting order so as to realize high-efficiency production without establishing the know-how of eliminating the tact loss of the component mounting apparatus k by a user himself/herself in a trial and error process.

(k) Monitoring and Analysis Software DB 330

Figure 40:
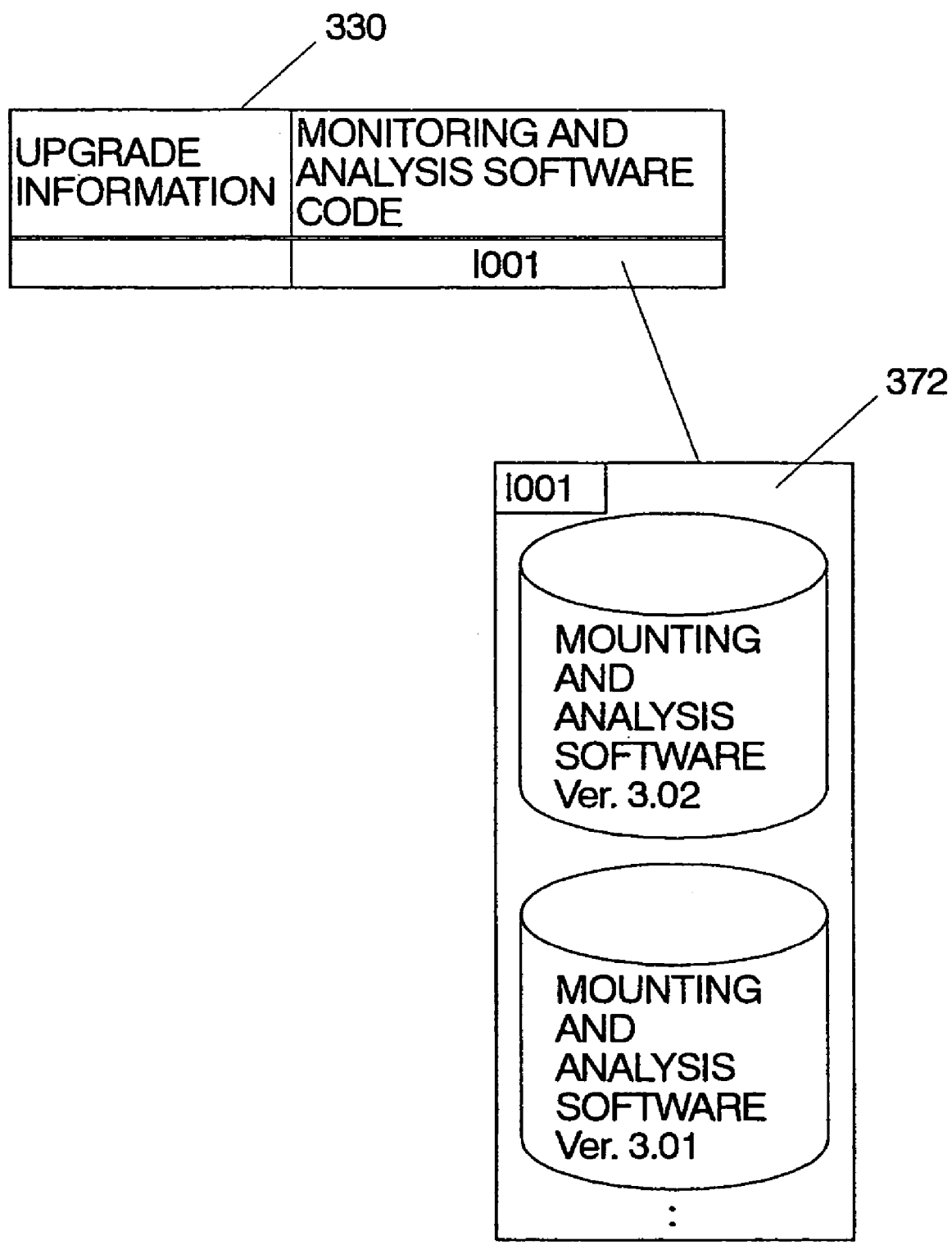
FIG. 40 is a configuration view of a monitoring and analyzing software DB in the third embodiment.

The monitoring and analysis software DB 330 stores, as shown in FIG. 40 illustrating the contents thereof, upgrade information in which the upgraded contents of each version of the monitoring and analysis software are stored and a monitoring and analysis software code corresponding to an address where the monitoring and analysis software is present. The monitoring and analysis software code allows the retrieval of the corresponding monitoring and analysis software 372. Not only the latest version but also the previous versions of the monitoring and analysis software 372 can be retrieved.

The monitoring and analysis software 372 is a software for causing the service providing device 2 to carry out a service for monitoring the quality and an operation status of the component mounting line 100 via the network 60 and furthermore, when the abnormality occurs during the monitoring, a service for analyzing its cause and for giving feedback as countermeasures to the component mounting line 100.

With this monitoring and analysis software DB 330, the monitoring and analysis software 372 for monitoring and analyzing a production status of a mounting factory, in which the latest monitoring and analysis know-how is accumulated, is centrally managed in a database. Since this database is capable of further accumulating the latest know-how in a successive manner, the already established and proven monitoring and analysis know-how can be provided at any time from anywhere of the world without establishing the monitoring and analysis know-how in a trial and error process by a user himself/herself. As a result, a monitoring and analysis service resulting from the same know-how can be provided for a user in any zone of the world, so that each user of the world can realize the production of the uniform quality. The monitoring and analysis software 372 can be executed in the service receiving device 1 on the user side.

(2-7) Control Section 301

The control section 301 reads out a service providing program from a program area 303 of the memory section 302 so as to execute a service providing program. As a result of this, the following various functions can be realized so that the service providing device 2 provides a service required by the service receiving device 1.

(a) Derivation of the Service Data 215 and the Service Program 216

In accordance with a derivation request from the service receiving device 1 via the transmitting/receiving section 305, the control section 301 derives the service data 215 and the service program 216 from the service information DB 26 so as to transmit them to the service receiving device 1 via the transmitting/receiving section 305. Herein, in actual, even if the control section 301 derives the service data 215 and the service program 216 from the service information DB 26 in response to a derivation request from the service receiving device 1 as described above, the service data 215 and the service program 216 are derived from the service information DB 26 by the service receiving device 1, in terms of results. Therefore, it is determined that the meaning of derivation of the service data 215 and the service program 216 from the service information DB 26 by the service receiving device 1 includes the derivation of the service data 215 and the service program 216 from the service information DB 26 in accordance with a derivation request from the service receiving device 1. Moreover, the meaning naturally includes the actual derivation of the service data 215 and the service program 216 from the service information DB 26 directly by the service receiving device 1.

The service receiving device 1 may be a mere terminal so that the control section 301 displays a WEB screen on the display section 25 of the service receiving device 1 on which a menu is invited to be selected, in accordance with a service providing program operating on the service providing device 2. In this case, a derivation request for a service corresponding to the selected menu is input to the control section 301. The control section 301 derives the requested service from the service information DB 26 so as to output it to the service receiving device 1. This case is also included in the meaning of derivation of the service data 215 and the service program 216 from the service information DB 26 by the service providing device 1.

Moreover, the control section 301 derives the service data 215 and the service program 216 from the service information DB 26 in response to a derivation request indicated by an operator operating the service providing device 2 using the display section 307 or the input section 306 so as to output them to the display section 307 or transfer them to the service receiving device 1 via the transmitting/receiving section 305. The control section 301 registers the input service data 216 and service program 216 in the service information DB 26 in response to an instruction from the display section 307 or the input section 306.

The specific contents for deriving the service data 215 and the service program 216 from the service information DB 26 are as follows.

The control section 301 uses the contract DB 320 for retrieval while specifying a user of the destination of delivery of a component mounting apparatus so as to consult or update the contents of a contract such as the level of a contract. The control section 301 registers the delivery result information 217 such as the type of the delivered component mounting apparatus k, the number of delivered component mounting apparatuses, the delivery date and the like, which is uploaded from the service receiving device 1 via the transmitting/receiving section 305, in the contract DB 302 while specifying the user of the destination of delivery of the component mounting apparatus. The control section 301 registers in the contract DB 320 if the service data 215 and the service program 216 of the type of machine having the delivery result are automatically transmitted at timing of revision or upgrade of the service data 215 and the service program 216 while specifying the user of the destination of delivery of the component mounting apparatus.

Furthermore, the control section 301 uses the business information DB 321 for retrieval while specifying the type of the component mounting apparatus k or specification conditions of the component mounting apparatus so as to extract a catalog or a specification of the corresponding component mounting apparatus k. The specification conditions of the component mounting apparatus k are a placement tact, a placement accuracy, a price, and a placeable component and the like.

Moreover, the control section 301 uses the instruction manual DB 322 for retrieval while specifying the type of the component mounting apparatus k so as to extract the electronic file 355 of an instruction manual of the corresponding component mounting apparatus k. Unless otherwise specified upon retrieval, the electronic file 355 of the latest version of the instruction manual is extracted. If an issuance number is specified, the electronic file 355 of an instruction manual of the specified issuance number is extracted.

Moreover, the control section 301 uses the mending parts DB 323 for retrieval while specifying a mending parts number so as to extract the stock information for the corresponding mending parts number. The control section 301 also registers the number, the delivery date, and a dealing point of mending parts to be arranged in the mending parts DB 323 while specifying a user name and the mending parts number. At this point, the control section 301 determines and registers a dealing point in consideration of the number of mending parts specified by the user, a point capable of responding to the delivery date, and if the point is geographically the closest to the user or not.

The control section 301 uses the virtual training DB 324 for retrieval while specifying the type of the component mounting apparatus k so as to extract the virtual training software 361 of the corresponding component mounting apparatus k.

The control section 301 uses the maintenance information DB 325 for retrieval while specifying the type of the component mounting apparatus k and each section of the component mounting apparatus k so as to extract the maintenance information 363 of the corresponding section of the corresponding component mounting apparatus k. Each section of the component mounting apparatus k is the placement head 4, the XY table 9, the component supplying section 11, or the like. The maintenance information 363 consists of the contents of errors or the contents of inconveniences occurred in the past and methods for coping with them. The control section 301 uses the maintenance information DB 325 for retrieval while specifying the type of the component mounting apparatus k so as to extract the electronic file 364 of the maintenance manual of the corresponding component mounting apparatus k. The maintenance manual is constituted by information required for maintenance such as regular check, a control wiring diagram, a sequence control diagram and the like in addition to the above-described maintenance information 363. Unless otherwise specified upon retrieval, the electronic file 364 of the latest version of the maintenance manual is extracted. If an issuance number is specified, the electronic file 364 of the maintenance manual of the specified issuance number is extracted.

The control section 301 uses the software DB 326 for retrieval while specifying the type of the component mounting apparatus k and the kind of a software so as to extract the upgrade information 366 of the corresponding kind of a software of the corresponding component mounting apparatus k and the software 367. As the kind of a software, an operation control software, a positioning software of the component supplying section 11, and the like are cited. The upgrade information 366 consists of the contents of upgrade of a software over each version of a software, for example, the contents of eliminated inconveniences, the contents of improvement in operability and functions, and the like. Unless otherwise specified upon retrieval, the software 367 of the latest version is extracted. If a version number is specified, the software 367 of the specified version number is extracted.

The control section 301 uses the mounted component DB 327 for retrieval while specifying a shape code and the type of the component mounting apparatus k so as to extract the component library 241 of the corresponding component mounting apparatus k of the corresponding shape code. The control section 301 uses the mounted component DB 327 for retrieval while specifying the type of the component mounting apparatus k so as to extract the component library 241 of all shape codes of the corresponding component mounting apparatus k. Furthermore, the control section 301 uses the mounted component DB 327 for retrieval while specifying the classification of a component and the type of the component mounting apparatus k so as to extract the component library 241 of the corresponding component mounting apparatus k of a shape code included in the corresponding classification. The classification corresponds to classification of components, for example, "rectangular chip," "QFP," and the like.

The control section 301 uses the mounting technique DB 328 for retrieval while specifying a board condition so as to extract mounting technique information of the corresponding board condition. The substrate conditions are a material or a thickness of a circuit board, the type of a component to be mounted, a closely adjacent status of a lead pitch of SOP or QFP, and the like. The mounting technique information is the cream solder information, the adhesive information, the reflow information, or the like. The cream solder information is information relating to a material, a viscosity, a temperature, and the like of a cream solder. The adhesive information is information relating to a material, a viscosity, a temperature, and the like of an adhesive to be applied. The reflow information is a temperature profile, a conveying speed of a board in a furnace.

The control section 301 uses the optimization software DB 329 for retrieval while specifying the type of the component mounting apparatus k so as to extract the optimization software 368 of the corresponding component mounting apparatus k. The optimization software 368 performs, for example, the optimization of the component mounting order for a single placement machine or the arrangement for the component supplying device 5. When "total optimization" is selected for the type of a machine, the control section 301 can use the optimization software DB 329 for retrieval so as to retrieve the total optimization software 374 for performing the total optimization of the component mounting line 100. The total optimization software 374 performs the distribution of components to the respective placement machines of the component mounting line 100 in consideration of the mounting tact balance, the creation of common component arrangement which is the arrangement of the component supplying device 5 common to a plurality of types of products, the optimization of the component placement order for each single placement machine and the arrangement of the component supplying device 5. The control section 301 uses the optimization software DB 329 for retrieval while specifying the type of the component mounting apparatus k so as to extract the mounting tact simulation software 375 of the corresponding component mounting apparatus k. The mounting tact simulation software 375 reads, for example, the NC data 220 of a single placement machine so as to perform a theoretical calculation of placement time in consideration of a tact loss of a single placement machine. When "total optimization" is selected for the type of machine, the total mounting tact simulation software 371 for performing the total mounting tact simulation of the component mounting line 100 can be retrieved. The total mounting tact simulation software 371 performs a theoretical calculation of the mounting tact balance of the component mounting line 100 and a theoretical calculation of the production time of the types of products produced in total for one day.

The control section 301 uses the monitoring and analysis software DB 330 for retrieval so as to extract the monitoring and analysis software 372. The monitoring and analysis software 372 is a software for causing the service providing device 2 to carry out a service for monitoring the quality and an operation status of the component mounting line 100 via the network 60 and further, when the abnormality occurs during the monitoring, a service for analyzing its cause and giving feedback as countermeasures to the component mounting line 100. The control section 301 executes the monitoring and analysis software 372 to collect the facility information 211, the mounting tact information 213, and the inspection result information 212 from the service receiving device 1 so as to accumulate the collected facility information 211, mounting tact information 213, and inspection result information 212 in the operation quality information DB 51. The control section 301 monitors a production status based on these accumulated information. If the control section 301 finds a problem, the control section 301 analyzes its cause so as to give feedback to the service receiving device 1.

(b) Collection of the Facility Information 211, the Mounting Tact Information 213, the Inspection Result Information 212, and the Delivery Result Information 217

The control section 301 automatically judges the timing for collecting the facility information 211, the mounting tact information 213, the inspection result information 212, and the delivery result information 217 so as to instruct a collection request of the facility information 211, the mounting tact information 213, the inspection result information 212, and the delivery result information 217 to the transmitting/receiving section 305. The control section 301 receives the facility information 211, the mounting tact information 213, and the inspection result information 212 for each component mounting apparatus from the transmitting/receiving section 305 so as to store them in the data area 304 of the memory section 302 for each component mounting apparatus k. The control section 301 also receives the delivery result information 217 for each user from the transmitting/receiving section 305 so as to store it in the data area 304 of the memory section 302.

The timing for automatically collecting the facility information 211, the mounting tact information 213, the inspection result information 212, and the delivery result information 217 can be arbitrarily set. For example, these information may be collected for each hour. Alternatively, the facility information 211, the mounting tact information 213, the inspection result information 212, and the delivery result information 217 for one day may be stored in the service receiving device 1 so as to be collected from the service receiving device 1 once a day. Further alternatively, the timing other than this may be used. Furthermore, the collection in the short term or in the long term may be determined depending on the urgency of analyzing the quality and an operation status. Furthermore, the facility information 211, the mounting tact information 213, the inspection result information 212, and the delivery result information 217 may be collected by the operation of an operator.

(c) Collection and Transmission of the NC Data 220

After collection of the mounting tact information 213, the control section 301 instructs the transmitting/receiving section 305 to collect, from the service receiving device 1, the NC data 220 of the production type upon collection of the mounting tact information 213 in the component mounting line 100 of the same factory of the destination of delivery of a component mounting apparatus where the component tact information 213 is collected. When the control section 301 receives the NC data 220 instructed by the transmitting/receiving section 305, the NC data 220 is stored in the data area 304 of the memory section 302 for each component mounting apparatus k. The theoretical calculations of a mounting tact and a tact loss are performed by using the collected NC data 220 and the speed master 414 and the tact simulation parameter 413 stored in the data area 304 of the memory section 302. The resulting theoretical values of the mounting tact and the tact loss are written in the data area 304 of the memory section 302 so as to add them to the mounting tact information 213.

The details of the above-described theoretical calculations of the mounting tact and the tact loss, that is, the mounting tact simulation will be described below.

Although the example where the tact loss is obtained by tact simulation has been described, it is not limited thereto. The tact loss may be detected in the component mounting apparatus k including the placement machine n108. The tact loss may be collected and included in the mounting tact information 213 so as to be stored in the data area 304 of the data memory section 302. As an example, a method of detecting a tact loss in the placement machine n108 may be for measuring the amount of time from the beginning of movement of the component supplying device 5 or the XY table 9 to the end of positioning so as to detect the amount of excess from the standard tact as a tact loss.

With the detection of a tact loss in the component mounting apparatus k in this manner, the tact loss is an absolute result value, resulting in better accuracy of the tact loss. Moreover, since it is no more necessary to perform the tact simulation each time the mounting tact information 213 is updated in the service providing device 2, the load on the service providing device 2 is reduced. However, there are actually few component mounting apparatuses k from which the tact loss is detected. Even if there is the component mounting apparatus k from which the tact loss is detected, it is believed that there are few cases where the tact loss is detected from all the component mounting apparatuses k of the component mounting line 100. Therefore, it is considered that the calculation of a tact loss by tact simulation is considerably effective in view of the system architecture.

The control section 301 reads out the NC data 220, which has been optimized by the NC data optimization function, from the data area 304 of the data memory section 302. Then, the control section 301 outputs the readout NC data 220 to the transmitting/receiving section 305 for transmission to the service receiving device 1.

(d) Mounting Tact Simulation

The mounting tact simulation is a function for performing the theoretical calculation of a mounting tact based on the NC data 220 after optimization (NC data prior to optimization may be used). The theoretical calculation of a mounting tact to a circuit board and the theoretical calculation of replacement time of the component supplying device 5 upon type switching are performed.

The control section 301 activates the mounting tact simulation software 375 of the corresponding type of the component mounting apparatus k for the mounting tact simulation software 375 stored in the program area 303 of the memory section 302, which software 375 is retrieved from the service information DB 26, thereby executing the mounting tact simulation.

Hereinafter, a theoretical calculation method of a placement tact will be described for an example of the high-speed placement machine.

A standard tact in each placed component (corresponding to a standard placement tact per point), an allowable movement range of the XY table 9 within the standard tact, and an allowable movement range of the component supplying device 5 within the standard tact are read from the speed master 414 and the tact simulation parameter 413 which are stored in the data area 304 of the memory section 302. Then, a theoretical value of the placement tact is calculated based on a relative moving distance from the previous placement position of the XY table 9 or the component supplying device 5 upon placement of each component, which is obtained from the corresponding NC data 220 stored in the data area 304 of the memory section 302. Specifically, a calculation method will be described below. First, a standard placement tact is calculated by using Formula I.

Standard placement tact=(loading time)+Σ((standard placement tact per point of a component)×(the number of components))+(tool change time)× (the number of changes)   (Formula I)

Herein, the loading time and the tool change time are obtained by retrieving a placement machine name from the speed master 414. Moreover, the standard placement tact per point of a component is obtained by retrieving a placement machine name and a shape code from the speed master 414. The number of components is obtained by counting the number of steps for placing the corresponding component from the NC program 221. The number of changes is obtained by counting the frequency of changing the component suction nozzle 7 or a tool used at each of the placement steps in the NC program 221. Moreover, Σ((standard placement tact per point of a component)×(the number of components)) means a calculation of the sum of ((standard placement tact per point of a component)×(the number of components)) for all kinds of components to be placed on one circuit board. The (tool change time)×(the number of changes) is applied in the multifunctional placement machine 108b, but not in the high-speed placement machine 108a (in the high-speed placement machine 108a, the tool change time=0).

Next, in the case of the high-speed placement machine 108a, an XY table movement loss upon placement per point at each placement step will be calculated by using Formula 2.

If (XY movement amount)<=(XY allowable movement range), (XY movement loss per point)=0.

If (XY movement amount)>(XY allowable movement range), (XY movement loss per point)=((XY movement amount)−(XY allowable movement range))/(XY speed).   (Formula 2)

Herein, the XY movement amount is the amount of relative movement of the XY table 9 from the previous placement position upon placement per point at each placement step, whereas the XY allowable movement range is an allowable movement range of the XY table 9 within the standard tact retrieved from the tact simulation parameter 413 with the corresponding placement speed. The XY movement loss per point is an XY table movement loss upon placement per point at each placement step, and the XY speed is a movement speed of the XY table 9 retrieved with the corresponding placement speed from the tact simulation parameter 413.

Next, in the case of the high-speed placement machine 108a, a component supplying device movement loss upon placement per point at each placement step will be calculated by using Formula 3.

If (Z movement amount)<=(Z allowable movement range), (Z movement loss per point)=0.

If (Z movement amount)>(Z allowable movement range), (Z movement loss per point)=((Z movement amount)−(Z allowable movement range))/(Z speed).   (Formula 3)

Herein, the Z movement amount is the amount of relative movement of the component supplying device 5 from the position at the previous placement step upon placement per point at each placement step, whereas the Z allowable movement range is an allowable movement range of the component supplying device 5 within the standard tact retrieved from the tact simulation parameter 413 with the corresponding placement speed. The Z movement loss per point is a component supplying device movement loss upon placement per point at each placement step, and the Z speed is a movement speed of the component supplying device 5 retrieved from the tact simulation parameter 413 with the corresponding placement speed.

Next, the XY table movement loss is calculated. The XY table movement loss is calculated by using Formula 4.

(XY table movement loss)=Σ((XY movement loss per point) establishing ((XY movement loss per point)>=(Z movement loss per point))).   (Formula 4)

Herein, the XY table movement loss is the sum of tact losses relating to movement of the XY table 9 when the placement is performed for one circuit board. Moreover, Σ((XY movement loss per point) establishing ((XY movement loss per point)>=(Z movement loss per point))) means the sum of XY table movement losses of the placement step at which the XY table movement loss upon placement per point at each placement step is equal to or larger than the component supplying device movement loss.

Similarly, the component supplying device movement loss is calculated. The component supplying device movement loss is calculated by using Formula 5.

(Component supplying device movement loss)=Σ((Z movement loss per point) establishing ((Z movement loss per point)>(XY movement loss per point))).   (Formula 5)

Herein, the component supplying device movement loss is the sum of tact losses relating to movement of the component supplying device upon placement for one circuit board. Moreover, Σ((Z movement loss per point) establishing ((Z movement loss per point)>(XY movement loss per point))) means the sum of Z movement losses at the placement step at which the Z movement loss upon placement per point at each placement step is equal to or larger than the XY movement loss.

Then, a theoretical value of a placement tact is calculated by Formula 6 from the standard mounting tact calculated by Formula 1, the XY table movement loss calculated by Formula 4, and the component supplying device movement loss calculated by Formula 5.

(Theoretical value of placement tact)=(standard placement tact)+(XY table movement loss)+(component supplying device movement loss). (Formula 6)

There is also provided a function for comparing a placement tact result value corresponding to a result value obtained by placement production by the same NC data 220 with the theoretical value of the mounting tact calculated by (Formula 6) so as to check if a difference between them is within the range of error. If it is judged not to be within the range of error, each parameter of the tact simulation parameters 413 is adjusted so that the difference falls within the range of error.

Moreover, the above-described Formula 2 to Formula 6 are for calculating theoretical values of the tact loss and the placement tact of the high-speed placement machine 108a. Although a formula is omitted for the multifunctional placement machine 108b, a tact loss is similarly calculated. In the case of the multifunctional placement machine 108b, since the placement head 4 moves between the supplying position of the component supplying device 5 and the placement position on the circuit board 10 by the XY robot 14, a moving distance is calculated. When this moving distance exceeds the allowable movement range within the standard tact, a tact loss is calculated based on the amount of excess of movement. A theoretical value of the placement tact can be obtained by the addition of the sum of the tact losses at all placement steps and the standard placement tact calculated by Formula 1. In the case where a plurality of components are simultaneously sucked by providing a plurality of the placement heads 4, a moving distance of the placement heads 4 is calculated in accordance with a movement operation of simultaneous suction.

A theoretical value of mounting time of the component mounting apparatus k other than the placement machine n108 is calculated in a method according to a mounting operation of that component mounting apparatus k.

(3) Control Configuration of the Service Receiving Device 1

Figure 26:
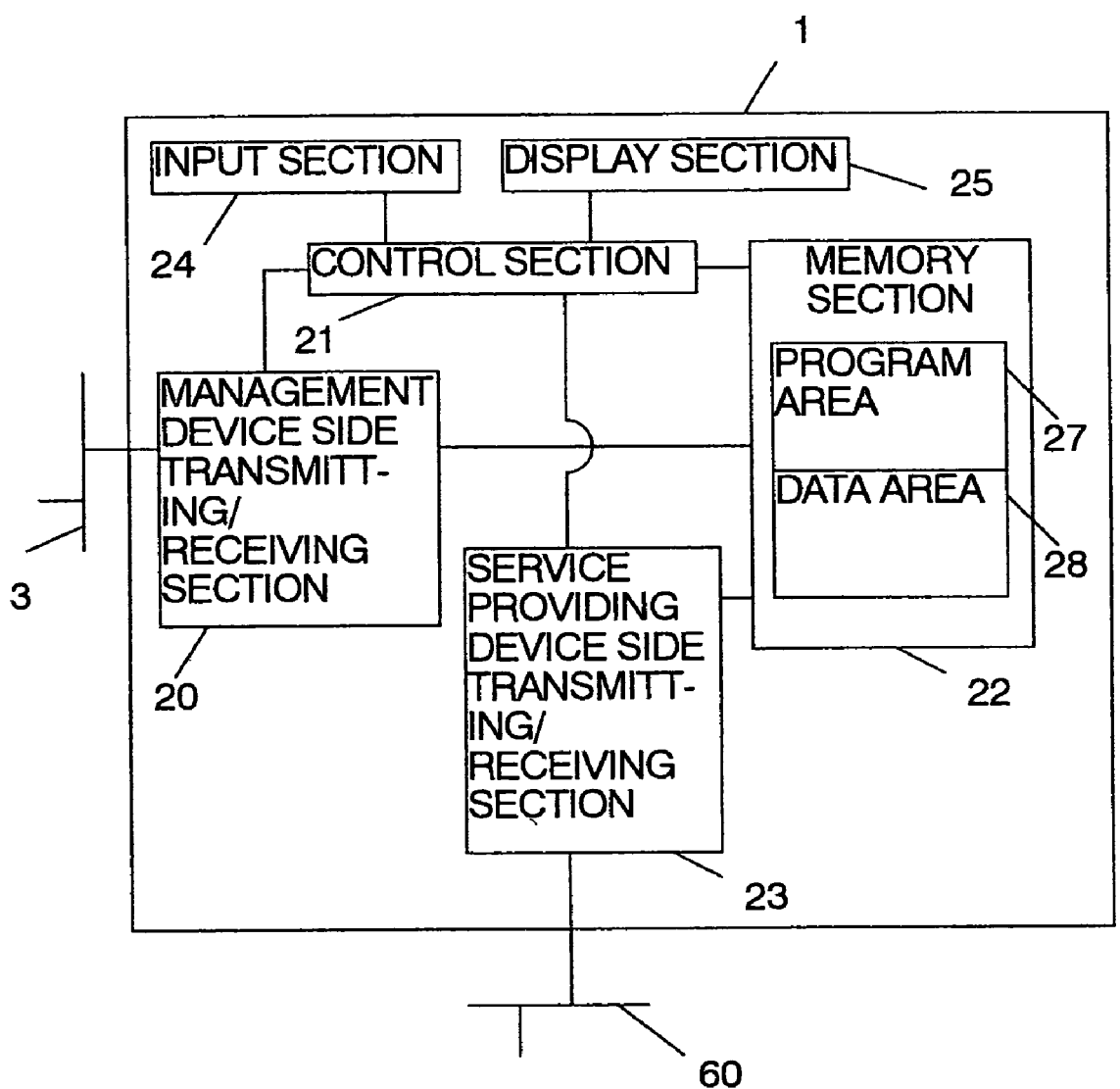
FIG. 26 is a control configuration view of a service receiving device in the third embodiment.

A control configuration of the service receiving device 1 will be described using FIG. 26.

The service receiving device 1 is constituted by: a management device side transmitting/receiving section 20, a service providing device side transmitting/receiving section 23, a memory section 22, a control section 21, an input section 24, and a display section 25. The management device side transmitting/receiving section 20 is connected to the network 3 so as to be capable of transmitting and receiving information to and from the service receiving device side transmitting/receiving section 406 of the management device 101 at a factory of the destination of delivery of each component mounting apparatus. The service providing device side transmitting/receiving section 23 is connected to the network 60 so as to be capable of transmitting and receiving information to and from the service providing device 2.

(3-1) Memory Section 22

The memory section 22 is constituted by a program area 27 and a data area 28.

A service receiving program for performing an operation in the following procedure so that the service receiving device 1 realizes various functions for deriving desired services from the service providing device 2 is installed and stored in advance in the program area 27. Moreover, the service program 216 derived from the service providing device 2 is stored in the program area 27. The service receiving program and the service program 216 can be installed and sold via a storage medium such as a floppy disk or a CD-ROM or a transmission medium such as the Internet.

In the data area 28, the facility information 211, the mounting tact information 213, and the NC data 220 of each component mounting apparatus k at each factory of the destination of delivery of a component mounting apparatus are stored. Moreover, the inspection result information 212 of each inspection machine and the delivery result information 217 of each user are stored in the data area 28. Furthermore, the service data 215 derived from the service providing device 2 is stored therein.

The facility information 211 is the result information uploaded from each component mounting apparatus k and is stored for each component mounting apparatus k. The mounting tact information 213 includes the mounting tact result value uploaded from each component mounting apparatus k and is stored for each component mounting apparatus. The inspection result information 212 is the result information uploaded from each inspection machine and is stored for each inspection machine. The delivery result information 217 is the result information which is created in the management device 101 of each factory to be uploaded, and is stored for each user. The NC data 220 is to be downloaded to each component mounting apparatus k or is uploaded from each component mounting apparatus k, and is stored for each component mounting apparatus k.

The service data 215 and the service program 216 are derived from the service providing device 2 to be transferred to the management device 101 of each factory. However, there is a possibility that the service program 216 may be executed in the service receiving device 1.

(3-2) Management Device Side Transmitting/Receiving Section 20

The management device side transmitting/receiving section 20 receives a request for collecting the facility information 211, the mounting tact information 213, the inspection result information 212, the delivery result information 217, and the NC data 220 from the control section 21 while specifying a factory at the destination of delivery of a component mounting apparatus. The facility information 211, the mounting tact information 213, the inspection result information 212, the delivery result information 217, and the NC data 220 are uploaded from the management device 101 at a specified factory of the destination of delivery of a component mounting apparatus via the network 3 so as to be written into the data area 28 of the memory section 22.

The management device side transmitting/receiving section 20 receives a request for transmitting the NC data 220, the service data 215, and the service program 216 from the control section 21 while specifying a factory at the destination of delivery of a component mounting apparatus. Then, the transmitting/receiving section 20 transmits them to the management device 101 via the network 3.

(3-3) Service Providing Device Side Transmitting/Receiving Section 23

The service providing device side transmitting/receiving section 23 receives a derivation request from the control section 21 to derive the service data 215 and the service program 216 from the service providing device 2 via the network 60 so as to write them into the data area 28 of the memory section 22.

Moreover, in response to an upload request of the facility information 211, the mounting tact information 213, the inspection result information 212, the delivery result information 217, and the NC data 220 from the service providing device 2, the service providing device side transmitting/receiving section 23 transmits the facility information 211, the mounting tact information 213, the inspection result information 212, the delivery result information 217, and the NC data 220 via the network 60. The service providing device side transmitting/receiving section 23 receives the download of the NC data 220 from the service providing device 2 via the network 60 so as to write it into the data area 28 of the memory section 22.

(3-4) Control Section 21

The control section 21 reads out a service receiving program from the program area 27 of the memory section 22 so as to execute the service receiving program. When the service receiving program is activated, a mounting WEB screen shown in FIG. 24 is displayed on the display section 25 so as to be in a preparation state of receiving an operation for service derivation from the display section 25 or the input section 24. As a result, the following various functions, which allows the service receiving device 1 from deriving a desired service from the service providing device 2, can be realized.

The functions of the control section 21 described below may be implemented not by the execution of the service receiving program by the control section 21 to function the service receiving device 1, but by remote control of the control section 301 of the service providing device 2 through execution of the service providing program by the control section 301 of the service providing device 2.

(a) Derivation of the Service Data 215 and the Service Program 216

The control section 21 fetches the service data 215 and the service program 216 from the service providing device 2 via the service providing device side transmitting/receiving section 23 by an operation of an operator through the display section 25 or the input section 24. Then, the service data 215 is written into the data area 28 of the memory section 22 whereas the service program 216 is written into the program area 27 of the memory section 22. The control section 21 transfers the service data 215 and the service program 216 to the management device 101 of each factory via the management device side transmitting/receiving section 20. The control section 21 reads out and execute the service program 216 stored in the memory section 22 so as to carry out a desired service in the service receiving device 1.

The specific contents of deriving the service data 215 and the service program 216 from the service providing device 2 via the service providing device side transmitting/receiving section 23 are as follows.

The control section 21 transmits an instruction for consultation or update of the contents of a contract such as the level of a contract to the service providing device 2 via the service providing device side transmitting/receiving section 23 while specifying a user name at the destination of delivery of a component mounting apparatus so as to consult or update the contents of a contract such as the level of a contract for the service providing device 2 via the service providing device side transmitting/receiving section 23. The control section 21 cause the service providing device 2 to upload the delivery result information 217 such as the type of a delivered machine, the number of delivered machines, and the delivery date of a component mounting apparatus via the service providing device side transmitting/receiving section 23. The control section 21 instructs the service providing device 2 to register the delivery result information 217 while specifying a user name of the destination of delivery of a component mounting apparatus via the service providing device side transmitting/receiving section 23. Moreover, the control section 21 instructs the service providing device 2 to register if the service data 215 and the service program 216 of the type of a machine having the delivery result are automatically transmitted at the timing of revision or upgrade of the service data 215 and the service program 216 via the service providing device side transmitting/receiving section 23 while specifying a user name at the destination of delivery of a component mounting apparatus.

The control section 21 instructs the service providing device 2 to extract a catalog or a specification of the corresponding component mounting apparatus k via the service providing device side transmitting/receiving section 23 while specifying the type of the component mounting apparatus k or a specification condition of the component mounting apparatus k, thereby extracting a catalog or a specification of the corresponding component mounting apparatus k via the service providing device side transmitting/receiving section 23 for the service providing device 2. The specification conditions of the component mounting apparatus k are a placement tact, a placement accuracy, a price, a placeable component, and the like.

The control section 21 also instructs the service providing device 2 to extract the electronic file 355 of an instruction manual of the corresponding component mounting apparatus k via the service providing device side transmitting/receiving section 23 while specifying the type of the component mounting apparatus k so as to extract the electronic file 355 of an instruction manual of the corresponding component mounting apparatus k for the service providing device 2 via the service providing device side transmitting/receiving section 23. The electronic file 355 of the latest version of an instruction manual is extracted if otherwise not specified upon retrieval. If an issuance number is specified, the electronic file 355 of an instruction manual having the specified issuance number is extracted.

Moreover, the control section 21 instructs the service providing device 2 to extract the stock information of the corresponding mending parts number via the service providing device side transmitting/receiving section 23 while specifying a mending parts number so as to extract the stock information of the corresponding mending parts number to the service providing device 2 via the service providing device side transmitting/receiving section 23. The control section 21 instructs the service providing device 2 to register the number and the delivery date of the mending parts to be arranged via the service providing device side transmitting/receiving section 23 while specifying a user name and a mending parts number so as to register the number and the delivery date of the mending parts to be arranged to the service providing device 2 via the service providing device side transmitting/receiving section 23.

The control section 21 instructs the service providing device 2 to extract the virtual training software 361 of the corresponding component mounting apparatus k via the service providing device side transmitting/receiving section 23 while specifying the type of the component mounting apparatus k so as to extract the virtual training software 361 of the corresponding component mounting apparatus k to the service providing device 2 via the service providing device side transmitting/receiving section 23.

Moreover, the control section 21 instructs the service providing device 2 to extract the maintenance information 363 of the corresponding section of the corresponding component mounting apparatus via the service providing device side transmitting/receiving section 23 while specifying the type of the component mounting apparatus k and each section of the component mounting apparatus k so as to extract the maintenance information 363 of the corresponding section of the corresponding component mounting apparatus k to the service providing device 2 via the service providing device side transmitting/receiving section 23. Each section of the component mounting apparatus k is the placement head 4, the XY table 9, the component supplying section 11, or the like. The maintenance information 363 is composed of the contents of an error or the contents of an inconvenience occurred in the past and a method for coping with them. The control section 21 instructs to extract the electronic file 364 of a maintenance manual of the corresponding component mounting apparatus k while specifying the type of the component mounting apparatus k so as to extract the electronic file 364 of a maintenance manual of the corresponding component mounting apparatus k to the service providing device 2 via the service providing device side transmitting/receiving section 23. The maintenance manual is constituted by information necessary for maintenance such as regular check, a control wiring diagram, and a sequence control diagram in addition to the above-described maintenance information 363. If not otherwise specified upon retrieval, the electronic file 364 of the latest version of the maintenance manual is extracted. If an issuance number is specified, the electronic file 364 of a maintenance manual having a specified issuance number is extracted.

The control section 21 instructs to extract the upgrade information 366 and the software 367 of the corresponding kind of a software of the corresponding component mounting apparatus k while specifying the type of the component mounting apparatus k and the kind of a software so as to extract the upgrade information 366 and the software 367 of the corresponding kind of a software of the corresponding component mounting apparatus k to the service providing device 2 via the service providing device side transmitting/ receiving section 23. As the kinds of a software, an operation control software, a positioning software of the component supplying section 11, and the like are cited. The upgrade information 366 is composed of the contents of upgrade of a software over each version of a software, for example, the contents of eliminated inconveniences, the contents of improvement in operability or functions, and the like. If not otherwise specified upon retrieval, the software 367 of the latest version is extracted. If a version number is specified, the software 367 of the specified version number is extracted.

Moreover, the control section 21 instructs to extract a component library of the corresponding component mounting apparatus k of a corresponding shape code while specifying a shape code and the type of the component mounting apparatus k so as to extract the component library of the corresponding component mounting apparatus k of the corresponding shape code to the service providing device 2 via the service providing device side transmitting/receiving section 23. Furthermore, the control section 21 instructs to extract a component library of all shape codes of the corresponding component mounting apparatus k while specifying the type of the component mounting apparatus k so as to extract the component library of all shape codes of the corresponding component mounting apparatus k to the service providing device 2 via the service providing device side transmitting/receiving section 23. Moreover, the control section 21 instructs to extract a component library of the corresponding component mounting apparatus k of a shape code including in the corresponding classification while specifying the classification of a component and the type of the component mounting apparatus k so as to extract the component library of the corresponding component mounting apparatus k of a shape code included in the corresponding classification. The classification includes a classification of components, for example, "rectangular chip," "QFP," or the like.

The control section 21 instructs to extract mounting technique information of corresponding board conditions while specifying board conditions so as to extract the mounting technique information of the corresponding board conditions to the service providing device 2 via the service providing device side transmitting/receiving section 23. The board conditions are a material or a thickness of a circuit board, the type of a component to be mounted, a closely adjacent status of a lead pitch of SOP or QFP, and the like. The mounting technique information are cream solder information, adhesive information, reflow information, and the like. The cream solder information is information of a material, a viscosity, a temperature, and the like of a cream solder. The adhesive information is information of a material, a viscosity, a temperature, and the like of an adhesive to be applied. The reflow information are a temperature profile, a speed of conveying a board in a; furnace, and the like.

The control section 21 also instructs to extract the optimization software 368 of the corresponding component mounting apparatus k while specifying the type of the component mounting apparatus k so as to extract the optimization software 368 of the corresponding component mounting apparatus k to the service providing device 2 via the service providing device side transmitting/receiving section 23. The optimization software 368 performs, for example, the optimization of the component placement order of a single placement machine or the arrangement of the component supplying device 5. If "total optimization" is selected in the type of machine, the control section 301 uses the optimization software DB 329 for retrieval so that the total optimization software 374 for performing the optimization of the component mounting line 100 in total can be retrieved. The total optimization software 374 performs the distribution of component to the respective placement machines of the component mounting line 100 in consideration of the mounting tact balance, the creation of the arrangement of a common component corresponding to the arrangement of the component supplying device 5 common to a plurality of types of production, and the optimization of the component placement order of each single placement machine or the arrangement of the component supplying device 5. Moreover, the control section 21 instructs to extract the mounting tact simulation software 375 of the corresponding component mounting apparatus k while specifying the type of the component mounting apparatus k so as to extract the mounting tact simulation software 375 of the corresponding component mounting apparatus k to the service providing device 2 via the service providing device side transmitting/receiving section 23. The mounting tact simulation software 375, for example, reads the NC data 220 of a single placement machine so as to perform a theoretical calculation of placement time in consideration of a tact loss of a single placement machine. If "total optimization" is selected for the type of a machine, the total mounting tact simulation software 371 for performing the total mounting tact simulation of the component mounting line 100 can be retrieved. The total mounting tact simulation software 371 executes a theoretical calculation of the mounting tact balance of the component mounting line 100 or a theoretical calculation of production time of the total types of production for one day.

The control section 21 instructs the execution of the monitoring and analysis software 372 in the service providing device 2 so as to execute the monitoring and analysis software 372 for the service providing device 2 via the service providing device side transmitting/receiving section 23. The monitoring and analysis software 372 is a software for allowing the service providing device 2 to execute a service for monitoring the quality and an operation status of the component mounting line 100 via the network 60 and further to execute a service for analyzing the cause of abnormality when the abnormality occurs during the monitoring and giving feedback to the component mounting line 100 for countermeasure. When the monitoring and analysis software 372 is executed in the service providing device 2, the service providing device 2 issues an instruction to collect the facility information 211, the mounting tact information 213, and the inspection result information 212 via the service providing device side transmitting/receiving section 23. As a result, the control section 21 collects the facility information 211, the mounting tact information 213, and the inspection result information 212 from the management device 101 via the management device side transmitting/receiving section 20 so as to upload these information to the service providing device 2 via the service providing device side transmitting/receiving section 23. When the analyzed result is feedbacked from the service providing device 2 via the service providing device side transmitting/receiving section 23, the control section 21 transfers the feedbacked information to the management device 101.

(b) Collection of the Facility Information 211, the Mounting Tact Information 213, the Delivery Result Information 217, and the Inspection Result Information 212

The control section 21 automatically judges the timing of collecting the facility information 211, the mounting tact information 213, the delivery result information 217, and the inspection result information 212 so as to instruct the management device side transmitting/receiving section 20 to collect the facility information 211, the mounting tact information 213, the delivery result information 217, and the inspection result information 212. Then, the control section 21 receives the facility information 211 and the mounting tact information 213 of each component mounting apparatus k from the management device side transmitting/receiving section 20 so that the data area 28 of the memory section 22 stores them for each component mounting apparatus k. The control section 21 also receives the inspection result information 212 of each inspection machine from the management device side transmitting/receiving section 20 so that the data area 28 of the memory section 22 stores it for each inspection machine. Moreover, the control section 21 receives the delivery result information 217 of each user from the management device side transmitting/receiving section 20 so that the data area 28 of the memory section 22 stores it for each user.

The timing of automatically collecting the facility information 211, the mounting tact information 213, the delivery result information 217, and the inspection result information 212 can be arbitrarily set. For example, the collection may be made for each hour for all factories at the destination of delivery of component mounting apparatuses at a time. Alternatively, it is determined that the facility information 211, the mounting tact information 213, the delivery result information 217, and the inspection result information 212 for one day are stored in the management device 101 of each factory at the destination of delivery of each component mounting apparatus, so that these information may be collected for all factories at the destination of delivery of component mounting apparatuses once a day at a time or at different timing for each factory at the destination of delivery of component mounting apparatuses. Moreover, other timing may be used. Alternatively, it may be judged whether the collection is made in the short term or in the long term depending on urgency of analyzing the quality and an operation status. Further alternatively, the facility information 211, the mounting tact information 213, the delivery result information 217, and the inspection result information 212 may be collected by the operation of an operator.

Furthermore, in response to an instruction of uploading the facility information 211, the mounting tact information 213, the delivery result information 217, and the inspection result information 212 from the service providing device 2 via the service providing device side transmitting/receiving section 23, the control section 21 reads out the facility information 211, the mounting tact information 213, the delivery result information 217, and the inspection result information 212 from the data area 28 of the memory section 22 so as to transmit them to the service providing device 2 via the service providing device side transmitting/receiving section 23.

(c) Collection and Transmission of the NC Data 220

After collection of the mounting tact information 213, the control section 21 instructs the management device side transmitting/receiving section 20 to collect the NC data 220 of the same produced type as that of the collected mounting tact information 213 at the same factory at the destination of delivery of a component mounting apparatus from which the mounting tact information 213 is collected. Upon reception of the NC data 220 instructed from the management device transmitting/receiving section 20, the data area 28 of the memory section 22 stores the NC data 220 for each component mounting apparatus k.

The control section 21 reads out the NC data 220 from the data area 28 of the data storage section 22 so as to output the readout NC data 220 to the management device side transmitting/receiving section 20 for transmission to the management device 101 of the corresponding factory at the destination of delivery of a component mounting apparatus.

In response to an instruction of upload of the NC data 220 from the service providing device 2 via the service providing device side transmitting/receiving section 23, the control section 21 reads out the NC data 220 from the data area 28 of the memory section 22 so as to transmit it to the service providing device 2 via the service providing device side transmitting/receiving section 23.

Moreover, in response to the download of the NC data 220 from the service providing device 2 via the service providing device side transmitting/receiving section 23, the control section 21 makes the data area 28 of the memory section 22 store the NC data 220.

III. Operation of the Entire Service System 380

Figure 41:
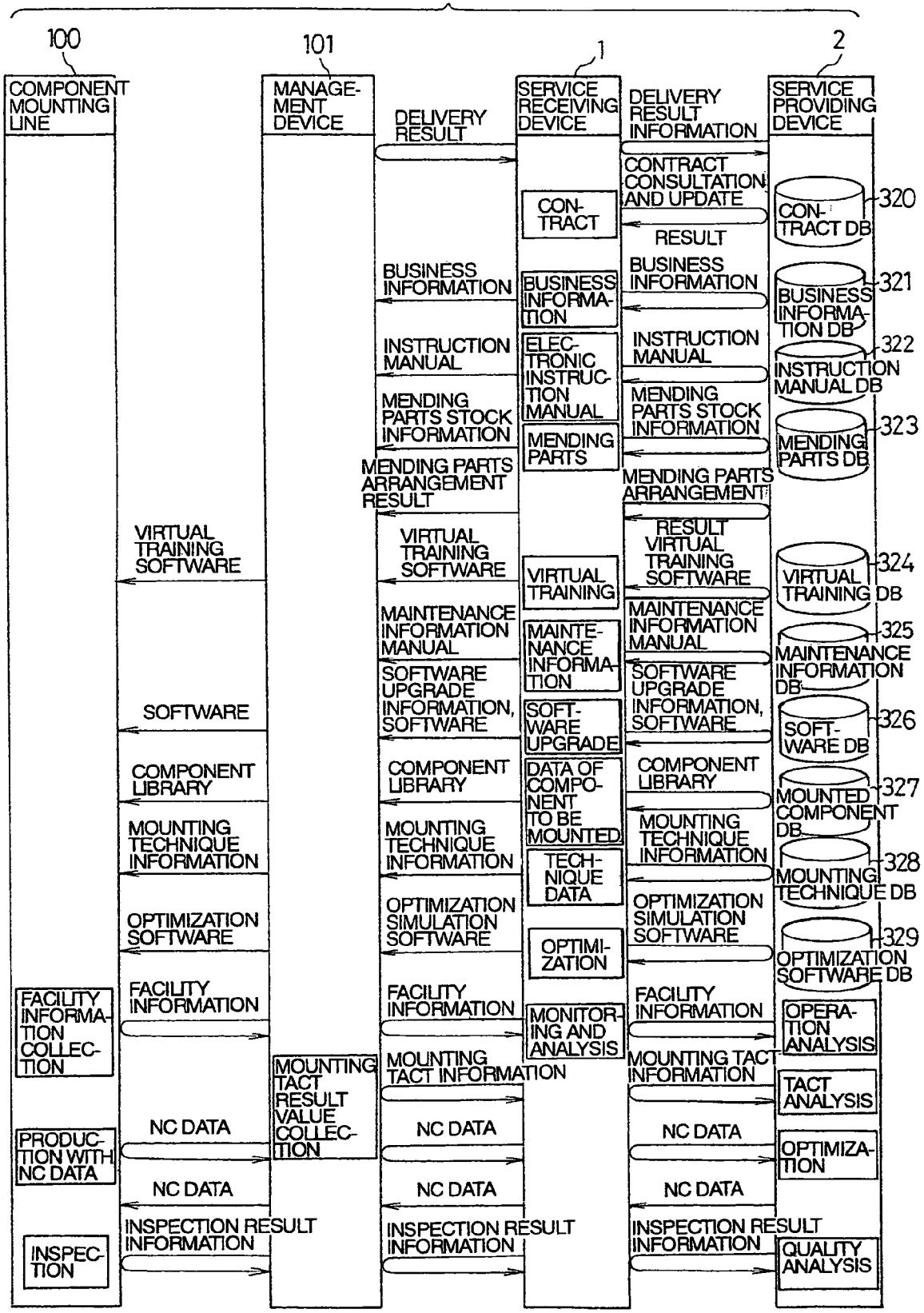
FIG. 41 is a schematic data flow chart of the entire service system in the third embodiment.

FIG. 41 shows a schematic data flow of the entire service system 380.

(1) Contract

The service receiving device 1 sets up a mounting WEB screen shown in FIG. 24 on the display section 25. An operator operates the input section 24 on the mounting WEB screen to select a menu of "Contract," the service receiving device 1 consults or updates the contents of a contract to the contract DB 320 of the service providing device 2. In this case, the contents of a contract or the result of update are transmitted to the service receiving device 1. For example, it is possible to know the level of a contract, the time of update, and the delivery result. Then, the service receiving device 1 registers the presence/absence of automatic transmission of the service data 215 and the service program 216 relating to the type of the component mounting apparatus k having the delivery result on the contract DB 320 of the service providing device 2.

The service providing device 2 periodically uploads the delivery result information 217 from the service receiving device 1 so as to register the delivery result information 217 on the contract DB 320. In response to an upload request from the service providing device 2, the service receiving device 1 uploads the delivery result information 217 from the management device 101.

(2) Business Information Service

When an operator operates the input section 24 to select a menu of "Business information" on the mounting WEB screen, the service receiving device 1 consults the business information to the business information DB 321 of the service providing device 2. For example, an electronic file of a catalog or a specification of the desired component mounting apparatus k can be fetched in. The service receiving device 1 transfers the consulted business information to the management device 101 at a factory. As a result, the business information can also be viewed on the management device 101 at each factory.

Moreover, in the case where the automatic transmission is registered in the contract DB 320, the service providing device 2 reads out the business information from the business information DB 320 at the timing of revising the business information so as to automatically transmit the business information to the service receiving device 1.

(3) Electronic Instruction Manual Service

When an operator operates the input section 24 to select a menu of "Electronic instruction manual" on the mounting WEB screen, the service receiving device 1 fetches an electronic file of an instruction manual from the electronic instruction manual DB 322 of the service providing device 2. The service receiving device 1 transfers the fetched electronic file of the instruction manual to the management device 101 at a factory. As a result, the instruction manual can also be viewed on the management device 101 at each factory.

Moreover, in the case where the automatic transmission is registered in the contract DB 320, the service providing device 2 reads out the electronic file of the instruction manual from the instruction manual DB 322 at the timing of revising the instruction manual so as to automatically transmit the instruction manual to the service receiving device 1.

(4) Mending Parts Service

When an operator operates the input section 24 to select a menu of "Mending parts" on the mounting WEB screen, the service receiving device 1 consults stock information of mending parts to the mending parts DB 323 of the service providing device 2. The service receiving device 1 transfers the consulted stock information of mending parts to the management device 101 of a factory. As a result, the stock information of mending parts can also be viewed on the management device 101 at each factory.

Then, the service receiving device 1 registers the arrangement of mending parts to the mending parts DB 323 of the service providing device 2. More specifically, a mending parts number, the number of the mending parts and the delivery date are registered. The result of registration if the arrangement is made in accordance with the registration is transmitted to the service receiving device 1. The service receiving device 1 transfers the received result of arrangement of the mending parts to the management device 101 at a factory. As a result, the result of arrangement of the mending parts can also be viewed on the management device 101 at each factory.

(5) Virtual Training Service

When an operator operates the input section 24 to select a menu of "Virtual training" on the mounting WEB screen, the service receiving device 1 fetches a virtual training software from the virtual training DB 324 of the service providing device 2. As a result, the virtual training software can be activated on the service receiving device 1 to offer the virtual training.

Moreover, the service receiving device 1 transfers the fetched virtual training software to the management device 101 at a factory. As a result, the virtual training software can also be activated on the management device 101 at each factory so as to offer the virtual training. Moreover, the management device 101 transfers the virtual training software to the corresponding component mounting apparatus k so that the virtual training software can be activated on the component mounting apparatus k so as to offer the virtual training.

(6) Maintenance Information Service

When an operator operates the input section 24 to select a menu of "Maintenance information" on the mounting WEB screen, the service receiving device 1 fetches maintenance information and a maintenance manual from the maintenance manual DB 325 of the service providing device 2. The service receiving device 1 transfers the fetched maintenance information and maintenance manual to the management device 101 at a factory. As a result, the maintenance information and the maintenance manual can also be viewed on the management device 101 at each factory.

Moreover, in the case where the automatic transmission is registered in the contract DB 320, the service providing device 2 reads out the maintenance information from the maintenance information DB 325 at the timing of revising the maintenance information so as to automatically transmit the maintenance information to the service receiving device 1.

(7) Software Upgrade Service

When an operator operates the input section 24 to select a menu of "Software upgrade" on the mounting WEB screen, the service receiving device 1 fetches software upgrade information and a software to be upgraded from the software DB 326 of the service providing device 2. The service receiving device 1 transfers the fetched software upgrade information and the software to be upgraded to the management device 101 at a factory. Moreover, the management device 101 transfers the software to be upgraded to the corresponding component mounting apparatus k so as to install the software on the component mounting apparatus k. As a result, the software upgrade information can be viewed on the management device 101 at each factory so that the component mounting apparatus k can be operated with a software of the latest version.

Moreover, in the case where the automatic transmission is registered in the contract DB 320, the service providing device 2 reads out the software from the software information DB 326 at the timing of upgrading the software so as to automatically transmit the software to the service receiving device 1.

(8) Mounted Component Data Service

When an operator operates the input section 24 to select a menu of "Data of component to be mounted" on the mounting WEB screen, the service receiving device 1 fetches the component library 241 from the mounted component DB 327 of the service providing device 2. The service receiving device 1 transfers the fetched component library 241 to the management device 101 at a factory. Moreover, the management device 101 transfers the component library 241 to the corresponding component mounting apparatus k so as to install the component library on the component mounting apparatus k. As a result, it is possible to eliminate the man-hour of producing the component library by the operator at a factory.

(9) Technique Data Service

When an operator operates the input section 24 to select a menu of "Technique data service" on the mounting WEB screen, the service receiving device 1 fetches mounting technique information from the mounting technique DB 328 of the service providing device 2. The service receiving device 1 transfers the fetched mounting technique information to the management device 101 at a factory. Then, the management device 101 transfers the mounting technique information to the corresponding component mounting apparatus k so as to install the mounting technique information on the component mounting apparatus k. As a result, the operator of a factory can carry out the cream solder print, the application of an adhesive, and the reflow with an optimal technique meeting the conditions such as the type of a circuit board.

(10) Optimization Service

When an operator operates the input section 24 to select a menu of "Optimization" on the mounting WEB screen, the service receiving device 1 fetches an optimization software and a mounting tact simulation software from the optimization software DB 329 of the service providing device 2. As a result, the optimization software is activated on the service receiving device 1 so as to perform the optimization of the uploaded NC data 220 of the component mounting apparatus k for the service receiving device 1. The mounting tact simulation software is activated on the service receiving device 1 so as to perform the mounting tact simulation on the NC data 220 after the optimization, thereby allowing a theoretical value of the mounting tact to be obtained.

The service receiving device 1 transfers the fetched optimization software and the mounting tact simulation software to the management device 101 at a factory. As a result, the optimization software is activated on the management device 101 at a factory to allow the optimization of the uploaded NC data 220. Moreover, the mounting tact simulation software is activated on the management device 101 at a factory so as to perform the mounting tact simulation on the NC data 220 after the optimization, thereby allowing a theoretical value of the mounting tact to be obtained.

Moreover, the management device 101 transfers the optimization software to the corresponding component mounting apparatus k so as to install on the component mounting apparatus k. As a result, the optimization software is activated on the component mounting apparatus k so as to allow the mount production to be performed with the NC data 220 after the optimization after performing the optimization of the NC data 220 or while performing the optimization.

Furthermore, in the case where the automatic transmission is registered in the contract DB 320, the service providing device 2 reads out the optimization software from the optimization software DB 329 at the timing of updating the optimization software so as to automatically transmit the optimization software to the service receiving device 1.

(11) Monitoring and Analysis Service

When an operator operates the input section 24 to select a menu of "Analysis" on the mounting WEB screen, the service receiving device 1 requests the service providing device 2 to analyze the cause of a trouble occurred in the component mounting line 100 of its own factory by the monitoring and analysis software 372. In response to this request, the service providing device 2 activates the monitoring and analysis software 372 fetched out from the monitoring and analysis software DB 330 so as to periodically upload the facility information 211, the mounting tact information 213, the NC data 220, and the inspection result information 212 to the service receiving device 1 to which the request has been issued, thereby analyzing the cause of a trouble. If the cause is elucidated as the result of analysis, the countermeasures for eliminating the cause are feedbacked to the service receiving device 1.

When an operator operates the input section 24 to select a menu of "Monitoring" on the mounting WEB screen, the service receiving device 1 requests the service providing device 2 to monitor the component mounting line 100 of its own factory by the monitoring and analysis software 372. In response to this request, the service providing device 2 activates the monitoring and analysis software 372 fetched out from the monitoring and analysis software DB 330 so as to periodically upload the facility information 211, the mounting tact information 213, the NC data 220, and the inspection result information 212 to the service receiving device 1 to which the request has been issued, thereby monitoring the production status. If the trouble occurrence is revealed or the symptom of a trouble is revealed as the result of monitoring, the cause of the trouble or the symptom of the trouble is analyzed for the uploaded facility information 211, the mounting tact information 213, the NC data 220, and the inspection result information 212. If the cause is elucidated as the result of analysis, the countermeasures for eliminating the cause are feedbacked to the service receiving device 1.

As the type of monitoring and analysis, there are operation analysis, tact analysis, and quality analysis.

The operation analysis is for monitoring an operation rate of the component mounting line 100 so as to analyze the cause of the lowered operation rate and perform the feedback for eliminating the cause. More specifically, in response to a request of uploading the facility information 211 from the service receiving device 1, the management device 101 uploads the facility information 211 collected by the respective component mounting apparatuses k from the component mounting line 100. In response to a request of uploading the facility information 211 from the service providing device 2, the service receiving device 1 uploads the facility information 211 from the management device 101. The service providing device 2 uploads the facility information 211 from the service receiving device 1. The service providing device 2 accumulates the collected facility information 211 in time series in the facility information DB 30 of the operation quality information DB 51. The service providing device 2 analyzes and ascertain the cause of the lowered operation rate in view of the transition of the operation rate from the facility information DB 30. Then, the service providing device 2 performs the feedback for eliminating the cause on the service receiving device 1. For example, if it is due to a defect of the component suction nozzle 7, a mending part is arranged. In the case of wrong operation of the component mounting apparatus k by an operator, the virtual training software is transmitted to the service receiving device 1. In the case of incompletion of the component library 241, the optimal component library 241 is transmitted to the service receiving device 1.

The tact analysis is for monitoring a mounting tact of the component mounting line 100 so as to ascertain a tact loss to perform feedback for eliminating the tact loss. More specifically, in response to a request of uploading the NC data 220 from the service receiving device 1, the management device 101 uploads the NC data 220 of each component mounting apparatus k from the component mounting line 100. In response to a request of uploading the mounting tact information 213 and the NC data 220 from the service providing device 2, the service receiving device 1 uploads the mounting tact information 213 and the NC data 220 from the management device 101. The service providing device 2 uploads the mounting tact information 213 and the NC data 220 from the service receiving device 1. The service providing device 2 perform the mounting tact simulation on the collected NC data 220 to calculate a tact loss so as to accumulate the collected mounting tact information and the calculated tact loss in the mounting tact DB 32 of the operation quality information DB 51. The service providing device 2 analyzes and ascertains the cause of a lowered tact while consulting the mounting tact from the mounting tact DB 32. Then, the service providing device 2 gives feedback for eliminating the cause to the service receiving device 1. For example, in the case where a tact is lowered due to a movement loss of the XY table 9 of the placement machine n108, the optimization of the placement order for eliminating the movement loss of the XY table 9 is performed on the collected NC data 220. The tact balance is not struck among the respective placement machines n108, the correction in distribution of components is performed on the collected NC data 220. After the thus optimized NC data 220 undergoes the mounting tact simulation so as to verify the elimination of reduction in the mounting tact, the NC data 220 after the optimization is feedbacked to the service receiving device 1. The service receiving device 1 feedbacks the NC data 220 after the optimization to the management device 101. The management device 101 feedbacks the NC data 220 after the optimization to the respective placement machines n108 of the component mounting line 100.

The quality analysis is for monitoring the result of inspection of each inspection machine in the component mounting line 100 so as to analyze the cause of a quality defect, thereby giving feedback for eliminating the cause of the detect. More specifically, in response to a request of uploading the inspection result information 212 from the service receiving device 1, the management device 101 uploads the inspection result information 212 of each inspection machine from the component mounting line 100. In response to a request of uploading the inspection result information 212 from the service providing device 2, the service receiving device 1 uploads the inspection result information 212 from the service providing device 2. The service providing device 2 uploads the inspection result information 212 from the service receiving device 1. The service providing device 2 accumulates the collected inspection result information 212 in the inspection result DB 32 of the operation quality information DB 51. The service providing device 2 recognizes a defect with the inspection result DB 34 so as to analyze and ascertain the cause while consulting the facility information DB 30 or the uploaded NC data 220. Then, the service providing device 2 gives feedback for eliminating the cause to the service receiving device 1. For example, in the case where there is a quality defect of a positional offset of a component by inertia force due to a wrongly increased moving speed of the XY table 9 specified in the component library 241, the component library 241, in which the moving speed of the XY table 9 has been corrected, is feedbacked to the service receiving device 1.

IV. Operations of the Service Receiving Device 1 and the Service Providing Device 2

Operations of the service receiving device 1 and the service providing device 2 when the service receiving device 1 derives a service from the service providing device 2 will be described with reference to FIGS. 42 to 66.

(1) Service Contract Flow

A way in which a user at the destination of delivery of a component mounting apparatus places a contract with and receives a service from a manufacturer supplying a component mounting apparatus will be described with reference to flow charts of FIGS. 42 and 43.

(1-1) Step S101 (Contract Level Set at 0)

Figure 42:
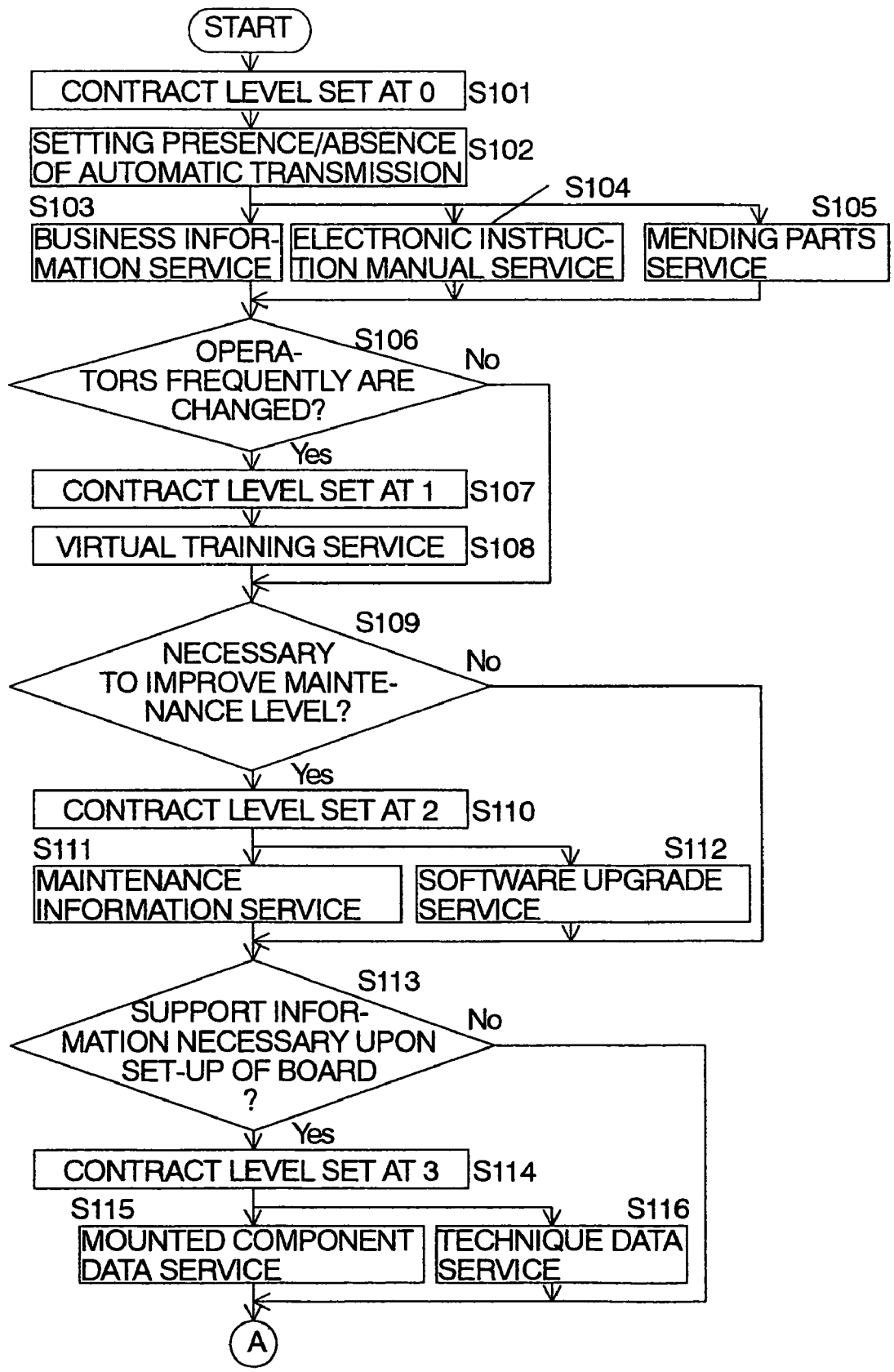
FIG. 42 is the first half of a flow chart showing a contract and a service in the third embodiment.
Figure 43:
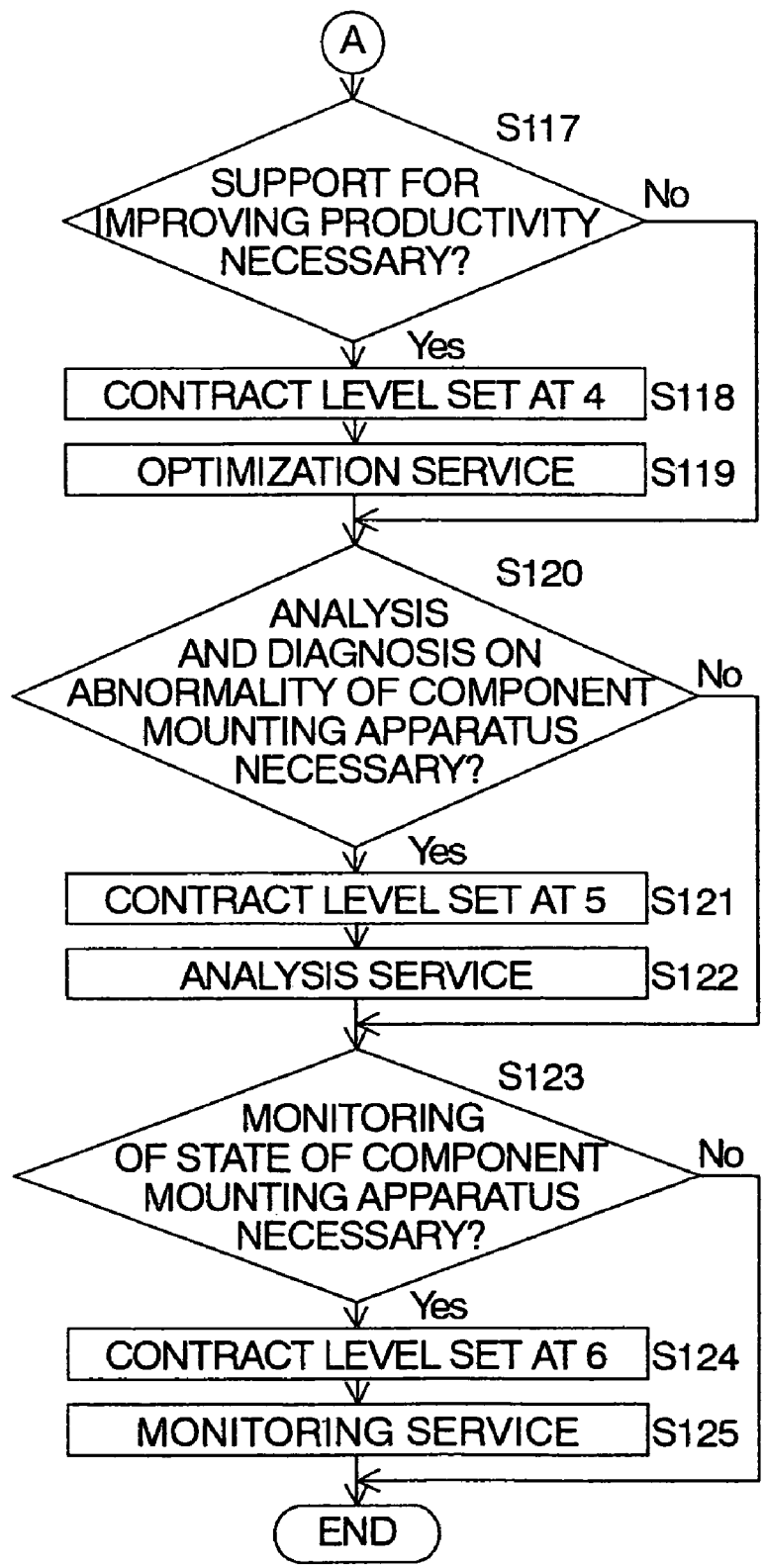
FIG. 43 is the second half of the flow chart showing the contract and the service in the third embodiment.

In FIG. 42, at step S101, in the service receiving device 1, in response to an instruction from the input section 24 by the operator, the control section 21 executes a service receiving program stored in the program area 27 of the memory section 22. Upon start-up of the service receiving program, the control section 21 displays a mounting WEB screen shown in FIG. 24 on the display section 25 in accordance with the contents instructed by the service providing program so as to enter a state for prompting an operation for deriving a service from the display section 25 or the input section 24. Simultaneously, the control section 21 enters a state for prompting the operator to input a user name through the display section 25 or the input section 24.

Upon input of the user name, the control section 21 transmits the input user name by the service providing device side transmitting/receiving section 23 via the network 60 to the service providing device 2. In the service providing device 2, the control section 301 registers the user name, which is received by the transmitting/receiving section 305 via the network 60, on the contract DB 320 of the service information DB 26 (at this moment, a user code which has been uniquely assigned to each user name is registered along with the user name). Upon registration of the user name, the control section 301 automatically sets a contract level 0 in the contract DB 320. The control section 301 transmits the completion of registration of the user name and setting of the contract level 0 by the transmitting/receiving section 305 via the network 60 to the service receiving device 1. In the service receiving device 1, the control section 21 receives the completion of registration of the user name and setting of the contract level 0 by the service providing device side transmitting/receiving section 23 via the network 60 to display a menu of the mounting WEB screen (see FIG. 24) on the display section 25 so that services at the contract level 0 can be selected. More specifically, in the state of the contract level 0, on the menu of the mounting WEB screen (see FIG. 24), a business information service (step S103), an electronic instruction manual service (step S104), and a mending parts service (step S105) can be selected.

When the contract level 0 is registered, the user is charged for the contract level 0. The user is periodically charged, for example, by the month. As a result, instead of charging for each service provision, the user is periodically charged in a collective manner, for example, by the month, depending on the level of the contract of services. Therefore, a charging process can be simplified both for the user and for the manufacturer. Moreover, there will be no more inconveniences for the user in selecting an unnecessary service to be wrongly charged.

Moreover, in order to consider the delivery of a component mounting apparatus, even a user, to whom a component mounting apparatus has not been delivered, can derives the service receiving program so as to install it on his/her own personal computer by accessing a website of the manufacturer supplying a component mounting apparatus on the personal computer connected to the Internet. In this case, the service receiving program can be activated on the personal computer in which the service receiving program is installed, so that the personal computer can serve as the service receiving device 1. The mounting WEB screen is started up on the service receiving device 1, so that even a user, to whom a component mounting apparatus has not been delivered, can set the contract level 0 to receive the services including the business information service.

(1-2) Step S102 (Setting of Presence/Absence of Automatic Transmission)

At step S102, in the service receiving device 1, the control section 21 prompts the operator to specify the presence/absence of automatic transmission of the service data 215 and the service program 216 (see the contract DB 320 of FIG. 30) on the display section 25. Upon input of the specification of the presence/absence of automatic transmission of the service data 215 and the service program 216 from the input section 24, the control section 21 transmits the contents of the input by the service providing device side transmitting/receiving section 23 via the network 60 to the service providing device 2. In the service providing device 2, the control section 301 registers the specified contents of the presence/absence of automatic transmission of the service data 215 and the service program 216, which have been received by the transmitting/receiving section 305 via the network 60 from the service receiving device 1, on the contract DB 320.

For the specification of the presence/absence of automatic transmission of the service data 215 and the service program 216, it is possible to set to either automatically transmit all the service data 215 and the service programs 216 in a collective manner or individually automatically transmit each service data 215 and each service program 216 specified for, for example, the business information, the instruction manual, the maintenance information, the softwares, and the optimization software. The control section 301 of the service providing device 2 judges if the service data 215 and the service program 216, which are set to be automatically transmitted, are at the timing of revision or update, and if they are at the contract level allowing a service of interest to be provided, so that the control section 301 reads out the revised or updated service data 215 and service program 216 from the service information DB 26 at the timing of revision or update to be transmitted by the transmitting/receiving section 305 via the network 60 to the service receiving device 1. In the service receiving device 1, upon reception of the service data 215 and the service program 216 which have been automatically transmitted by the service providing device side transmitting/receiving section 23 via the network 60 from the service providing device 2, the control section 21 causes the display section 25 to display the execution of revision or update of the received service data 215 and service program 216 so as to perform the display to prompt an input for confirming if the already fetched one is to be replaced by that data or program. In the case where an input indicating the replacement is effected through the input section 24, the replacement is executed.

As a result of this process, the user can immediately replace the service data 215 or the service program 216 by a new one at the time of revision or update with the latest service without particularly checking the revision or the update of the service data 215 or the service program 216 by himself/herself one by one.

For the automatic transmission of the service data 215 or the service program 216, the control section 301 of the service providing device 2 may consult the delivery result accumulated in the contract DB 320 so as to read out only the service data 215 and the service program 216 relating to the type of the component mounting apparatus which have been delivered in the past to that user from the service information DB 26 and to transmit them by the transmitting/receiving section 305 via the network 60 to the service receiving device 1. As a result, since the user can receive only the service data 215 and the service program 216 relating to a necessary type of component mounting apparatus, a service can be efficiently provided without any loss.

(1-3) Step S103 (Business Information Service)

At step S103, in the service receiving device 1, when a menu of "business information" is selected by the operator, the control section 21 transmits an instruction of consulting the business information by the service providing device side transmitting/receiving section 23 via the network 60 to the service providing device 2. Upon reception of the instruction by the transmitting/receiving section 305, the control section 301 consults the business information on the business information DB 321 in the service providing device 2 so as to transmit the consulted business information by the transmitting/receiving section 305 via the network 60 to the service receiving device 1. In the service receiving device 1, upon reception of the consulted business information by the service providing device side transmitting/receiving section 23, the control section 21 outputs the business information to the display section 25 or transmits the business information by the management device side transmitting/receiving section 20 via the intranet to the management device 101 of a corresponding factory.

By consulting the business information, for example, an electronic file of a catalog or a specification of a desired component mounting apparatus can be fetched in (see the business information DB 321 of FIG. 31). As a result, the user can timely examine the latest specifications of a component mounting apparatus. Alternatively, the user can obtain information of the component mounting apparatus which can realize desired specifications such as a placement tact or a placement accuracy.

Moreover, although not executed at the step S103, in the case where the execution of collective automatic transmission or automatic transmission of business information is set in the contract DB 320, the control section 301 of the service providing device 2 consults the delivery result accumulated in the contract DB 320 so as to judges if the business information relating to the type of the component mounting apparatus which has been delivered in the past to the user has been revised or not. As a result of judgment, in the case where the business information has been revised, the control section 301 fetches the revised business information from the business information DB 321 so as to transmit it to the service receiving device 1 by the transmitting/receiving section 305 via the network 60. As a result, the service receiving device 1 can acquire an electronic file of the latest catalog or specification of a necessary type of component mounting apparatus at the timing of revision without always inquiring the service providing device 2 if the business information has been revised or not.

Moreover, as the timing of automatic transmission of the business information, the business information may be automatically transmitted at the timing other than that of revision, for example, at the timing of release of a new type of component mounting apparatus, at the timing immediately before exhibiting the component mounting apparatus on the exhibition, or in a periodical manner (for example, at the beginning of the year).

(1-4) Step S104 (Electronic Instruction Manual Service)

At step S104, in the service receiving device 1, when a menu of "Electronic instruction manual" is selected by the operator, the control section 21 transmits an instruction of consulting the electronic instruction manual by the service providing device side transmitting/receiving section 23 via the network 60 to the service providing device 2. Upon reception of the instruction by the transmitting/receiving section 305, the control section 301 consults the electronic file of the instruction manual from the instruction manual DB 322 in the service providing device 2 so as to transmit the consulted electronic file of the instruction manual by the transmitting/receiving section 305 via the network 60 to the service receiving device 1. In the service receiving device 1, upon reception of the electronic file of the consulted instruction manual by the service providing device side transmitting/receiving section 23, the control section 21 outputs the electronic file of the instruction manual to the display section 25 or transmits it by the management device side transmitting/receiving section 20 via the intranet 3 to the management device 101 of a corresponding factory.

As a result, the latest instruction manual of a desired type of component mounting apparatus can timely be acquired so as to understand the operation of the component mounting apparatus.

Moreover, although not executed at the step S104, in the case where the execution of collective automatic transmission or automatic transmission of the instruction manual is set in the contract DB 320, the control section 301 of the service providing device 2 consults the delivery result accumulated in the contract DB 320 so as to judges if the instruction manual relating to the type of component mounting apparatus which has been delivered in the past to the user has been revised. In the case where the instruction manual has been revised, the control section 301 fetches the electronic file of the revised instruction manual from the instruction manual DB 322 so as to transmit it by the transmitting/receiving section 305 via the network 60 to the service receiving device 1. As a result, the service receiving device 1 can acquire an electronic file of the latest instruction manual of a necessary type of component mounting apparatus at the timing of revision without always inquiring the service providing device 2 if the instruction manual has been revised or not.

(1-5) Step S105 (Mending Parts Service)

At step S105, when a menu of "Mending parts" is selected by the operator in the service receiving device 1, the control section 21 transmits an instruction of consulting stock information of mending parts by the service providing device side transmitting/receiving section 23 via the network 60 to the service providing device 2. In the service providing device 2, upon reception of the instruction by the transmitting/receiving section 305, the control section 301 consults the stock information of mending parts (see FIG. 33) from the mending parts DB 323 so as to transmit the consulted stock information of the mending parts by the transmitting/receiving section 305 via the network 60 to the service receiving device 1. When the consulted stock information of the mending parts is received by the service providing device side transmitting/receiving section 23 of the service receiving device 1, the control section 21 outputs the stock information of the mending parts to the display section 25 or transmits the stock information of the mending parts by the management device side transmitting/receiving section 20 to the management device 101 of a corresponding factory via the intranet 3. As a result, the user can also view the stock information of the mending parts on the management device 101 of each factory so as to know the delivery date of a mending part in the case where the mending part is arranged.

Moreover, in the service receiving device 1, the control section 21 causes the display section 25 to perform the display so as to prompt an input of the arrangement of a mending part. When the arrangement of the mending part is input through the input section 24, the contents of the arrangement of the mending part are transmitted by the service providing device side transmitting/receiving section 23 via the network 60 to the service providing device 2. Upon reception of the contents of the arrangement of the mending part by the transmitting/receiving section 305, the control section 301 registers the contents of the order of the mending part on the mending parts DB 323 in the service providing device 2. More specifically, a mending part number, the number thereof, and the delivery date are registered (see the arrangement information 359 of the mending parts DB 323 of FIG. 33). The control section 301 transmits the result if the arrangement has been placed in accordance with the input by the user, by the transmitting/receiving section 305 via the network 60 to the service receiving device 1. As a result, the user can precisely know when the arranged mending part is delivered.

(1-6) Step S106 (Conditions at a Contract Level 1)

At a step S106, the control section 21 of the service receiving device 1 or the control section 301 of the service providing device 2 judges if operators of the component mounting apparatus k frequently are changed or not. In the case where the operators are frequently changed, a contract level 1 is set at the step S106.

A specific method of judging if the operators of the component mounting apparatus k are frequently changed by the control section 21 of the service receiving device 1 or the control section 301 of the service providing device 2 may be as follows.

For example, the control section 21 of the service receiving device 1 prompts a reply regarding the absence/presence of changes of the operator of the component mounting apparatus k to be input on the display section 25. In the case where the contents of the reply input through the input section 24 is "Yes," the control section 21 may judge that the operators of the component mounting apparatus k are frequently changed.

Alternatively, an operator name of the component mounting apparatus k is registered on the component mounting apparatus k, the management device 101, or the service receiving device 1. The control section 21 of the service receiving device 1 always checks the operator names registered for each component mounting apparatus k. When a new operator name is registered or it is recognized that the operator names are frequently changed, the control section 21 may judge that the operators of the component mounting apparatus k are frequently changed. In such a process, when the control section 21 judges the operators of the component mounting apparatus k are frequently changed, the control section performs the display indicating the intention of registration of the contract level 1 on the display section 25 so as to prompt the confirmation by the operator of the service receiving device 1.

Alternatively, naturally, not the control section 21 of the service receiving device 1 or the control section 301 of the service providing device 2 but the operator of the service receiving device 1 judges if the operators of the component mounting apparatus k are changed so as to select the "Contract" menu on the service receiving device 1. By inputting the contract level 1, the service providing device 2 may register the contract level 1 on the contract DB 320.

(1-7) Step S107 (Contract Level Set at 1)

A contract level 1 is input based on the result of judgment by the control section 21 of the service receiving device 1 or the control section 301 of the service providing device 2 at the step S106 or by selecting the "Contract" menu by the operator of the service receiving device 1, the control section 301 sets the contract level 1 in the contract DB 320 in the service providing device 2 at the step S107. The control section 301 transmits the completion of setting of the contract level 1 by the transmitting/receiving section 305 via the network 60 to the service receiving device 1. In the service receiving device 1, the control section 21 receives the completion of setting of the contract level 1 by the service providing device side transmitting/receiving section 23 via the network 60 to cause the display section 25 to display a menu of the mounting WEB screen (see FIG. 24) so that the services of the contract level 1 are selectable. More specifically, in the state of the contract level 1, on the menu of the mounting WEB screen (see FIG. 24), the virtual training service (step S108) can be additionally selected in addition to the selectable services at the contract level 0.

When the contract level 1 is registered, the user is charged for the contract level 1. The user is periodically charged, for example, by the month. Since the contract level 1 allows the service of a higher level to be derived as compared with the contract level 0, the charged fee is normally higher than that at the contract level 0.

(1-8) Step S108 (Virtual Training Service)

At step S108, when a menu of "Virtual training" is selected by the operator in the service receiving device 1, the control section 21 transmits an instruction of fetching the virtual training software by the service providing device side transmitting/receiving section 23 via the network 60 to the service providing device 2. Upon reception of the instruction by the transmitting/receiving section 305, the control section 301 fetches the virtual training software from the virtual training DB 324 in the service providing device 2 so as to transmit the fetched virtual training software by the transmitting/receiving section 305 via the network 60 to the service receiving device 1. In the service receiving device 1, upon reception of the fetched virtual training software by the service providing device side transmitting/receiving section 23, the control section 21 outputs the reception to the display section 25 so that the virtual training software is stored in the program area 27 of the memory section 22. Alternatively, the virtual training software is transmitted by the management device side transmitting/receiving section 20 via the intranet 3 to the management device 101 of a corresponding factory.

As a result, the virtual training software can be activated on the service receiving device 1 to offer the virtual training. Moreover, the virtual training software can be transferred to the management device 101 of a factory so as to offer the virtual training on the management device 101 of the factory. Therefore, even in the case where the operator of the component mounting apparatus k is replaced by a novice operator, the novice operator can learn the operation of the component mounting apparatus k owing to the virtual training so as to avoid a trouble due to wrong operation.

(1-9) Step S109 (Conditions at a Contract Level 2)

At step S109, the control section 21 of the service receiving device 1 or the control section 301 of the service providing device 2 judges whether it is necessary to improve the maintenance level of the operator of the component mounting apparatus k. If it is judged as necessary, a contract level 2 is set at step S110.

A specific method, in which the control section 21 of the service receiving device 1 or the control section 301 of the service providing device 2 judges whether it is necessary to improve the maintenance level of the operator of the component mounting apparatus k, may be as follows.

For example, the control section 21 of the service receiving device 1 prompts the input of a reply whether it is necessary to improve the maintenance level of the operator of the component mounting apparatus k on the display section 25. In the case where the reply of the input through the input section 24 is "Yes," the control section 21 may judge that it is necessary to improve the maintenance level of the operator of the component mounting apparatus k.

Alternatively, in each component mounting apparatus k, the frequency of occurrence of troubles adversely affecting the production of the component mounting apparatus k is stored in accordance with the maintenance level of the operator of the component mounting apparatus k. Based on the stored contents, the control section 21 of the service receiving device 1 or the control section 301 of the service providing device 2 judges whether it is necessary to improve the maintenance level of the operator of the component mounting apparatus k. In such a processing, when the control section 21 judges that it is necessary to improve the maintenance level of the operator of the component mounting apparatus k, the control section 21 may display the intention of registration of the contract level 2 on the display 25 so as to prompt the operator of the service receiving device 1 to confirm it.

Further alternatively, naturally, it may be not the control section 21 of the service receiving device 1 or the control section 301 of the service providing device 2 but the operator of the service receiving device 1 that judges whether it is necessary to improve the maintenance level of the operator of the component mounting apparatus k so as to select the "Contract" menu on the service receiving device 1 for inputting the contract level 2. In this manner, the service providing device 2 may register the contract level 2 on the contract level DB 320.

(1-10) Step S110 (Contract Level Set at 2)

Based on the result of judgment by the control section 21 of the service receiving device 1 or the control section 301 of the service providing device 2 at the step S109 or by selecting the "Contract" menu by the operator of the service receiving device 1 to input the contract level 2, the control section 301 of the service providing device 2 sets the contract level 2 in the contract DB 320 at a step S110. The control section 301 transmits the completion of setting of the contract level 2 is transmitted by the transmitting/receiving section 305 via the network 60 to the service receiving device 1. In the service receiving device 1, the control section 21 receives the completion of setting of the contract level 2 by the service providing device side transmitting/receiving section 23 via the network 60 to display a menu of the mounting WEB screen (see FIG. 24) on the display section 25 so that the services of the contract level 2 can be selectable. In the state of the contract level 2, on the menu of the mounting WEB screen (see FIG. 24), the maintenance information service (step S111) and the software update service (step S112) can be additionally selected in addition to the services selectable at the contract levels 0 and 1.

Upon registration of the contract level 2, the user is charged for the contract level 2. The user is periodically charged, for example, by the month. Since the contract level 2 allows the services of a higher level to be derived as compared with the contract level 1, the charged fee is normally set higher than at the contract level 1.

(1-11) Step S111 (Maintenance Information Service)

When a menu of "Maintenance information" is selected by the operator at a step Sill in the service receiving device 1, the control section 21 transmits an instruction of consulting the maintenance information by the service providing device side transmitting/receiving section 23 via the network 60 to the service providing device 2. Upon reception of the instruction by the transmitting/receiving section 305, the control section 301 consults the maintenance information (see FIG. 35) to the maintenance information DB 325 in the service providing device 2. Simultaneously, the control section 301 transmits the consulted maintenance information by the transmitting/receiving section 305 via the network 60 to the service receiving device 1. In the service receiving device 1, upon reception of the consulted maintenance information by the service providing device side transmitting/receiving section 23, the control section 21 outputs the maintenance information to the display section 25 or transmits the maintenance information by the management device side transmitting/receiving section 20 via the intranet 3 to the management device 101 of a corresponding factory.

As a result, the user can also view the maintenance information 363 and the maintenance manual in a timely manner on the service receiving device 1 or on the management device 101 of each factory so as to know a method of eliminating the inconveniences of the component mounting apparatus k or a maintenance method for preventing the inconveniences. Accordingly, the maintenance level of the operator of the component mounting apparatus k can be improved.

Although not executed at the step S111, in the case where the execution of collective automatic transmission or automatic transmission of the maintenance information is set and the contract level 2 is set in the contract DB 320, the control section 301 of the service providing device 2 consults the delivery result accumulated in the contract DB 320 so as to judge whether the maintenance information relating to the type of component mounting apparatus delivered to the user in the past has been revised or not. In the case where the maintenance information has been revised, the control section 301 fetches the revised maintenance information from the maintenance information DB 325 so as to transmit it by the transmitting/receiving section 305 via the network 60 to the service receiving device 1. As a result, it is possible to acquire the latest maintenance information of a necessary type of component mounting apparatus at the timing of revision in the service receiving device 1 without always checking the service providing device 2 if the maintenance information has been revised.

(1-12) Step S112 (Software Update Service)

At a step S112, when a menu of "Software upgrade" is selected by the operator on the service receiving device 1, the control section 21 transmits an instruction of fetching the software upgrade by the service providing device side transmitting/receiving section 23 via the network 60 to the service providing device 2. Upon reception of the instruction by the transmitting/receiving section 305, the control section 301 fetches the upgrade information 366 of a software and the latest software 367 from the software DB 326. Simultaneously, the control section 301 transmits the fetched upgrade information 366 of the software and the latest software 367 by the transmitting/receiving section 305 via the network 60 to the service receiving device 1.

In the service receiving device 1, upon reception of the fetched upgrade information 366 of the software and the latest software 367 by the service providing device side transmitting/receiving section 23, the control section 21 outputs the reception of these information and the upgrade information 366 of the software to the display section 25 so as to transmit the upgrade information 366 of the software and the latest software 367 by the management device side transmitting/receiving section 20 via the intranet 3 to the management device 101 of a corresponding factory.

As a result, the user can view the upgrade information 366 of the software on the service receiving device 1 or on the management device 101 of each factory so as to confirm if a later version of the software than that currently operating on the component mounting apparatus k exists. If it exists, it is possible to confirm the contents of upgrade. Moreover, the management device 101 transfers the transferred latest software 367 to the component mounting apparatus k so as to install it thereon. As a result, it is possible to upgrade the component mounting apparatus k so as to be capable of operating with the latest software, thereby executing the maintenance for enhancing the functions of the component mounting apparatus k or for eliminating the inconveniences in the older version.

Furthermore, although not executed at the step S112, in the case where the execution of collective automatic transmission or automatic transmission of the software is set and the contract level 2 is set in the contract DB 320, the control section 301 of the service providing device 2 consults the delivery result accumulated in the contract DB 320 so as to judge whether the revision or the upgrade information 366 of the software or the upgrade of the latest software 367 relating to the type of the component mounting apparatus delivered to the user in the past has been effected. In the case where the revision or the upgrade has been effected, the revised upgrade information 366 of the software or the latest upgraded software 367 is fetched from the software DB 326 so as to be transmitted by the transmitting/receiving section 305 via the network 60 to the service receiving device 1. As a result, it is possible to acquire the latest upgrade information 366 of the software or the latest software 367 of a necessary type of component mounting apparatus at the timing of revision or upgrade without always checking the service providing device 2 for the execution of revision of the upgrade information 366 of the software or upgrade of the latest software 367 in the service receiving device 1.

(1-13) Step S113 (Conditions at a Contract Level 3)

At step S113, the control section 21 of the service receiving device 1 or the control section 301 of the service providing device 2 judges whether support information upon setup of a board is necessary or not. If it is judged as necessary, a contract level 3 is set at step S114.

A specific method, in which the control section 21 of the service receiving device 1 or the control section 301 of the service providing device 2 judges whether the support information upon setup of the board is necessary or not, may be as follows.

For example, the control section 21 of the service receiving device 1 prompts the input of a reply whether the support information upon setup of the board is necessary or not on the display section 25. In the case where the reply of the input through the input section 24 is "Yes," the control section 21 may judge that the support information upon setup of the board is needed.

Alternatively, in each component mounting apparatus k, the frequency of occurrence of troubles adversely affecting the production of the component mounting apparatus k due to absence of the support information upon setup of the board is stored. Based on the stored contents, the control section 21 of the service receiving device 1 or the control section 301 of the service providing device 2 judges whether the support information upon setup of the board is necessary or not. In such a processing, when the control section 21 judges that the support information upon setup of the board is necessary, the control section 21 may display the intention of registration of the contract level 3 on the display 25 so as to prompt the operator of the service receiving device 1 to confirm it.

Further alternatively, naturally, it may be not the control section 21 of the service receiving device 1 or the control section 301 of the service providing device 2 but the operator of the service receiving device 1 that judges whether the support information upon setup of the board is necessary or not so as to select the "Contract" menu on the service receiving device 1 for inputting the contract level 3. In this manner, the service providing device 2 may register the contract level 3 on the contract level DB 320.

(1-14) Step S114 (Contract Level Set at 3)

Based on the result of judgment by the control section 21 of the service receiving device 1 or the control section 301 of the service providing device 2 at the step S113 or by selecting the "Contract" menu by the operator of the service receiving device 1 to input the contract level 3, the control section 301 sets the contract level 3 in the contract DB 320 in the service providing device 2 at step S114. The control section 301 transmits the completion of setting of the contract level 3 by the transmitting/receiving section 305 via the network 60 to the service receiving device 1. In the service receiving device 1, the control section 21 receives the completion of setting of the contract level 3 by the service providing device side transmitting/receiving section 23 via the network 60 to display a menu of the mounting WEB screen (see FIG. 24) on the display section 25 so that the services of the contract level 3 can be selectable. In the state of the contract level 3, on the menu of the mounting WEB screen (see FIG. 24), the mounted component data service (step S115) and the technique data service (step S116) can be additionally selected in addition to the services selectable at the contract levels 0, 1, and 2.

Upon registration of the contract level 3, the user is charged for the contract level 3. The user is periodically charged, for example, by the month. Since the contract level 3 allows the services of a higher level to be derived as compared with the contract level 2, the charged fee is normally set higher than at the contract level 2.

(1-15) Step S115 (Mounted Component Data Service)

When a menu of "Data of component to be mounted" is selected by the operator at step S115 on the service receiving device 1, the control section 21 transmits an instruction of fetching the component library 241 by the service providing device side transmitting/receiving section 23 via the network 60 to the service providing device 2. Upon reception of the instruction by the transmitting/receiving section 305, in the service providing device 2, the control section 301 fetches the component library 241 from the mounted component DB 327 and transmits the fetched component library 241 by the transmitting/receiving section 305 via the network 60 to the service receiving device 1. In the service receiving device 1, upon reception of the fetched component library 241 by the service providing device side transmitting/receiving section 23, the control section 21 outputs the reception of the component library to the display section 25 or transmits the fetched component library 241 by the management device side transmitting/receiving section 20 via the intranet 3 to the management device 101 of a corresponding factory. Moreover, the management device 101 installs the transferred component library 241 on the component mounting apparatus k.

As a result, upon start of the production of a new board, the operator needs not create the component library 241 for a new component. Therefore, the number of steps of creating the component library 241 can be reduced so as to immediately start the production of a new board. Moreover, it is possible to prevent the occurrence of an error in the component library 241 due to creation of the component library 241 by the operator to avoid the occurrence of any mount production troubles or quality troubles.

(1-16) Step S116 (Technique Data Service)

When a menu of "Technique data" is selected by the operator at a step S116 on the service receiving device 1, the control section 21 transmits an instruction of fetching the technique data such as cream solder information or adhesive information by the service providing device side transmitting/receiving section 23 via the network 60 to the service providing device 2. Upon reception of the instruction by the transmitting/receiving section 305, in the service providing device 2, the control section 301 fetches the technique data from the mounting technique DB 328. Simultaneously, the control section 301 transmits the fetched technique data by the transmitting/receiving section 305 via the network 60 to the service receiving device 1. In the service receiving device 1, upon reception of the fetched technique data by the service providing device side transmitting/receiving section 23, the control section 21 outputs the reception of the technique data to the display section 25 and transmits the fetched technique data by the management device side transmitting/receiving section 20 via the intranet 3 to the management device 101 of a corresponding factory. Moreover, the management device 101 installs the transferred component library on the component mounting apparatus k.

As a result, upon start of the production of a new board, the operator need not determine the technique know-how such as the type, a temperature, a viscosity of a cream solder, or the type of adhesive or a temperature profile of reflow through a trial and error process. Therefore, the number of steps for determining the technique know-how through a trial and error process can be reduced so as to immediately start the production of a new board. Moreover, it is possible to prevent the occurrence of a quality trouble such as defective soldering due to production by the operator with an erroneous technique.

(1-17) Step S117 (Conditions at a Contract Level 4)

At step S117, the control section 21 of the service receiving device 1 or the control section 301 of the service providing device 2 judges whether support for improving the productivity is necessary or not. If it is judged as necessary, a control level 4 is set at step S118.

A specific method, in which the control section 21 of the service receiving device 1 or the control section 301 of the service providing device 2 judges whether the support for improving the productivity is necessary or not, may be as follows.

For example, the control section 21 of the service receiving device 1 prompts the input of a reply whether the support for improving the productivity is necessary or not on the display section 25. In the case where the reply of the input through the input section 24 is "Yes," the control section 21 may judge the necessity of the support for improving the productivity.

Alternatively, in each component mounting apparatus k, the frequency of occurrence of troubles adversely affecting the production of the component mounting apparatus k due to absence of the support for improving the productivity is stored. Based on the stored contents, the control section 21 of the service receiving device 1 or the control section 301 of the service providing device 2 judges whether the support for improving the productivity is necessary or not. In such a processing, when the control section 21 judges that the support for improving the productivity is necessary, the control section 21 may display the intention of registration of the contract level 4 on the display 25 so as to prompt the operator of the service receiving device 1 to confirm it.

Further alternatively, naturally, it may be not the control section 21 of the service receiving device 1 or the control section 301 of the service providing device 2 but the operator of the service receiving device 1 that judges whether the support for improving the productivity is necessary or not so as to select the "Contract" menu on the service receiving device 1 for inputting the contract level 4. In this manner, the service providing device 2 may register the contract level 4 on the contract level DB 320.

(1-18) Step S118 (Contract Level Set at 4)

Based on the result of judgment by the control section 21 of the service receiving device 1 or the control section 301 of the service providing device 2 at the step S117 or by selecting the "Contract" menu by the operator of the service receiving device 1 to input the contract level 4, the control section 301 sets the contract level 4 in the contract DB 320 in the service providing device 2 at step S118. The control section 310 transmits the completion of setting of the contract level 4 by the transmitting/receiving section 305 via the network 60 to the service receiving device 1. In the service receiving device 1, the control section 21 receives the completion of setting of the contract level 4 by the service providing device side transmitting/receiving section 23 via the network 60 to display a menu of the mounting WEB screen (see FIG. 24) on the display section 25 so that the services of the contract level 4 can be selectable. In the state of the contract level 4, on the menu of the mounting WEB screen (see FIG. 24), the optimization service (step S119) can be additionally selected in addition to the services selectable at the contract levels 0 to 3.

Upon registration of the contract level 4, the user is charged for the contract level 4. The user is periodically charged, for example, by the month. Since the contract level 4 allows the services of a higher level to be derived as compared with the contract level 3, the charged fee is normally set higher than at the contract level 3.

(1-19) Step S119 (Optimization Service)

When a menu of "Optimization" is selected by the operator at step S119 on the service receiving device 1, the control section 21 transmits an instruction of fetching the optimization software such as the optimization software 368, the total optimization software 374, the mounting tact simulation software 375, or the total mounting tact simulation software 371 by the service providing device side transmitting/receiving section 23 via the network 60 to the service providing device 2. Upon reception of the instruction by the transmitting/receiving section 305, in the service providing device 2, the control section 301 fetches the optimization software from the optimization software DB 329 and transmits the fetched optimization software by the transmitting/receiving section 305 via the network 60 to the service receiving device 1. In the service receiving device 1, upon reception of the fetched optimization software by the service providing device side transmitting/receiving section 23, the control section 21 outputs the reception of the optimization software to the display section 25 so as to make the program area 27 of the memory section 22 store the fetched optimization software.

In the service receiving device 1, the control section 21 activates the optimization software such as the optimization software 368, the total optimization software 374, the mounting tact simulation software 375, or the total mounting tact simulation software 371 from the program area 27 of the memory section 22 to perform the optimization of the mounting order or the simulation of mounting time on the NC data 220 uploaded from a factory. As a result, the mounting order is determined to reduce a tact loss of the component mounting apparatus k and to reduce the mounting time so that the mounting time can be confirmed in the NC data 220 after the optimization without actually producing the mounted circuit boards with the component mounting apparatus k. The optimized NC data 220 is downloaded to the component mounting apparatus k to realize the effective production support with a remarkably improved production efficiency.

Moreover, the control section 21 transmits the optimization software by the management device side transmitting/receiving section 20 via the intranet 3 to the management device 101 of a corresponding factory. The management device 101 installs the transferred optimization software to the component mounting apparatus k. As a result, the optimization or the mounting tact simulation can be performed in the management device 101 or the component mounting apparatus k.

Although not executed at the step S119, in the case where the execution of collective automatic transmission or automatic transmission of the optimization software is set and the contract level 4 is set in the contract DB 320, the control section 301 of the service providing device 2 consults the delivery result accumulated in the contract DB 320 so as to judge whether the optimization software relating to the type of component mounting apparatus delivered to the user in the past has been updated or not. In the case where the update has been implemented, the control section 301 fetches the updated optimization software from the optimization software DB 329 so as to transmit the optimization software by the transmitting/receiving section 305 via the network 60 to the service receiving device 1. As a result, it is possible to acquire the optimization software of a necessary type of component mounting apparatus at the timing of update in the service receiving device 1 without always inquiring the service providing device 2 for the implementation of update of the optimization software.

(1-20) Step S120 (Conditions at a Contract Level 5)

At step S120, the control section 21 of the service receiving device 1 or the control section 301 of the service providing device 2 judges whether the analysis and diagnosis at the occurrence of abnormality of the component mounting apparatus k is necessary or not. If it is judged as necessary, a control level 5 is set at a step S121.

A specific method, in which the control section 21 of the service receiving device 1 or the control section 301 of the service providing device 2 judges whether the analysis and diagnosis at the occurrence of abnormality of the component mounting apparatus k is necessary or not, may be as follows.

For example, the control section 21 of the service receiving device 1 prompts the input of a reply whether the analysis or diagnosis at the occurrence of abnormality is necessary or not on the display section 25. In the case where the reply of the input through the input section 24 is "Yes," the control section 21 may judge that the analysis and diagnosis at the occurrence of abnormality of the component mounting apparatus k are needed.

Alternatively, in each component mounting apparatus k, the frequency of occurrence of troubles adversely affecting the production of the component mounting apparatus k due to absence of the analysis and diagnosis at the occurrence of abnormality in the component mounting apparatus k is stored. Based on the stored contents, the control section 21 of the service receiving device 1 or the control section 301 of the service providing device 2 judges whether the analysis and diagnosis at the occurrence of abnormality in the component mounting apparatus k is necessary or not. In such a processing, when it is judged that the analysis and diagnosis at the occurrence of abnormality in the component mounting apparatus k is necessary, the control section 21 may display the intention of registration of the contract level 5 on the display section 25 so as to prompt the operator of the service receiving device 1 to confirm it.

Further alternatively, naturally, it may be not the control section 21 of the service receiving device 1 or the control section 301 of the service providing device 2 but the operator of the service receiving device 1 that judges whether the analysis and diagnosis at the occurrence of abnormality in the component mounting apparatus k is necessary or not so as to select the "Contract" menu on the service receiving device 1 for inputting the contract level 5. In this manner, the service providing device 2 may register the contract level 5 on the contract level DB 320.

(1-21) Step S121 (Contract Level Set at 5)

Based on the result of judgment by the control section 21 of the service receiving device 1 or the control section 301 of the service providing device 2 at the step S120 or by selecting the "Contract" menu by the operator of the service receiving device 1 to input the contract level 5, the control section 301 of the service providing device 2 sets the contract level 5 in the contract DB 320 to the contract DB 320 at step S121. The control section 310 transmits the completion of setting of the contract level 5 by the transmitting/receiving section 305 via the network 60 to the service receiving device 1. In the service receiving device 1, the control section 21 receives the completion of setting of the contract level 5 by the service providing device side transmitting/receiving section 23 via the network 60 to display a menu of the mounting WEB screen (see FIG. 24) on the display section 25 so that the services of the contract level 5 can be selectable. In the state of the contract level 5, on the menu of the mounting WEB screen (see FIG. 24), the analysis service (step S122) can be additionally selected in addition to the services selectable at the contract levels 0 to 4.

Upon registration of the contract level 5, the user is charged for the contract level 5. The user is periodically charged, for example, by the month. Since the contract level 5 allows the services of a higher level to be derived as compared with the contract level 4, the charged fee is normally set higher than at the contract level 4.

(1-22) Step S122 (Analysis Service)

When a menu of "Analysis" is selected by the operator at step S122 on the service receiving device 1, the control section 21 causes the display section 25 to display so as to prompt the contents of abnormality to be input. When the contents of abnormality are input through the input section 24, the control section 21 transmits an instruction of analyzing the contents of abnormality by the service providing device side transmitting/receiving section 23 via the network 60 to the service providing device 2. This instruction is received by the transmitting/receiving section 305 in the service providing device 2. In response to this request, the control section 301 fetches and activates the monitoring and analysis software 372 from the monitoring and analysis software DB 330. As a result, the control section 301 periodically transmits a request of uploading the facility information 211, the mounting tact information 213, the NC data 220 and the inspection result information 212 in accordance with a procedure of the monitoring and analysis software 372 via the network 60 to the service receiving device 1. Based on the uploaded facility information 211, mounting tact information 213, NC data 220, and inspection result information 212, the control section 301 analyzes the abnormality.

This analysis procedure will be described below in detail. The result of analysis is feedbacked to the service receiving device 1. This feedback is given from the service receiving device 1 to the management device 101 and then from the management device 101 to the component mounting apparatus k. As a result, the cause of abnormality occurred in the component mounting apparatus k is immediately ascertained to accurately implement the countermeasures against it. Thus, it is ensured that the abnormality is eliminated with a high response.

(1-23) Step S123 (Conditions at a Contract Level 6)

At step S123, the control section 21 of the service receiving device 1 or the control section 301 of the service providing device 2 judges whether it is necessary to monitor a state of the component mounting apparatus k or not. If it is judged as necessary, a contract level 6 is set at step S124.

A specific method, in which the control section 21 of the service receiving device 1 or the control section 301 of the service providing device 2 judges whether it is necessary to monitor a state of the component mounting apparatus k, may be as follows.

For example, the control section 21 of the service receiving device 1 prompts the input of a reply whether it is necessary to monitor a state of the component mounting apparatus k or not on the display section 25. In the case where the reply of the input through the input section 24 is "Yes," the control section 21 may judge that it is necessary to monitor a state of the component mounting apparatus k.

Alternatively, in each component mounting apparatus k, the frequency of occurrence of troubles adversely affecting the production of the component mounting apparatus k due to absence of the monitoring of a state of the component mounting apparatus k is stored. Based on the stored contents, the control section 21 of the service receiving device 1 or the control section 301 of the service providing device 2 judges whether it is necessary to monitor a state of the component mount k or not. In such a processing, when it is judged that it is necessary to monitor a state of the component mounting apparatus k, the control section 21 may display the intention of registration of the contract level 6 on the display 25 so as to prompt the operator of the service receiving device 1 to confirm it.

Further alternatively, naturally, it may be not the control section 21 of the service receiving device 1 or the control section 301 of the service providing device 2 but the operator of the service receiving device 1 that judges whether it is necessary to monitor a state of the component mounting apparatus k so as to select the "Contract" menu on the service receiving device 1 for inputting the contract level 6. In this manner, the service providing device 2 may register the contract level 6 on the contract level DB 320.

(1-24) Step S124 (Contract Level Set at 6)

Based on the result of judgment by the control section 21 of the service receiving device 1 or the control section 301 of the service providing device 2 at the step S123 or by selecting the "Contract" menu by the operator of the service receiving device 1 to input the contract level 6, the control section 301 of the service providing device 2 sets the contract level 6 in the contract DB 320 at step S124. The control section 301 transmits the completion of setting of the contract level 6 by the transmitting/receiving section 305 via the network 60 to the service receiving device 1. In the service receiving device 1, the control section 21 receives the completion of setting of the contract level 6 by the service providing device side transmitting/receiving section 23 via the network 60 to display a menu of the mounting WEB screen (see FIG. 24) on the display section 25 so that the services of the contract level 6 can be selectable. In the state of the contract level 6, on the menu of the mounting WEB screen (see FIG. 24), the monitoring service (step S125) can be additionally selected in addition to the services selectable at the contract levels 0 to 5.

Upon registration of the contract level 6, the user is charged for the contract level 6. The user is periodically charged, for example, by the month. Since the contract level 6 allows the services of a higher level to be derived as compared with the contract level 5, the charged fee is normally set higher than at the contract level 5.

(1-25) Step S125 (Monitoring Service)

When a menu of "Monitoring" is selected by the operator at a step S125 on the service receiving device 1, the control section 21 transmits an instruction of monitoring and analyzing the component mounting line 100 of its own factory with the monitoring and analysis software 372 by the service providing device side transmitting/receiving section 23 via the network 60 to the service providing device 2. Upon reception of the instruction by the transmitting/receiving section 305, in the service providing device 2, the control section 301 reads and activates the monitoring and analysis software 372 from the monitoring and analysis software DB 330 in response to this request. As a result, in accordance with a procedure of the monitoring and analysis software 372, the control section 301 periodically transmits a request of uploading the facility information 211, the mounting tact information 213, the NC data 220, and the inspection result information 212 by the transmitting/receiving section 305 via the network 60 to the service receiving device 1. Based on the uploaded facility information 211, mounting tact information 213, NC data 220, and inspection result information 212, the control section 301 monitors a production status.

If any problem is found as the result of monitoring, the control section 301 analyzes the cause of the problem and feedbacks the result of analysis by the transmitting/receiving section 305 via the network 60 to the service receiving device 1. This monitoring analysis procedure will be described below in detail. The result of analysis of abnormality found after monitoring and analysis of a tendency before the occurrence of abnormality is feedbacked to the service receiving device 1. This feedback is implemented from the service receiving device 1 to the management device 101 and then from the management device 101 to the component mounting apparatus k.

As a result, the abnormality can be immediately found in the component mounting apparatus k or a state immediately before the occurrence of abnormality can be found to immediately ascertain the cause and to accurately implement the countermeasures against it. Therefore, it is ensured to eliminate the abnormality or prevent the abnormality with a high response.

(2) Operation of the Monitoring and Analysis Service

The monitoring and analysis service is carried out by the control section 301 executing the monitoring and analysis software 372 in the service providing device 2 to perform the control in accordance with the procedure of the monitoring and analysis software 372. The monitoring and analysis software 372 includes a monitoring software and an analysis software. In the case where both the monitoring and analysis are to be executed, the monitoring software and the analysis software are executed in this order.

Upon execution of the monitoring software, the control section 301 periodically collects the facility information 211, the mounting tact information 213, the NC data 220, and the inspection result information 211 by the transmitting/receiving section 305 via the network 60. The control section accumulates the collected facility information 211, the mounting tact information 213, and the NC data 220 in the operation quality information DB 51. The control section 301 creates a graph for monitoring an operation status or a quality status based on the data collected and accumulated in the operation quality information DB 51 so as to display the graph on a display section 307. As a result, the occurrence of abnormality is immediately found so as to facilitate the analysis of the abnormality.

Upon execution of the analysis software, the control section 301 analyses the contents of abnormality which are revealed as a result of monitoring or are input through the service receiving device 1 so as to search the cause thereof. When the cause is found, the feedback for eliminating the cause is given by the transmitting/receiving section 305 via the network 60 to the service receiving device 1.

In this embodiment, the monitoring and analysis software 372 are executed in the service providing device 2 so as to perform the monitoring and analysis. Then, the graph is displayed on the display section 307 of the service providing device 2 to give the feedback from the service providing device 2. However, it is not limited thereto. For example, the monitoring and analysis software 372 may be installed from the service providing device 2 via the network 60 to the service receiving device 1 so as to execute the monitoring and analysis software 372 in the service receiving device 1, thereby displaying the graph on the display section 25 of the service receiving device 1. Then, the feedback may be given from the service receiving device 1 to the management device 101 of each factory.

Among the monitoring and analysis services, a detailed processing procedure of the operation for performing the graph display of the monitoring and analysis and the operation for monitoring the graph display and analyzing the abnormality will be described below.

(2-1) Operation of Graph Display of Monitoring and Analysis

The operation of graph display of the monitoring and analysis of the service providing device 2 will be described using flow charts of FIGS. 44A to 44C.

(a) Operation of Graph Display of Line Operation Rate Transition Analysis

Figure 44A:
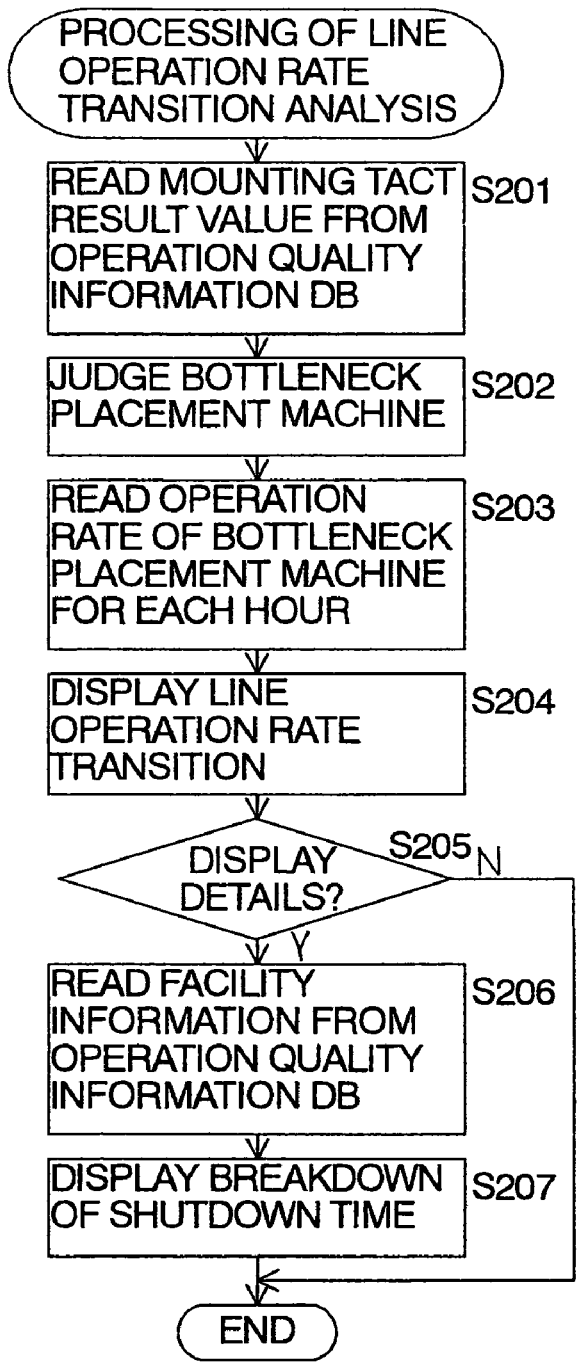
FIG. 44A is a flow chart showing an operation of graph display for a line operation rate transition analysis processing related to monitoring and analysis in the third embodiment.

FIG. 44A shows a flow chart of an operation of line operation rate transition analysis. The line operation rate represents an operation rate of the entire component mounting line 100; for example, an operation rate of a bottleneck component mounting apparatus which is a component mounting apparatus having the largest mounting tact result value in the component mounting line 100 is considered as a line operation rate.

As shown in the drawing, the control section 301 reads a mounting tact result value of each product type of all component mounting apparatuses k of a specified factory at the destination of delivery of the component mounting apparatus from the mounting tact DB 32 of the operation quality information DB 51 (Step S201) so as to judge which component mounting apparatus k of each product type is a bottleneck component mounting apparatus (a component mounting apparatus having the largest mounting tact result value in the component mounting line 100) (Step S202). Next, the operation rate of the bottleneck component mounting apparatus corresponding to production time of the product type, which is judged for each product type described above in the specified factory at the destination of delivery of the component mounting apparatus, is fetched out from the facility information DB 30 of the operation quality information DB 51 (step S203) so as to display the line operation rate transition on the display section 307 as a graph (Step S204).

If, for example, the operator of the service providing device 2 performs an input operation for displaying the details of shutdown time for the purpose of analyzing the cause of a lowered line operation rate (Step S205), the facility information 31 of each component mounting apparatus k at a specified factory of the destination of delivery of a component mounting apparatus is read for each hour from the facility information DB 30 of the operation quality information DB 51 (Step s206). Then, the breakdown of shutdown time for each component mounting apparatus k, that is, P-plate waiting time, trouble shutdown time, maintenance time, and the like are displayed for each period of time (step S207).

(b) Operation of Graph Display of Line Mounting Tact Analysis

Figure 44B:
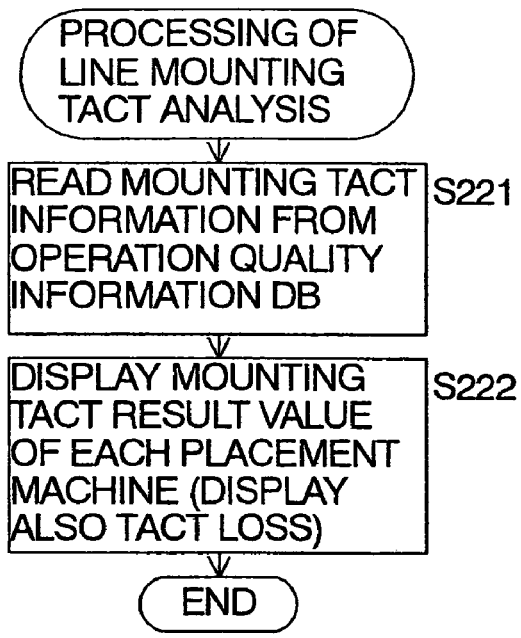
FIG. 44B is a flow chart showing an operation of graph display for a line mounting tact analysis processing related to monitoring and analysis in the third embodiment.

FIG. 44B shows a flow chart of an operation of graph display of line mounting tact analysis. The line mounting tact represents a mounting tact of the entire component mounting line 100; for example, the largest mounting tact result value among the mounting tact result values of the respective component mounting apparatuses k of the component mounting line 100 is considered as a line component tact.

As shown in the drawing, the control section 301 reads the mounting tact information 33 of the specified product type of all component mounting apparatuses k of the specified factory at destination of delivery of a component mounting apparatus from the mounting tact DB 32 of the operation quality information DB 51 (step S221) to arrange the mounting tact result values of the respective component mounting apparatuses k so as to clarify the tact balance, thereby performing the graph display on the display section 307 (step S222). Then, as the breakdown of the mounting tact result values of the respective component mounting apparatuses k which are displayed on the graph, for example, in the case of the placement machine n108, the XY table movement loss and the component supplying device movement loss of each placement machine n108 are simultaneously displayed.

(c) Operation of Graph Display of Suction Rate Transition Analysis

Figure 44C:
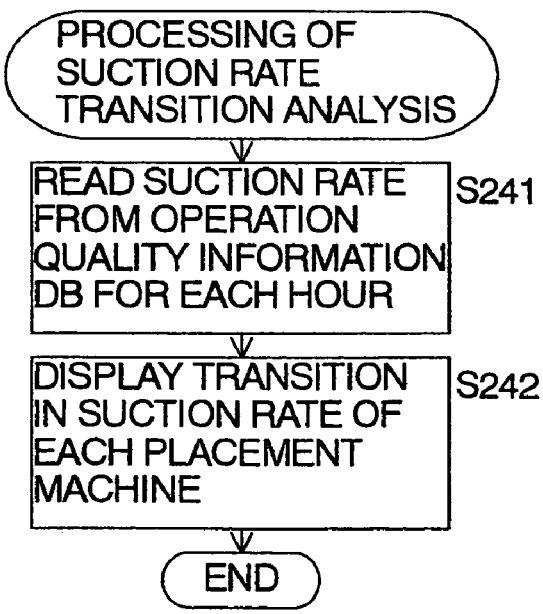
FIG. 44C is a flow chart showing an operation of graph display for a suction rate transition analysis processing related to monitoring and analysis in the third embodiment.

FIG. 44C shows a flow chart of an operation of graph display of suction rate transition analysis. The control section 301 fetches suction rates of all placement machines at a specified factory of destination of delivery of the component mounting apparatus from the facility information DB 30 of the operation quality information DB 51 (step S241) so as to display a transition in suction rate of each placement machine n108 on the display section 307 as a graph (step S242).

(d) Operation of Graph Display of Inspection Result Defective Rate Transition Analysis Although not illustrated, the control section 301 displays a transition in rate of occurrence of NG as the result of inspection on the display section 307 as a graph in the same manner as in FIGS. 44A to 44C. For example, the rate of occurrence of NG may be a rate of occurrence of NG even for a point on one circuit board or may be a rate of occurrence of NG in each component to be mounted.

Alternatively, as the details of a status of occurrence of a defect, the control section 301 displays the breakdown of NG of the result of inspection on the display section 307 as a graph. For example, in the result of inspection for each time period or product type, a ratio of frequency of occurrence of each of a placement offset of a component, a missing component, bridge, poor soldering connection, and the like is displayed as a graph. For example, it is displayed which one of the placement offset of a component, a missing component, bridge, poor soldering connection and the like corresponds to the breakdown of a defect of each circuit board or with a specified circuit number.

(2-2) Operation of Monitoring and Analysis

Figure 56:
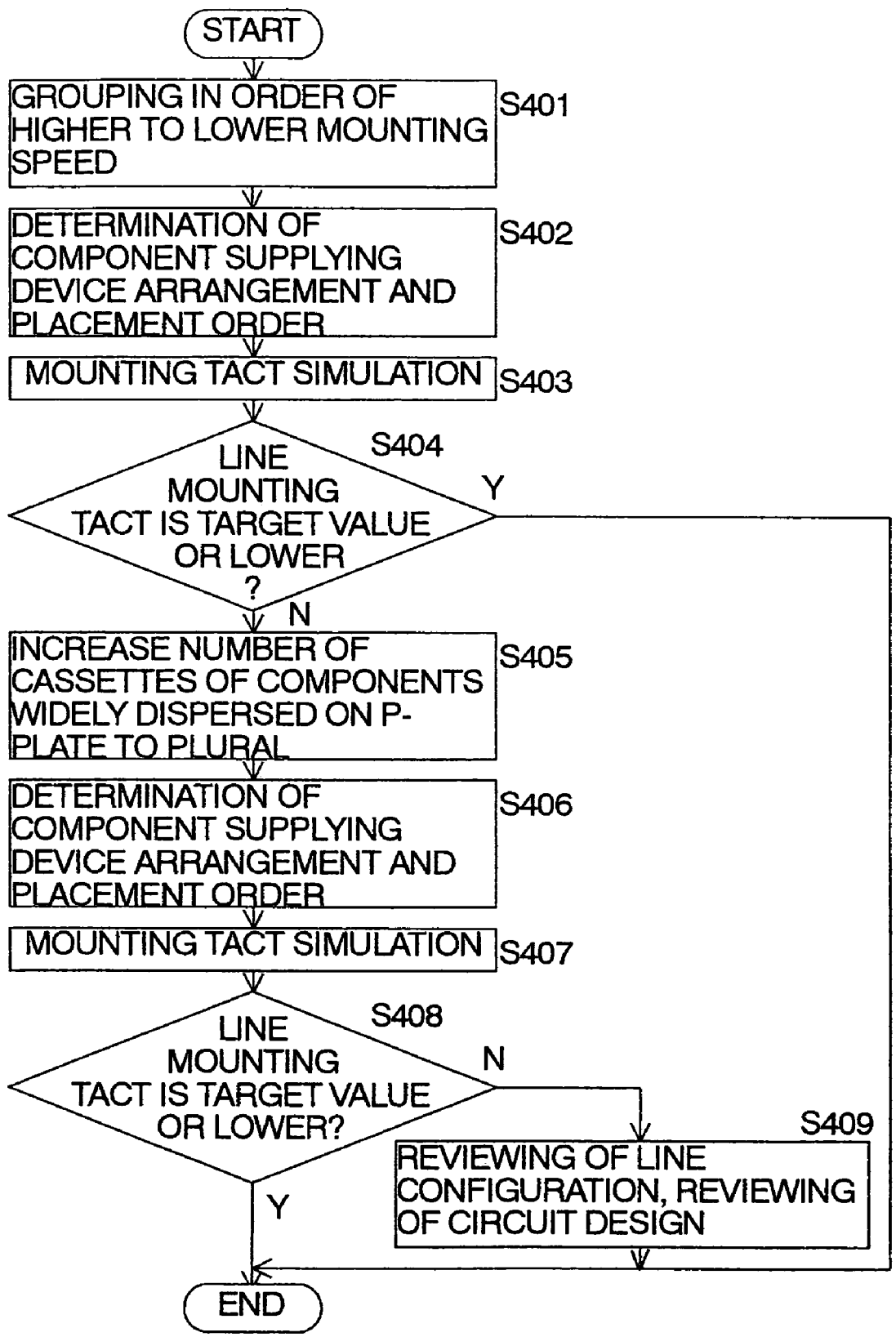
FIG. 56 is a flow chart showing an optimization processing for a placement machine alone in the third embodiment.

An operation of monitoring and analysis will be described using flow charts of FIGS. 45 and 56. Although the following operation of monitoring and analysis will be described for an example where the monitoring and analysis is performed on the placement machine n108, it is not limited thereto. The monitoring and analysis may be performed on the component mounting apparatus k other than the placement machine n108 in the same concept.

It is the operator of the service providing device 2 that performs an operation of monitoring and analysis. The operator of the service providing device 2 may check the displayed graph of an operation status as described above from various aspects to narrow down the problem so as to pursue the cause. In addition to this, however, the control section 301 of the service providing device 2 is capable of not only displaying the graph of an operation status as described above, but also internally checking the data for displaying the graph of an operation status from various aspects to narrow down the problem so as to pursue the cause. In a procedure of monitoring and analysis described below, it may be any of the operator of the service providing device 2 and the control section 301 of the service providing device 2 that performs the monitoring and analysis.

Figure 45:
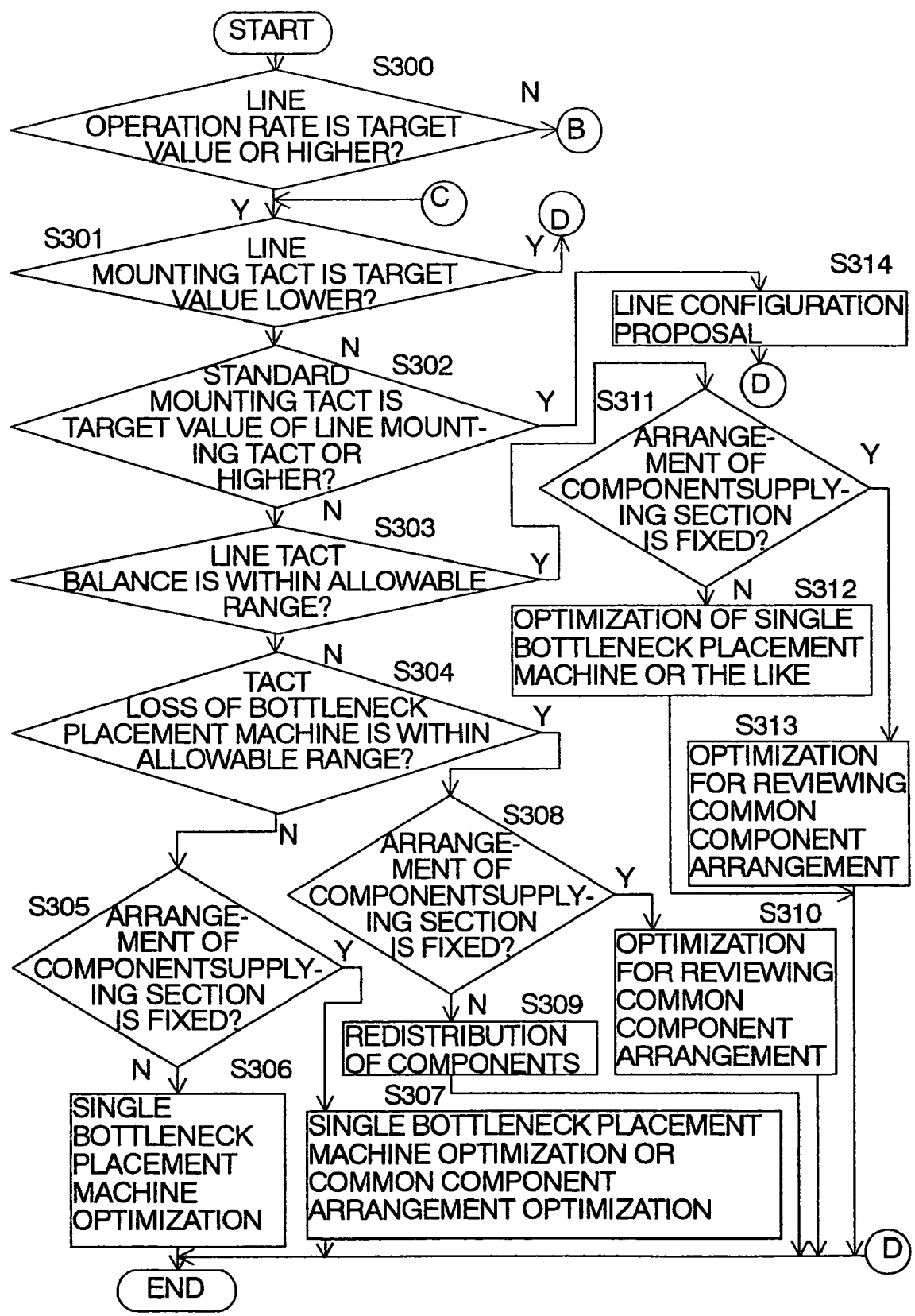
FIG. 45 is a flow chart in the case where an operation rate indicating an operation of monitoring and analysis is a target value or higher in the third embodiment.
Figure 47A:
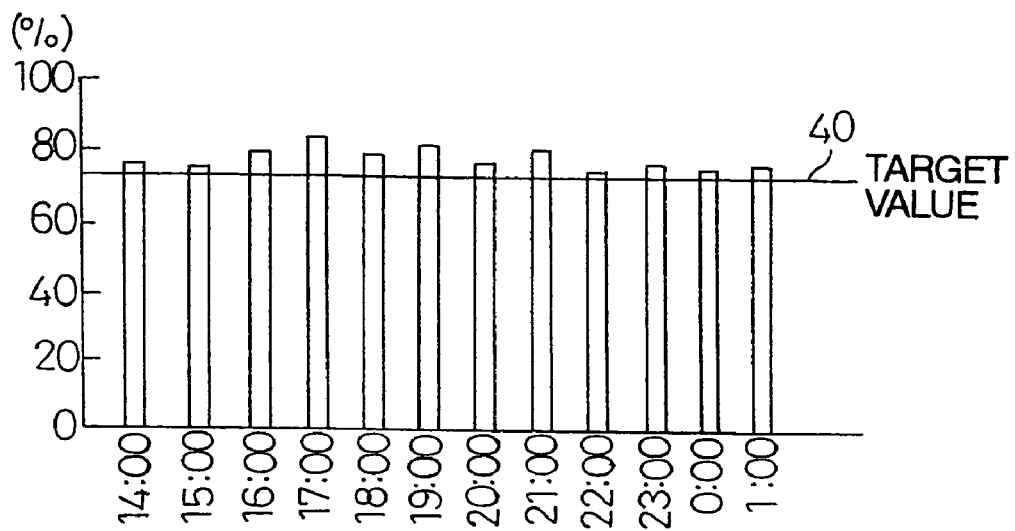
FIG. 47A is a view showing a display screen of line operation rate transition analysis in the third embodiment.

In FIG. 45, in view of the graph showing the line operation rate transition, it is monitored if the line operation rate maintains a target value or higher (step S300). For example, FIG. 47A shows the display of the line operation rate of the component mounting line 100 while specifying the destination of delivery of a component mounting apparatus. The abscissa represents time, whereas the ordinate the line operation rate. The line operation rate for each time is represented on the graph. A line 40 indicates a target value of the line operation rate. On this graph, the target value 40 of the line operation rate is set at 73%. According to this graph, the line operation rate transits while maintaining the target value or higher. Herein, the target value 40 of the line operation rate is stored in advance in the operation quality information DB 51 of the service providing device 2.

A processing in the case where the line operation rate does not transit while maintaining the target value or higher will be described below using FIG. 46.

Figure 47B:
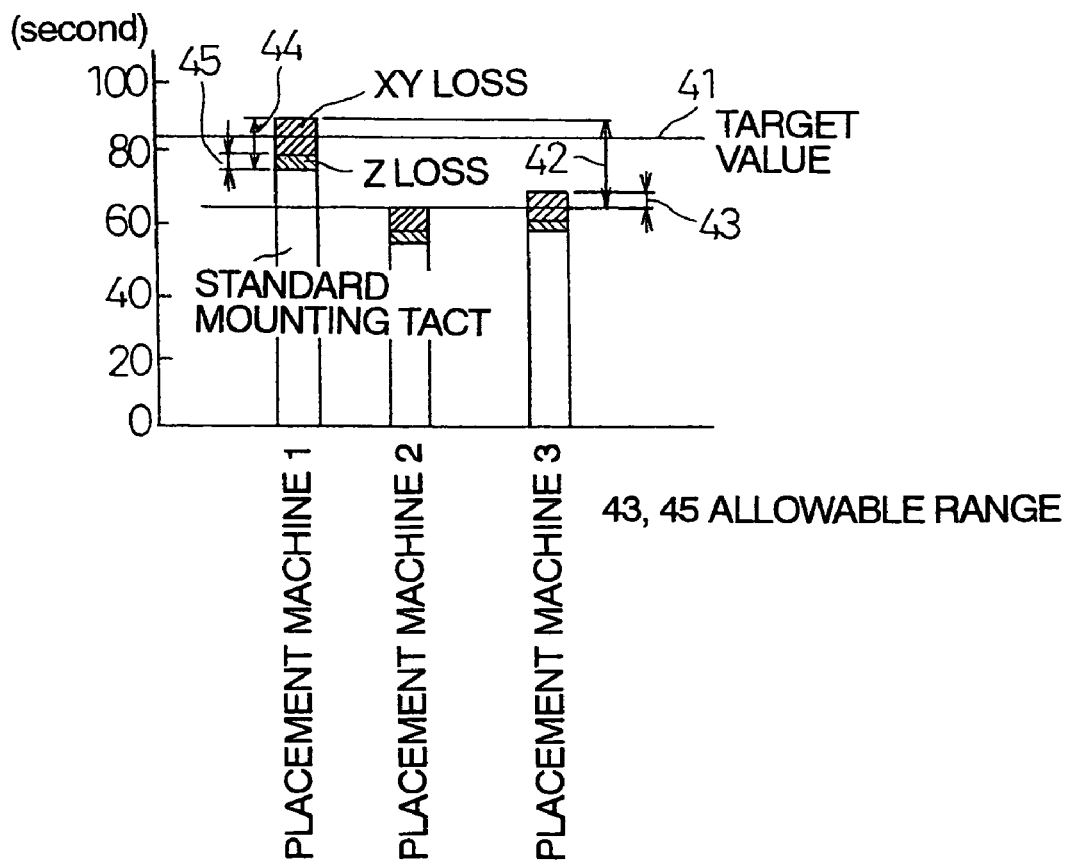
FIG. 47B is a view showing a display screen of line tact analysis corresponding to FIG. 47A.

After monitoring the line operation rate, in view of the graph of the line mounting tact in a specified product type in the same component mounting line 100, it is monitored if the line mounting tact maintains the target value or lower (step S301). FIG. 47B shows an example where the line mounting tact is displayed as a graph. The graph shown in FIG. 47B is for the same component mounting line 100 as that for the graph shown in FIG. 47A. The abscissa represents a placement machine, whereas the ordinate represents a placement tact result value, indicating a placement tact result value of each placement machine n108 of the component mounting line 100. As the breakdown of the placement tact result value, the standard mounting tact, the XY table movement loss (XY loss), and the component supplying device movement loss (Z loss) are shown as a graph. A line 41 indicates a target value of the line mounting tact. According to this graph, a mounting tact is later than a target value. Therefore, the process proceeds to step S302. Herein, the target value 41 of the line mounting tact is stored in advance in the operation quality information DB 51 of the service providing device 2.

Next, on the graph of the line mounting tact displayed at the step S301, it is monitored if the standard placement tacts of all placement machines are not above the target value of the line mounting tact (step S302). Since there is no placement machine n108 having the standard placement tact above the target value of the line mounting tact in FIG. 47B, the process proceeds to step S303.

Next, on the graph of the line mounting tact displayed at the step S301, it is monitored if the line tact balance is within the allowable range (step S303). The allowable range of the line tact balance is present in the operation quality information DB 51. As an example, the allowable range is set to be within 5% of a mean value of each placement machine n108. Since a difference 42 in placement tact result value between a placement machine 1 serving as a bottleneck placement machine as described above and a placement machine 2 having the smallest placement tact result value exceeds an allowable range 43 of the line tact balance in FIG. 47B, the process proceeds to step S304.

Next, on the graph of the line mounting tact displayed at the step S301, it is monitored if the tact loss of the bottleneck placement machine is within the allowable range (step S304). The allowable range of the tact loss is present in the operation quality information DB 51. As an example, the allowable range is set to be within 5% of the standard mounting tact. In FIG. 47B, it is understood that a tact loss 44 of the placement machine 1 serving as a bottleneck placement machine exceeds an allowable range 45 of the tact loss. In examples of FIGS. 47A and 47B, the line mounting tact is later than the target value due to the excess of the tact loss of the placement machine 1 serving as a bottleneck placement machine from the allowable range 45. Therefore, this tact loss must be eliminated. In this case, the process proceeds to step S305.

Next, in the product type in the cause of analysis, it is judged if the component supplying device 5 is fixed at the same position as that of the previous type (common component arrangement) (step S305). A judgment method may be for checking if the arrangement of the component supplying device 5 is the same as that of the previous product type based on the NC data 220 (the arrangement program 231) or for collecting flags indicating if it is the common component arrangement or not, which is set in the placement machine n108 and the management device 101, by the service receiving device 1 together with the facility information 211 to perform the judgment in view of the collected flags.

In the case where the component supplying device 5 is not fixedly arranged but is freely arranged, the optimization of a single placement machine is carried out to eliminate the tact loss of the bottleneck placement machine so as to lower the line mounting tact below the target value (step S306). In this case, the arrangement of the component supplying device 5 and the placement order are both optimized. The details will be described below.

On the other hand, in the case where the arrangement of the component supplying device 5 is fixed, first, the optimization for eliminating the tact loss of the bottleneck placement machine is performed on a single placement machine. This serves as the optimization of the placement order under the condition where the arrangement of the component supplying device 5 is fixed. As a result, if the line mounting tact is lowered to the target value or lower, the optimization is completed. If the mounting tact is not lowered to the target value or lower, the optimization for reviewing the common arrangement of the component supplying device 5 (step S307). The details thereof will be described below.

Figure 48A:
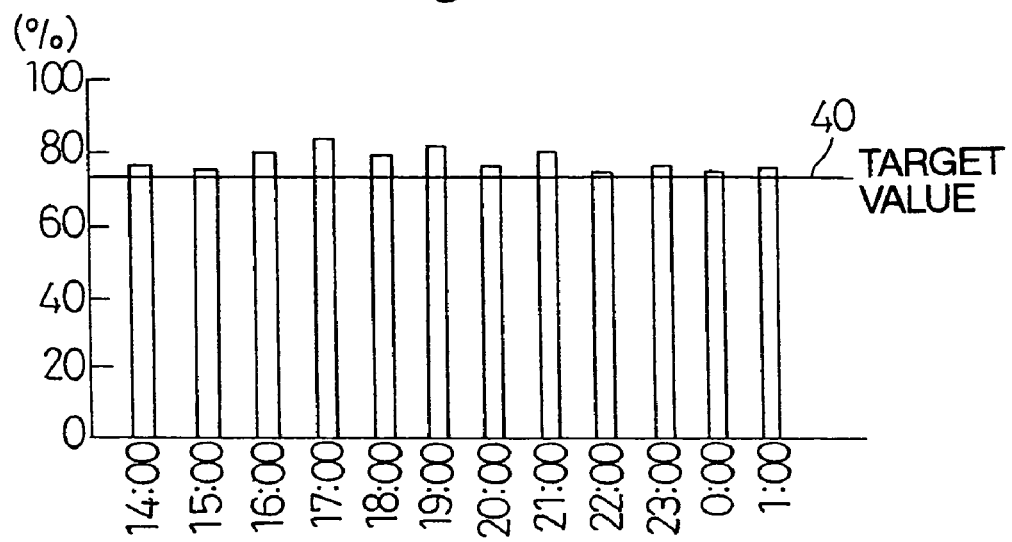
FIG. 48A is a view showing another display screen of line operation rate transition analysis in the third embodiment.
Figure 48B:
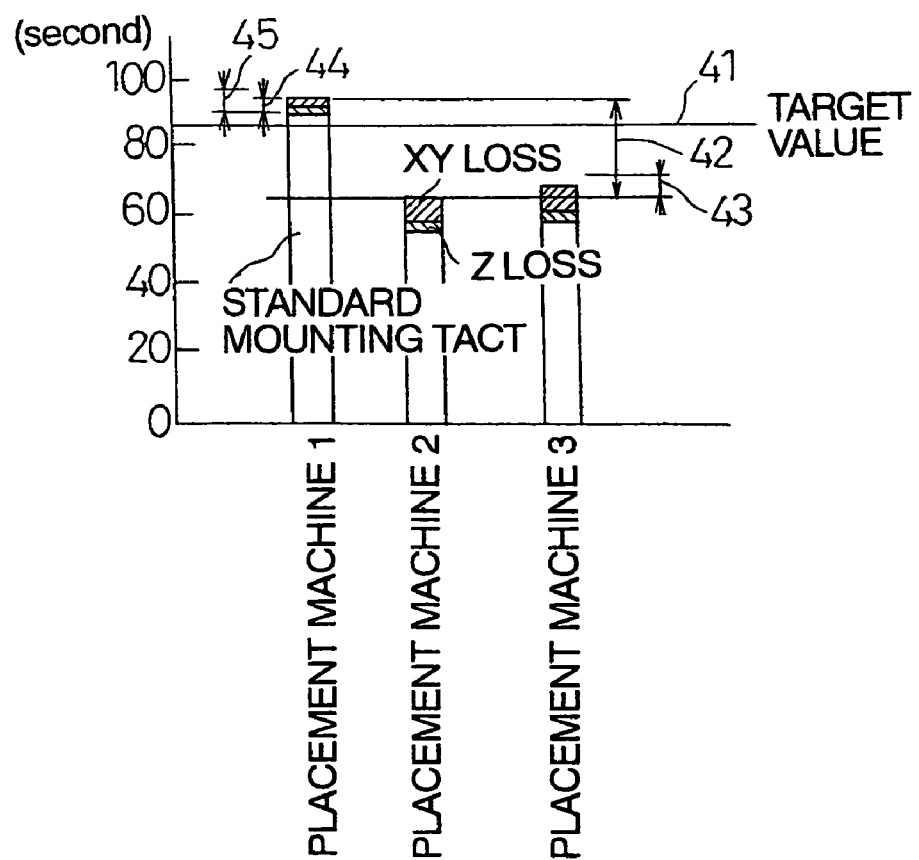
FIG. 48B is a view showing a display screen of line tact analysis corresponding to FIG. 48A.

At a step S304, as shown in FIG. 48B, in the case where the tact loss 44 of the placement machine 1 serving as the bottleneck placement machine falls within the allowable range 45 of the tact loss, it means that there is a problem with the distribution of components to each placement mounting apparatus n108. In this case, it is necessary to correct the distribution. Thus, the process proceeds to a step S308.

At the step S308, in the product type in the course of analysis, it is judged whether the component supplying device 5 is fixed at the same position as the previous type (the common component arrangement). A method of judgment is similar to that at the step S305.

In the case where the component supplying device 5 is freely arranged, the operation for redistributing the components to each placement machine n108 is performed in order to eliminate the line tact unbalance to lower the line mounting tact to the target value or lower (step S309). In this case, after redistribution of the components, the single placement machine optimization for optimizing both the arrangement of the component supplying device 5 and the placement order is performed on each placement machine n108. The details thereof will be described below.

On the other hand, in the case where the component supplying device 5 is fixedly arranged, the optimization for reviewing the common arrangement of the component supplying device 5 (step S310). Naturally, in this case, the optimization for redistributing the components to each placement machine n108 is also performed. The details thereof will be described below.

Figure 49A:
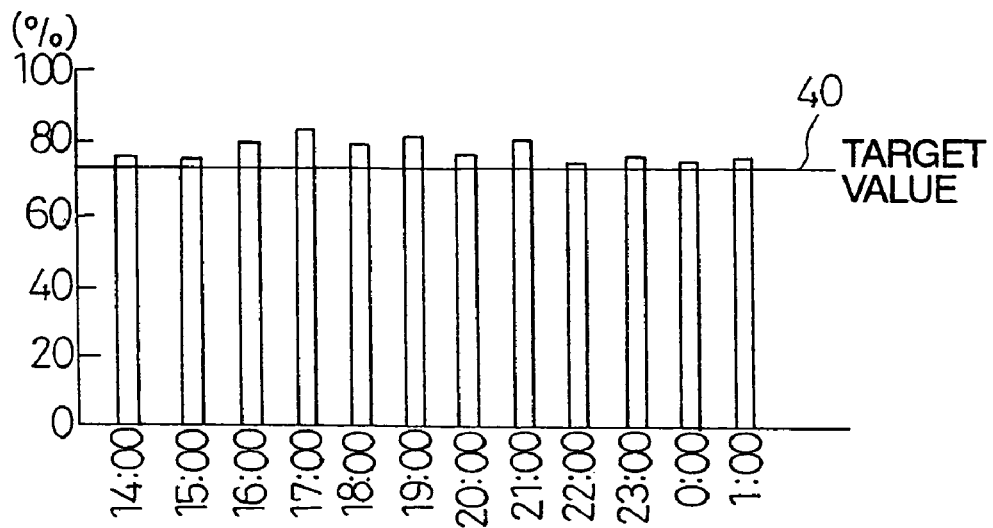
FIG. 49A is a view showing a further display screen of line operation rate transition analysis in the third embodiment.
Figure 49B:
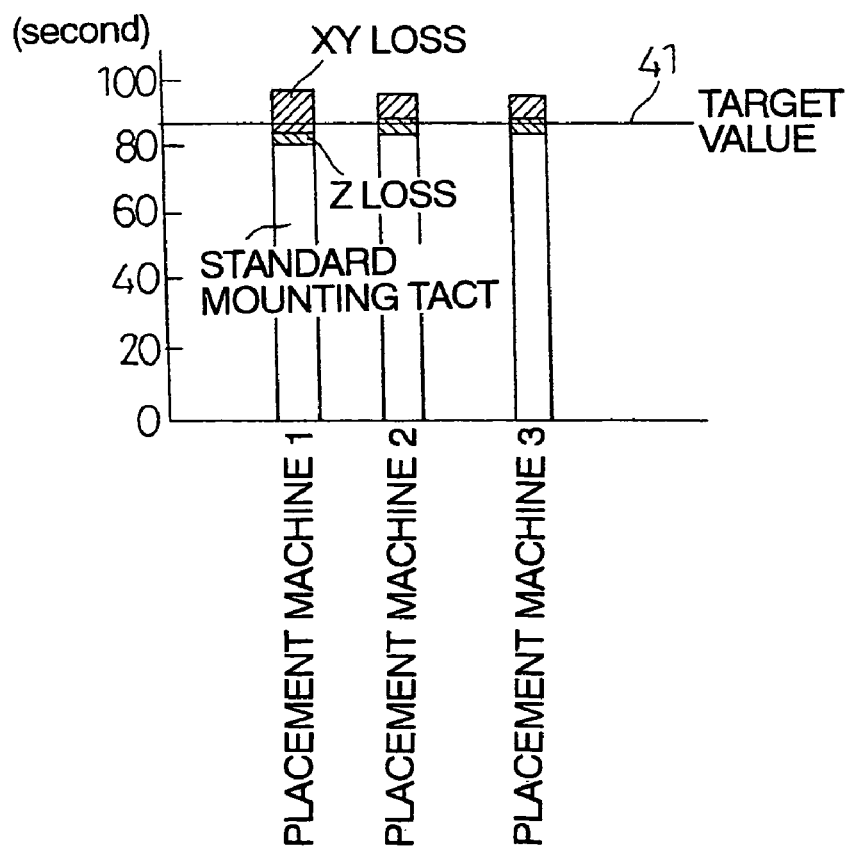
FIG. 49B is a view showing a display screen of line mounting tact analysis corresponding to FIG. 49A.

At a step S303, as shown in FIG. 49B, in the case where the line tact balance is struck, the line mounting tact becomes larger than the target value due to a tact loss of each placement machine. Therefore, the line tact balance is obtained due to a large tact loss of each placement machine. It is necessary to perform the optimization for eliminating this tact loss of each placement machine. Thus, the process proceeds to step S311.

At the step S311, in the product type in the course of analysis, it is judged whether the component supplying device 5 is fixed at the same position as that of the previous type (common component arrangement). A judgment method is similar to that of the step S305.

In the case where the component supplying device 5 is freely arranged, the single placement machine optimization is performed in each placement machine in order to eliminate the tact loss of each placement machine n108 to lower the line mounting tact to the target value or lower (step S312). The optimization for both the arrangement of the component supplying device 5 and the placement order is performed. The details thereof will be described below.

On the other hand, in the case where the component supplying device 5 is fixedly arranged, the single placement machine optimization is first performed in each placement machine n108 so as to eliminate the tact loss of each placement machine. This serves as the optimization of the placement order under the condition where the component supplying device 5 is fixedly arranged. If the line mounting tact can be lowered to the target value or lower by this optimization, the optimization is completed. If the line mounting tact is not lowered to the target value or lower, the optimization for reviewing the common arrangement of the component supplying device 5 is performed (step S313). The details thereof will be described below.

Figure 50A:
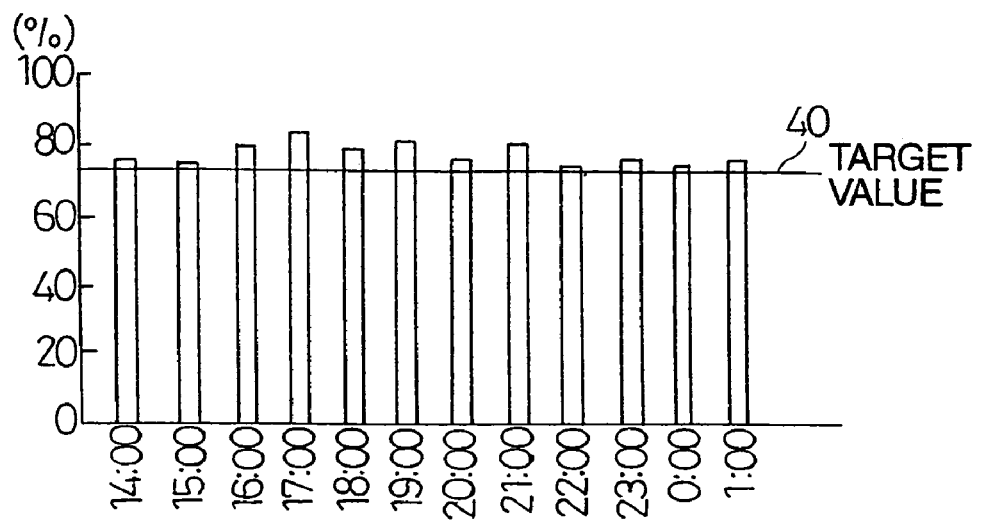
FIG. 50A is a view showing a further display screen of line operation rate transition analysis in the third embodiment.
Figure 50B:
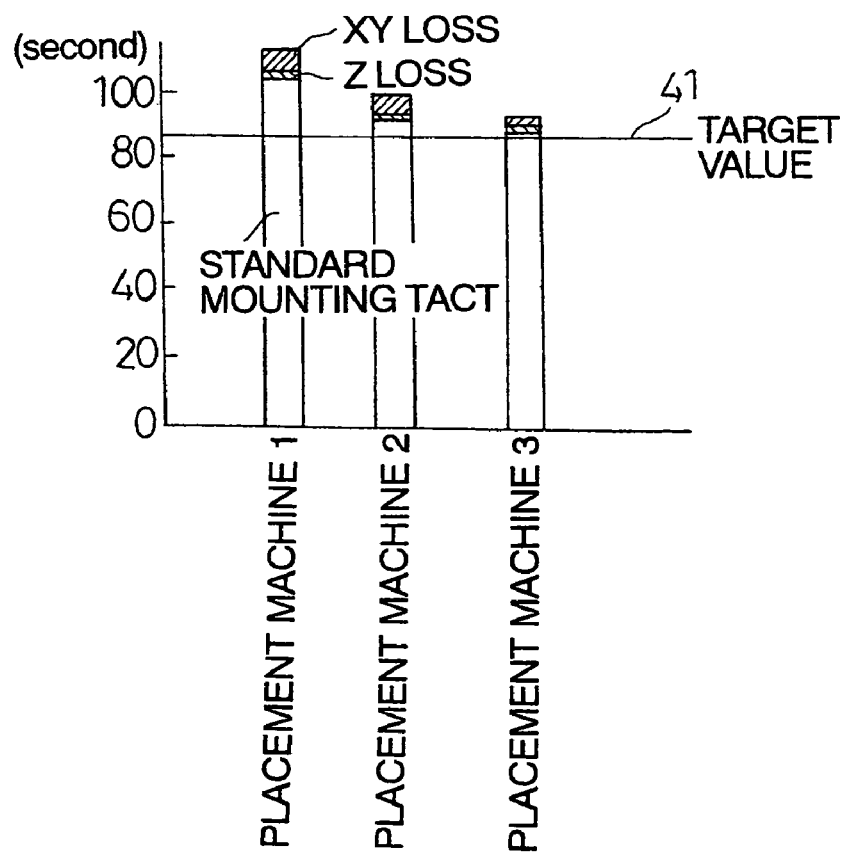
FIG. 50B is a view showing a display screen of line mounting tact analysis corresponding to FIG. 50A.

At the step S302, in the case where the standard mounting tact of all placement machines is the target value 41 of the line mounting tact or higher as shown in FIG. 50B, it is considered that it is impossible to lower the line mounting tact to the target value or lower with this configuration of the component mounting line 100, thereby proposing a configuration of the component mounting line 100.

A process in the case where the line operation rate is lowered at the step 300 will be described using a flow chart of FIG. 46.

Figure 51A:
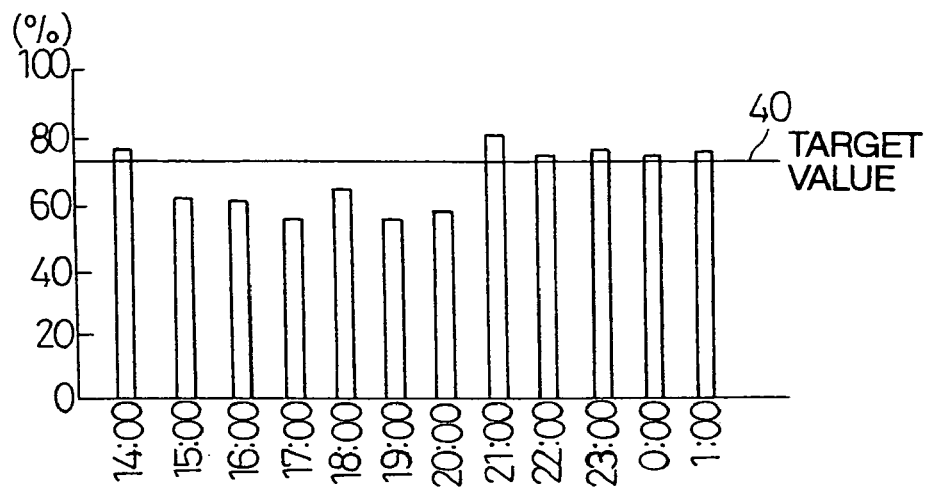
FIG. 51A is a view showing a further display screen of line operation rate transition analysis in the third embodiment.
Figure 51B:
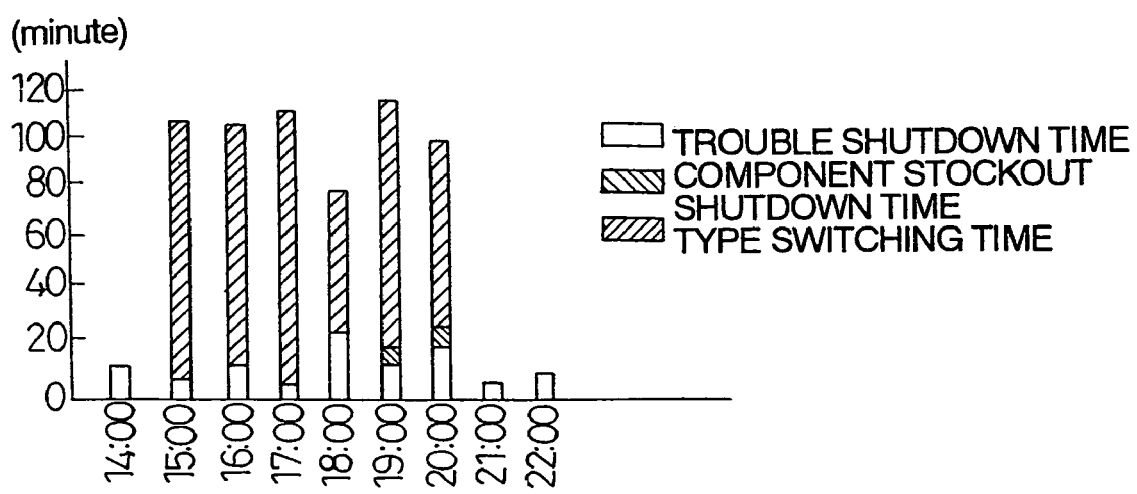
FIG. 51B is a view showing a display screen of shutdown time transition analysis corresponding to FIG. 51A.

In FIG. 51A, the line operation rate is below the target value between 15 o'clock to 20 o'clock. In order to examine this cause, the breakdown of shutdown time of the placement machine 1 serving as a bottleneck placement machine between 15 o'clock to 20 o'clock is displayed as a graph as shown in FIG. 51B. In the drawing, the abscissa represents time, whereas the ordinate represents shutdown time, displaying the breakdown of shutdown time for each hour. In view of the drawing, it is understood that the amount of type switching time is large between 15 o'clock to 20 o'clock (step S315). Therefore, since the lowered line operation rate is due to a large amount of type switching time, the process proceeds to step S316 in order to perform the optimization for reducing the amount of type switching time.

At the step S316, the optimization of the common arrangement of the component supplying device 5 is executed to obtain theoretical values of the line mounting tact in each product type and the type switching time between each product type through the tact simulation for examination. The details thereof will be described below.

The example where the line operation rate is lowered in the case where the amount of type switching time is large in the bottleneck placement machine has been described above. However, even in the placement machine other than the bottleneck placement machine, in the case where the amount of type switching time becomes large in any of the placement machines constituting the component mounting line 100, the amount of shutdown time of the bottleneck placement machine is increased due to the effect (for example, in the case where the type is switched for the entire line at a time, at the beginning of next production after the completion of the type switching for all placement machines). As a result, the line operation rate may be lowered.

Figure 52A:
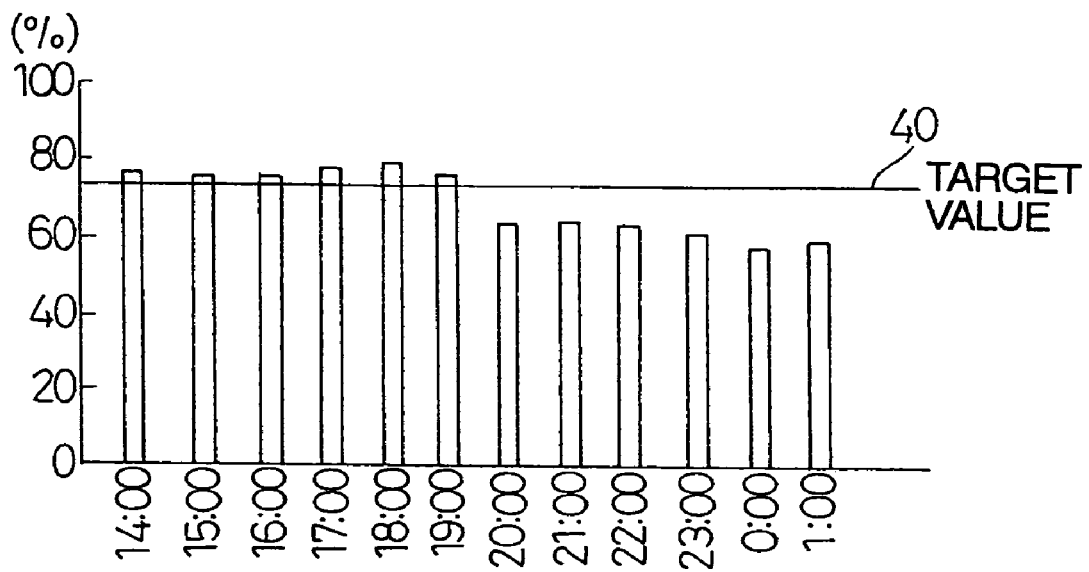
FIG. 52A is a view showing a further display screen of line operation rate transition analysis in the third embodiment.
Figure 52B:
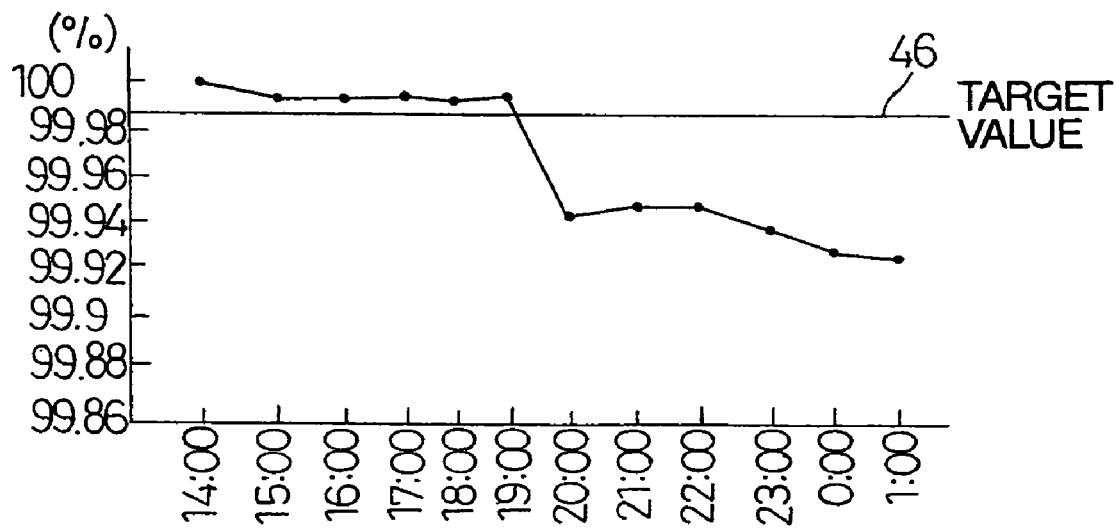
FIG. 52B is a view showing a display screen of component suction rate transition analysis corresponding to FIG. 52A.

Next, in an example of FIG. 52A, the line operation rate is below the target value after 20 o'clock. In order to examine the cause for this, the transition in suction rate of the component suction nozzle 7 of the placement machine 1 serving as a bottleneck placement machine is displayed as shown in FIG. 52B. Then, it is understood that the suction rate is below a target value 46 (the target value of the suction rate is preset to 99.99% in the operation quality information DB 51 of the service providing device 2) after 20 o'clock (step S317). As a result, it is revealed that the lowered line operation rate is due to the lowered suction rate. Therefore, the cause of the lowered suction rate of the placement machine 1 is further analyzed.

First, a transition in suction rate for each kind of the component suction nozzle 7 of the placement machine 1 is examined (although not shown in the facility information 211 of FIG. 22, a suction rate for each type of the component suction nozzle 7 is collected from each placement machine n108). If a suction rate is lowered only for the specific component suction nozzle 7 (step S318), it is due to occurrence of a defect in the suction nozzle 7. In this case, a message is sent to the management device 101 of a corresponding factory at the destination of delivery of the component mounting apparatus so as to replace the suction nozzle 7. If necessary, the arrangement for shipping the component suction nozzle 7 as a mending part to a corresponding factory at the destination of delivery of the component is registered on the mending parts DB 323 in the service information DB 26 (step S319).

Next, a transition in suction rate for each kind of the component supplying device 5 (for example, a parts cassette) of the placement machine 1 is examined (the transition is also collected as one data in the facility information 211). If only a suction rate of the specific component supplying device 5 is lowered (step S320), it is due to occurrence of a defect in that component supplying device 5. In this case, a message is sent to the management device 101 of a corresponding factory at the destination of delivery of the component mounting apparatus so as to replace that component supplying device 5. If necessary, the arrangement for shipping the component supplying device 5 as a mending part to a corresponding factory at the destination of delivery of the component is registered on the mending parts DB 323 in the service information DB 26 (step S321).

Figure 53A:
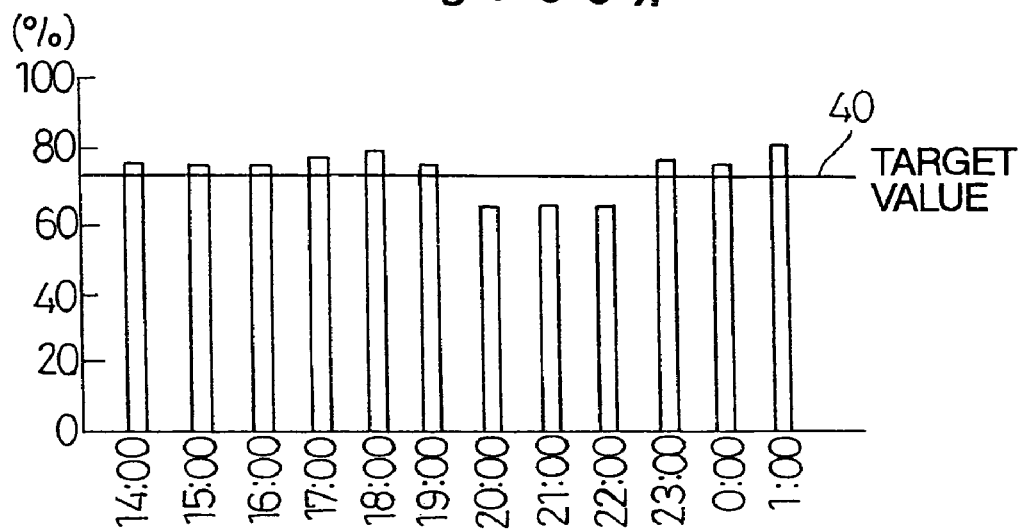
FIG. 53A is a view showing a further display screen of line operation rate transition analysis in the third embodiment.
Figure 53B:
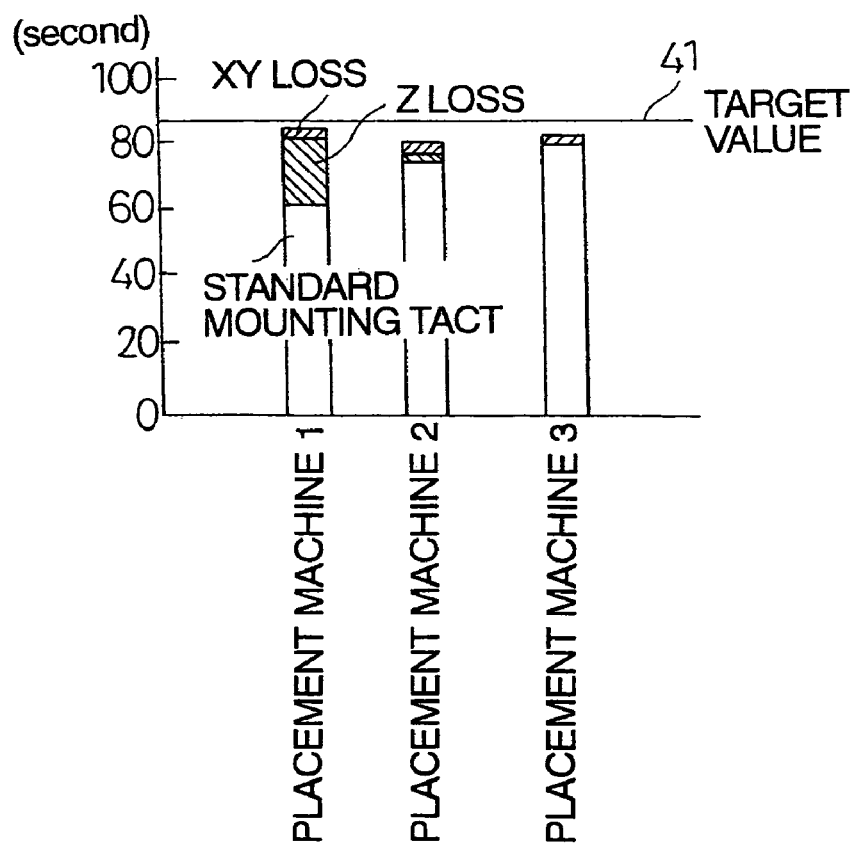
FIG. 53B is a view showing a display screen of line mounting tact analysis corresponding to FIG. 53A.

Moreover, the line mounting tact in a corresponding product type is examined. In an example of FIG. 53A, the line operation rate is lowered between 20 o'clock and 22 o'clock. FIG. 53B shows the display of the line mounting tact in the corresponding product type of that time period. In the drawing, the movement loss (Z loss) of the component supplying device 5 of the placement machine 1 serving as the bottleneck placement machine is large (step S322). This means that the amount of movement of the component supplying device 5 is large. As a result, the vibration of the component supplying section 11 is increased, which has the effect on the lowered suction rate. In this case, the single placement machine optimization is performed for the placement machine 1 so as to eliminate the movement loss of the component supplying device 5 (step S323). The details thereof will be described below.

The example where the line operation rate is lowered due to the lowered suction rate of the component suction nozzle 7 in the bottleneck placement machine has been described above. However, even in the placement machine n108 other than the bottleneck placement machine, in the case where the suction rate of the component suction nozzle 7 is lowered in any placement machine n108 constituting the component mounting line 100, the amount of shutdown time of the bottleneck placement machine is increased due to effects thereof. For example, in the case where the bottleneck placement machine is situated at the downstream of the placement machine n108 having a lowered suction rate, the amount of shutdown time for waiting a P plate (waiting the conveyance of a circuit board) is increased. In the case where the bottleneck placement machine is situated at the upstream of the placement machine n108 having a lowered suction rate, the amount of shutdown time due to jammed downstream where a circuit board is stopped at the downstream (a kind of P-plate waiting) is increased. As a result, the line operation rate may be lowered.

Figure 54A:
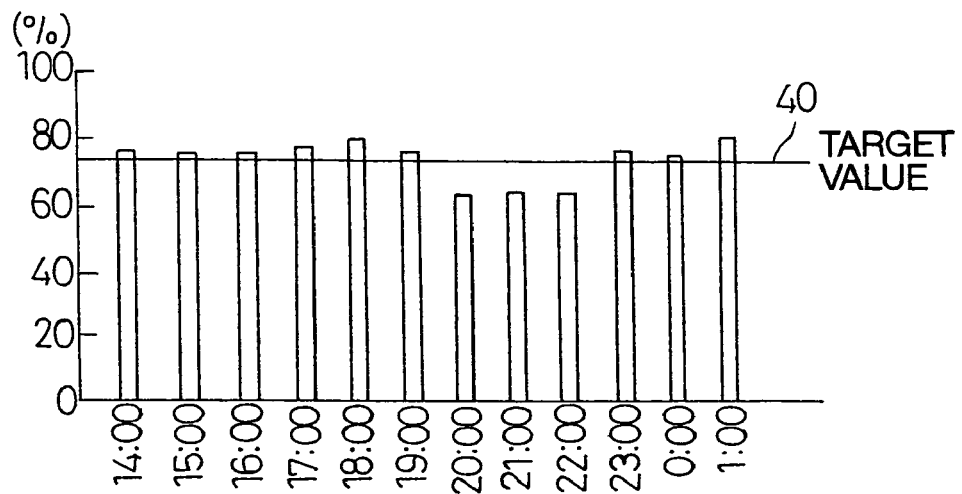
FIG. 54A is a view showing a further display screen of line operation rate transition analysis in the third embodiment.
Figure 54B:
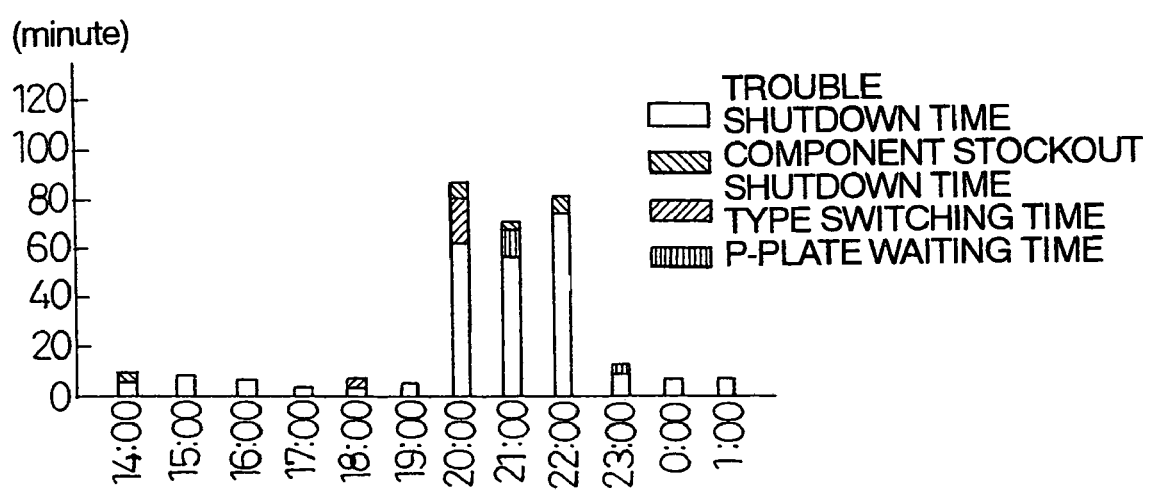
FIG. 54B is a view showing a display screen of shutdown time transition analysis corresponding to FIG. 54A.

Next, also in an example of FIG. 54A, the line operation rate is lowered between 20 o'clock to 22 o'clock. In order to examine the cause, the breakdown of shutdown time of the placement machine 1 serving as a bottleneck placement machine between 20 o'clock and 22 o'clock is displayed as a graph as shown in FIG. 54B. From the drawing, the amount of shutdown time due to a trouble is increased between 20 o'clock and 22 o'clock. It is revealed that the line operation rate is lowered due to an increased amount of shutdown time due to a trouble. Therefore, the cause of an increased amount of shutdown time of the placement machine 1 due to a trouble is analyzed.

First, a transition in the frequency of occurrence of wrong operations is examined (although not displayed in the facility information 211 of FIG. 22, it is assumed that each placement machine n108 detects a wrong operation and collects the frequency of occurrence of wrong operations). If the frequency of wrong operations of the placement machine 1 between 20 o'clock and 22 o'clock is increased, the wrong operation of the operator leads to a lowered line operation rate (step S324). In this case, a message indicating that the wrong operation of the operator leads to a lowered line operation rate is sent to the management device 101 of a corresponding factory at the destination of delivery of the component mounting apparatus. If necessary, the electronic file 355 of the instruction manual of the placement machine 1 is fetched out from the instruction manual DB 322 in the service information DB 26 so as to transfer the fetched electronic file 355 of the instruction manual of the placement machine 1 to the management device 101. Moreover, the virtual training software 361 for the placement machine 1 is fetched out from the virtual training DB 324 in the service information DB 26. The fetched virtual training software 361 is activated so as to offer the virtual training on the operator by remote processing using a display section of the management device 101 of a factory at the destination of delivery of the component mounting apparatus or the placement machine 1 (step S325). This virtual training is performed for an operation in which an error occurs, in accordance with the contents of wrong operation (assumed to be collected as the facility information 211 and written in the facility information DB 30). In the facility information DB 30, the data relating to operator shifts is also written. It is possible to analyze if the wrong operation occurs on a specific shift. If the wrong operation occurs in a specific shift time period, that is, with a specific operator, as a result of analysis, countermeasures for a specified operator can be taken such as offering the virtual training on that operator.

Next, the version of the software of the placement machine 1 is inspected (although not displayed in the facility information 211 of FIG. 22, it is assumed that the version information of the software of each placement machine n108 is collected as the facility information 211 and is stored in the operation quality information DB 51). Then, it is confirmed if the current version of the software of the placement machine 1 is the latest one or not while consulting the upgrade information 366 of the software DB 326 in the service information DB 26. In the case where the current software of the placement machine 1 is not the latest one, it is possible to examine the contents of upgrade or bug patch information in each version from history data of each version of the software of each placement machine n108 stored in the upgrade information 366. As a result, if it is revealed that an unpatched bug remains in the version of the software of the placement machine 1 which is the corresponding placement machine, leading to shutdown due to a trouble, the old version of the software causes the shutdown due to a trouble, that is, a lowered line operation rate (step S326). In this case, the latest version of the software 367 of a corresponding placement machine is fetched out from the software DB 326 in the service information DB 26 of the service providing device 2 so as to transfer it to the management device 101 of a corresponding factory of the destination of delivery of the component mounting apparatus. Then, the software is installed on the corresponding placement machine n108 by remote processing (step S327). At this moment, information relating to the installed latest version, for example, the contents of upgrade or the contents of a patched bug are also transferred to the management device 101. Moreover, in the case where a change or an addition occurs in the operation of the placement machine n108, a maintenance method, a message at the occurrence of a trouble, or the like due to upgrading to the latest version, the electronic file 355 of the instruction manual clearly showing the contents thereof is fetched out from the instruction manual DB 322 in the service information DB 26 to be transferred. Alternatively, a service for fetching the virtual training software 361 out from the virtual training DB 324 in the service information DB 26 so as to offer the virtual training is also carried out.

Next, as a result of examination if the NC data 220 is incomplete or not, in particular, the data in the component library 241 is incomplete or not (the component library 241 is, as described above, stored in the data memory section 22 for each placement machine), it is assumed that an incompletion is found. For example, it is assumed that a head speed in the component library 241 is set at high although it should be set at low for that component. In this case, since a rotation speed of the placement head 4 is too high, the suction force of the component suction nozzle 7 cannot sufficiently resist against the inertia force due to a mass of a component, causing a trouble such as a suction offset of a component or a falling component. Therefore, in this case, the incompletion of the component library 241 causes a lowered line operation rate (step S328). In this case, the component library 241 of a corresponding placement machine is read out from the mounted component DB 327 in the service information DB 26 so as to be transmitted to the management device 101 of a corresponding factory at the destination of delivery of the component mounting apparatus (step S329). The component library 241 stored in the mounted component DB 327 covers the data of components of all component manufacturers used in the field of mounting. However, only the component library 241 relating to a component, which meets the conditions of a manufacturer of the components used by the user to be serviced or the type of a produced circuit board, can be retrieved and transferred. As a result, since the minimum necessary component library 241 is transferred, the placement machine n108, for which the component library 241 is input, does not occupy the storage capacity with unnecessary data.

The example where a large amount of shutdown time due to a trouble in the bottleneck placement machine lowers the line operation rate has been described above. However, even in the placement machine other than the bottleneck placement machine, in the case where the amount of shutdown time due to a trouble is increased in any placement machine constituting the component mounting line 100, the amount of shutdown time of the bottleneck placement machine is increased under the influence thereof. For example, in the case where the bottleneck placement machine is situated at the downstream of the placement machine having a large amount of shutdown time due to a trouble, the amount of shutdown time for P-plate waiting (circuit board conveyance waiting) is increased. In the case where the bottleneck placement machine is situated at the upstream of the placement machine having a large amount of shutdown time due to a trouble, the amount of shutdown time due to jammed downstream where a circuit board is stopped at the downstream (a kind of P-plate waiting) is increased. As a result, the line operation rate may be lowered.

Figure 55A:
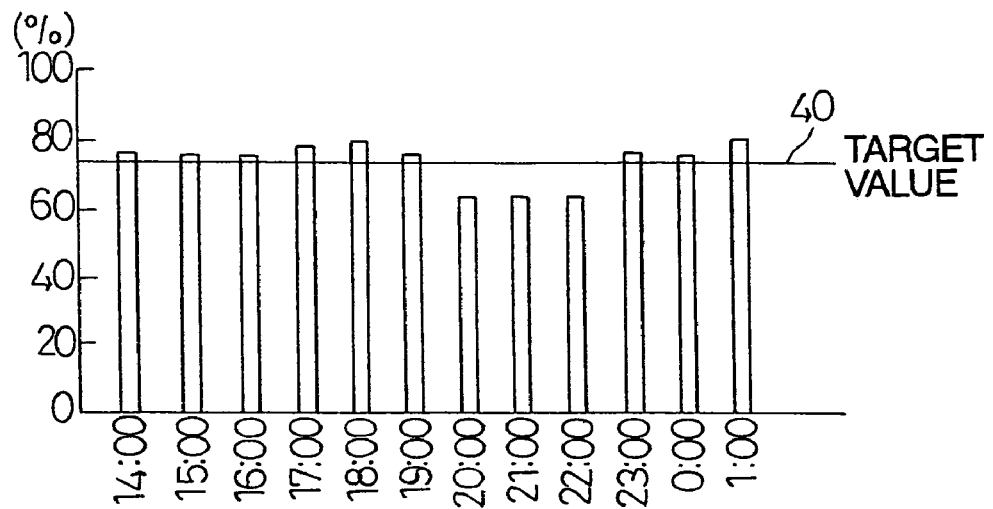
FIG. 55A is a view showing a further display screen of line operation rate transition analysis in the third embodiment.
Figure 55B:
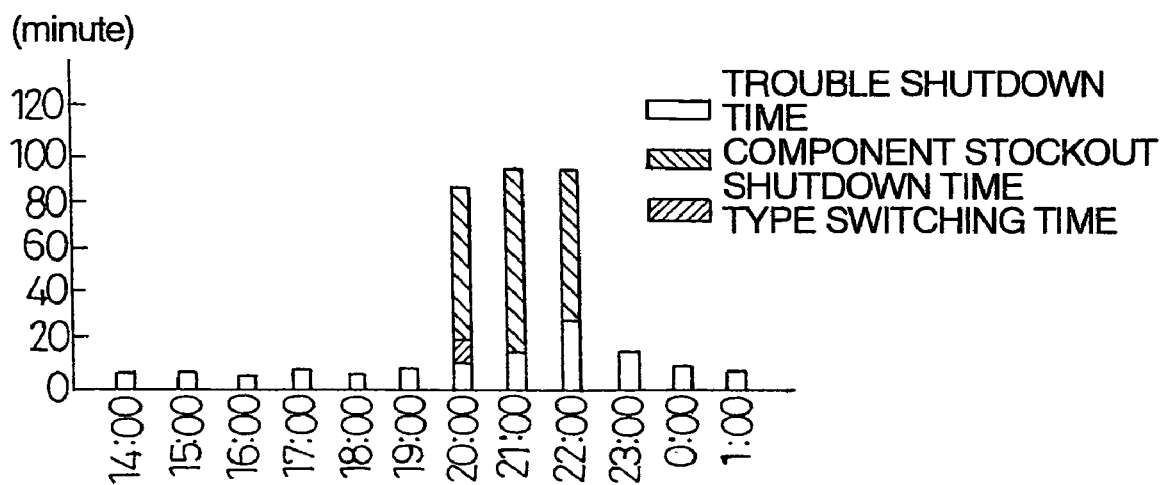
FIG. 55B is a view showing a display screen of shutdown time transition analysis corresponding to FIG. 55A.

In the example of FIG. 55A, the line operation rate is lowered between 20 o'clock and 22 o'clock. In order to examine the cause, as shown in FIG. 55B, the breakdown of shutdown time of the placement machine 1 serving as a bottleneck placement machine between 20 o'clock and 22 o'clock is displayed as a graph. From the drawing, it is understood that the amount of shutdown time due to component stockout is large between 20 o'clock and 22 o'clock. It is revealed that a large amount of shutdown time due to component stockout leads to a lowered line operation rate (step S330). In this case, it is important to quickly replace the component supplying device 5, in which the component runs out of stock. However, for example, if the number of the component supplying devices 5 to be provided is increased in accordance with the number of used components supplied by a single component supplying device 5 so that a plurality of component supplying devices 5 share the burden of supplying the component, the stockout itself does not occur. Therefore, there is also a choice of performing the optimization so that the number of the same component supplying devices 5 to be provided is increased (step S331). The details thereof will be described below.

The example where the line operation rate is lowered by a large amount of shutdown time due to component stockout in the bottleneck placement machine has been described above. However, even in the placement machine n108 other than the bottleneck placement machine, in the case where the amount of shutdown time due to component stockout is increased in any placement machine n108 constituting the component mounting line 100, the amount of shutdown time of the bottleneck placement machine is increased under the influence thereof. For example, in the case where the bottleneck placement machine is situated at the downstream of the placement machine n108 suffering from a large amount of shutdown time due to a trouble, the amount of shutdown time for P-plate waiting (circuit board conveyance waiting) is increased. In the case where the bottleneck placement machine is situated at the upstream of the placement machine n108 suffering from a large amount of shutdown time due to a trouble, the amount of shutdown time due to jammed downstream where a circuit board is stopped at the downstream (a kind of P-plate waiting) is increased. As a result, the line operation rate may be lowered.

As described above, the cause that the line mounting tact or the line operation rate does not reach the target value is analyzed from various aspects based on the obtained phenomena. The optimal response such as the optimization of the NC data 220, the service provision, or the like can be made through a remote operation via the network 60 depending on the case. Therefore, it is ensured that the line mounting tact or the line operation rate can be restored to the target value in real time. Moreover, the operation status is monitored and analyzed from various aspects, so that the preventive measures against a crucial trouble or halt in production can be taken.

The monitoring and analysis for preventing the operation rate or the mounting tact from being degraded have been described above based on the flow charts of FIGS. 45 and 46. The monitoring and analysis for preventing the poor quality can be performed in the same manner.

For example, a transition in defective rate in the result of inspection is monitored. In the case where the defective rate is above its target, the cause thereof is analyzed. For this analysis, when the defective rate is above its target, it is examined precisely which defect occurs.

For example, in the case where a placement positional offset of a component occurs and the component for which the placement positional offset occurs is limited to a large component to be mounted at low speed such as SOP or QFP, the specified contents for placement speed of these components in the component library 241 are checked. If it is revealed that the placement speed is specified to high, it is judged that the positional offset due to inertia of the component suction nozzle 7 is caused by high-speed placement of a component which should have been mounted at low speed. Then, the specified placement speed in the component library 241 is corrected to be low, so that the component library 241 after correction is feedbacked to the service receiving device 1.

Alternatively, for example, in the case where the occurrence of faintness of a solder is detected as a result of cream solder print inspection, technique data such as a viscosity and a temperature of a cream solder or a plate detaching speed is examined. If it is revealed that there is any inadequate data or speed among them, for example, as a printing speed of a narrow lead pitch, for that kind of circuit board, the technique is feedbacked to the service receiving device 1 so that the contents retrieved and fetched out from the mounting technique DB 328 are reflected into that technique.

Although there are still an extremely large number of other examples where the quality analysis is performed, they are not described in this embodiment. However, the analysis is performed and the feedback is given in the same manner as the above-described method.

(2-3) Operation of NC Data Optimization

Figure 46:
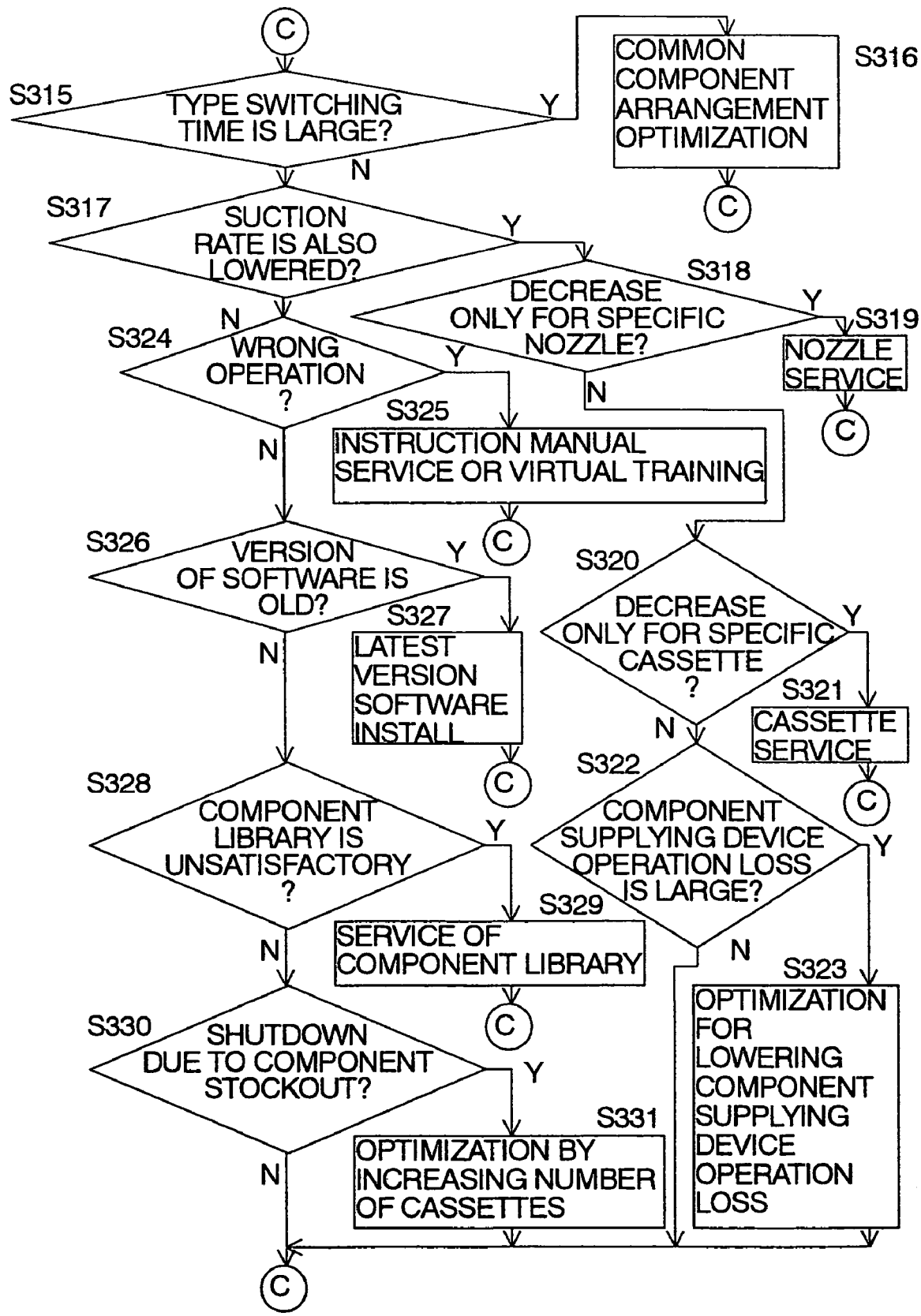
FIG. 46 is a flow chart in the case where the operation rate is lower than a target value in the third embodiment.

In the flow charts of the operation status analysis of FIGS. 45 and 46 described above, the NC data optimization as countermeasures for eliminating the cause which is ascertained as a result of analysis has been presented at every turn. The detailed processing operation thereof will be described below.

(a) Operation of Single Placement Machine Optimization at the Step S306

The operation of single placement machine optimization at the step S306 will be described for the example of the high-speed placement machine 108a using a flow chart shown in FIG. 56.

The object of the single placement machine optimization at the step S306 is for eliminating the excess of the tact loss of the bottleneck placement machine from the allowable range.

First, the components to be placed are grouped for each placement speed. The groups are arranged in the order of higher placement speed to lower placement speed in the placement speed to the circuit board 10 and the arrangement of the component supplying devices 5 (step S401). The placement speed is the movement speed of the placement head 4 or the movement speed of the XY table 9. The arrangement of the component supplying devices 5 is in the order of higher speed to lower speed from the vicinity of the initial position (original point) on the moving table 6.

Next, the placement order in each speed group described above and the arrangement of the component supplying devices 5 are determined (step S402). In determination of the placement order and the arrangement of the component supplying devices 5, the amount of movement of the component supplying devices 5 is considered so as to fall within the allowable movement range (Z movement allowable movement range) in the standard tact of the component supplying devices 5 as the first priority. As the second propriety, the amount of movement of the XY table 9 is considered so as to fall within the allowable movement range (XY movement allowable movement range) in the standard tact of the XY table. As a result, the movement loss of the component supplying devices 5 is completely eliminated.

The movement loss of the component supplying devices 5 is completely eliminated in this manner, so that a constraint is generated on a component at the placement position which can be next selected from the current placement position. Therefore, a component at the placement position which is further than another component at the placement position near to the current placement position on the circuit board should sometimes be selected. Therefore, on the other hand, the movement loss of the XY table 9 can necessarily remain. The reduction of the amount of movement of the component supplying devices 5 to be within the allowable movement range in the standard tact of the component supplying devices 5 is, for example, if it is assumed that the allowable movement range in the standard tact of the component supplying devices 5 is ±1, limited to a component of the same component supplying device 5 or the adjacent component supplying device 5. If there is no component at the placement position within the allowable movement range in the standard tact from the current placement position among those components, it is a movement loss of the XY table 9. However, even if the amount of movement of the XY table 9 does not fall within the allowable movement range in the standard tact of the XY table 9, it is considered to select a component for a next placement position so that the amount of movement becomes minimum. As a result, the placement order can be determined so that the movement loss of the XY table 9 becomes minimum even under the condition where the movement loss of the component supplying device 5 is completely eliminated.

In the case of the high-speed placement machine 108a performing the placement with the standard tact of 0.2 second or less, the amount of movement of the component supplying devices 5 is more strictly limited. More specifically, the placement order is determined so that the adjacent component supplying device 5 is not moved until the completion of all components of one component supplying device 5. In this manner, the amount of movement of the component supplying device 5 can be minimized and the lowering of the suction rate due to the vibration of the component supplying device 5 can be prevented. By this method, however, since the movement loss of the XY table 9 is slightly increased by strictly limiting the amount of movement of the component supplying device 5, the placement tact becomes slow.

Next, the mounting tact simulation is performed based on the NC data 220 of the bottleneck placement machine after the optimization which has the determined arrangement of the component supplying devices 5 and component placement order so as to calculate a theoretical value of the placement tact, that is, the line mounting tact (step S403). The theoretical value of the placement tact is calculated by using the above-described (Formula 1) to (Formula 6).

Next, it is evaluated if the calculated theoretical value of the line mounting tact reaches the target value or not (step S404). If it reaches the target value, the optimization processing is ended. If it does not reach the target value, the process proceeds to step S405.

Figure 57:
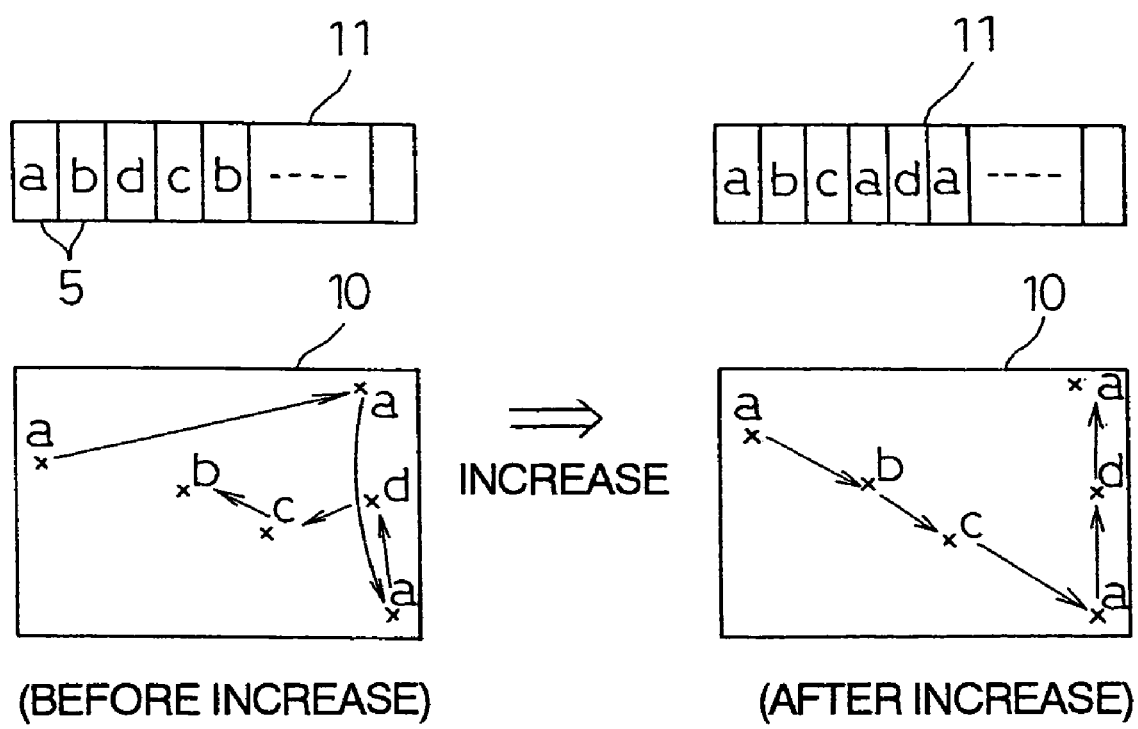
FIG. 57 is an image view showing the relation between the division of a component supplying device and the component mounting order in the third embodiment.

At the step S405, as shown in FIG. 57, if components supplied by one component supplying device 5 are widely distributed on the circuit board (P plate) 10, the number of component supplying devices 5 is increased for each group of distributed components (in the example of the drawing, each group corresponds to an individual component) so that the plurality of component supplying devices share the burden of supplying the components. In the example of the drawing, the number of the component supplying device 5 for a component a is increased to 3. As a result, before increasing the number of the component supplying devices 5, for example, when the components of the same component supplying device 5 are successively placed so as to eliminate the movement loss of the component supplying device 5, the amount of movement of the XY table 9 is considerably increased as illustrated. After increasing the number of the component supplying devices 5, since the arrangement of the component supplying devices 5 can be determined in the order of closer placement positions on the circuit board 10 as illustrated, the amount of movement of the XY table 9 is considerably reduced.

Next, for the NC data 220 after increasing the number of the component supplying devices 5, the arrangement of the component supplying devices 5 and the placement order are determined in the same processing as that at the step S402 (Step S406). Moreover, the mounting tact simulation is performed based on the NC data 220 after the optimization at the step S406 so as to calculate a theoretical value of the placement tact, that is, the line mounting tact (Step S407).

Next, it is evaluated if the calculated theoretical value of the line mounting tact reaches the target value or not (step S408). If it reaches the target value, the optimization processing is ended. It is considered that it reaches the target value in most cases. If it does not reach the target value, the process proceeds to step S409.

If it cannot reach the target value even after the optimization as described above at the step S409, there is a possibility that there may be a problem in the arrangement of components on the circuit board. Therefore, the correction of circuit design is proposed. Alternatively, the further enhancement of performance of a configuration of the component mounting line 100 is proposed.

(b) Operation of Optimization at the Step S307

Figure 58:
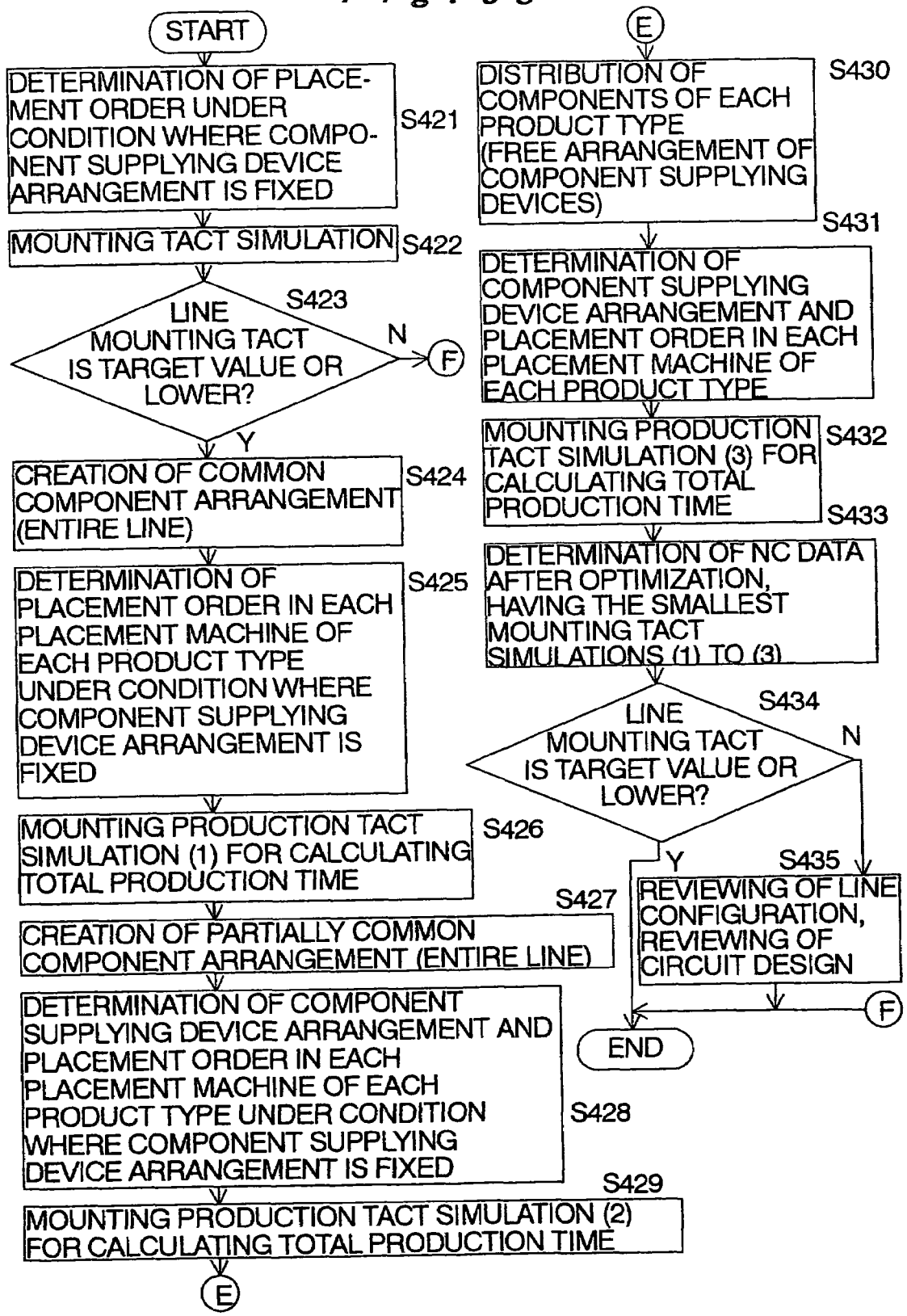
FIG. 58 is a flow chart showing an optimization processing for revising the optimization processing for the placement machine alone and the arrangement of common components in the third embodiment.

The operation of optimization at the step S307 will be described for an example of the case of the high-speed placement machine 108a using a flow chart shown in FIG. 58.

The object of optimization at the step S307 is to eliminate the excess of the tact loss of the bottleneck placement machine from the allowable range.

(b-1) Optimization Under the Condition where the Arrangement of the Component Supplying Devices 5 of the Bottleneck Placement Machine is Fixed First, in the bottleneck placement machine, the placement order is determined under the condition where the current arrangement of the component supplying devices 5 is fixed without being changed (step S421). In determination of the placement order, the amount of movement of the component supplying devices 5 is considered so as to fall within the allowable movement range (Z movement allowable movement range) in the standard tact of the component supplying devices 5 as the first priority. As the second propriety, the amount of movement of the XY table 9 is considered so as to fall within the allowable movement range (XY movement allowable movement range) in the standard tact of the XY table. As a result, the movement loss of the component supplying devices 5 is completely eliminated.

Figure 59A:
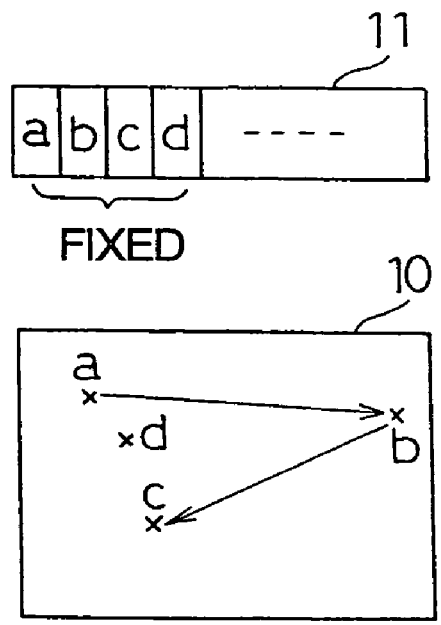
FIG. 59A is an image view showing the relation with a fixed mounting order of the component supplying device in the third embodiment.
Figure 59B:
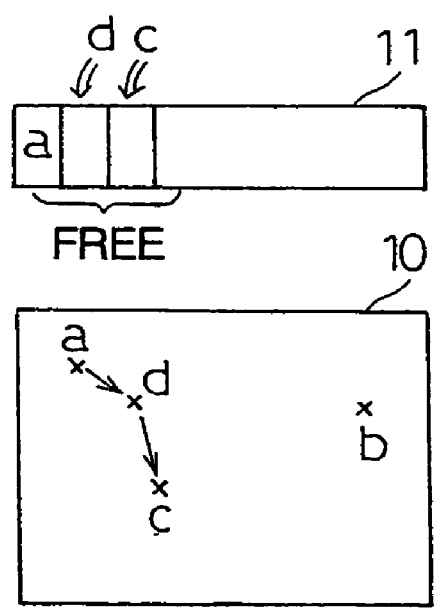
FIG. 59B is an image view showing the relation when the fixed mounting order shown in FIG. 59A is replaced by a free mounting order.

However, under the condition where the arrangement of the component supplying devices 5 is fixed, the movement loss of the XY table 9 is further increased than in the case where the arrangement of the component supplying devices 5 is not fixed. This point will be described using FIGS. 59A and 59B. If the arrangement of the component supplying devices 5 is fixed as shown in FIG. 59A, when the movement of the component supplying devices 5 is intended to be limited to fall within the allowable range in the standard tact, for example, after the placement of a component a, a component b of the adjacent component supplying device 5 must be placed by all means. If the component b is away from the current placement position of the component a as shown in the drawing, the movement loss of the XY table is generated. On the other hand, in the case where the arrangement of the component supplying devices 5 is not fixed but free as shown in FIG. 59B, after the placement of the component a, it is possible to place the component supplying device 5 for the component d present within the allowable range in the standard tact from the component a so as to be adjacent to the component supplying device 5 for the component a. More specifically, the component supplying devices 5 can be arranged so as not to generate any movement loss of the XY table 9. Therefore, in the case where the arrangement of the component supplying devices 5 is fixed, a possibility that the movement loss of the XY table 9 is generated is increased as compared with the case where the arrangement is fixed.

Next the mounting tact simulation is performed based on the NC data 220 of the bottleneck placement machine after the optimization having the determined component placement order so as to calculate a theoretical value of the placement tact, that is, the line mounting tact (Step S422). A theoretical value of the placement tact is calculated by using (Formula 1) to (Formula 6) described above.

Next, it is evaluated if the calculated theoretical value of the line mounting tact reaches the target value or not (step S423). If it reaches the target value, the optimization processing is ended. If it does not reach the target value, there is a problem in the arrangement of the component supplying devices 5 which is rendered common to product types, that is, the common arrangement of the component supplying devices 5 (hereinafter, referred to as the common component arrangement). Therefore, it is judged that the line mounting tact in the evaluated product type cannot reach the target value, so that the process proceeds to step S424 to perform the optimization for reviewing the common component arrangement.

(b-2) Common Component Arrangement Optimization

At the step S424, the common component arrangement is created. An example where the common component arrangement is created is shown in FIG. 60A. The common component arrangement is created based on the NC data 220 of all placement machines of the component mounting line 100 in the intended product types (for example, the types of products for one day or for one week). Herein, for simplification, as shown in the drawing, the example of only two placement machines 1 and 2 as the placement machines of the component mounting line 100 and three product types A, B, and C is described. As the number of circuit boards to be produced, 200 for the product type A, 120 for the product type B, and 70 for the product type C, i.e., in the order of increasing number A>B>C. The production order is in the order of A, B, and C.

In FIG. 60A, the arrangement of the component supplying devices 5 of the placement machines 1 and 2 (Z in the drawing corresponds to an arrangement number) is displayed in the order of product types A, B, and C. In the common component arrangement, the arrangement of all product types becomes the same. Among them, the component supplying device 5 of a component used commonly to the product types is positioned at the same position. Moreover, for example, in the case of a component used only for a certain product type, the component supplying device 5 of that component remains placed for the other product types and this component supplying device 5 is not used (for example, a component g in Z7 of the placement machine 1 is used only for the product type A but is not used for the product types B and C while the component supplying device 5 is placed as it is). The distribution of the components to the placement machines 1 and 2 is performed so that the tact balance with the standard mounting tact, which is calculated based on the standard tact for the product type A having the largest number of production can be obtained. Moreover, the placement position of the component supplying device 5 of a component which is commonly used to a plurality of product type is determined so as to be an optimal arrangement for the product type having the largest number of produced circuit boards. For example, the components a, b, and C are optimally arranged for the product type A. Moreover, the placement position of the component supplying device 5 of a component which is used only for one product type is determined so as to be optimal for that product type. For example, a component h is placed at the position optimal for the product type B.

Next, the component placement order of each placement machine n108 of each product type is determined under the condition where the component supplying devices 5 are fixed in the common component arrangement created at the step S424 (step S425). An optimization method is the same as that at the step S421.

Next, the simulation of production time of the intended all product types is performed so as to calculate the amount of total production time (step S426). Hereinafter, this simulation is referred to as mount production tact simulation. A specific calculation method of the mount production tact simulation is described in an example of FIGS. 60A and 60B.

First, as shown in FIG. 60A, the placement tact of each placement machine is calculated for each product type. The placement tact is calculated by using (Formula 1) to (Formula 6) as at the step S422. The result of calculation is shown for each product type in the fields of the placement tact of the placement machines 1 and 2. Then, the maximum value of the placement tact of each placement machine serves as the line mounting tact, and as illustrated, is obtained for each product type. Furthermore, the line mounting tact is multiplied by the number of produced products of a corresponding type to obtain the type production time shown in the drawing. The type production time is the amount of time required to perform the mount production on the number of produced circuit boards of that product type.

Moreover, based on the frequency of replacement of the component supplying device 5 upon type switching, as shown in FIG. 60B, the amount of type switching time between the respective product types is calculated. In the case of the common component arrangement, since the component supplying device 5 which is used for all intended product types is mounted on each placement machine, the replacement of the component supplying device 5 does not occur at all.

As described above, by figuring out the sum of the type production time of each product type and the type switching time between the respective product types obtained as a result of calculation, the total production time is calculated. At step S426, the total production type calculated in the example of FIGS. 60A and 60B is 506 minutes 20 seconds. The mount production tact simulation in the case where this common component arrangement is used is referred to as mount production tact simulation (1). At step S426, for simplification, the amount of time required to replace the component supplying device 5 is considered as the type switching time. However, it is not limited thereto. For example, the amount of time for selecting the NC data 220 in each placement machine n108 or stage replacement operation time such as the amount of time for changing a conveyance width of the circuit board in each placement machine n108 or the amount of time for changing the position of a support pin for downwardly supporting a circuit board may be considered.

(b-3) Partially Common Component Arrangement Optimization

Following the optimization using the common component arrangement, the partially common component arrangement is created based on the NC data 220 of the same product type of each placement machine of the same component mounting line 100 as that at the step S424 (step S427). The partially common component arrangement is an arrangement of the component supplying devices 5 configured such that the component supplying device 5 of a component which is commonly used to product types is the same arrangement, and the component supplying device 5 of a component which is used only for a single product type is used in production of that product type and causes the partial replacement of a component.

FIG. 61A shows the example where the partially common component arrangement is created. FIG. 61A shows the production of the same circuit board in the same line configuration as those in the case shown in FIG. 60A. In FIG. 61A, the arrangement of the component supplying devices 5 of the placement machines 1 and 2 (Z in the drawing corresponds to an arrangement number) is shown in the order of product types A, B, and C. In the partially common component arrangement, the arrangement of the component supplying device 5 of a component which is commonly used to product types in the successive production order is the same. For example, from Z1 of Z3 of the placement machine 1, the arrangement of the component supplying device 5 is the same for all the product types A, B, and C. However, the component supplying device 5 of a component which is not commonly used to successive product types has the placement only for that product type. When the product type is switched, the component supplying device is replaced with another. For example, for Z5 of the placement machine 1, the component supplying device 5 of the component e for the product type A is placed. For the product type B, it is replaced with the component supplying device 5 for the component h. For the product type C, it is replaced again with the component supplying device 5 for the component e. Similarly, in the portion indicated with the arrows in the drawing, the replacement of the component supplying device 5 occurs. The distribution of the components to the placement machines 1 and 2 is executed so that the tact balance is obtained in the standard placement tact calculated with the standard tact for the product type A having the largest number of product. Moreover, the component supplying device 5 of a component which is commonly used to a plurality of product types is positioned so as to be optimal for the product type having the largest number of products. For example, the components a, b, and c are positioned so as to be optimal for the product type A. Moreover, the position of the component supplying device 5 of a component which is used only for a single product type is determined to be an optimal position for that product type and is determined at step S428. For example, the component h is positioned so as to be optimal for the product type B.

Next, based on the partially common component arrangement which is created at the step S427, under the condition where the component supplying device 5 which is common to product types is fixedly arranged whereas the component supplying device 5 which is used only for that product type is not fixedly arranged, the placement order and the arrangement of the component supplying device 5 relating to a component which is used only for that product type are determined for each placement machine n108 and each product type (step S428). In determination of the placement order and determination of the arrangement of the component supplying device 5 relating to a component which is only used for that product type, the amount of movement of the component supplying device 5 is considered so as to fall within the allowable movement range (Z movement allowable movement range) in the standard tact of the component supplying device 5 as the first priority. As the second priority, the amount of movement of the XY table 9 is considered so as to fall within the allowable movement range (XY movement allowable movement range) in the standard tact of the XY table 9.

Next, the mount production tact simulation is performed in the targeted all product types so as to calculate the total production time (Step S429). A specific calculation method of the mount production tact simulation is described for the example of FIGS. 61A and 61B.

First, as shown in FIG. 61A, the placement tact of each placement machine is calculated for each product type. For calculation of the placement tact, (Formula 1) to (Formula 6) are used as at the step S422. The result of calculation is shown in the fields of the placement tact of the placement machines 1 and 2 for each product type. In view of values in the drawing, the placement tact is slightly reduced by the amount of a portion where the optimization is freely performed for each product type as compared with those of the common component arrangement. Then, the largest value of the placement tact of each placement machine serves as a line mounting tact, and is obtained for each product type as shown in the drawing. Furthermore, the line mounting tact is multiplied by the number of products of a corresponding product type to obtain the type production time shown in the drawing. The type production time is time required to perform the mount production for a produced number of circuit boards of that product type.

Moreover, based on the frequency of replacement of the component supplying device 5 upon type switching, the type switching time between the respective product types is calculated as shown in FIG. 61B. In the drawing, the frequency of replacement of the component supplying device 5 upon each type switching from the type A to B and from the type B to C in the placement machines 1 and 2 is shown. For example, in the placement machine 1, the replacement of the component supplying device 5 upon type switching from the type A to B occurs twice, from the component e to the component h for Z5 and from the component g to the component f for Z6. The amount of time required for one replacement of the component supplying device 5 is obtained by reading out the speed master 414 (cassette replacement time) from the data memory section 22 of the service receiving device 1. According to the speed master 414, for example, it takes 180 seconds to replace the component supplying device 5 of the placement machine 1 once, and it takes 240 seconds to replace the component supplying device 5 of the placement machine 2 once. Based on this, the type switching time between the respective product types for each placement machine can be obtained by multiplying the component replacement time obtained from the speed master 414 by the component replacement frequency. For simplification, the type switching is carried out in the component mounting line 100 at a time. The largest type switching time in the placement machines 1 and 2 becomes line type switching time. In the case of illustration, the line type switching time is 8 minutes in both switching from the type A to B and the type B to C.

As described above, by figuring out the sum of the type production time of each product type and the type switching time between the respective product types as the result of calculation, the total production time is calculated. At step S429, the total production time which is calculated in the example of FIGS. 61A and 61B is 483 minutes. The mount production tact simulation in the case where this partially common component arrangement is referred to as mount production tact simulation (2).

(b-4) Individual Component Arrangement Optimization

Following the optimization using the partially common component arrangement, the optimization as a line is performed while all the component supplying devices 5 are freely arranged (not fixed) for each product type based on the NC data 220 of each of the same product types of each placement machine in the same component mounting line 100 as those at the steps S424 and S427. It is determined that the respective product types have no relationship with each other; the optimization is performed so as to carry out the mounting in the shortest time as a line independently for each product type. Specifically, it is not considered at all to share the component supplying device 5 among the product types. The arrangement of the component supplying devices 5 is determined so that the mounting is achieved in the shortest time individually for each product type. Therefore, first, the components are distributed to each placement machine so as to obtain the line tact balance in each product type (step S430). At this point, for example, the components are distributed so as to obtain the placement tact balance of each placement machine with a theoretical value of the placement tact obtained by adding an allowable range value of the tact loss of each placement machine (stored in the operation quality information DB 51 and set at, for example, 5% of the standard placement tact) to the standard placement tact. However, it is not limited thereto. The balance may be obtained with the standard placement tact or the balance may be obtained with the number of placed components. Alternatively, the balance may be obtained with the placement tact obtained by adding a mean value of the tact loss up to them to the standard placement tact. However, the accuracy of striking the balance is higher in the case where the balance is redressed with the placement tact in consideration of the tact loss.

Next, for each placement machine to which the components are distributed, the arrangement of the component supplying devices 5 and the component placement order are determined (step S431). In determination of the component supplying devices 5 and the placement order, the amount of movement of the component supplying device 5 is considered so as to fall within the allowable movement range (Z movement allowable movement range) in the standard tact of the component supplying device 5 as the first priority. As the second priority, the amount of movement of the XY table 9 is considered so as to fall within the allowable movement range (XY movement allowable movement range) in the standard tact of the XY table.

FIG. 62A shows an example of the individual component arrangement determined at the steps S430 and S431, that is, the arrangement of the component supplying devices 5 after the optimization is performed by freely arranging the component supplying devices 5 for each product type. FIG. 62A shows the production of the same circuit board as that in FIGS. 60A and 61A with the same line configuration. In FIG. 62A, the arrangement of the component supplying devices 5 of the placement machines 1 and 2 (Z in the drawing indicates an arrangement number) is shown in the order of types A, B, and C. As illustrated, the arrangement of the component supplying devices 5 for each product type is individually optimal for each product type, and is independent between the product types. Therefore, even the component supplying device 5 of the same component has often different positions. Thus, the replacement of the component supplying device 5 frequently occurs.

Next, the mount production tact simulation is performed in the targeted all product types so as to calculate the total production time (Step S432). A specific calculation method of the mount production tact simulation is described for the example of FIGS. 62A and 62B.

First, as shown in FIG. 62A, the placement tact of each placement machine is calculated for each product type. For calculation of the placement tact, (Formula 1) to (Formula 6) are used as at the step S422. The result of calculation is shown in the fields of the placement tact of the placement machines 1 and 2 for each product type. In view of values in the drawing, the placement tact is slightly reduced by the amount of a portion where the optimization of arrangement of all the compound supplying devices 5 is freely performed for each product type as compared with those of the partially common component arrangement. Generally, the placement tact is shorter in the partially common component arrangement than in the common component arrangement, and shorter in the individual component arrangement than in the partially common component arrangement. Then, the largest value of the placement tact of each placement machine becomes a line mounting tact, which is obtained for each product type as is illustrated. Furthermore, the type production time illustrated in the drawing is obtained by multiplying the line mounting tact by the number of produced products of a corresponding type. The type production time is the amount of time required to perform the mount production for the number of produced circuit boards of that type.

Moreover, based on the frequency of replacement of the component supplying device 5 upon type switching, the type switching time between the respective product types is calculated as shown in FIG. 62B. In the drawing, the frequency of replacement of the component supplying device 5 upon each type switching from the type A to B and from the type B to C in the placement machines 1 and 2 is shown. In view of the drawing, the frequency of replacement is increased as compared with that in the partially common component arrangement. The amount of time required for one replacement of the component supplying device 5 is obtained by reading out the speed master 414 (cassette replacement time) from the data area 304 of the memory section 302 of the service providing device 2. As a result, the type switching time between the respective types for each placement machine can be obtained by multiplying the component replacement time obtained from the speed master 414 by the component replacement frequency. For simplification, if it is assumed that the type switching is carried out in the component mounting line 100 at a time, the largest type switching time in the placement machines 1 and 2 becomes line type switching time. In the case of illustrated example, the line type switching time is 20 minutes in switching from the type A to B and 16 minutes in switching from the type B to C.

As described above, by figuring out the sum of the type production time of each product type and the type switching time between the respective product types as the result of calculation, the total production time is calculated. At step S432, the total production time which is calculated in the example of FIGS. 62A and 62B is 490 minutes 40 seconds. The mount production tact simulation, in the case where this partially common component arrangement is used, is referred to as mount production tact simulation (3).

(b-5) Result of the Optimization for Reviewing the Common Component Arrangement

At step S433, the results of the mounting tact simulations (1) to (3) are evaluated so as to determine the NC data 220 having the smallest total production time. In the examples shown in (FIGS. 60A and 60B) to (FIGS. 62A and 62B), the result of the partially common component arrangement is obtained as the smallest, i.e., the total production time of 483 minutes. Therefore, the NC data 220 where the partially common component arrangement optimization is performed is determined.

Next, in the product type in which the line mounting tact cannot reach the target value in the operation status analysis, it is evaluated if the line mounting tact is improved so as to reach the target value in the NC data 220 determined at the step S433 (step S434). If the line mounting tact reaches the target value, the optimization processing is ended. If not, there is possibly a problem in the component arrangement on the circuit board because the target value is not achieved even after the optimization as described above. Therefore, the correction of circuit design is proposed. Alternatively, the further enhancement of performance of a configuration of the component mounting line 100 is proposed (step S435). Alternatively, in the case where the total production time can reach the target value, that is, a production plan can be achieved, it is considered that the line mounting tact does not reach the target in a corresponding type. Thus, the NC data 220 after the optimization is adopted.

If the line mounting tact reaches the target value, the NC data after the optimization described above is adopted not only for a corresponding product type but naturally also for other product types.

Moreover, in the examples shown in (FIGS. 60A and 60B) to (FIGS. 62A and 62B), for simplification, the placement speed is described as unique while the grouping of the placement speeds is not mentioned. However, if any component has a different placement speed, the component supplying devices are required to be arranged in the order of higher placement speed to lower placement speed. Similarly, in the following example of the NC data optimization, the placement speed is also described as unique for simplification. However, if any component has a different placement speed, the component supplying devices 5 are required to be arranged in the order of higher placement speed to lower placement speed.

In the above-described example, a uniform component arrangement method is used, for example, the common component arrangement is used if the common component arrangement is used for all product types, and the partially common component arrangement is used if the partially common component arrangement is used for all product types. However, it is not limited thereto. The component arrangement method may be changed depending on the product type. For example, in the case where the product types A, B, C, D, and E are successively produced, it is assumed that the number of products to be produced is small for the product types A, B, and C while the number of products to be produced is remarkably increased for the product types D and E. In this case, the common component arrangement is used for the product types A, B, and C while the individual component arrangement is used for each of the product types D and E. In this manner, the product types are grouped in accordance with the number of products to be produced. Then, if the component arrangement method is switched in the course of production, the detailed optimization of the component arrangement for further reducing the total production time is made possible.

(c) Operation of the Optimization at the Step S309

Figure 63:
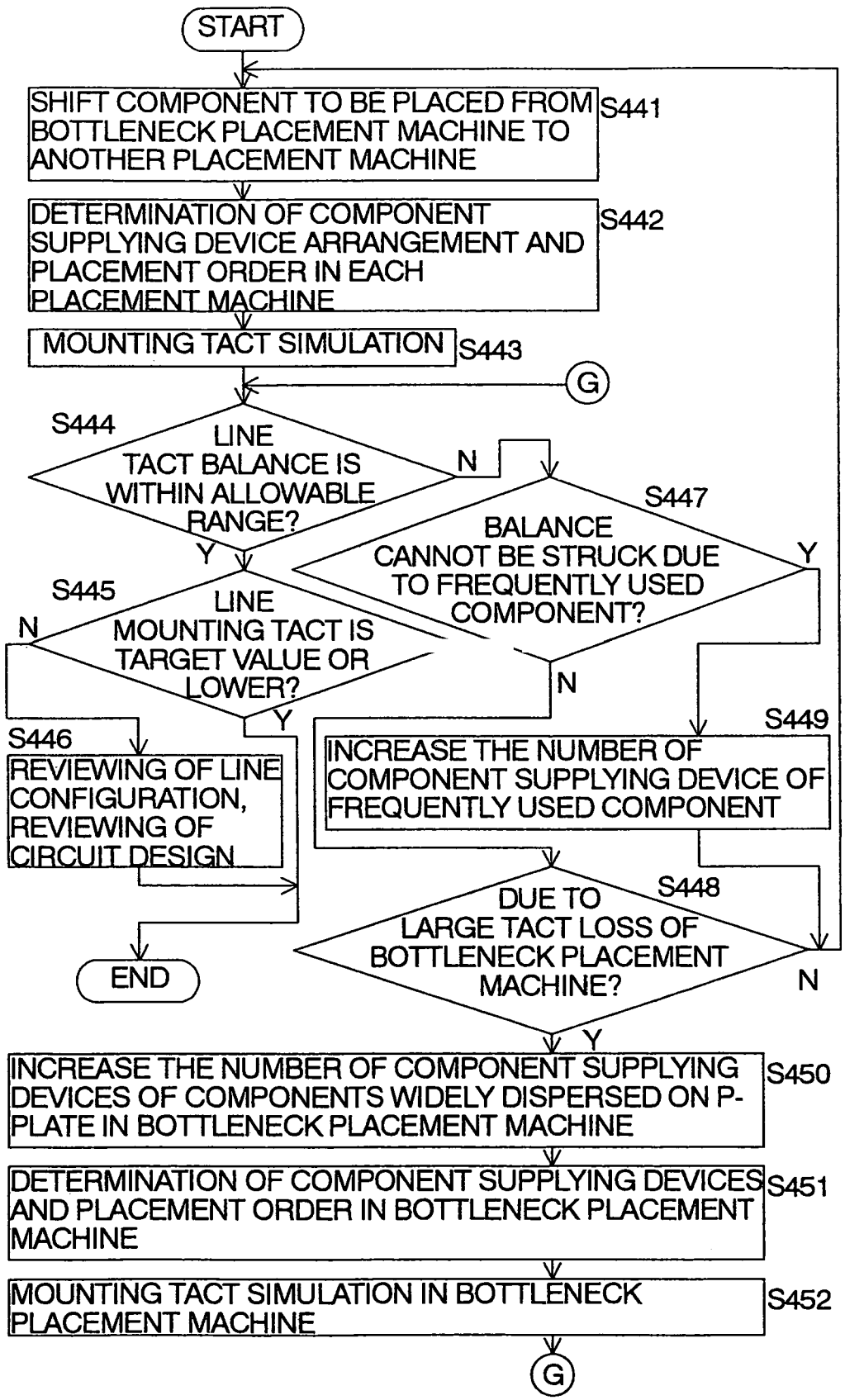
FIG. 63 is a flow chart showing a component distribution correction processing in the third embodiment.

The operation of the optimization at the step S309 will be described for an example of the case of the high-speed placement machine 108a using a flow chart shown in FIG. 63.

The object of the optimization at the step S309 is to correct the distribution of the components so as to strike the line tact balance.

First, the components to be placed are moved from the placement machine having a large placement tact result value to the placement machine having a small placement tact result value by the unit of the component supplying device 5 so that the placement tact result values are equalized. For example, a sufficient number of components to be placed are moved from the bottleneck placement machine to another placement machine to strike the line tact balance (step S441). At this point, for example, the components to be placed of the bottleneck placement machine are successively shifted bit by bit to the placement machine having the smallest placement tact so that the placement tacts of all the placement machines ultimately fall within the allowable range. The calculation of the placement tact of each placement machine after moving the components is absolutely a provisional calculation; the calculation is for adding a tact of the components, which are added as a result of a shift, to the placement tact before the shift of the components or for subtracting a tact of the component, which are removed as a result of a shift, to the placement tact before the shift of the components. It is assumed that the tact of the components to be shifted at this time is the standard tact or a tact obtained by multiplying the target tact by a ratio of inclusion of a predetermined tact loss.

Next, in each placement machine n108 in which the distribution of the components is corrected, the arrangement of the component supplying devices 5 and the component placement order are determined (step S442). In determination of the arrangement of the component supplying devices 5 and the placement order, the amount of movement of the component supplying devices 5 is considered so as to fall within the allowable movement range (Z movement allowable movement range) in the standard tact of the component supplying devices 5 as the first priority. As the second priority, the amount of movement of the XY table 9 is considered so as to fall within the allowable movement range (XY movement allowable movement range) in the standard tact of the XY table 9.

Next, the mounting tact simulation is performed based on the NC data 220 of each placement machine n108 having the determined arrangement of the component supplying devices 5 and component placement order after the optimization so as to calculate a theoretical value of the placement tact of each placement machine n108 and the line mounting tact (step S443). The theoretical value of the placement tact is calculated by using (Formula 1) to (Formula 6) described above.

Next, it is evaluated if the line tact balance falls within the allowable range or not as a result of the mounting tact simulation (step S444). If the line tact balance falls within the allowable range, it is then evaluated if the line mounting tact reaches the target value or not (step S445). If the line mounting tact reaches the target value, the optimization processing is ended. If not, the arrangement of the components on the circuit board possibly has a problem because the target value is not achieved even after the optimization as described above. Therefore, the correction of a circuit design is proposed. Alternatively, the further enhancement of performance of a configuration of the component mounting line 100 is proposed (step S446). Moreover, although omitted in FIG. 63, in the case where the line mounting tact does not reach the target value at the step S445, it is evaluated again if the tact loss exists or not. If the tact loss exists, the optimization for eliminating the tact loss may be performed on each placement machine.

If the line tact balance does not fall within the allowable range at the step S444, its cause is examined. First, it is examined if the phenomenon of a stood-out placement tact of a placement machine to which the components have been distributed occurs or not because a certain component is more frequently used than the other components, that is, because the number of the components serving as the minimum unit of the distributed components is extremely large (step S447). If that is the case, the processing proceeds to step S449. If not, the process proceeds to step S448. At the step S448, it is examined if the cause is a large tact loss of the bottleneck placement machine. If the cause is a large tact loss of the bottleneck placement machine, the processing proceeds to step S450. If not, the processing returns to the step S441, and after the steps S441 to the step S443 are performed again, it is evaluated again if the tact balance falls within the allowable range.

At the step S449, the number of the component supplying devices 5 is increased so that a plurality of the component supplying devices 5 share the burden of supplying the frequently used components. At this point, for example, as shown in FIG. 57, the components which are widely distributed on the circuit board may be divided so as to be supplied by a plurality of the component supplying devices 5. After the step S449, the processing returns to the step S441 where the correction of the distribution is performed again. Then, after the steps S442 and S443 are performed, it is evaluated again if the tact balance falls within the allowable range.

At the step S450, in the bottleneck placement machine, as shown in FIG. 57, the number of the component supplying devices 5 is increased so that a plurality of the component supplying devices 5 share the burden of supplying the components which are widely distributed on the circuit board. As a result, the movement loss of the XY table 9 can be eliminated.

After the step S450, in the bottleneck placement machine, the arrangement of the component supplying devices 5 and the component placement order are determined (step S451). In determination of the arrangement of the component supplying devices 5 and determination of the placement order, the amount of movement of the component supplying devices 5 is considered so as to fall within the allowable movement range (Z movement allowable movement range) in the standard tact of the component supplying devices 5 as the first priority. As the second priority, the amount of movement of the XY table 9 is considered so as to fall within the allowable movement range (XY movement allowable movement range) in the standard tact of the XY table 9.

Next, the mounting tact simulation is performed based on the NC data 220 of the bottleneck placement machine after the optimization which has the determined arrangement of the component supplying devices 5 and component placement order so as to calculate a theoretical value of the placement tact of the bottleneck placement machine, that is, the line mounting tact (step S452). The theoretical value of the placement tact is calculated by using the above-described (Formula 1) to (Formula 6). After the step S452, it is evaluated again if the line tact balance falls within the allowable range at the step S444.

(d) Operation of the Optimization at the Step S310

The object of the optimization at the step S310 is to correct the distribution of the components so as to strike the line tact balance. However, since it is already considered so that the arrangement of the component supplying devices 5 is common to the product types, similar optimization as that at the step S307 for reviewing the common component arrangement. In this optimization, the distribution of the components to each placement machine is also reviewed. However, in the flow chart of FIG. 58, the processing after the step S424 is carried out. More specifically, the common component arrangement optimization, the partially common component arrangement optimization, and the individual component arrangement optimization shown in (FIGS. 60A and 60B) to (FIGS. 62A and 62B) are respectively performed. The result of optimization having the smallest total production time among them is selected. The other processing is the same as that of the optimization at the step S307.

(e) Operation of the Optimization at the Step S312

Figure 64:
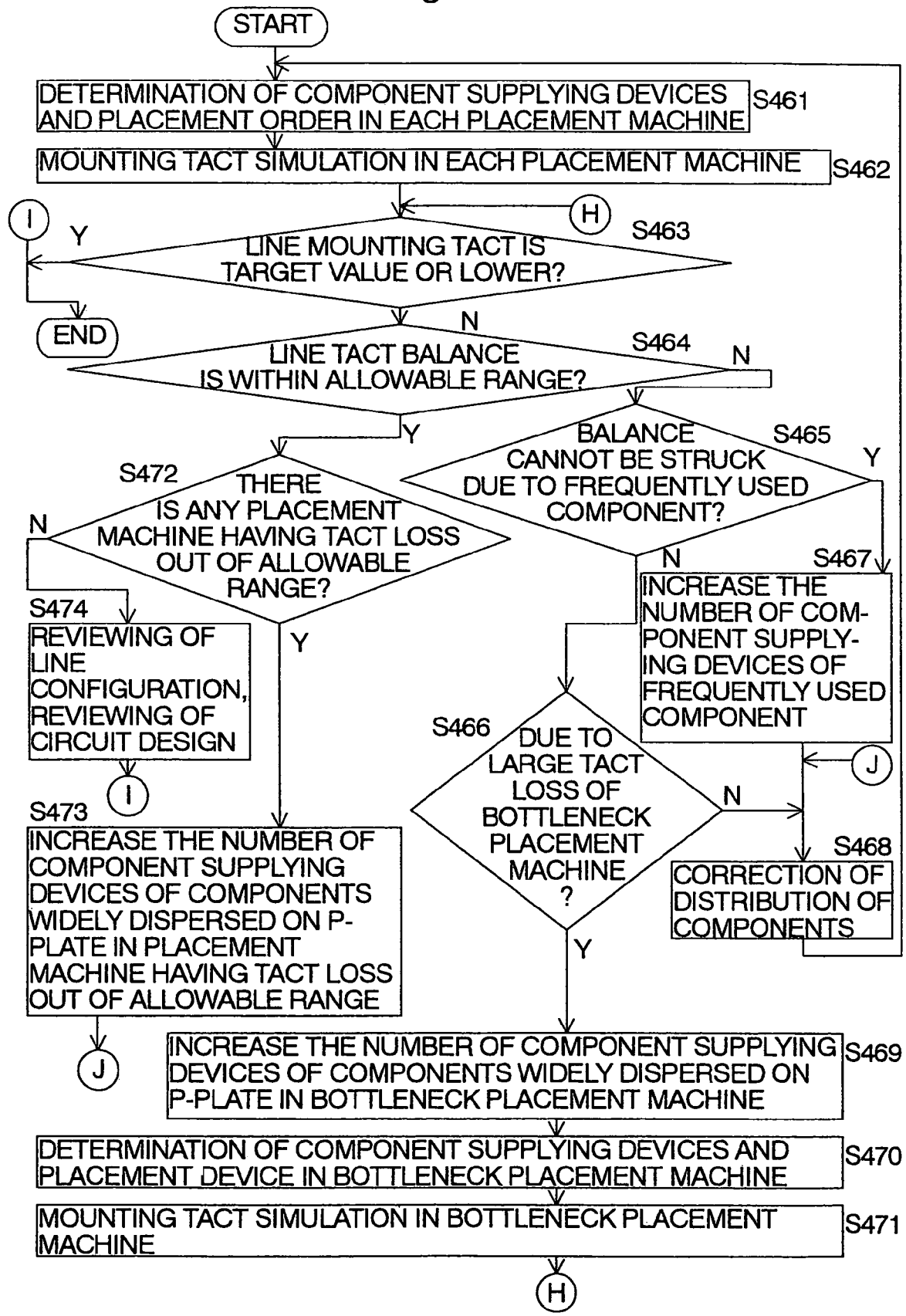
FIG. 64 is a flow chart showing the optimization processing for the placement machine alone and the component distribution correction processing in the third embodiment.

The operation of the optimization at the step S312 will be described for an example of the case of the high-speed placement machine 108a using a flow chart shown in FIG. 64.

The object of the optimization at the step S312 is to restrain the tact loss of each placement machine in the component mounting line 100 to be within the allowable range so that the line mounting tact can reach its target value.

First, in each placement machine, the arrangement of the component supplying devices 5 and the component placement order are determined (step S461). In determination of the arrangement of the component supplying devices 5 and determination of the placement order, the amount of movement of the component supplying devices 5 is considered so as to fall within the allowable movement range (Z movement allowable movement range) in the standard tact of the component supplying devices 5 as the first priority. As the second priority, the amount of movement of the XY table 9 is considered so as to fall within the allowable movement range (XY movement allowable movement range) in the standard tact of the XY table 9.

Next, the mounting tact simulation is performed based on the NC data 220 of each placement machine after the optimization which has the determined arrangement of the component supplying devices 5 and component placement order so as to calculate a theoretical value of the placement tact of each placement machine n108 and the line mounting tact (step S462). The theoretical value of the placement tact is calculated by using the above-described (Formula 1) to (Formula 6).

Next, it is evaluated if the line mounting tact reaches the target value or not as a result of the mounting tact simulation (step S463). If the line mounting tact reaches the target value, the optimization processing is ended. If not, it is evaluated if the line tact balance falls within the allowable range (step S464). If line tact balance does not fall within the allowable range, the processing proceeds to step S465 in order to examine its cause. If the lien tact balance falls within the allowable range, the processing proceeds to step S472.

First, at the step S465, it is examined if the phenomenon of a stood-up placement tact of a placement machine to which the components have been distributed occurs or not because some component are more frequently used than the other components, that is, because the number of the components serving as the minimum unit of the distributed components is extremely large. If that is the case, the processing proceeds to step S467. If not, the process proceeds to step S466. At the step S466, it is examined if the cause is a large tact loss of the bottleneck placement machine. If the cause is a large tact loss of the bottleneck placement machine, the processing proceeds to step S469. If not, the correction of distribution of the components is performed at step S468. The correction of distribution of the components means a shift of a sufficient number of placed components to strike the line tact balance from the placement machine having a large placement tact to the placement machine having a small placement tact. At this moment, for example, the component to be placed of the bottleneck placement machine are successively shifted bit by bit from the placement machine having the smallest placement tact so that the placement tacts of all the placement machines ultimately fall within the allowable range. After the correction of distribution of the components is performed, the processing returns to the step S461 where the arrangement of the component supplying devices 5 of each placement machine and the component placement order are determined again.

At the step S467, the frequently used components are divided so as to be supplied by a plurality of the component supplying devices 5. At this moment, for example, as shown in FIG. 57, the number of the component supplying devices 5 may be increased so that a plurality of the component supplying devices 5 share the burden of supplying the components which are widely distributed on the circuit board. After the increase, the distribution of the components is corrected at the step S468. Then, the processing returns to the step S461.

At the step S469, in the bottleneck placement machine, as shown in FIG. 57, the number of the component supplying devices 5 is increased so that a plurality of the component supplying devices 5 share the burden of supplying the components which are widely distributed on the circuit board. As a result, the movement loss of the XY table 9 can be eliminated.

After the step S469, in the bottleneck placement machine, the arrangement of the component supplying devices 5 and the component placement order are determined (step S470). In determination of the arrangement of the component supplying devices 5 and determination of the placement order, the amount of movement of the component supplying devices 5 is considered so as to fall within the allowable movement range (Z movement allowable movement range) in the standard tact of the component supplying devices 5 as the first priority. As the second priority, the amount of movement of the XY table 9 is considered so as to fall within the allowable movement range (XY movement allowable movement range) in the standard tact of the XY table 9.

Next, the mounting tact simulation is performed based on the NC data 220 of the bottleneck placement machine after the optimization which has the determined arrangement of the component supplying devices 5 and component placement order so as to calculate a theoretical value of the placement tact of the bottleneck placement machine, that is, the line mounting tact (step S471). The theoretical value of the placement tact is calculated by using the above-described (Formula 1) to (Formula 6). After the step S471, it is evaluated again if the line mounting tact reaches the target value or not at the step S463.

At step S472, if there is any placement machine which has the tact loss out of the allowable range among the placement machines even if the line tact balance is struck. If there is any, the number of the component supplying devices 5 is increased so that a plurality of the component supplying devices 5 share the burden of supplying the components which are widely distributed on the circuit board in the placement machine having the tact loss out of the allowable range (step S473). As a result, the movement loss of the XY table 9 can be eliminated. After increasing the number of the component supplying devices 5, the distribution of the components is corrected at the step S468. Then, the processing returns to the step S461.

At the step S472, if there is no placement machine having the tact loss out of the allowable range, the arrangement of the components of the circuit board may possibly has a problem because the target value cannot be achieved even after the optimization as described above. Therefore, the correction of a circuit design is proposed. Alternatively, a proposal is made so as to further enhance the performance of a configuration of the component mounting line 100.

(f) Operation of the Optimization at the Step S313

The object of the optimization at the step S313 is to restrain the tact loss of each placement machine n108 of the component mounting line 100 within the allowable range so as to reach the target value of the line mounting tact. Therefore, similar processing as that of the optimization at the step S307 is performed based on the flow chart shown in FIG. 53. However, it differs from the optimization at the step S307 in that all the placement machines in the component mounting line 100 are considered at the steps S421 and S422. Specifically, after determination of the placement order under the condition where the arrangement of the component supplying devices 5 for all placement machines is fixed, the placement tact simulation of all placement machines is performed so as to evaluate if the line mounting tact reaches the target value. If the target value is not achieved, the common component arrangement optimization, the partially common component arrangement optimization, and the individual component arrangement optimization shown in (FIGS. 60A and 60B) to (FIGS. 62A and 62B) are performed in the processing after the step S424 so as to select the result of optimization having the smallest total production time among them. The remaining part is the same as that of the optimization at the step S307.

(g) Operation of the Optimization at the Step S316

The object of the optimization at the step S316 is to render the component supplying devices 5 common so as to reduce the type switching time. Therefore, processing similar to that of the optimization at the step S307 is performed based on the flow chart shown in FIG. 58. However, in FIG. 58, the processing starts with the step S424. The common component arrangement optimization, the partially common component arrangement optimization, and the individual component arrangement optimization shown in (FIGS. 60A and 60B) to (FIGS. 62A and 62B) are performed so as to select the result of optimization having the smallest total production time among them.

Although the aim is absolutely to maintain the target of the line operation rate by reducing the type switching time, it is important to simultaneously achieve the minimization of the total production time. It is the best to achieve both the minimization of the total production time and the reduction of the type switching time. However, it may be judged that it is sufficient to achieve the minimization of the total production time even though the type switching time is not reduced.

(h) Operation of the Optimization at the Step S323

Figure 65:
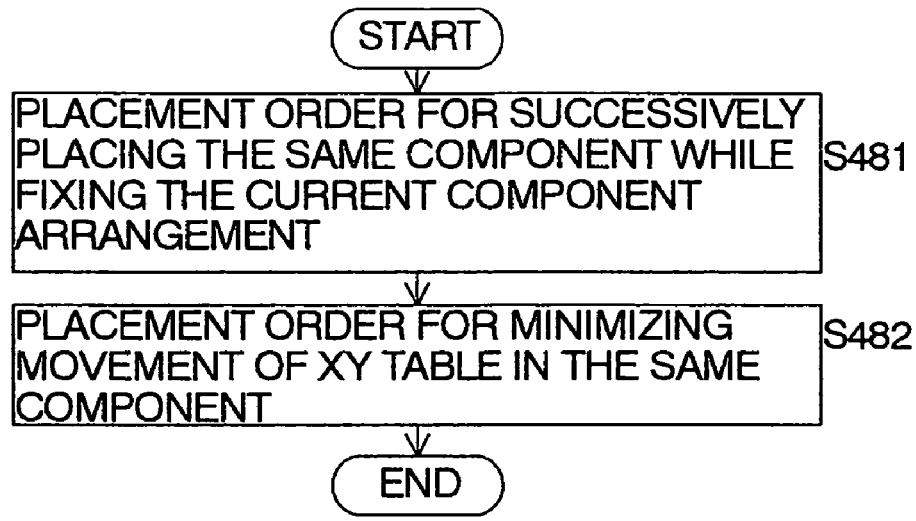
FIG. 65 is a flow chart showing the placement machine unit optimization processing for restraining the vibration of the component supplying device in the third embodiment.

The operation of the optimization at the step S323 will be described for an example of the case of the high-speed placement machine, using the flow chart shown in FIG. 65.

The object of the optimization at the step S323 is to eliminate the movement loss of the component supplying devices 5, to reduce the vibration of the movement table 6 on which the component supplying devices 5 are mounted, and to reduce the suction rate of the component suction nozzles 7.

At step S481, the current arrangement of the component supplying devices 5 is fixed, and the placement order is set such that the same component supplying devices 5 consecutively place the components. More specifically, the placement order is determined so that the adjacent component supplying device 5 is not moved until the completion of placing all components of one component supplying device 5. In this manner, the amount of movement of the component supplying device 5 can be minimized, and the lowering of the suction rate due to the vibration of the component supplying device 5 can be prevented.

At step S482, the order of placing the components of the same component supplying device 5 is determined so that the movement of the XY table 9 falls within the standard tact movement allowable range. In the case where it does not fall within the standard tact movement allowable range by any means, the movement of the XY table 9 is minimized.

In particular, in the case of the high-speed placement machine 108a which performs the placement with the standard tact of 0.2 seconds or less, such a placement order for strictly restraining the amount of movement of the component supplying devices 5 is effective in preventing the suction rate from being lowered due to the vibration of the component supplying section 11. In such a way, however, the amount of movement of the component supplying devices 5 is strictly restrained to slightly increase the movement loss of the XY table 9, resulting in a slower placement tact. In this case, however, it is general to give priority to prevent a quality trouble, that is, a lowered suction rate.

(i) Operation of the Optimization at the Step S331

Figure 66:
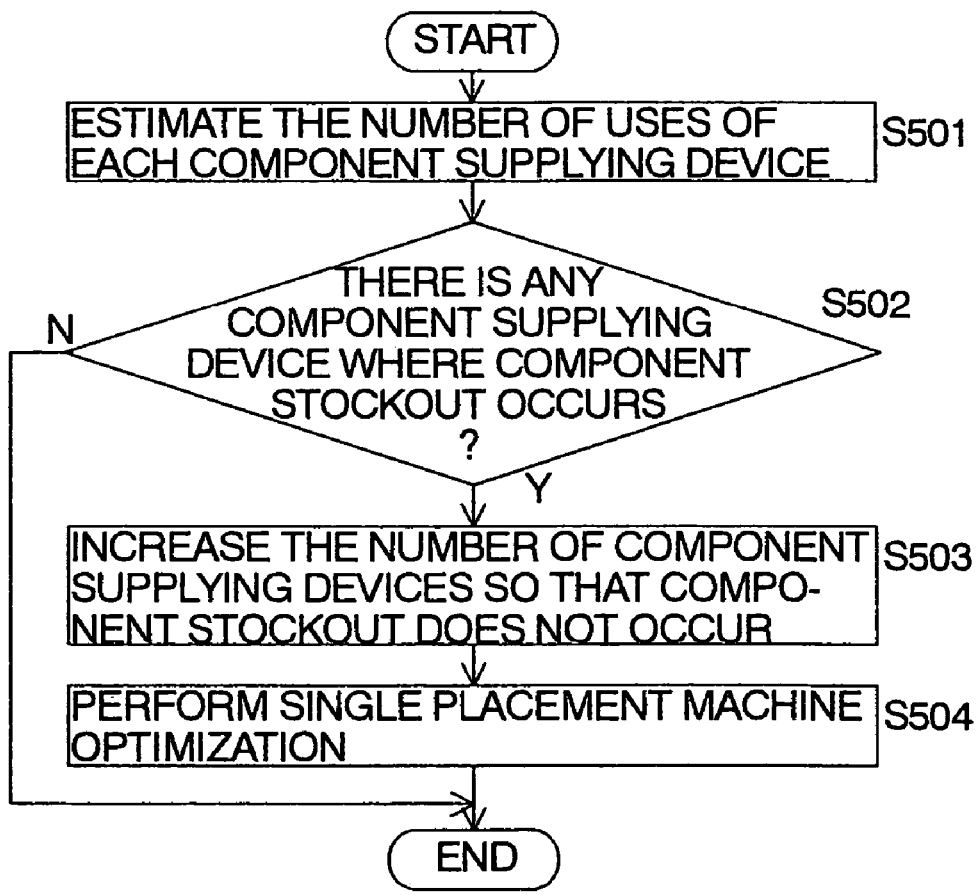
FIG. 66 is a flow chart showing an expanded optimization processing of the component supplying device in the third embodiment.
Figure 67:
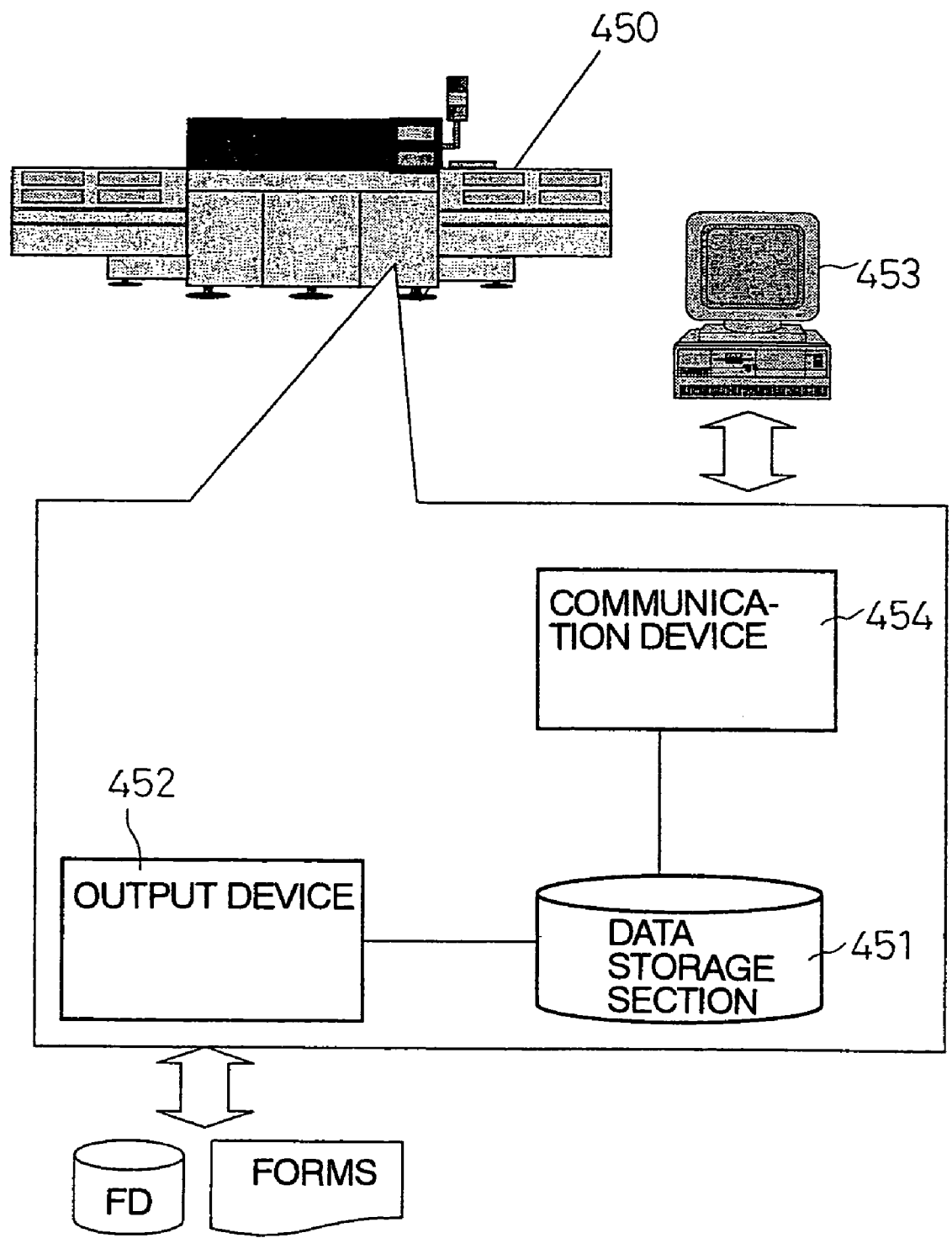
FIG. 67 is a block diagram showing a conventional component mounting apparatus.
Figure 68:
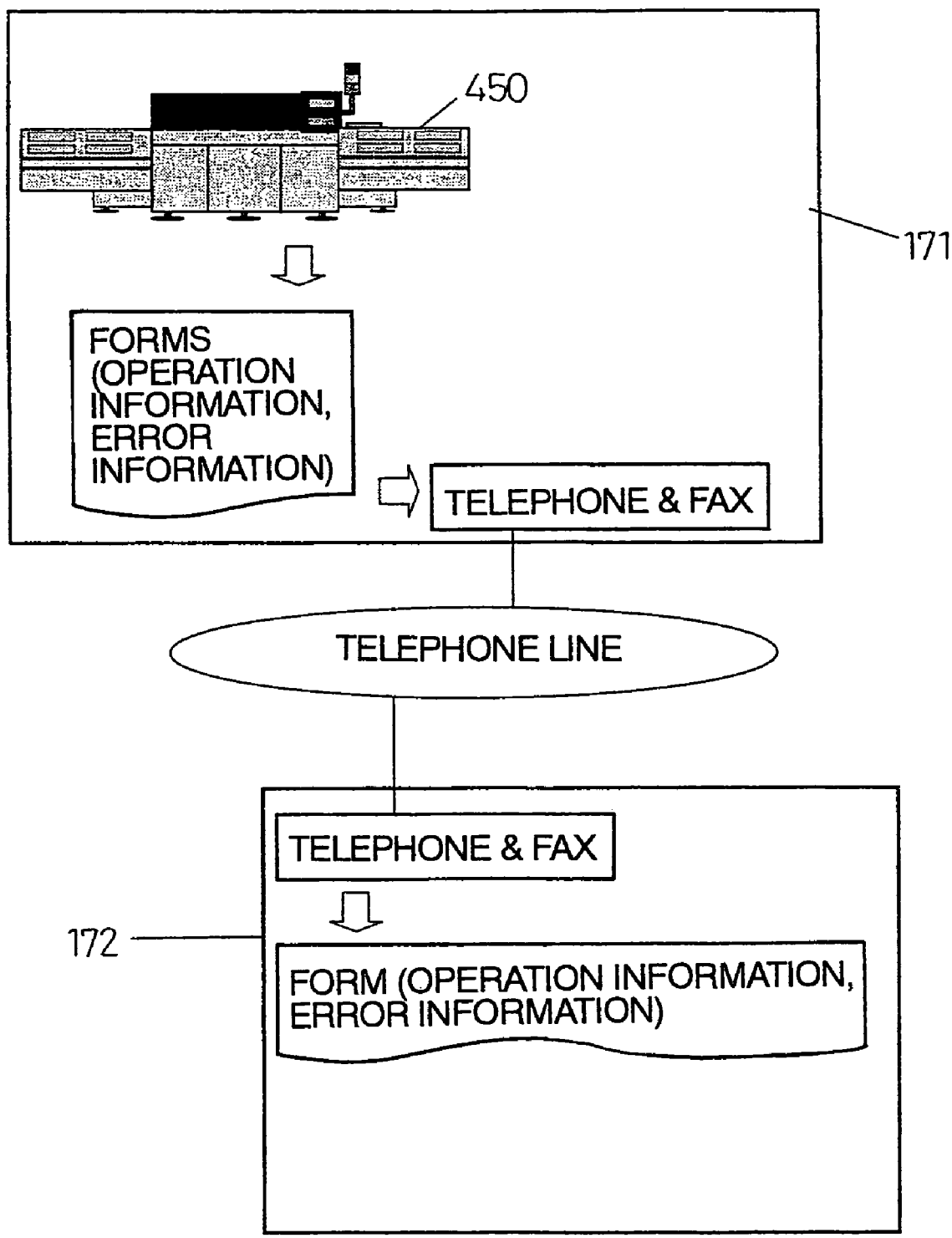
FIG. 68 is a configuration view of a conventional customer servicing method and a device thereof.
Figure 69:
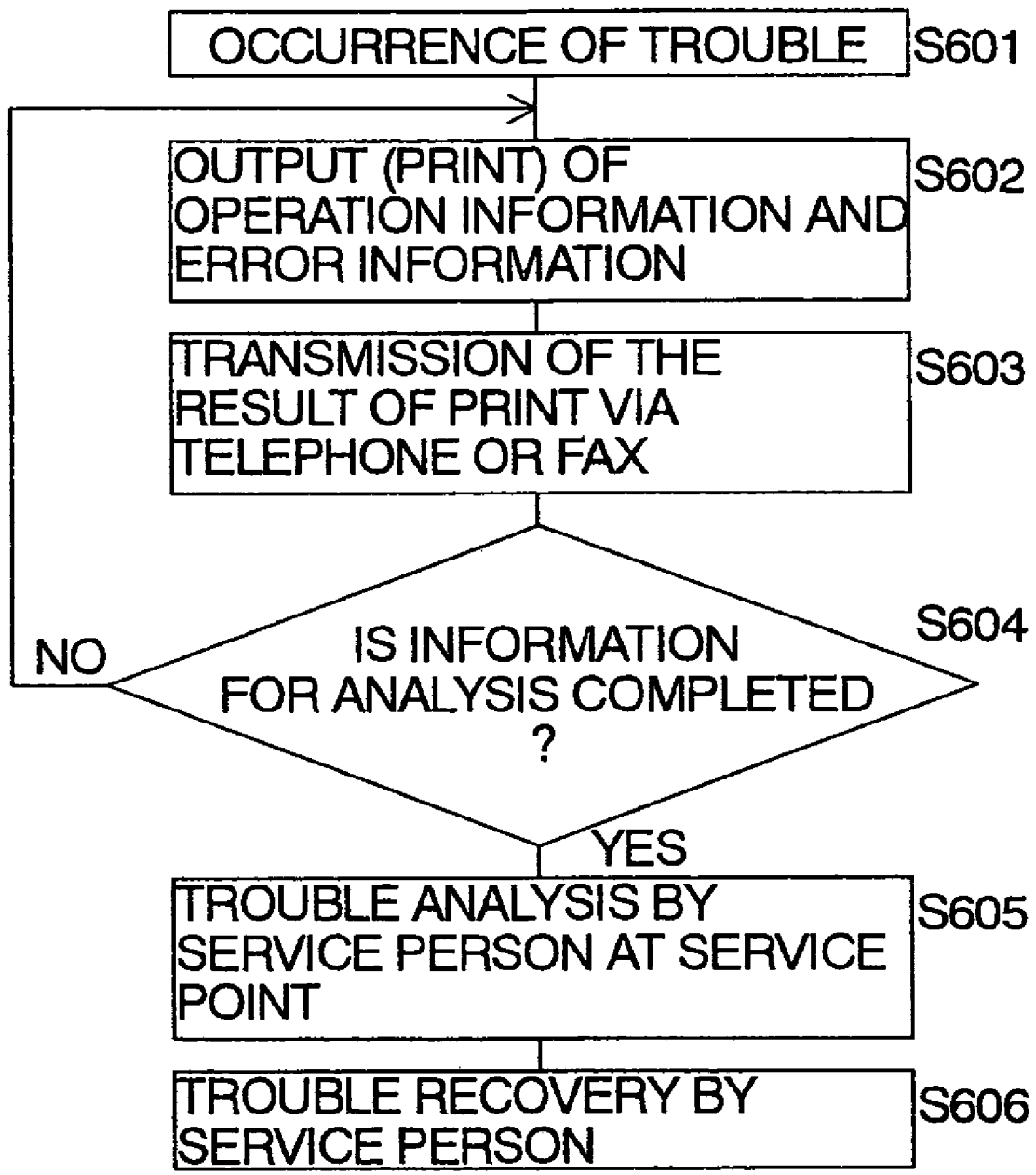
FIG. 69 is a flow chart showing a conventional procedure of a trouble recovery method.

The operation of the optimization at the step S331 will be described for an example of the case of the high-speed placement machine, using a flow chart shown in FIG. 66.

The object of the optimization at the step S331 is to increase the number of the component supplying devices 5 of the frequently used components so as to disperse the amount of reduced components, thereby preventing the stockout of components during production.

First, in each component supplying device 5 used in the placement machine n108, the number of components to be used is estimated for a product type of a circuit board (step S501). For that purpose, first, the number of steps of the NC program 221 is counted for each component to obtain the number of components to be used of each component supplying device 5 used for a single circuit board. This number of components to be used of each component supplying device 5 is multiplied by the number of products of that product type, the number of components to be used of the product type can be obtained.

In comparison of this number of components to be used with the number of components remaining in the component supplying device 5, it can be judged if the stockout occurs during the production of that product type (step S502). If the number of components to be used is larger, the stockout occurs during the production of that product type in the component supplying device 5.

At step S502, if there is any component supplying device 5 in which the stockout of components may occur, that component supplying device 5 is divided so that a plurality of the component supplying devices 5 supply the component (step S503). The number of increase component supplying devices is set so that a value obtained by dividing the number of components to be used by the number of increased component supplying devices is below the number of remaining components.

Next, the single placement machine optimization is performed in the ND data 220 after the division of the component supplying device 5, the processing of (step S504) is ended.

In production with the NC data 220 after such optimization, the stockout does not occur during the production of the product type.

(3) Details of a Service Relating to the Mounting Technique DB 328

Herein, an example of generation of cream solder information and the details of a servicing method in the above-described mounting technique DB 328 shown in FIG. 38 will be described.

Since there are an extremely large number of parameters for the printing conditions of the cream solder, it is difficult to select an optimal condition and realize it. Conventionally, on the manufacturer side, new start-up, product type change, troubleshooting, and improvement in quality or productivity on the user side are individually coped with by an unspecified engineer. Therefore, naturally, for each customer, the variation occurs in the printing condition, which is set and executed at each occasion, even for the same customer, so that the productivity or the quality is hardly stabilized.

Figure 71:
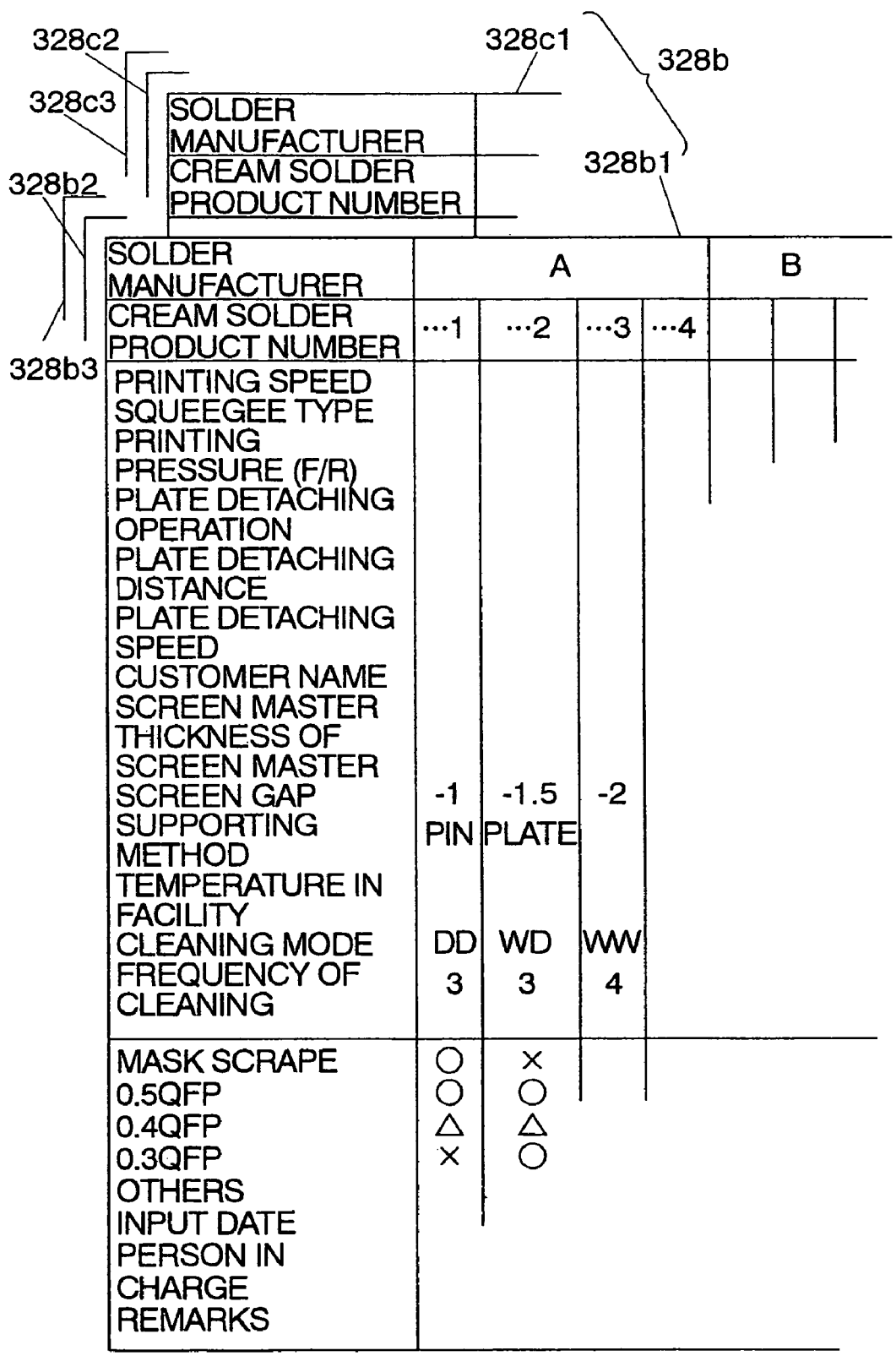
FIG. 71 is a configuration view showing an example of a printing condition DB of a cream solder in the cream solder information in the mounting technique DB in the third embodiment.

In this example, as the cream solder information, a solder characteristic DB 328a relating to solder characteristics of a cream solder as shown in FIG. 70 and a printing condition DB 328b relating to result data for printing conditions as shown in FIG. 71 are adopted. Therefore, the service providing device 2 provides, for the service receiving device 1, a retrieval service allowing the retrieval of the solder characteristic data from the solder characteristic DB 328a shown in FIG. 74 and the retrieval of the printing condition data from the printing condition DB 328b shown in FIG. 71, and a response service for accepting and responding to a requirement or an inquiry for new start-up, product type change, troubleshooting, and improvement in quality or productivity. As a result, for the start-up, the product type change, and the troubleshooting of the cream solder print, the user side can obtain adequate cream solder information or printing conditions corresponding to the problem at each occasion without any difficulty so as to cope with it within a short term or a short period of time. Moreover, if desired, the individual improvement for the quality or the productivity is requested to a service person so as to upgrade the version.

Along with it, on the service providing device 2 side, the data relating to the cream solder print is input by a service person himself/herself on the service providing device 2 side or/and the result data relating to the cream solder print on the user side is requested to be input to the service receiving device 1 so as to be collected and accumulated. While creating printing condition DBs 328b1, 328b2, . . . corresponding to each type of board or each combination of a type of board and the number of products to be produced shown in FIG. 71, a response operation such as monitoring, analysis, evaluation, countermeasures, and improvement of a printing condition, or a printing state or status is performed by an engineer so as to be reflected into the above-described printing condition DBs 328b1, 328b2, . . . . As a result, the service person side collectively manages the printing conditions selected and executed by the user side or the service person side so that the printing conditions are widely treated to be systematized as common data, regardless of the engineer. Then, the latest and reliable printing condition without any variation is provided for the user side so as to improve and stabilize the quality and the productivity of the cream solder print. Moreover, the requested countermeasures or service for improvement can be more accurately performed based on the broad result data or the printing condition or status. Specifically, the result of evaluation can be converged to the printing conditions DBs 328b1, 328b2, . . . as the needs while being at that place so as to contribute to the development of new functions. Simultaneously, the following business is realized; after a problem is found by spontaneous monitoring, analysis, and evaluation by a program or an engineer even without any request of the user, the upgraded technique or information is proposed from the service person side so as to provide the countermeasures against or the improvement over the problem. The response as described above is performed on necessary items or on all items for each customer to create and accumulate the data exclusively for each customer so as to individually provide a service.

Furthermore, as a result of such a response operation, in the service providing device 2, in the case where the data or a state or a statue, which is newly input and registered, is judged adequate or stable, the data is transferred to basic DBs 328c1, 328c2, . . . for each board or for each combination of a board and the number of products to be produced so as to update or upgrade the data. At the same time, these basic DBs 328c1, 328c2, . . . are used for the retrieval from the service receiving device 1 so as to be browsed and utilized at any time. As a result, only the data judged as adequate or stable is used by the user side while the latest result data input from the user side is reflected into the contents of a service at the early stage. Therefore, inadequate result data can be prevented from being widely used. However, since it is desirable to make the data adequate and stable with a wide range of the result at the early stage even if the data is new data, it is also meaningful to provide new data. In this case, it is suitable to mention that it is new data. As described above, since new data can be effectively used regardless of its disclosure, the user is prompted to input the data even if it is new data.

Since the service as described above becomes more effective as it is developed in a wider network, the service is desired to be globalized. However, there will be no difference from the case described above in that only a contractant can receive a service under the control of the ID management and that the security is intended to be achieved by providing a difference in the contents of a service to be received depending on the contract level. However, a condition under which service is provided is not limited thereto.

Moreover, it is suitable to similarly perform a data processing for other factors such as an adhesion condition or a reflow condition so as to provide a service. However, the specific description thereof is herein omitted.

The solder characteristic DB 328a shown in FIG. 70 has been completed on the service person side as standard data. Each time new data is added, the new data is accumulated while being additionally registered or updated so that the solder characteristic DB is used for the retrieval from the user side. Examples of information items to be treated include, as shown in the drawing, remarks such as a manufacturer of a cream solder, a product number of a cream solder, a particle size (MAX/MIN) and a viscosity of a cream solder, and a mean particle size of a cream solder, a flux type, a flux content, a thixotropic ratio, a chlorine content, a corresponding pitch, an alloy composition, and a solder item. Herein, the thixotropic ratio is a ratio of a change in viscosity when a stress is applied to a viscous material, and represents the degree of the nature of increasing the fluidity by agitation and of restoring its original state when it is left at rest. The corresponding pitch is a corresponding pitch of a cream solder of each product number recommended by the manufacturer, that is, a pitch between leads or a pitch between electrodes such as a QFP electronic component to be soldered. The alloy composition represents an alloy composition which causes a variation in characteristics of a cream solder depending on its presence/absence. A representative example thereof is the presence/absence of lead. The solder item is to fill in a characteristic of a cream solder and is a specification recommended by the manufacturer in accordance with the product number, such as for high-speed print, the maximum amount of shipping, or the compliance to lead-free. The flux type is an adopted type of flux, affecting the thixotropic ratio. The thixotropic ratio is related to a kinetic viscosity of a solder which is being printed. Generally, when the content of the flux is large, a viscosity of a cream solder is lowered.

The printing condition DBs 328b1, 328b2, . . . shown in FIG. 71 are created and accumulated based on the result data input by the user side. Examples of the data items to be treated include, as shown in the drawing, a manufacturer of a solder, a product number of a cream solder, printing conditions such as a printing speed, a squeegee type, a printing pressure (F/R) plate detaching operation, a plate detaching distance, a plate detaching speed, a customer name, a screen mask, a thickness of a screen mask, a screen gap, a supporting method, a temperature in the facility, a cleaning mode, and the frequency of cleaning, mask scrape, 0.5QFP, 0.4QFP, 0.3QFP, others, input date, person in charge, and remarks.

Herein, the squeegee type is a type of squeegee and a moving speed. There are different types such as urethane, metal, and resin, and there are different moving speeds such as high speed and low speed. The printing pressure is a pressure applied to the screen mask when the squeegee moves, and is input twice for a forward squeegee F and a rear squeegee R. The plate detaching operation is a form of operation of detaching a plate, and has different forms such as constant speed system, multi-stage system, and elevation system. For the plate detaching distance and the plate detaching speed, one condition can be filled in in the case of constant speed system, whereas up to ten conditions can be filled in in the case of multi-stage or elevation system. For the customer name, when a screen mask or the like, which is different from that of a customer using a printer provided by a service person, is adopted, the customer name is accumulated as data so as to recognize the customer. Thus, in the case where a customer name is unknown, the user side is requested to input it. For the screen, a model number, a fabrication method, the minimum pattern, and the like are filled in as much as possible. The screen gap is a gap between the screen mask in printing and a board on which a cream solder is printed through it. Normally, the printing is effected while a board is slightly lifting the screen mask, i.e., in a so-called minus gap state where both sides interfere with each other. The supporting method is a supporting form of a board, and has different forms such as a support pin, a support plate, and a suction block. For the cleaning mode, a combination of dry cleaning D and wet cleaning W for one cleaning so as to carry out the cleaning is filled in. There are different combinations of D-D, W-D, W-W, D-D-D, W-W-W-D, W-W-D-D, and W-D-D-D. The frequency of cleaning is the frequency of cleaning for the number of printed boards. The mask scrape is a state of scraping the screen mask with the squeegee. The insufficient scrape, the presence of a successive remaining part in a movement direction of the squeegee after scraping, or the distribution of remaining parts after scrape in a dotted manner is filled in as good/bad scrape with ○ or ×. However, since the cause differs depending on a state of poor scrape such as an insufficient printing pressure, an offset, clattering and a flaw, it is suitable to concretely fill in as a sentence, a drawing, or a picture. For 0.5QFP, 0.4QFP and 0.3QFP, in addition to indication of a pitch between leads of a QFP electronic component with a numerical value in mm, poor printing such as bridge due to excessive printing of a cream solder to a minute portion or thinning due to insufficient printing, slightly poor or good is filled in with ×, Δ, or ○. However, the fill-in can be entered without being limited to the above-described 0.5 QPF, 0.4 QPF, and 0.3 QPF. Poor, slightly good, or good is similarly filled in using the remarks, depending on the presence/absence of effects or the degree of effects of cream solder dragging or the degree of insufficient printing which is likely to occur in printing on the entire wide face of a package; in the cream solder dragging, after a squeegee after printing is once detached from a screen while a cream solder adhered onto an edge hangs down, the adhered cream solder is pressed to flow in the rear of the squeegee to be dragged when the squeegee gets in contact with the screen again for printing, so that the cream solder remains at various positions on the screen to adversely affect the result of the remaining printing. In "others," data on the user side, which is input upon a request of the service person side as needed or without any request, is filled in. For example, the type of board, the number of produced boards, or the like may be filled in this part. The input date is the date when the data is input, the person in charge is a person who has input. The remarks is remarks data other than the items in "others" described above and serves as management of input data by filling in each item.

Figure 72:
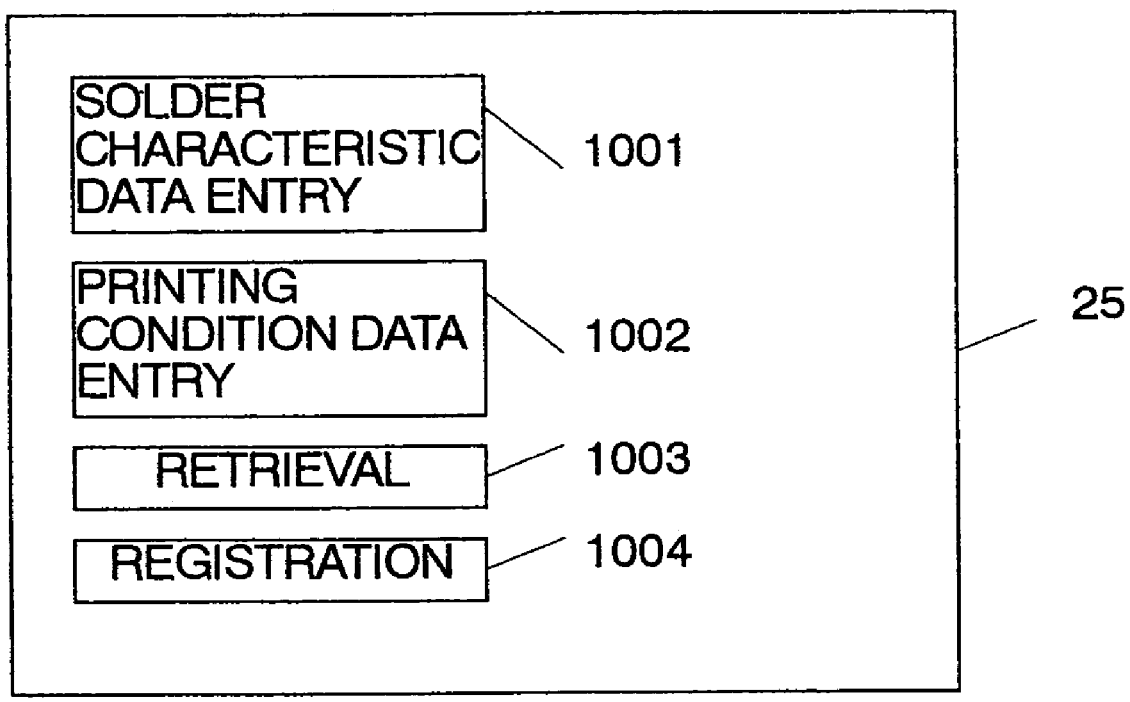
FIG. 72 is a menu screen for handling the cream solder information on the service receiving device side in the third embodiment.

The operation of retrieving the solder characteristic data and the operation of inputting and registering the adopted data of the solder characteristics or the printing conditions are performed, for example, by calling up a website of a cream printing information service on the WEB screen 25 of the service receiving device 1 under the control of the ID management, in accordance with a selecting operation on a menu screen as shown in FIG. 72. On the illustrated menu screen, a solder characteristic data entry button 1001, a printing condition data entry button 1002, a retrieval button 1003, and a registration button 1004 are displayed. Through the selecting operation of these buttons, the solder characteristic DB 328a in FIG. 70 or the printing condition DB 328b shown in FIG. 71 on the service providing device 2 side becomes accessible.

In each characteristic item of the solder characteristic DB 328a shown in FIG. 70, the printing condition is almost determined by a solder product number, or a particle size or a viscosity. The product number is positioned at the head of various characteristic items that follow. In retrieval of these items, the first priority is given thereto. In the case where the product number is unknown or a desired solder manufacturer or solder product number cannot be retrieved, a high accuracy can be still obtained even by retrieving the particle size and/or the viscosity. Therefore, the priority is given to the solder product number as an essential so that the effective retrieval is performed. However, in the case where the solder manufacturer and the solder product number are unknown, the priority is given to the particle size and/or the viscosity as the second essential(s) to retrieve the solder product number so that other solder characteristic data can be successively retrieved as the lower-order data to these items from them on. However, it is apparent that the retrieval can be performed with any other item such as the corresponding pitch.

Figure 73:
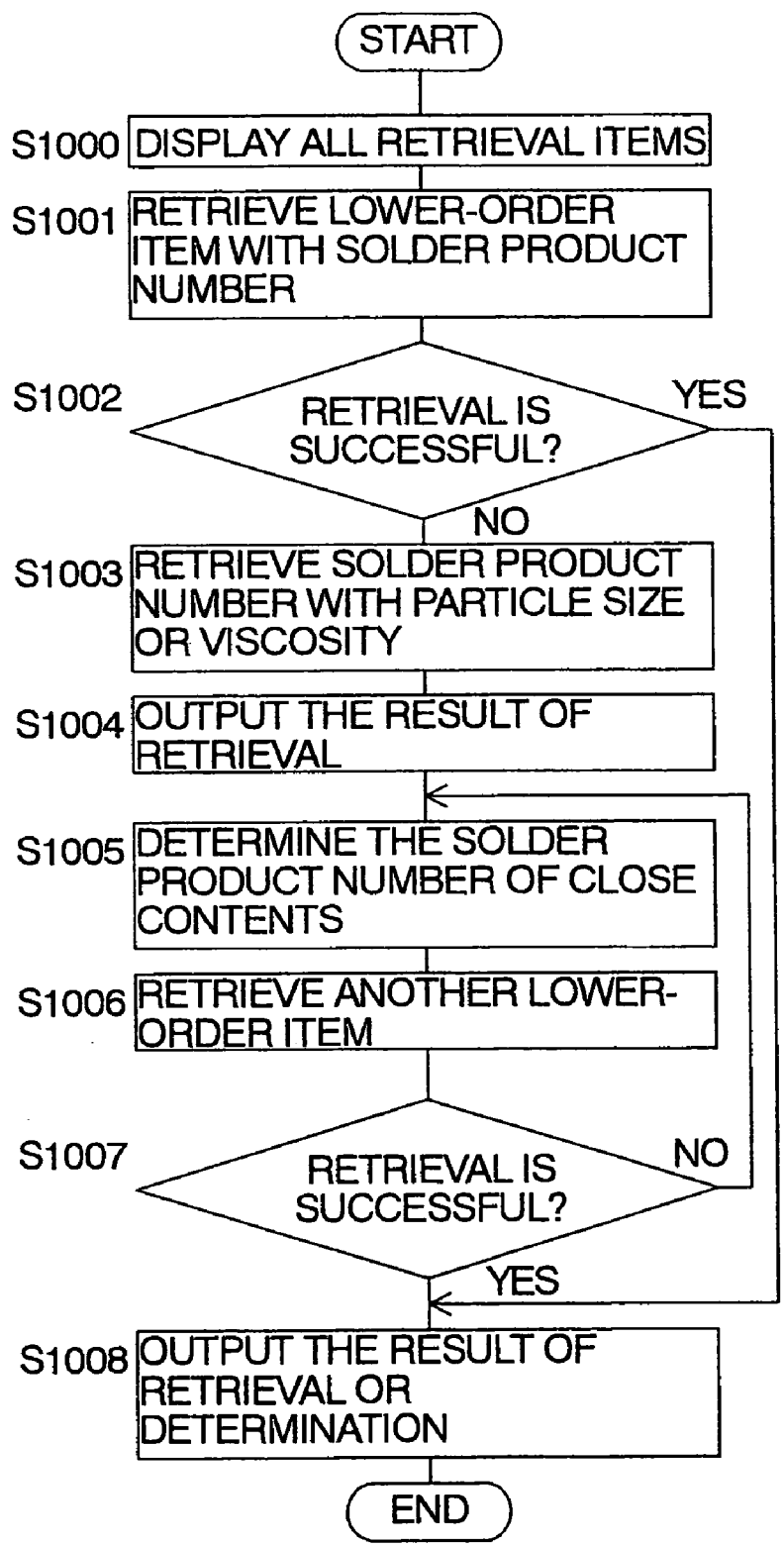
FIG. 73 is a flow chart showing a retrieval operation of the solder characteristic DB.

A procedure of the operation of retrieval of this example will be specifically described based on a flow chart shown in FIG. 73. For simplification of description, the operation of retrieving from all items is omitted. Giving the first priority to the solder product number, only the operation of performing the retrieval again with the particle size and the viscosity if the retrieval is unsuccessful will be described. The retrieval is started with the operation of selecting the retrieval button 1003 on the WEB screen 25, thereby displaying all items below the solder manufacturer shown in FIG. 70 at a time on the WEB screen 25 (S1000). As a result, necessary selection items become obvious at a glance. For this purpose, however, it is necessary to clarify the order of priority of the above-described retrieval. To that end, the guidance is displayed by at least one of the size of letters of the item, the order of arrangement, the numbering, and the like. Such guidance can be performed by guidance with letters or by displaying the items one by one from the first priority and displaying the item on the next order in the case where the item of the first priority is unknown to perform an updating operation.

The retrieval for the lower-order solder characteristic item is started to be performed on the solder characteristic DB 328*a* by inputting the solder number. Then, the retrieved items are displayed on the screen for the targeted items, so that the selection is made for determination (S1001). When it is judged that the retrieval is ended or the input is made (S1002), the result of determination by the retrieval is output, for example, on a document from a printer (S1008), thereby ending the retrieval.

In the case where the number of hits is enormous, for example, 100 or more as the result of retrieval with the particle size or the viscosity, it is possible to further narrow down the retrieval while specifying another item.

On the other hand, in the case where the solder product number is unknown or the expected retrieval cannot be performed even by inputting the solder product number, the retrieval of the solder product number is first performed with the particle size and/or the viscosity on the solder characteristic information DB 328*a* by inputting the particle size and/or the viscosity corresponding to the second order of priority (S1003). When the result of this retrieval is output on the WEB screen 25 (S1004), the closest solder product number is selected to be determined (S1005). Subsequently, the retrieval for solder characteristics of the lower order than the solder product number, the particle size, and the viscosity is performed. When the number of hits is enormous, the retrieval is narrowed down for a necessary number of times while specifying another item (S1006). When it is judged that the retrieval is ended or the input is made (S1007), the result of determination by the retrieval is output to, for example, a printer or the like (S1008) to end the retrieval.

A technique program corresponding to the result of retrieval can be downloaded from the service providing device so as to be input to a printer.

Figure 74:
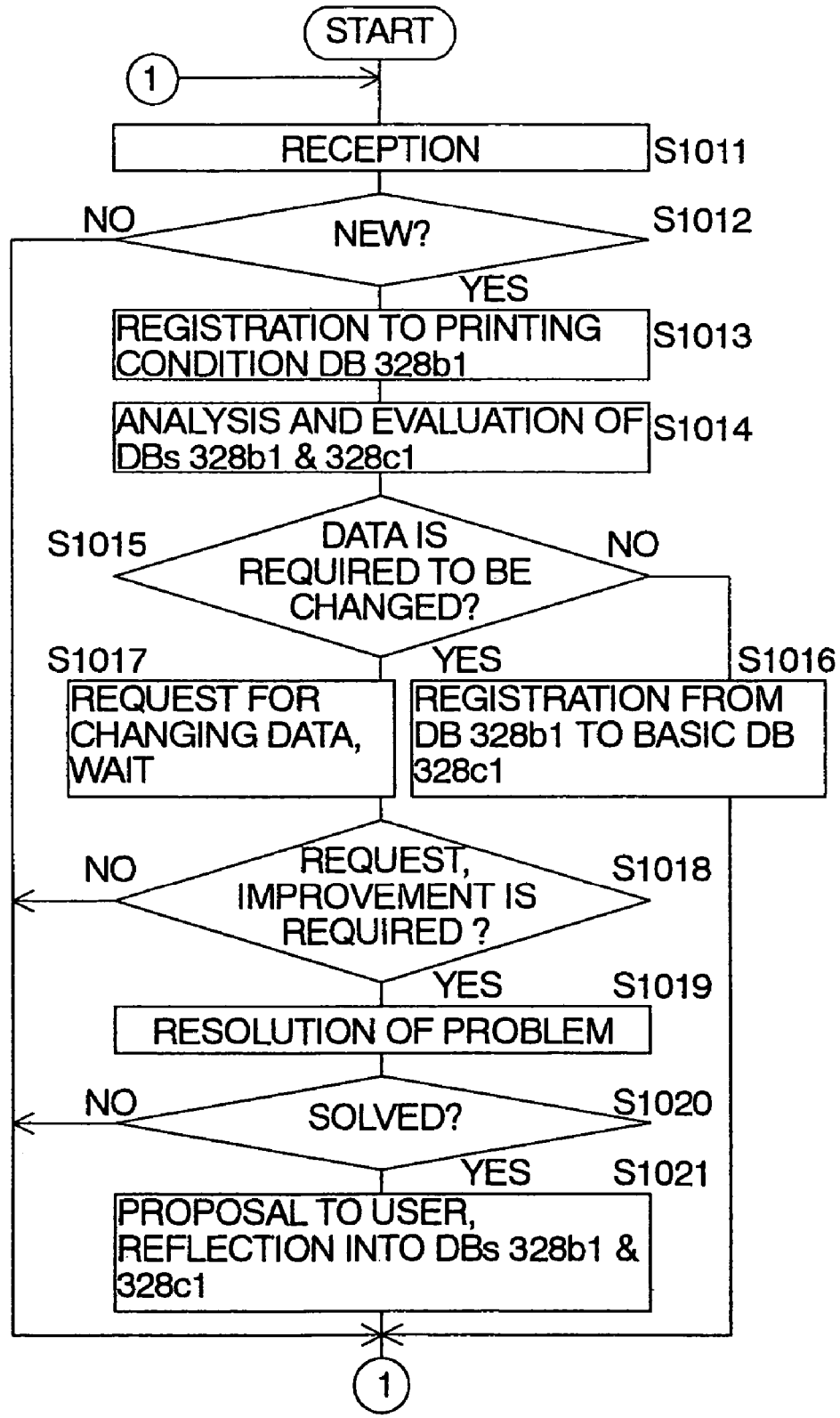
FIG. 74 is a flow chart showing a procedure of creating the printing condition DB.

Next, in accordance with a flow chart shown in FIG. 74, the case where a service such as the creation of the printing condition DB 328*b*1, 328*b*2, . . . and the basic DB 328*c*1, 328*c*2, . . . by data input from the user side, monitoring, evaluation, countermeasures, and improvement of a printing state is performed on the service person side will be described.

In the service providing device 2, for example, an inquiry or a request for the result data, data of a printing state or status, start-up time, a trouble, and improvement is momentarily input and registered from the globally spread users of various zones. Each time a registration operation of these inputs is received (S1011), it is judged if it is new data (for example, data input for a new solder product number, board, or the like) or not (S1012). If it is not new data, the processing returns (S1011) without any further process. If it is new data, the new data is additionally registered or updated to be registered on the corresponding printing condition DB 328*b*1, . . . (S1013). Then, the printing condition DB 328*b*1 . . . and the basic DB 328*c*1, . . . , in which the adequated or stabilized data in the printing condition DB is moved to be accumulated, are monitored automatically, by an engineer, or by both of them in accordance with a program so as to analyze and evaluate the relation between the printing condition and the printing state or status (S1014). Among the new data registered on the printing condition DB 328*b*1, . . . , the data which is judged as adequate or/and stable (S1015) as a result of analysis and evaluation is moved to and registered on the basic DB 328*c*1, . . . because the degree of necessity of changing the data is low (S1016) so that the data is browsed or used from the user side. For the data at the level having the necessity of changing the data, the data is on standby as it is or on standby after a request of changing the data is issued to the user side to prompt the data setting again (S1017). Next, in the case where a request is issued from the user side (S1018) or a problem is spontaneously found in the above-described monitoring, analysis and evaluation, the problem is solved automatically or by the engineer in accordance with a program (S1019). When the problem is solved, the resolution of the problem is proposed to the user who has issued the request while it is reflected into the printing condition DB 328*b*1, . . . or the basic DB 328*c*1, . . . .

Herein, at the above S1014, even if the new data overlaps the already registered one having the same solder product number, board, particle size, viscosity, or the like, it is desirable to distinctively register the new data separately from the already registered one. In this case, for example, the distinction may be made by an additional number for distinguishing the solder product number. In this manner, various patterns of the printing condition data can be accumulated even for the same board or solder product number as being adequate for a condition at each occasion. From the thus accumulated data, it is possible to select the optimal one based on the result of evaluation.

INDUSTRIAL APPLICABILITY

As described above, according to the component mounting apparatus, the service providing device, and the servicing method of the present invention, even if a trouble occurs in a device on the customer side, the grasp of the contents of the trouble, an operation for recovering the trouble, an instruction of an operation for trouble recovery, the update or adjustment of a software or parameter setting for trouble recovery can be performed to solve the trouble of the component mounting apparatus on the customer side without taking long time and cost by using the Internet line which is in widespread use. Since any required problem such as start-up, type change, or improvement in quality or productivity can be coped with, it is particularly effective in the case where the customer is remotely located from the service person.

Moreover, even in the case where no trouble occurs, an operating status of the component mounting apparatus on the customer side is periodically checked so as to carry out the maintenance by an operator on the customer side or a service person on the service person side before occurrence of any trouble. Therefore, it is suitable to increase the operation rate of the component mounting apparatus possessed on the customer side. Furthermore, effectuation of even at least one such customer service is effective.

Moreover, since the user side can obtain adequate cream solder information or printing condition responding to a problem at each occasion from the service person side without any difficulty, for start-up, type change, and troubleshooting in the cream solder printing, it is useful for achieving an accurate response in a short term or a short period of time. Furthermore, if desired, it is suitable to request the individual improvement of the quality or the productivity to the service person so as to upgrade the version.

The invention claimed is:

1. A service providing method for providing mounting technique data including one of cream solder information and adhesive information necessary for allowing one of a cream solder printing apparatus and an adhesive applicator to perform a mount production, from a service provider provided at a supplier side or a serviceperson side of a cream solder printer for printing cream solder on a circuit board for mounting a component thereon, or an adhesive applicator for applying an adhesive for adhering components onto the circuit board, to a service receiver provided at a user side for mount production using the cream solder printer or the adhesive applicator, via a communication system including the Internet, the method comprising:

receiving and collecting, by the service provider, mounting technique data having results of fabrication of non-defective products input by the service receiver via the communication system;

accumulating, by the service provider, the input mounting technique data for each type of component, cream solder, adhesive, or circuit board in a mounting technique database, and deriving the mounting technique data by the service receiver, wherein the service provider comprises a printing condition database for storing the printing condition of the cream solder within the mounting technique database, wherein the service provider derives one of cream solder characteristic information and printing condition information from the printing condition database in response to a request from the service receiver during the accumulating of input mounting technique data, and wherein the cream solder characteristic information includes a product number, a particle size, and a viscosity; and retrieving, by the service provider, the product number, and if the retrieving fails, retrieving the particle size or the viscosity, so as to obtain cream solder characteristic information close to the desired product number in the retrieved cream solder characteristic information as a result of the retrieving during the deriving of a component library.

* * * * *